United States Patent
Hayoz et al.

(10) Patent No.: US 9,209,412 B2
(45) Date of Patent: Dec. 8, 2015

(54) DIKETOPYRROLOPYRROLE OLIGOMERS AND COMPOSITIONS, COMPRISING DIKETOPYRROLOPYRROLE OLIGOMERS

(75) Inventors: Pascal Hayoz, Hofstetten (CH); Natalia Chebotareva, Hagenthal le Bas (FR); Yves Henri Geerts, Brussels (BE); Sara Stas, Halle (BE); Jean-Yves Balandier, Uccle (BE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/241,769

(22) PCT Filed: Aug. 31, 2012

(86) PCT No.: PCT/EP2012/066941
§ 371 (c)(1),
(2), (4) Date: Feb. 27, 2014

(87) PCT Pub. No.: WO2013/030325
PCT Pub. Date: Mar. 7, 2013

(65) Prior Publication Data
US 2014/0217329 A1    Aug. 7, 2014

Related U.S. Application Data

(60) Provisional application No. 61/530,419, filed on Sep. 2, 2011.

(30) Foreign Application Priority Data

Sep. 2, 2011   (EP) .................................... 11179840

(51) Int. Cl.
| C08G 73/00 | (2006.01) |
| H01L 51/00 | (2006.01) |
| C09B 23/14 | (2006.01) |
| C09B 57/00 | (2006.01) |
| C09B 69/10 | (2006.01) |
| H01L 51/05 | (2006.01) |
| H01L 51/42 | (2006.01) |

(52) U.S. Cl.
CPC .......... *H01L 51/0072* (2013.01); *C09B 23/148* (2013.01); *C09B 57/004* (2013.01); *C09B 69/109* (2013.01); *H01L 51/0035* (2013.01); *H01L 51/0053* (2013.01); *H01L 51/0068* (2013.01); *H01L 51/0074* (2013.01); *H01L 51/0512* (2013.01); *H01L 51/4253* (2013.01); *Y02E 10/549* (2013.01)

(58) Field of Classification Search
CPC .................................................. C09B 57/004
USPC .............. 257/40, E51.012; 427/331; 528/367
See application file for complete search history.

(56) References Cited

U.S. PATENT DOCUMENTS

| 5,703,436 A | 12/1997 | Forrest et al. |
| 6,420,031 B1 | 7/2002 | Parthasarathy et al. |
| 6,451,459 B1 | 9/2002 | Tieke et al. |
| 6,933,436 B2 | 8/2005 | Shaheen et al. |
| 2003/0021913 A1 | 1/2003 | O'Neill et al. |
| 2004/0004433 A1 | 1/2004 | Lamansky et al. |
| 2006/0013549 A1 | 1/2006 | Shtein et al. |
| 2007/0079867 A1 | 4/2007 | Chittibabu et al. |
| 2007/0228359 A1 | 10/2007 | Heim et al. |
| 2009/0065878 A1 | 3/2009 | Li |
| 2010/0326525 A1 | 12/2010 | Nguyen et al. |
| 2011/0204351 A1 | 8/2011 | Heim et al. |
| 2011/0284826 A1 | 11/2011 | Hayoz et al. |

(Continued)

FOREIGN PATENT DOCUMENTS

| EP | 0 648 770 A2 | 4/1995 |
| EP | 0 648 817 A1 | 4/1995 |

(Continued)

OTHER PUBLICATIONS

Bright Walker, et al., "Nanoscale Phase Separation and High Photovoltaic Efficiency in Solution-Processed, Small-Molecule Bulk Heterojunction Solar Cells" Advanced Functional Materials, vol. 19, No. 19, XP001548629, Oct. 9, 2009, pp. 3063-3069.

(Continued)

*Primary Examiner* — Shane Fang
(74) *Attorney, Agent, or Firm* — Oblon, McClelland, Maier & Neustadt, L.L.P.

(57) ABSTRACT

The present invention relates to compositions, comprising (a) a compound of the formula (I), and (b) a polymeric material, to specific oligomers of the formula I, and their use as organic semiconductor in organic devices, especially in organic photovoltaics (solar cells) and photodiodes, or in a device containing a diode and/or an organic field effect transistor. High efficiency of energy conversion, excellent field-effect mobility, good on/off current ratios and/or excellent stability can be observed, when the compositions, or oligomers according to the invention are used in organic field effect transistors, organic photovoltaics (solar cells) and photodiodes.

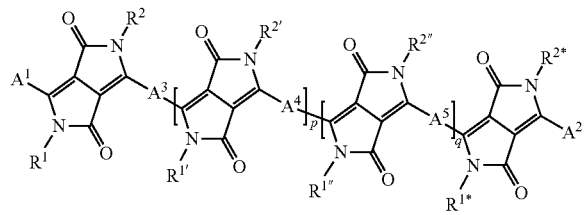

20 Claims, No Drawings

(56) References Cited

U.S. PATENT DOCUMENTS

| | | | |
|---|---|---|---|
| 2012/0074393 A1 | 3/2012 | Wurthner et al. | |
| 2014/0128618 A1 | 5/2014 | Hayoz et al. | |

FOREIGN PATENT DOCUMENTS

| | | |
|---|---|---|
| EP | 0 742 255 A1 | 11/1996 |
| EP | 0 761 772 A1 | 3/1997 |
| EP | 1 086 984 A2 | 3/2001 |
| EP | 2 033 983 A2 | 3/2009 |
| EP | 2 034 537 A2 | 3/2009 |
| EP | 2 075 274 A1 | 7/2009 |
| JP | 2006-310538 A | 11/2006 |
| WO | WO 98/32802 A1 | 7/1998 |
| WO | WO 98/45757 A1 | 10/1998 |
| WO | WO 98/58027 A1 | 12/1998 |
| WO | WO 99/01511 A1 | 1/1999 |
| WO | WO 00/17275 A1 | 3/2000 |
| WO | WO 00/36210 A1 | 6/2000 |
| WO | WO 00/39221 A1 | 7/2000 |
| WO | WO 00/63297 A1 | 10/2000 |
| WO | WO 03/048268 A1 | 6/2003 |
| WO | WO 2004/112161 A2 | 12/2004 |
| WO | WO 2005/049695 A1 | 6/2005 |
| WO | WO 2006/061343 A1 | 6/2006 |
| WO | WO 2007/003520 A1 | 1/2007 |
| WO | WO 2008/000664 A1 | 1/2008 |
| WO | WO 2008/001123 A1 | 1/2008 |
| WO | WO 2009/047104 A2 | 4/2009 |
| WO | WO 2010/049321 A1 | 5/2010 |
| WO | WO 2010/049323 A1 | 5/2010 |
| WO | WO 2010/108873 A1 | 9/2010 |
| WO | WO 2010/115767 A1 | 10/2010 |
| WO | WO 2010/136352 A1 | 12/2010 |
| WO | WO 2010/136353 A1 | 12/2010 |
| WO | WO 2011/144566 A2 | 11/2011 |
| WO | WO 2012/041849 A1 | 4/2012 |

OTHER PUBLICATIONS

Arnold B. Tamayo, et al., "A Low Band Gap, Solution Processable Oligothophene with a Diketopyrrolopyrrole Core for Use in Organic Solar Cells" Journal of Physical Chemistry, vol. 112, No. 30, XP055017336, Jul. 31, 2008, pp. 11545-11551.

Mario Smet, et al., "Construction of rod-like diketopyrrolopyrrole oligomers with well-defined length" Tetrahedron Letters, vol. 42, 2001, pp. 6527-6530.

Matthias Horn, et al., "Synthesis and characterization of thermomesogenic polysiloxanes with 2,5-dihydropyrrolo[3,4-c]pyrrole-1,4-dione units in the main chain" European Polymer Journal, vol. 38, 2002, pp. 2197-2205.

Yanbin Xu, et al., "Syntheses and electroluminescence properties of red emitting copolymers with different lengths of diketopyrrolopyrrole units" Synthetic Metals, vol. 160, 2010, pp. 2135-2142.

Bram P. Karsten, "Chain Length Dependence in Diketopyrrolophyrrole/Thiophene Oligomers" Macromolecular Journals, Macromolecular Chemistry and Physics, vol. 212, 2011, pp. 515-520.

Stephen Loser, et al., A Naphthodithiophene-Diketopyrrolopyrrole Donor Molecule for Efficient Solution-Processed Solar Cells, Journal of the American Chemical Society, vol. 133, 2011, pp. 8142-8145.

J. Peet, et al., "Small molecule sensitizers for near-infrared absorption in polymer bulk heterojunction solar cells" Applied Physics Letters, vol. 93, 2008, pp. 163306-1-163306-2.

Bram P. Karsten, et al., "Diketopyrrolopyrroles as Acceptor Materials in Organic Photovoltaics" Macromolecular Journals, Macromolecular Rapid Communications, vol. 31, 2010, pp. 1554-1559.

U.S. Appl. No. 14/361,129, filed May 28, 2014, Bujard, et al.
U.S. Appl. No. 14/362,500, filed Jun. 3, 2014, Hayoz, et al.
U.S. Appl. No. 14/385,696, filed Sep. 16, 2014, Welker, et al.
U.S. Appl. No. 14/386,123, filed Sep. 18, 2014, Hayoz.

DIKETOPYRROLOPYRROLE OLIGOMERS AND COMPOSITIONS, COMPRISING DIKETOPYRROLOPYRROLE OLIGOMERS

CROSS-REFERENCE TO RELATED APPLICATION

This application is a National Stage of PCT/EP2012/066941 filed on Aug. 31, 2012, which claims the benefit of priority to U.S. Provisional Application No. 61/530,419 filed on Sep. 2, 2011. This application is based upon and claims the benefit of priority to European Application No. 11179840.1 filed on Sep. 2, 2011.

The present invention relates to compositions, comprising (a) a compound of the formula I, and (b) a polymeric material, to specific oligomers of the formula I, and their use as organic semiconductor in organic devices, especially in organic photovoltaics (solar cells) and photodiodes, or in a device containing a diode and/or an organic field effect transistor. High efficiency of energy conversion, excellent field-effect mobility, good on/off current ratios and/or excellent stability can be observed, when the compositions, or oligomers according to the invention are used in organic field effect transistors, organic photovoltaics (solar cells) and photodiodes.

Examples of DPP polymers and their synthesis are, for example, described in US6451459B1, WO05/049695, WO2008/000664, EP2034537A2, EP2075274A1, WO2010/049321, WO2010/049323, WO2010/108873, WO2010/115767, WO2010/136353, WO2010/136352 and WO2011/144566:

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose DPP oligomers.

EP2034537A2 discloses polymers of formula

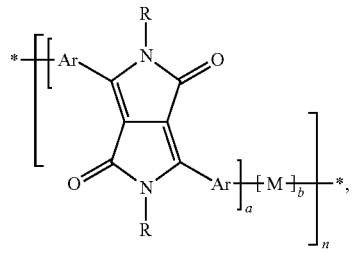

wherein each R is independently selected from hydrogen, an optionally substituted hydrocarbon, and a hetero-containing group; each Ar is independently selected from optionally substituted aryl and heteroaryl groups; each M is an optional, conjugated moiety; a represents a number that is at least 1; b represents a number from 0 to 20; and n represents a number that is at least 1, but fails to disclose DPP oligomers.

M. Smet et al., Tetrahedron Letters 42 (2001) 6257-6530 describes oligomers, which are prepared by a stepwise sequence of suzuki couplings using brominated 1,4-dioxo-3,6-diphenylpyrrolo[3,4c]pyrrole (DPP derivatives) and 1,4-dibromo-2,5-di-n-hexylbenzene as the monomers. The resulting oligomers contained three, five and seven DPP units, respectively.

Matthias Horn et al., Eur. Polymer J. 38 (2002) 2197-2205 describes the synthesis and characterisation of thermomesogenic polysiloxanes with 2,5-dihydropyrrolo[3,4-c]pyrrole units in the main chain.

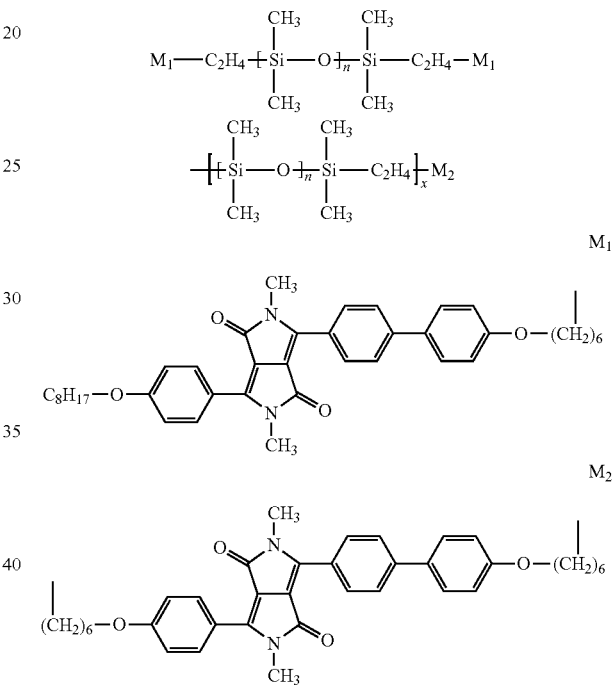

WO2003048268 relates to an organic electroluminescent device comprising a perylene derivative and a diketopyrrolopyrrole derivative, such as, for example,

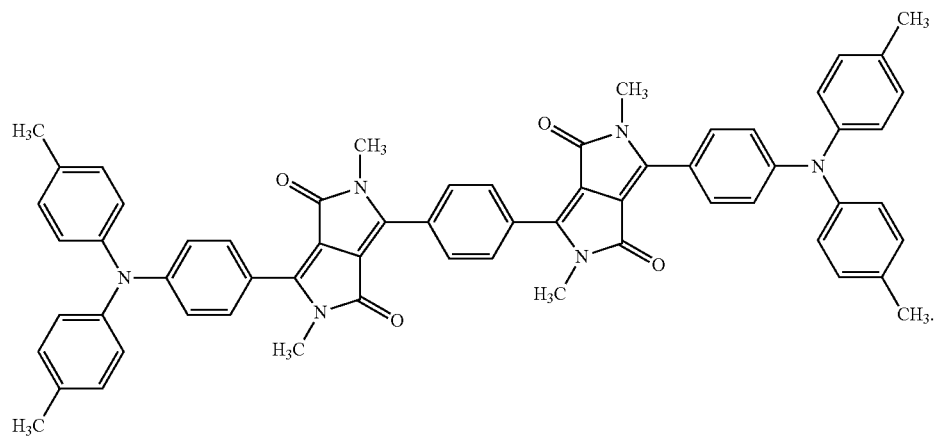 [SMILES: Cc1ccc(N(c2ccc(C)cc2)c2ccc(C3=C4C(=O)N(C)C(c5ccc(C6=C7C(=O)N(C)C(c8ccc(N(c9ccc(C)cc9)c9ccc(C)cc9)cc8)=C7C(=O)N6C)cc5)=C4C(=O)N3C)cc2)cc1]

WO06/061343 discloses fluorescent diketopyrrolopyrroles of the formula

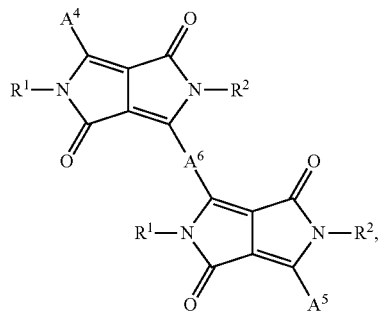

wherein $R^1$ and $R^2$ may be the same or different and are selected from a $C_1$-$C_{25}$alkyl group, an allyl group, which can be substituted one to three times with $C_1$-$C_3$alkyl, a cycloalkyl group, which can optionally be substituted one to three times with $C_1$-$C_8$alkyl and/or $C_1$-$C_8$alkoxy, a cycloalkyl group, which is condensed one or two times by phenyl which can be substituted one to three times with $C_1$-$C_4$-alkyl, halogen, nitro, or cyano, an alkenyl group, a cycloalkenyl group, an alkynyl group, a heterocyclic group, haloalkyl, haloalkenyl, haloalkynyl, a heterocyclic group, a ketone or aldehyde group, an ester group, a carbamoyl group, a silyl group, a siloxanyl group, aryl, heteroaryl, or —$CR^3R^4$—$(CH_2)_m$-$A^3$ wherein $R^3$ and $R^4$ independently from each other stand for hydrogen or $C_1$-$C_4$alkyl, or phenyl which can be substituted one to three times with $C_1$-$C_3$alkyl, $A^3$ stands for aryl, or heteroaryl, in particular phenyl or 1- or 2-naphthyl, which can be substituted one to three times with $C_1$-$C_8$alkyl and/or $C_1$-$C_8$alkoxy, and m stands for 0, 1, 2, 3 or 4, $A^4$ and $A^5$ independently of each other stands for

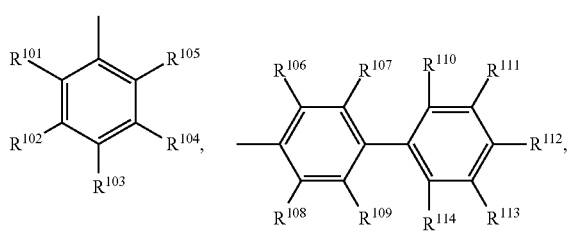

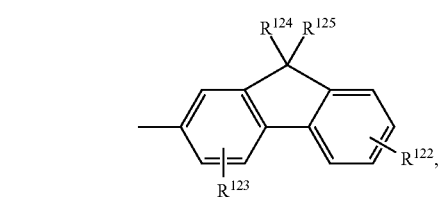

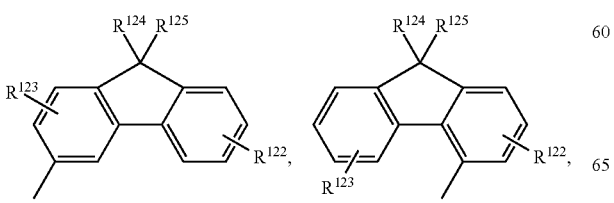

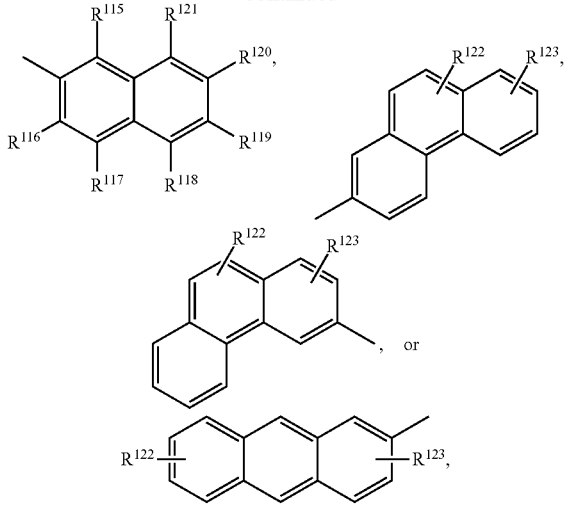

wherein $R^{101}$ to $R^{123}$ may be the same or different and are selected from hydrogen, $C_1$-$C_{25}$alkyl group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group $NR^{27}R^{28}$, wherein $R^{27}$ and $R^{28}$ are as defined above, a nitro group, a silyl group, a siloxanyl group, a substituted or unsubstituted vinyl group, or at least two adjacent substituents $R^{115}$ to $R^{121}$ form an aromatic, heteroaromatic or aliphatic fused ring system, $R^{124}$ and $R^{125}$ may be the same or different and are selected from $C_1$-$C_{18}$alkyl; $C_1$-$C_{18}$alkoxy, $A^3$, $C_6$-$C_{18}$aryl; $C_7$-$C_{18}$aralkyl; or $R^{124}$ and $R^{125}$ together form a ring especially a five-, six- or seven-membered ring, which can optionally be substituted by $C_1$-$C_8$alkyl, or which can optionally be condensed one or two times by phenyl which can be substituted one to three times with $C_1$-$C_8$-alkyl, $C_1$-$C_8$-alkoxy, halogen and cyano; or a heteroaromatic group, especially

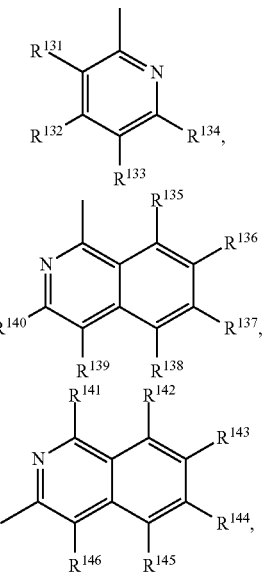

-continued

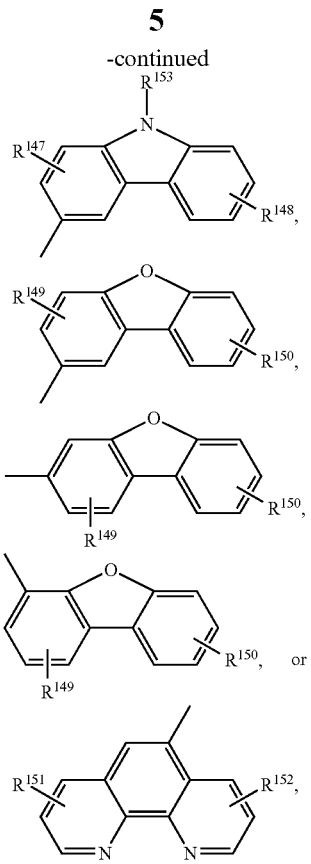

wherein R[131] to R[152] may be the same or different and are selected from hydrogen, $C_1$-$C_{25}$alkyl group, cycloalkyl, aralkyl, alkenyl, cycloalkenyl, alkynyl, hydroxyl, a mercapto group, alkoxy, alkylthio, an aryl ether group, an aryl thioether group, aryl, a heterocyclic group, halogen, haloalkyl, haloalkenyl, haloalkynyl, a cyano group, an aldehyde group, a carbonyl group, a carboxyl group, an ester group, a carbamoyl group, a group NR[27]R[28], wherein R[27] and R[28] are as defined above, a nitro group, a silyl group, a siloxanyl group, a substituted or unsubstituted vinyl group, R[153] is a hydrogen atom, a $C_1$-$C_{25}$alkyl group, which might be interrupted by —O—, a cycloalkyl group, an aralkyl group, an aryl group, or a heterocyclic group, and A[6] is cycloalkyl, arylene, or heteroarylene, which are optionally substituted one to three times with $C_1$-$C_8$-alkyl, or $C_1$-$C_8$-alkoxy; and their use for the preparation of inks, colorants, pigmented plastics for coatings, non-impact-printing material, color filters, cosmetics, polymeric ink particles, toners, as fluorescent tracers, in color changing media, in solid dye lasers, EL lasers and electroluminescent devices.

The following compounds are explicitly mentioned in WO06/061343:

| Cpd. | A[4] = A[5] | A[6] | R[1] = R[2] |
|---|---|---|---|
| D-1 | 1-methylnaphthyl | 4-methylphenyl | CH₃ |
| D-2 | 1-methylnaphthyl | 1,4-dimethylnaphthyl | CH₃ |
| D-3 | 1-methylnaphthyl | 1,5-dimethylnaphthyl | CH₃ |
| D-4 | 1-methylnaphthyl | 3-methylphenyl | CH₃ |
| D-5 | 1-methylnaphthyl | 3,5-di-tert-butylphenyl (with methyl) | CH₃ |
| D-6 | 1-methylnaphthyl | biphenyl-4,4'-diyl | CH₃ |
| D-7 | 1-methylnaphthyl | terphenyl | CH₃ |

JP2006310538 discloses fluorescent diketopyrrolopyrroles of the formula

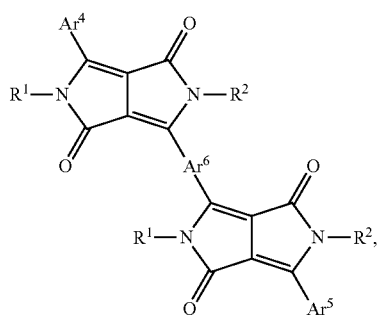

wherein Ar[6] may be aryl, or heteroryl, and its use in light emitting elements.

WO2007/003520 relates to fluorescent compounds, such as, for example,

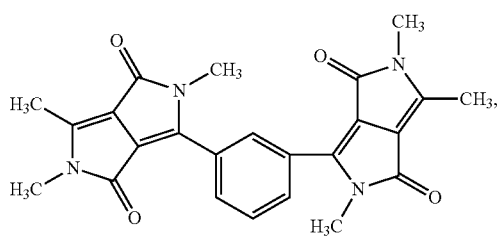

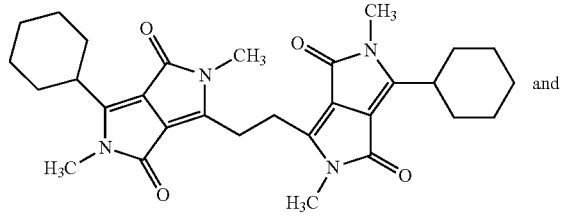

and

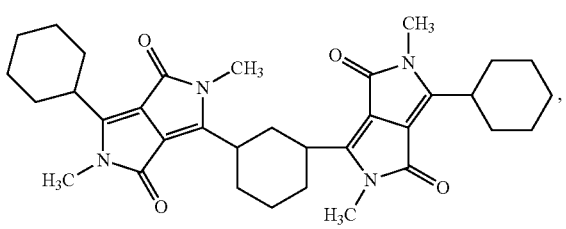

a process for their prepn. and their use for the prepn. of inks, colorants, pigmented plastics for coatings, non-impact-printing material, color12 filters, cosmetics, polymeric ink particles, toners, as fluorescent tracers, in color changing media, dye lasers and electroluminescent devices.

US2010/0326525 relates to optoelectronic devices, such as photovoltaic devices, comprising:

a) a first hole-collecting electrode;
b) an optional hole-transporting layer;
c) a layer comprising a mixture of an electron donor material and an electron acceptor material; and
d) a second electron-collecting electrode,
wherein the electron donor material comprises a compound of Formula (I):

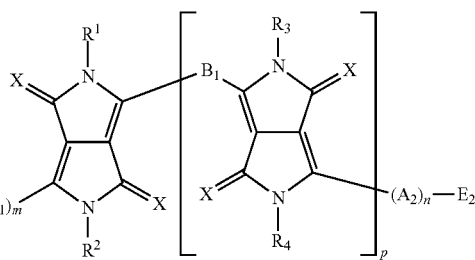

(I)

wherein X is oxygen or sulfur;
A1 and A2 are independently selected from substituted and unsubstituted aryl or heteroaryl groups, wherein each individual $A_1$ within the $(A_1)m$ moiety can be independently selected from a substituted or unsubstituted aryl or heteroaryl group, and each individual $A_2$ within the $(A_2)n$ moiety can be independently selected from a substituted or unsubstituted aryl or heteroaryl group;
$B_1$ is independently selected from substituted and unsubstituted aryl or heteroaryl groups;
m is independently selected from 1, 2, 3, 4, 5, 6, 7, 8, or 9;
n is independently selected from 1, 2, 3, 4, 5, 6, 7, 8, or 9;
p is independently selected from 0 or 1;
$E_1$ and $E_2$ are independently selected from a nonentity, H, or a substituted or unsubstituted aryl or heteroaryl group or a $C_1$-$C_{12}$ alkyl group; and
$R_1$, $R_2$, $R_3$, and $R_4$ are independently selected from H, $C_1$-$C_{12}$ alkyl, and —C(—O)—O—$C_1$-$C_{12}$ alkyl.

The following dimeric DPP compound is explicitly disclosed:

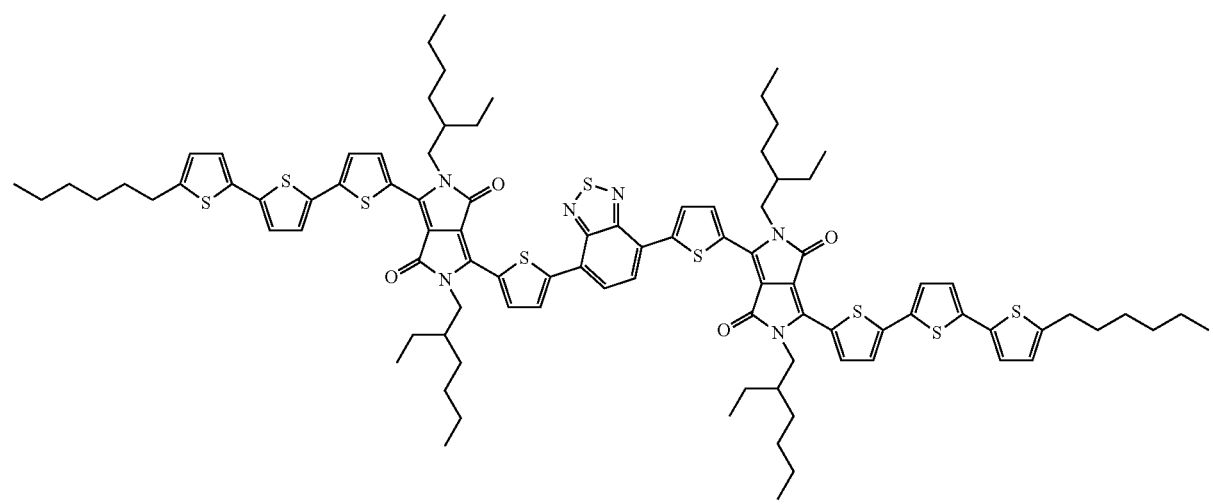 [SMILES: CCCCCCc1ccc(-c2ccc(-c3ccc(C4=C5C(=O)N(CC(CC)CCCC)C(c6ccc(-c7ccc(-c8ccc(C9=C%10C(=O)N(CC(CC)CCCC)C(c%11ccc(-c%12ccc(-c%13ccc(CCCCCC)s%13)s%12)s%11)=C%10C(=O)N9CC(CC)CCCC)s8)c8nsnc78)s6)=C5C(=O)N4CC(CC)CCCC)s3)s2)s1]

Y. Xu et al., Synthetic Metals 160 (2010) 2135-2142 reports the synthesis of DPP-containing oligomers:

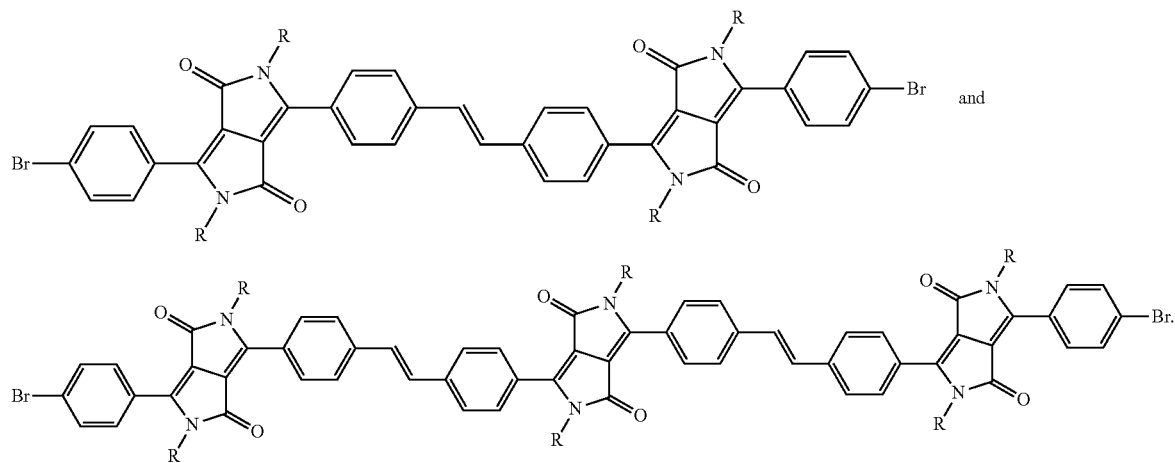

The monomers were copolymerized with benzothiadiazole, dioctyloxybenzene and fluorene through fluoride-mediated Suzuki polymerization to give copolymers with low content of DPP (1 mol %). The copolymers were used as the emitting layers in the light-emitting diodes.

R. A. J. Janssen et al., Macromol. Chem. Phys. 2011, 212, 515-520 disclose diketopyrrolopyrrole-based oligomers of formula

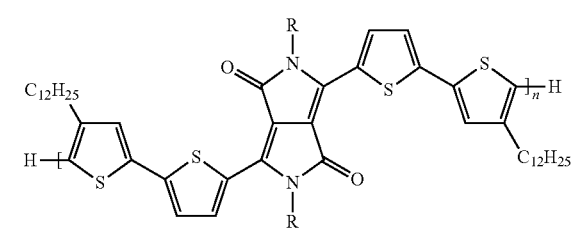

(R=2-hexyldecyl; n=1 to 4), which were prepared nickel (0)-mediated Yamamoto coupling reaction of a mixture of mono- and dibrominated monomers

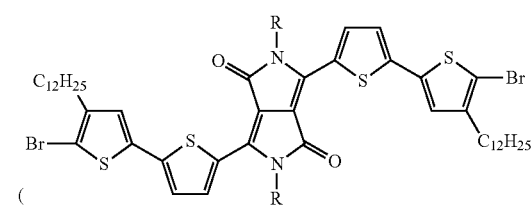

and

-continued

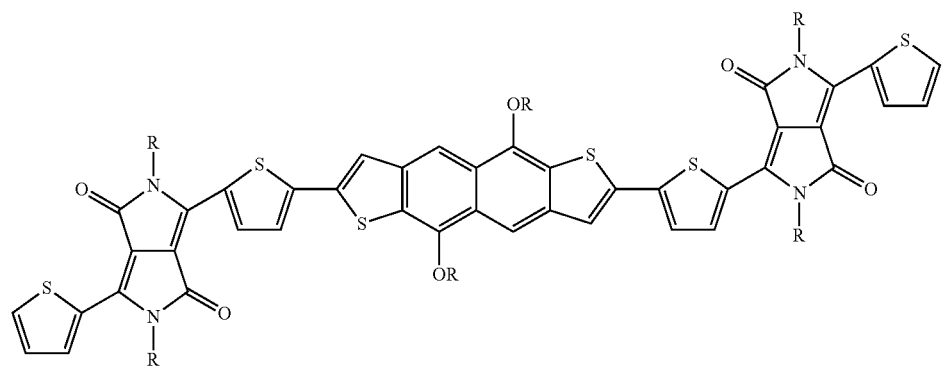

).

Monodisperse oligomers were obtained from the resulting mixture by separation of the oligomers using recycling GPC. Their optical and electrochemical properties were investigated. For all properties, measured in solution, no clear change was observed upon increase of the chain length, leading to the conclusion that conjugation in this system is only very limited.

Stephen Loser et al., J. Am. Chem. Soc. 133 (2011) 8142-8145 (DOI: 10.1021/ja202791n • Publication Date (Web): 5 May 2011) describes the synthesis, characterization, and first implementation of a naphtho[2,3-b:6,7-b']dithiophene (NDT)-based donor molecule in highly efficient organic photovoltaics (OPVs). When NDT(TDPP)2 (TDPP=thiophene-capped diketopyrrolopyrrole (R=2-ethylhexyl)) is combined with the electron acceptor PC61BM, a power conversion efficiency (PCE) of 4.06±0.06% is achieved.

T.-Q. Nguyen et al., Applied Physics Letters 93 (2008) 163306 reports the incorporation of a soluble oligothiophene with a diketopyrrolopyrrole core into a polymer (poly(3-hexylthiophen)/fullerene bulk heterojunction (BHJ) solar cell.

R. A. J. Janssen et al., Macromol. Rapid Commun. 31 (2010) 1554-1559 disclose small molecule DPP derivatives

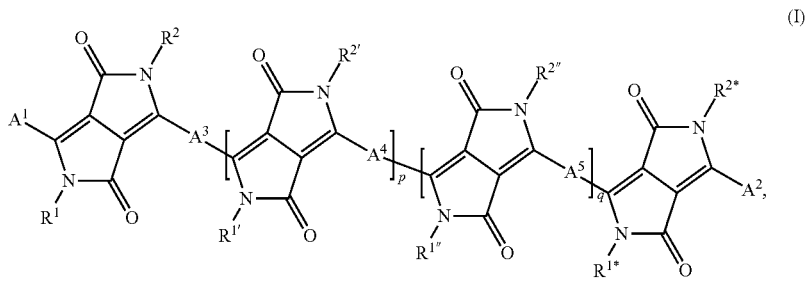

The compounds are tested as electron acceptors in combination with poly(3-hexylthiophene) (P3HT) as the donor material. Working photovoltaic devices are obtained that show a photoresponse in the wavelength region where the DPP molecules absorb. The best device shows a power conversion efficiency of 0.31% in simulated solar light, with a photon-to-electron conversion efficiency of ca. 10% up to 700 nm.

It is the object of the present invention to provide compounds, which show high efficiency of energy conversion, excellent field-effect mobility, good on/off current ratios and/or excellent stability, when used in organic field effect transistors, organic photovoltaics (solar cells) and photodiodes.

It has surprisingly been found that certain dimeric, trimeric and quatermeric diketopyrrolopyrrol derivatives can be used alone, or in admixture with polymers as organic semiconductors. Alone, or in admixture with polymers, they are especially suitable as semiconductors for the application in field effect transistors. Said derivatives have excellent solubility in non-halogenated organic solvents (allowing easy handling).

Accordingly, the present invention relates to compositions, comprising
(a) a compound of the formula (I)

[chemical structure showing the formula (I) with multiple diketopyrrolopyrrole units linked by $A^3$, $A^4$, $A^5$ groups with $R^1$, $R^2$, $R^{1'}$, $R^{2'}$, $R^{1''}$, $R^{2''}$, $R^{1*}$, $R^{2*}$ substituents, and $A^1$, $A^2$ terminal groups, with subscripts $p$ and $q$]

and
(b) a polymeric material, wherein
p is 0, or 1, q is 0, or 1,
$A^1$ and $A^2$ are independently of each other a group of formula

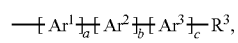

or have the meaning of $R^5$,
$A^3$, $A^4$ and $A^5$ are independently of each other a group of formula

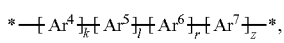

a is 1 or 2; b is 0, 1 or 2; c is 0, 1 or 2;
k is 0, 1, or 2; l is 1, 2, or 3; r is 0, or 1; z is 0, 1 or 2;
$R^1$, $R^2$, $R^{1'}$, $R^{2'}$, $R^{1''}$, $R^{2''}$, $R^{1*}$ and $R^{2*}$ may be the same or different and are selected from hydrogen, a $C_1$-$C_{100}$alkyl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_2$-$C_{100}$alkenyl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_3$-$C_{100}$alkinyl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_3$-$C_{12}$cycloalkyl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_6$-$C_{24}$aryl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, a $C_2$-$C_{20}$heteroaryl group which can optionally be substituted one or more times with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, —CO—$C_1$-$C_{18}$alkyl, —CO—$C_5$-$C_{12}$cycloalkyl, —COO—$C_1$-$C_{18}$alkyl;

$R^3$ is hydrogen, halogen, cyano, $C_1$-$C_{25}$alkyl, $C_1$-$C_{25}$alkyl which is substituted one or more times by E and/or interrupted one or more times by D,

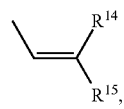

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^6$ is

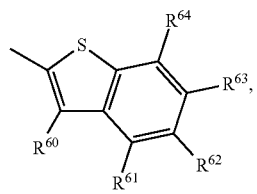 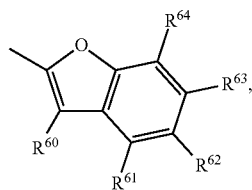

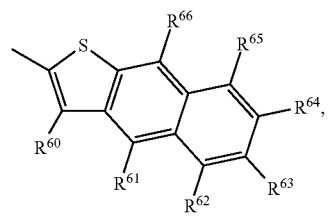

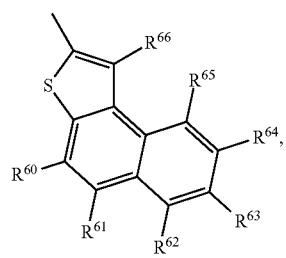

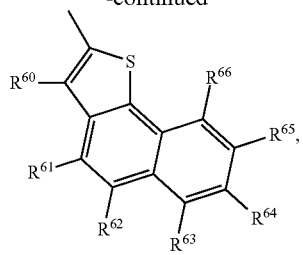

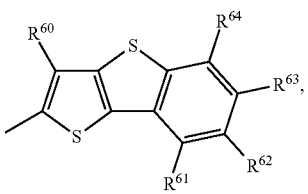

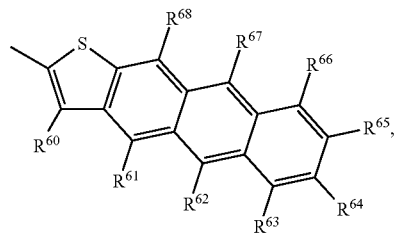

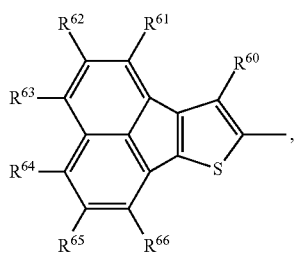

$R^6$ is

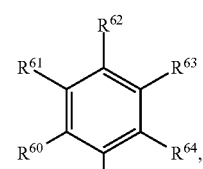

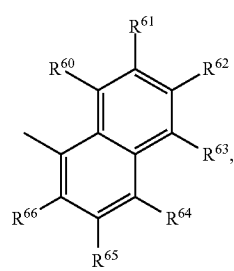

-continued
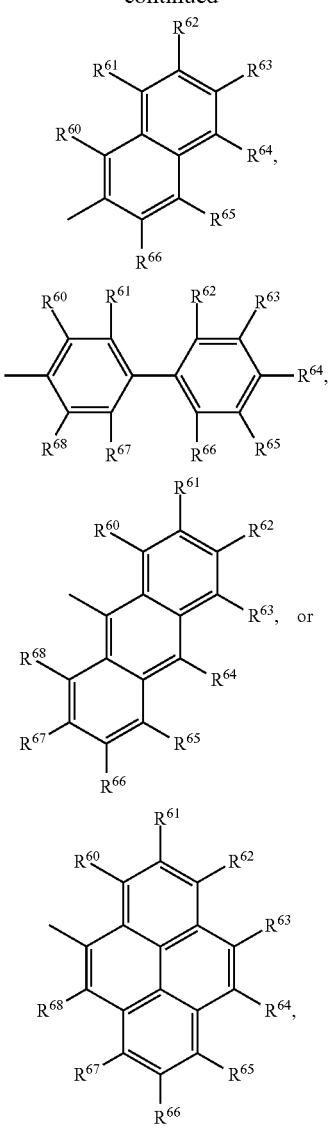
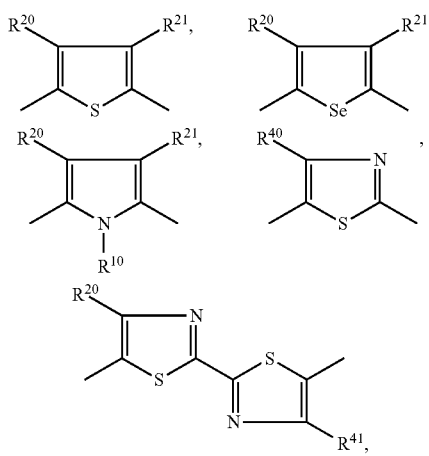
$Ar^1, Ar^2, Ar^3, Ar^4, Ar^5, Ar^6$ and $Ar^7$ are independently of each other a bivalent group of formula
-continued
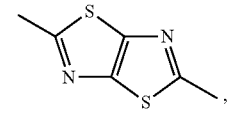
especially
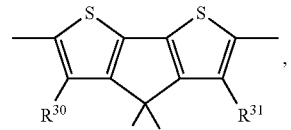
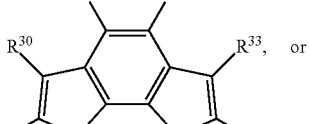
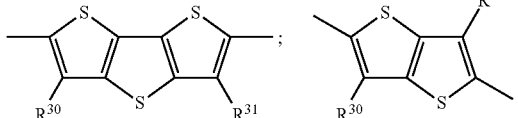
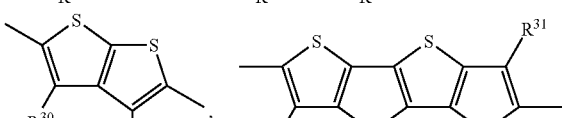
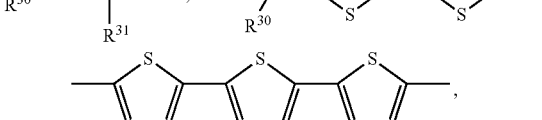
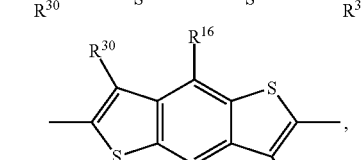
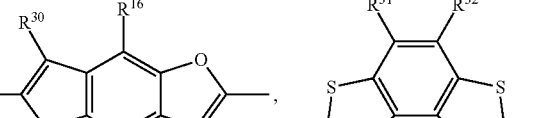
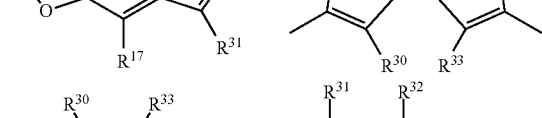
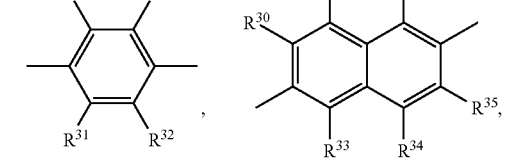

-continued

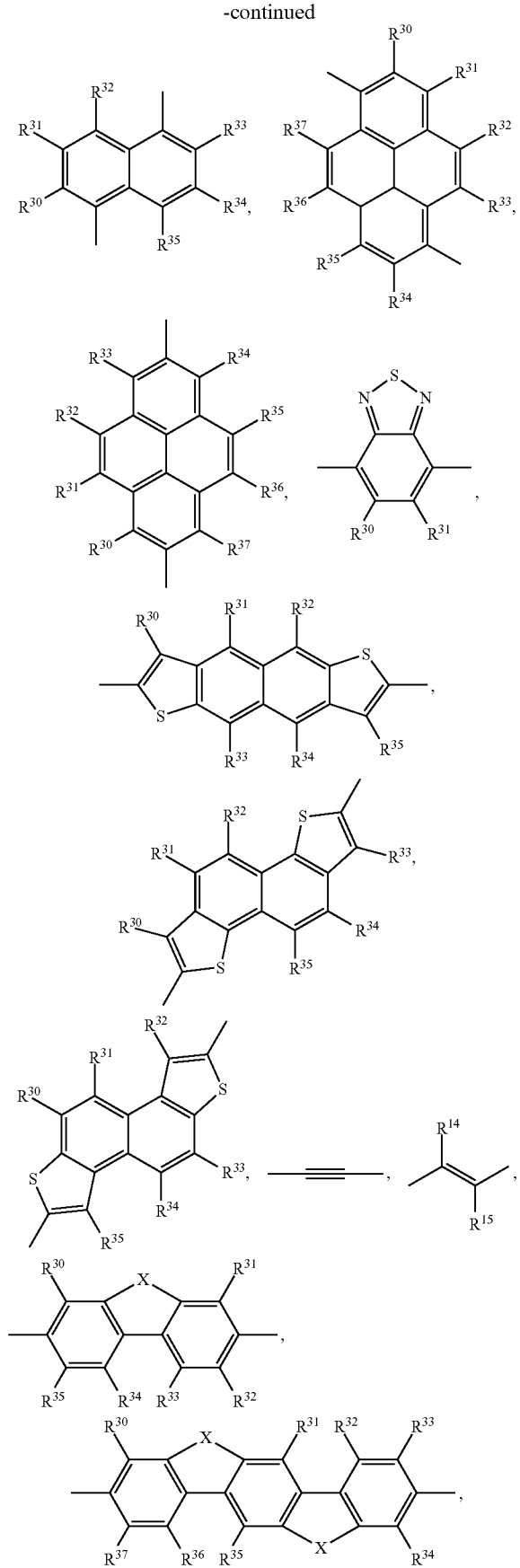

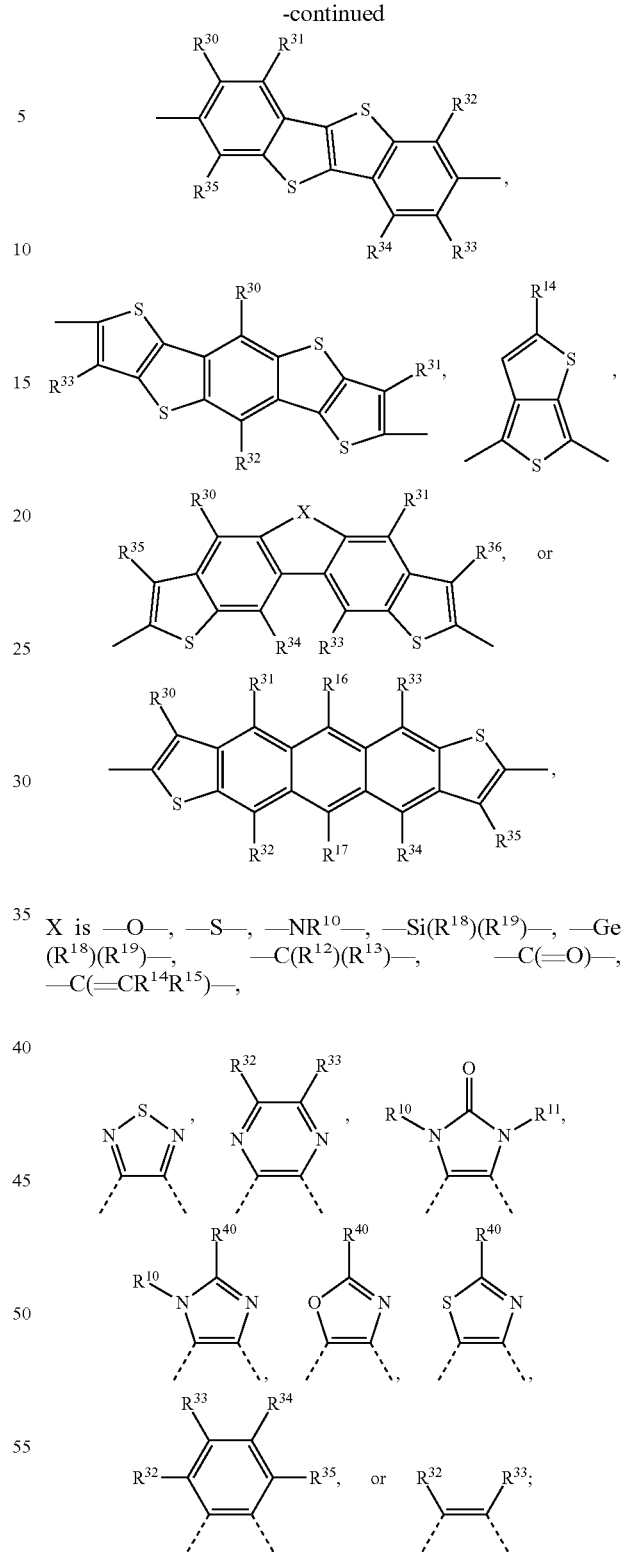

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,

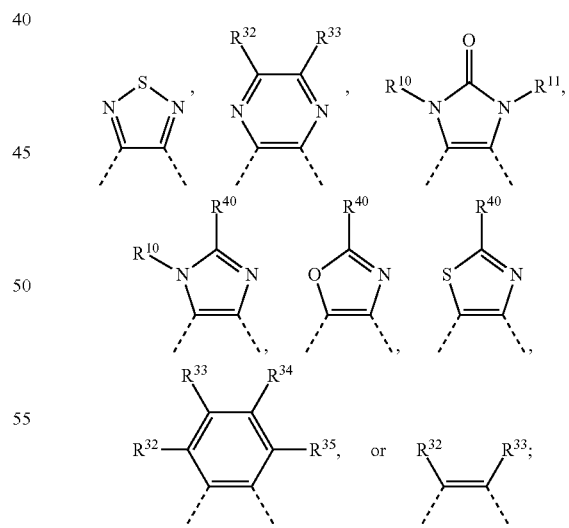

R$^{10}$ and R$^{11}$ are independently of each other hydrogen, C$_1$-C$_{18}$alkyl, C$_1$-C$_{18}$haloalkyl, C$_7$-C$_{25}$arylalkyl, C$_1$-C$_{18}$alkanoyl, R$^{12}$ and R$^{13}$ are independently of each other hydrogen, C$_1$-C$_{18}$alkyl, C$_1$-C$_{18}$haloalkyl, C$_7$-C$_{25}$arylalkyl, C$_6$-C$_{24}$aryl, C$_2$-C$_{20}$heteroaryl, or R$^{12}$ and R$^{13}$ together represent oxo,

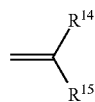

or form a five or six membered ring, which is unsubstituted or substituted by $C_1$-$C_{18}$alkyl and/or $C_1$-$C_{18}$alkoxy;

$R^{14}$ and $R^{15}$ are independently of each other hydrogen, $C_1$-$C_{18}$alkyl, $C_6$-$C_{24}$aryl, $C_2$-$C_{20}$heteroaryl, —CN or COOR$^{50}$;

$R^{16}$ and $R^{17}$ are independently of each other hydrogen, halogen, $C_1$-$C_{25}$alkyl, $C_1$-$C_{25}$alkoxy, $C_7$-$C_{25}$arylalkyl, or

$R^x$ is a $C_1$-$C_8$alkyl group, or a tri($C_1$-$C_8$alkyl)silyl group, $R^{18}$ and $R^{19}$ are independently of each other hydrogen, $C_1$-$C_{18}$alkyl, $C_7$-$C_{25}$arylalkyl, or a phenyl group, which optionally can be substituted one to three times with $C_1$-$C_8$alkyl and/or $C_1$-$C_8$alkoxy, $R^{20}$ and $R^{21}$ are independently of each other hydrogen, $C_1$-$C_{25}$alkyl, $C_2$-$C_{25}$alkenyl, $C_2$-$C_{25}$alkyl which is interrupted by one or more —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, or $R^{20}$ and $R^{21}$ together represent alkylene or alkenylene which may be both bonded via oxygen and/or sulfur to the (hetero)aromatic residue and which may both have up to 4 carbon atoms, $R^{30}$ to $R^{38}$ are independently of each other hydrogen, $C_1$-$C_{25}$alkyl, $C_2$-$C_{25}$alkenyl, $C_2$-$C_{25}$alkyl which is interrupted by one or more —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{40}$ and $R^{41}$ are independently of each other hydrogen, $C_1$-$C_{25}$alkyl, $C_2$-$C_{25}$alkenyl, $C_2$-$C_{25}$alkyl which is interrupted by one or more —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{50}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

$R^{60}$ to $R^{68}$ represent independently of each other H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, D is —CO—, —COO—, —S—, —O—, —NR$^{39}$—, or —C(=O)NR$^{39}$—, E is $C_1$-$C_8$thioalkoxy, COO—$C_1$-$C_{18}$alkyl, $C_1$-$C_8$alkoxy, CN, —NR$^{39}$R$^{39'}$, —CONR$^{39}$R$^{39'}$, or halogen, G is E, or $C_1$-$C_{18}$alkyl, and $R^{39}$ and $R^{39'}$ are independently of each other hydrogen, $C_1$-$C_{18}$alkyl, $C_1$-$C_{18}$haloalkyl, $C_7$-$C_{25}$arylalkyl, or $C_1$-$C_{18}$alkanoyl.

If the polymeric material is a diketopyrrolopyrrole (DPP) polymer it comprises at least 5 DPP repeating units of formula

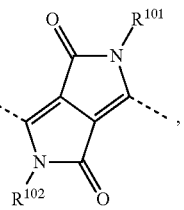

wherein each $R^{101}$ and $R^{102}$ have the meaning of $R^1$.

The quotient of the weight average molecular weight of the polymer and the molecular weight of the repeating unit of the polymer is at least 5. The quotient is usually in the range of 5 to 1000, especially 10 to 200, very especially 10 to 150.

The compositions of the present invention may provide improved charge mobility in electronic devices as well as improved stability and integrity of the organic semiconductor layer.

In addition, an oligomer may be used to extend the effective absorption breath of a polymer bulk heterojunction solar cell. Phase separation may be controlled and the device morphology may be optimized.

Preferably a is 1 or 2; b is 0, or 1; c is 0, or 1, more preferably a is 1, b is 1 and c is 1, even more preferably a is 1, b is 1 and c is 0, most preferably a is 1, b and c are 0.

Preferably k is 0, or 1; l is 1 or 2; r is 0, or 1; z is 0 or 1. Preferably k+l+r+z is an integer smaller than 4, more preferably k+l+r+z is 1 or 3.

Preferably $R^1, R^2, R^{1'}, R^{2'}, R^{1''}, R^{2''}, R^{1*}$ and $R_{2*}$ may be the same or different and are selected from hydrogen, a $C_1$-$C_{36}$alkyl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl, and/or can optionally be interrupted by —O—, —S—, —COO— or —OCO—, a $C_2$-$C_{36}$alkenyl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl, and/or can optionally be interrupted by —O—, —S—, —COO— or —OCO—, a $C_3$-$C_{36}$alkinyl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl, and/or can optionally be interrupted by —O—, —S—, —COO— or —OCO—, a $C_3$-$C_{12}$cycloalkyl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl, and/or can optionally be interrupted by —O—, —S—, —COO— or —OCO—, a $C_6$-$C_{24}$aryl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl, a $C_2$-$C_{20}$heteroaryl group which can optionally be substituted one or more times with $C_1$-$C_8$alkyl, $C_1$-$C_8$alkoxy, halogen, $C_5$-$C_{12}$cycloalkyl, cyano, $C_6$-$C_{24}$aryl, $C_2$-$C_{20}$heteroaryl and —CO—$C_1$-$C_{18}$alkyl, —CO—$C_5$-$C_{12}$cycloalkyl, —COO—$C_1$-$C_{18}$alkyl.

More preferably $R^1, R^2, R^{1'}, R^{2'}, R^{1''}, R^{2''}, R^{1*}$ and $R^{2*}$ may be the same or different and are selected from hydrogen, a $C_1$-$C_{36}$alkyl group, a $C_2$-$C_{36}$alkenyl group, a $C_3$-$C_{36}$alkinyl group which can optionally be interrupted one or more times by —O—, —S— or COO and a phenyl group which can optionally be substituted one or more times by $C_1$-$C_8$alkyl, $C_1$-$C_8$alkoxy, halogen or cyano. Even more preferably $R^1, R^2$, $R^{1'}, R^{2'}, R^{1'''}, R^{2''}, R^{1*}$ and $R^{2*}$ may be the same or different and are selected from hydrogen and a $C_1$-$C_{36}$alkyl group. Most preferred $R^1, R^2, R^{1'}, R^{2'}, R^{1'''}, R^{2''}, R^{1*}$ and $R^{2*}$ may be the same or different and are selected from a $C_9$-$C_{36}$alkyl group.

In one particularly preferred embodiment of the present invention $R^1, R^2, R^{1'}, R^{2'}, R^{1'''}, R^{2''}, R^{1*}$ and $R^{2*}$ may be the same or different and are selected from a $C_{13}$-$C_{24}$alkyl group.

Preferably $R^1$ is $R^2$, $R^{1'}$ is $R^{2'}$, $R^{1'''}$ is $R^{2''}$ and $R^{1*}$ is $R^{2*}$. Most preferably $R^1, R^2, R^{1'}, R^{2'}, R^{1'''}, R^{2''}, R^{1*}$ and $R^{2*}$ have all the same meaning.

In a preferred embodiment of the present invention $R^1, R^2, R^{1'}, R^{2'}, R^{1'''}, R^{2''}, R^{1*}$ and $R^{2*}$ are $C_{13}$-$C_{24}$alkyl, especially $C_{16}$-$C_{24}$alkyl.

Advantageously, the groups $R^{1'}$ and $R^{2'}$ can be represented by formula

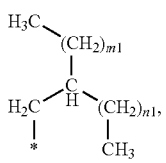

wherein $m1=n1+2$ and $m1+n1 \leq 24$. Chiral side chains, such as $R^{1'}$ and $R^{2'}$, can either be homochiral, or racemic, which can influence the morphology of the polymers.

Preferably $R^3$ is hydrogen, halogen, cyano, $C_1$-$C_{25}$ alkyl,

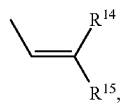

COO—$C_1$-$C_{18}$alkyl, $C_1$-$C_{18}$thioalkoxy, $C_1$-$C_{18}$alkoxy, or is $R^5$ or $R^6$;

More preferably $R^3$ is hydrogen, halogen, cyano, $C_1$-$C_{25}$ alkyl,

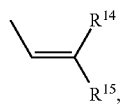

$C_1$-$C_{18}$thioalkoxy, $C_1$-$C_{18}$alkoxy, or is $R^5$ or $R^6$. Even more preferably $R^3$ is hydrogen, cyano, $C_1$-$C_{25}$alkyl, $C_1$-$C_{18}$alkoxy, or is $R^5$, or $R^6$. Most preferably $R^3$ is hydrogen.

$R^5$ is preferably a group of formula

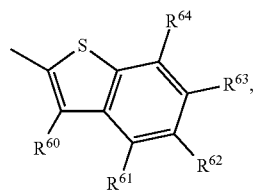

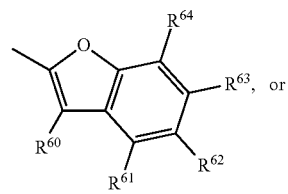

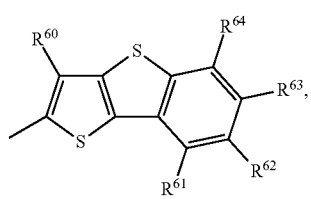

more preferably a group of formula

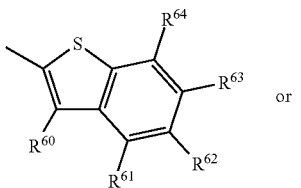

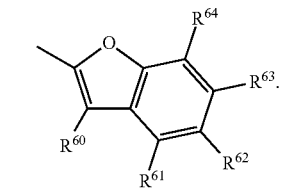

$R^6$ is preferably a group of formula

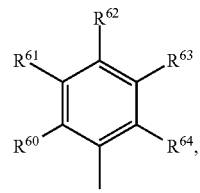

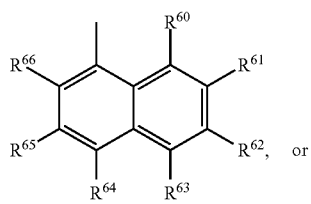

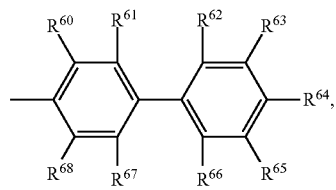

more preferably a group of formula

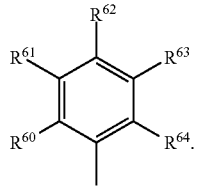

Compounds of formula I are preferred, wherein the (hetero)aryl groups Ar¹ and Ar¹ to Ar⁷, which are directly linked to the diketopyrrolopyrrole basic structure, are different from a six-membered ring.

Preferably Ar¹, Ar² and Ar³ are independently of each other a bivalent group of formula

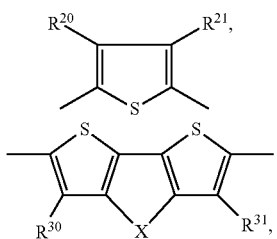

especially

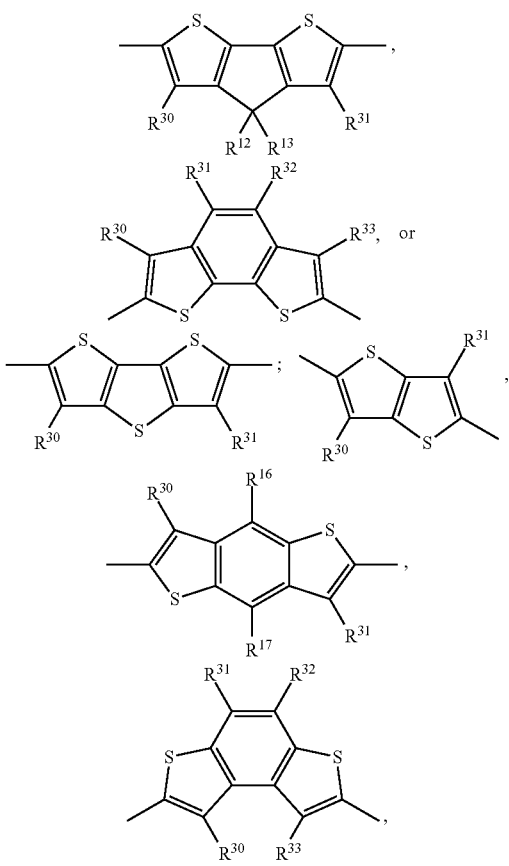

-continued

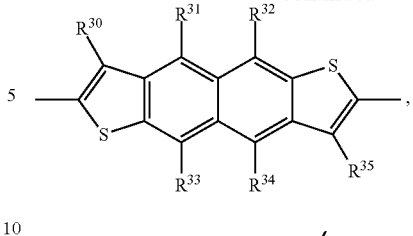

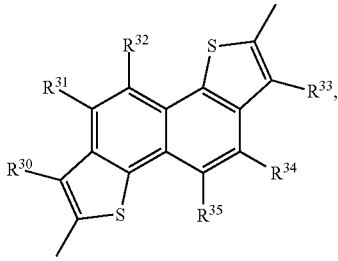

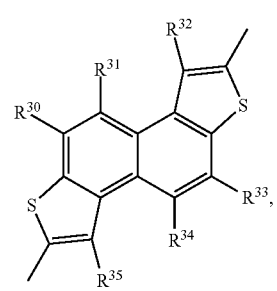

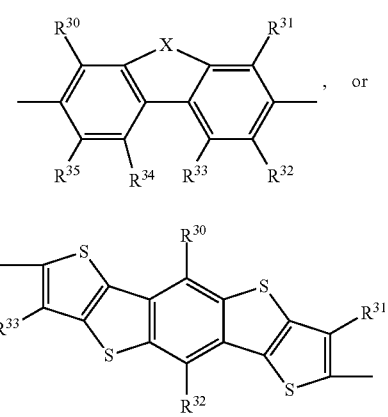

Preferably X is —S—, —C(R¹²)(R¹³)— or

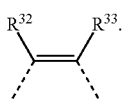

More preferably X is —C(R¹²)(R¹³)— or

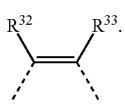

More preferably Ar¹, Ar² and Ar³ are independently of each other a bivalent group of formula la
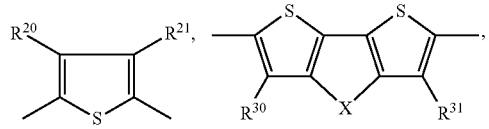
especially
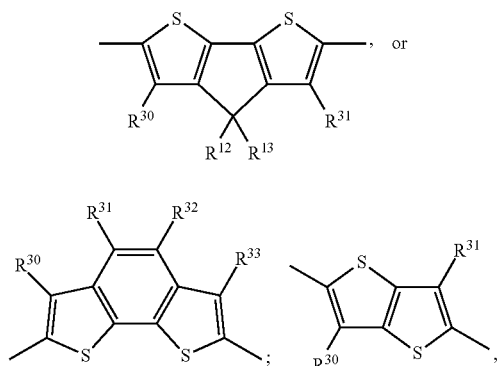
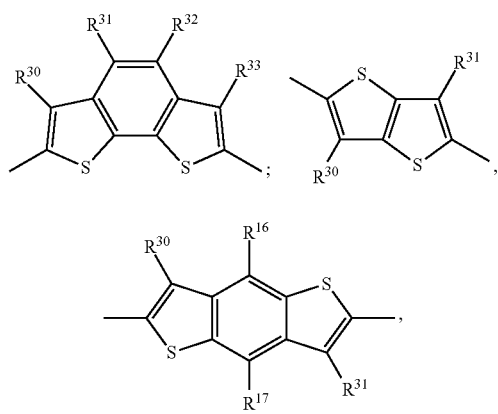
Even more preferably, Ar¹, Ar² and Ar³ are independently of each other a bivalent group of formula
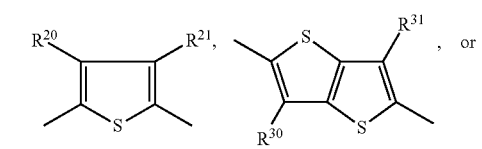
-continued
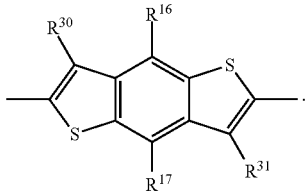
Most preferably Ar¹, Ar² and Ar³ are independently of each other a bivalent group of formula
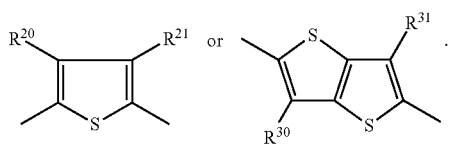
Ar⁴, Ar⁵, Ar⁶ and Ar⁷ are preferably independently of each other a bivalent group of formula
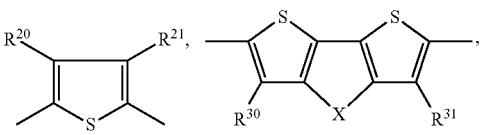
especially
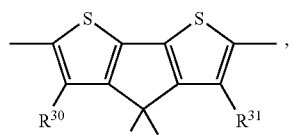
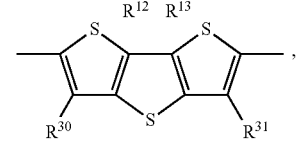
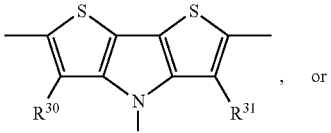
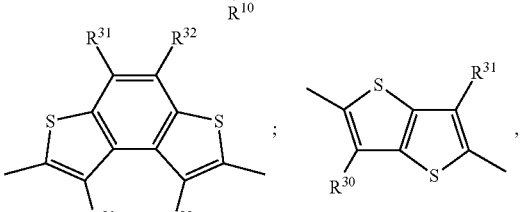
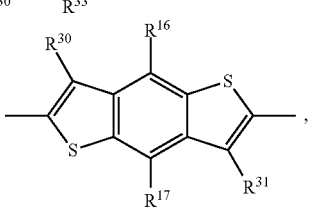

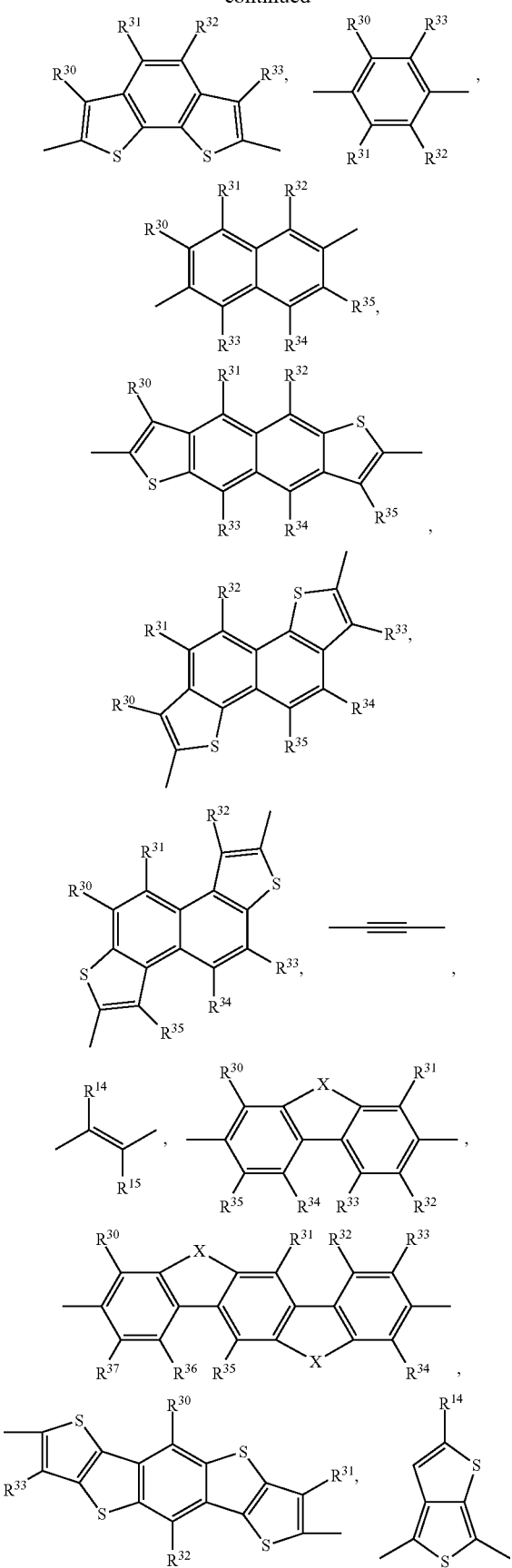
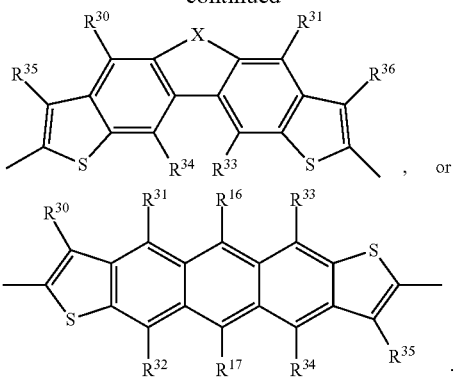
More preferably $Ar^4$, $Ar^5$, $Ar^6$ and $Ar^7$ are independently of each other a bivalent group of formula
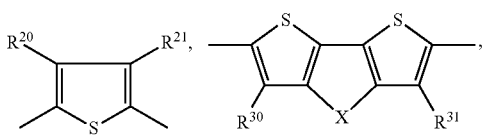
especially
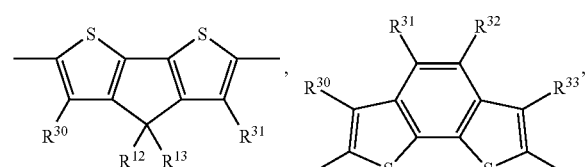
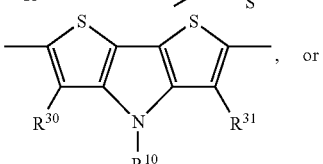
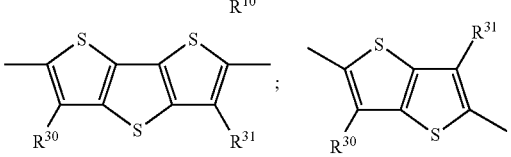
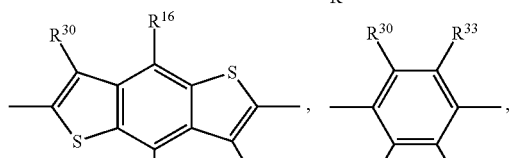
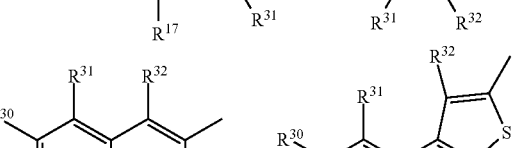
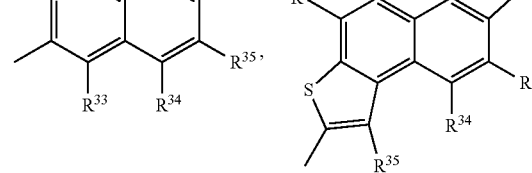

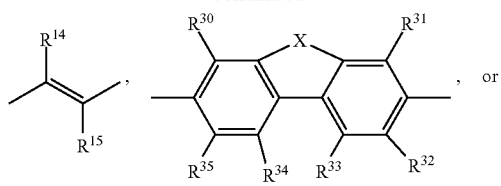, 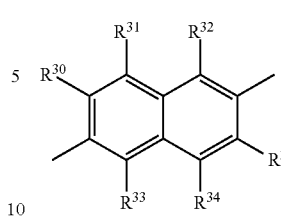, or 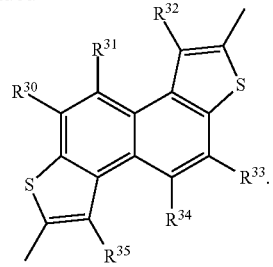
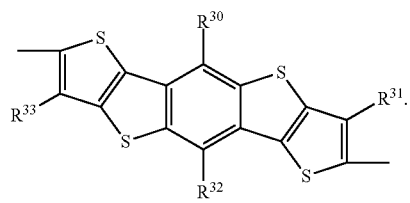
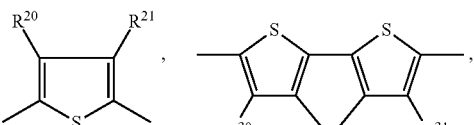
Most preferably Ar⁴, Ar⁵, Ar⁶ and Ar⁷ are independently of each other a bivalent group of formula
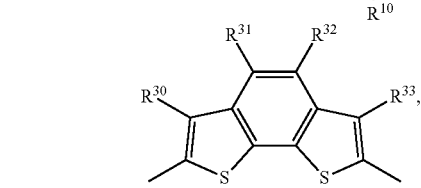
Even more preferably Ar⁴, Ar⁵, Ar⁶ and Ar⁷ are independently of each other a bivalent group of formula
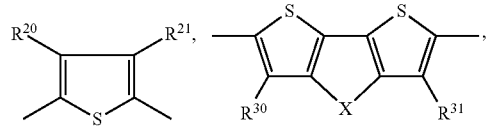
especially
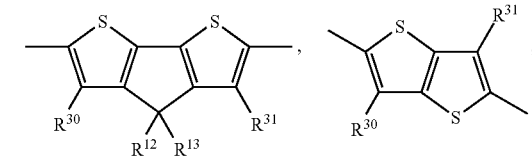
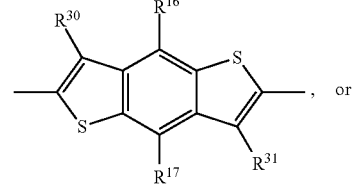
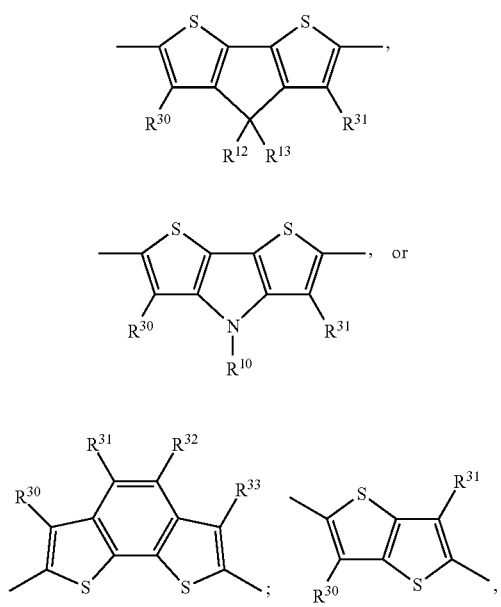
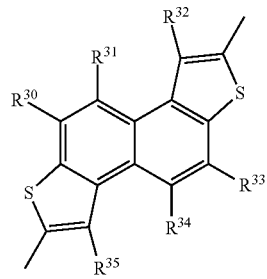
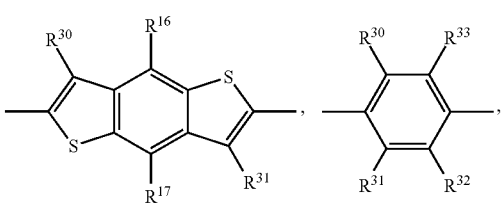
X is preferably —O—, —S—, —NR¹⁰—, —Si(R¹⁸)(R¹⁹)—, —Ge(R¹⁸)(R¹⁹)—, —C(R¹²)(R¹³)—,
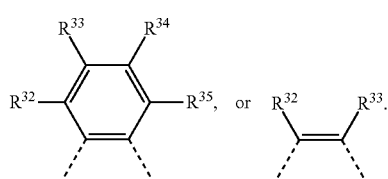

More preferably X is —S—, —NR$^{10}$—, —Si(R$^{18}$)(R$^{19}$)—, —C(R$^{12}$)(R$^{13}$)— or

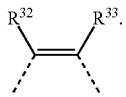

Most preferably X is —NR$^{10}$—, —C(R$^{12}$)(R$^{13}$)— or

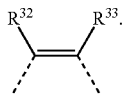

Preferably R$^{10}$ and R$^{11}$ are independently of each other C$_1$-C$_{18}$alkyl, or C$_1$-C$_{18}$alkanoyl. Most preferably R$^{10}$ and R$^{11}$ are independently of each other C$_1$-C$_{18}$alkyl.

Preferably R$^{12}$ and R$^{13}$ are independently of each other hydrogen, C$_1$-C$_{18}$alkyl, or R$^{12}$ and R$^{13}$ together represent

More preferably R$^{12}$ and R$^{13}$ are independently of each other hydrogen, or C$_1$-C$_{18}$alkyl. Most preferably R$^{12}$ and R$^{13}$ are independently of each other C$_1$-C$_{18}$alkyl.

Preferably R$^{14}$ and R$^{15}$ are independently of each other hydrogen, C$_1$-C$_{18}$alkyl, C$_6$-C$_{24}$aryl, C$_2$-C$_{20}$heteroaryl, —CN. or COOR$^{50}$. More preferably R$^{14}$ and R$^{15}$ are independently of each other hydrogen, C$_1$-C$_{18}$alkyl, —CN or COOR$^{50}$. Most preferably R$^{14}$ and R$^{15}$ are independently of each other hydrogen, —CN or COOR$^{50}$; especially —CN.

Preferably R$^{16}$ and R$^{17}$ are independently of each other hydrogen, C$_1$-C$_{25}$alkyl, C$_1$-C$_{25}$alkoxy or

Rx is a C$_1$-C$_8$alkyl group, or a tri(C$_1$-C$_8$alkyl)silyl group. More preferably R$^{16}$ and R$^{17}$ are independently of each other C$_1$-C$_{25}$alkyl or

wherein R$^x$ is a tri(C$_1$-C$_8$alkyl)silyl group. Most preferably R$^{16}$ and R$^{17}$ are independently of each other

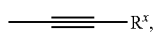

wherein R$^x$ is a tri(C$_1$-C$_8$alkyl)silyl group,

Preferably R$^{18}$ and R$^{19}$ are independently of each other C$_1$-C$_{18}$alkyl, a phenyl group, which optionally can be substituted one to three times with C$_1$-C$_8$alkyl and/or C$_1$-C$_8$alkoxy. Most preferably R$^{18}$ and R$^{19}$ are independently of each other C$_1$-C$_{18}$alkyl.

Preferably R$^{20}$ and R$^{21}$ are independently of each other hydrogen, C$_1$-C$_{25}$alkyl, C$_2$-C$_{25}$alkyl which is interrupted by one or more —O— or —S—, COOR$^{50}$, cyano, C$_1$-C$_{18}$alkoxy, fluoro or R$^{20}$ and R$^{21}$ together represent alkylene or alkenylene which may be both bonded via oxygen and/or sulfur to the (hetero)aromatic residue and which may both have up to 4 carbon atoms. More preferably R$^{20}$ and R$^{21}$ are independently of each other hydrogen, C$_1$-C$_{25}$alkyl, or cyano. Even more preferably R$^{20}$ and R$^{21}$ are independently of each other hydrogen, or C$_1$-C$_{25}$alkyl. Most preferably R$^{20}$ and R$^{21}$ are hydrogen.

Preferably R$^{30}$ to R$^{38}$ are independently of each other hydrogen, C$_1$-C$_{25}$alkyl, C$_2$-C$_{25}$alkyl which is interrupted by one or more —O— or —S—, COOR$^{50}$, cyano, C$_1$-C$_{18}$alkoxy, or fluoro. More preferably R$^{30}$ to R$^{38}$ are independently of each other hydrogen, C$_1$-C$_{25}$alkyl, or C$_1$-C$_{18}$alkoxy. Most preferably R$^{30}$ to R$^{38}$ are independently of each other hydrogen, or C$_1$-C$_{25}$alkyl; especially hydrogen.

Preferably R$^{40}$ and R$^{41}$ are independently of each other hydrogen, C$_1$-C$_{25}$alkyl, or cyano. More preferably R$^{40}$ and R$^{41}$ are independently of each other hydrogen, or C$_1$-C$_{25}$alkyl. Most preferably R$^{40}$ and R$^{41}$ are independently of each other C$_1$-C$_{25}$alkyl, Preferably R$^{50}$ is C$_1$-C$_{25}$alkyl, C$_6$-C$_{24}$aryl or C$_2$-C$_{20}$heteroaryl. Most preferably R$^{50}$ is C$_1$-C$_{25}$alkyl, Preferably R$^{60}$ to R$^{68}$ represent independently of each other H, fluoro, cyano, C$_1$-C$_{25}$alkyl, or C$_1$-C$_{25}$alkyl which is substituted by E and/or interrupted by D, C$_1$-C$_{18}$alkoxy. More preferably R$^{60}$ to R$^{68}$ represent independently of each other H, fluoro, cyano, C$_1$-C$_{25}$alkyl, or C$_1$-C$_{25}$haloalkyl. Even more preferably R$^{60}$ to R$^{68}$ represent independently of each other H, cyano, or C$_1$-C$_{25}$alkyl. Most preferably R$^{60}$ to R$^{68}$ represent hydrogen.

In an embodiment of the present invention, compounds of formula I are preferred, wherein R$^3$, R$^{20}$, R$^{21}$, R$^{30}$ to R$^{38}$ and R$^{60}$ to R$^{68}$ are hydrogen.

Preferably D is —COO—, —S—, —O— or —C(=O)NR$^{39-}$. More preferably D is —S—, or —O—. Most preferably D is —O—. Preferably E is C$_1$-C$_8$thioalkoxy, COO—C$_1$-C$_{18}$alkyl, C$_1$-C$_8$alkoxy, CN or fluoro. More preferably E is C$_1$-C$_8$alkoxy, CN, or fluoro. Even more preferably E is C$_1$-C$_8$alkoxy, or fluoro. Most preferably E is C$_1$-C$_8$alkoxy. G is E, or C$_1$-C$_{18}$alkyl.

Preferably R$^{39}$ and R$^{39'}$ are independently of each other C$_1$-C$_{18}$alkyl, C$_1$-C$_{18}$haloalkyl, or C$_1$-C$_{18}$alkanoyl. More preferably R$^{39}$ and R$^{39'}$ are independently of each other C$_1$-C$_{18}$alkyl, or C$_1$-C$_{18}$haloalkyl. Most preferably R$^{39}$ and R$^{39'}$ are independently of each other C$_1$-C$_{18}$alkyl.

Examples of compounds of the formula I are compounds A-1 to A-27 and B-1. Reference is made to claim 9.

The polymeric material b) is preferably selected from non-conductive or semiconductive material, more preferably semiconductive material, such as, for example,

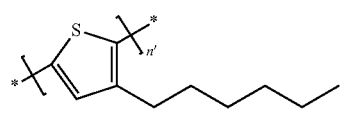

(n' is usually in the range of 10 to 1000, especially 10 to 200; very especially 10 to 150) and polymers containing diketopyrrolopyrrole (DPP) repeating units, which are, for example, described in U.S. Pat. No. 6,451,459, WO2005/049695, WO2008/000664, WO2009/047104, WO2010/049321, WO2010/049323, WO2010/108873, WO2010/115767, WO2010/136353, WO2011/144566, European patent application no. 11192316.5, EP2033983 and EP2034537. The polymeric material is preferably p-type semiconductive.

In a preferred embodiment of the present invention the polymeric material is a polymer comprising diketopyrrolopyrrole (DPP) repeating units, especially a polymer represented by formula:

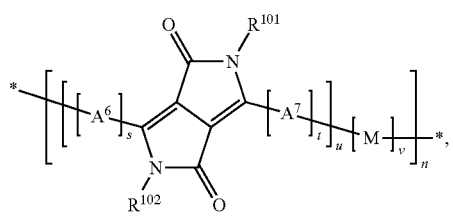

(VII)

wherein each $R^{101}$ and $R^{102}$ have the meaning of $R^1$; each $A^6$ and $A^7$ is independently selected from optionally substituted aryl and heteroaryl groups; each M is an optional, conjugated moiety; s represents a number from 1 to 4; t represents a number from 1 to 4; u represents a number that is at least 1, especially 1; v represents a number from 0 to 20, especially 1 to 5; and n represents a number that is at least 5. $A^6$, $A^7$ and M may independently of each other have the meaning of $Ar^1$. The same preferences apply for $A^6$, $A^7$ and M as for $Ar^1$.

In said embodiment polymers of the formula

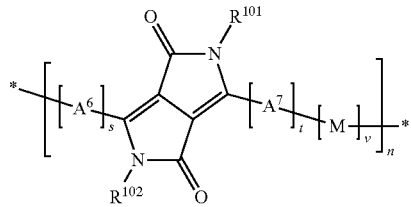

are preferred, wherein v is an integer of 1 to 5, especially 1; t is an integer of 1 to 3, especially 1;

s is an integer of 1 to 3, especially 1; the sum of v, t and s is equal, or smaller than 7, $A^6$, $A^7$ and M are independently of each other a group of formula

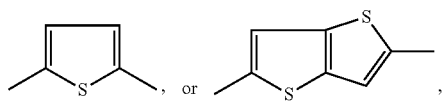

and $R^{101}$ and $R^{102}$ are the same and are a $C_1$-$C_{36}$alkyl group. n is usually in the range of 5 to 1000, especially 10 to 200, very especially 10 to 150.

The oligomers of formula (I) comprise 2, 3, or 4 diketopyrrolopyrrole (DPP) units:

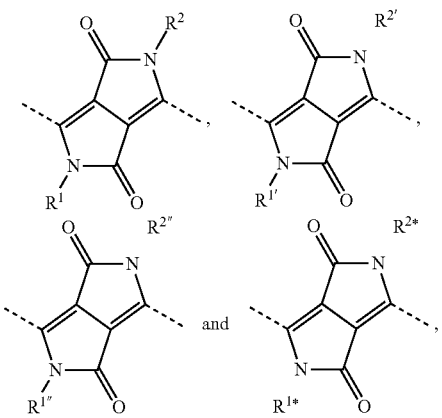

respectively.

$R^1$, $R^{1'}$, $R^{1''}$, and $R^{1*}$ may be the same or different. $R^2$, $R^{2'}$, $R^{2''}$, or $R^{2*}$ may be the same or different.

If the polymeric material is a DPP polymer it comprises at least 5, especially at least 10 DPP repeating units of formula

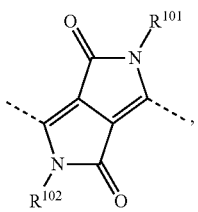

wherein each $R^{101}$ and $R^{102}$ have the meaning of $R^1$.

The quotient of the weight average molecular weight of the DPP polymer and the molecular weight of the repeating unit of the polymer is at least 5. The quotient is usually in the range of 5 to 1000, especially 10 to 200, very especially 10 to 150.

Examples of preferred polymers are shown below:

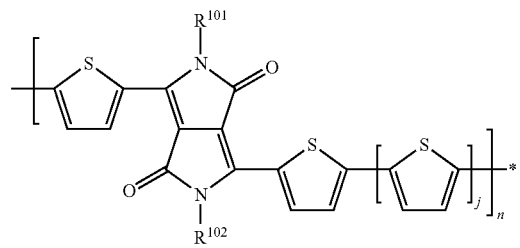

(j is an integer from 0 to 3, especially 1, or 2, very especially 1);

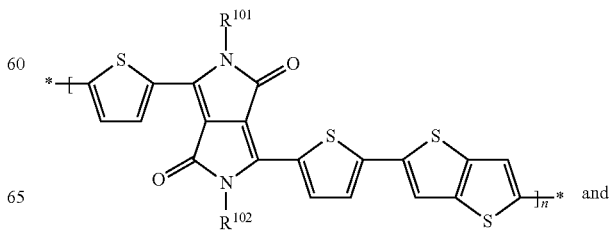

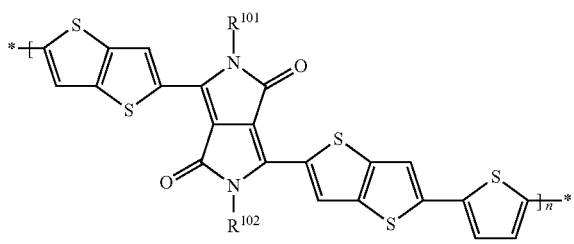

(n is usually in the range of 5 to 1000, especially 10 to 200, very especially 10 to 150 and $R^{101}$ and $R^{102}$ are a $C_1$-$C_{38}$alkyl group).

In a preferred embodiment of the present invention the composition comprises a compound of the formula

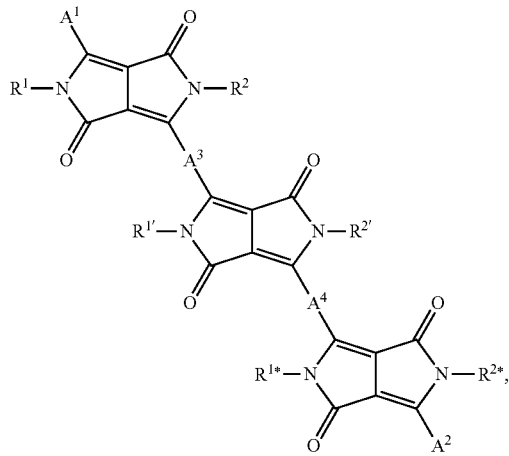

(IIIa)

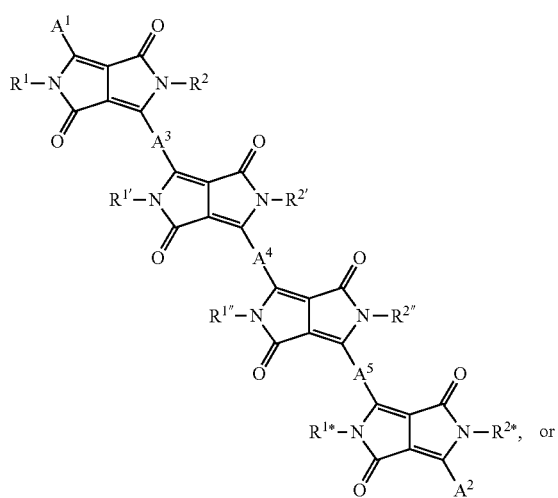

(IIb)

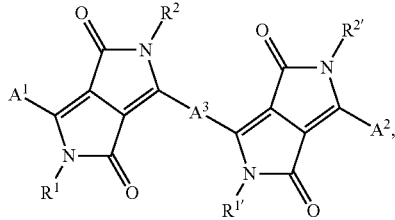

(III)

wherein $A^1$, $A^2$, $A^3$, $A^4$, $A^5$, $R^1$, $R^2$, $R^{1'}$, $R^{2'}$, $R^{1''}$, $R^{2''}$, $R^{1*}$ and $R^{2*}$ are as defined above.

The weight % (w %$_{Olig}$) of one, or a mixture of more than one oligomer of formula (I) in the composition of the present invention is 0.1% to 99.9%. The weight % (W %$_{Pol}$) of one, or a mixture of more than one polymers in the composition of the present invention is 0.1% to 99.9%. The sum of w %$_{Olig}$ and w %$_{Pol}$ adds up to 100.

Examples of compositions according to the present invention are mixtures of compounds A-1, A-2, A-3, or A-4 with the polymer described in Example 1 of WO2010/049321:

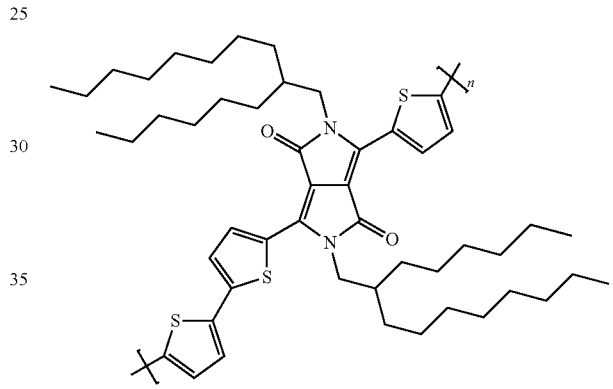

(Mw=39,500, Polydispersity=2.2 (measured by HT-GPC)).

In addition, the present invention is also directed to a formulation, comprising
(a) a compound of formula I as defined above,
(b) a polymeric material as defined above, and
(c) a solvent, or solvent mixture.

The formulation can be used for the production of the organic layer, especially an organic semiconducting (OSC) layer. The OSC layer can be used in an organic semiconductor device.

The formulation and the OSC layer according to the present invention may be prepared by a process which comprises:
(i) first mixing the compound(s) of formula I and the polymeric material(s). Preferably the mixing comprises mixing the components together in a solvent or solvent mixture,
(ii) applying the solvent(s) containing the compound(s) of formula I and the polymeric material(s) to a substrate; and optionally evaporating the solvent(s) to form a solid OSC layer according to the present invention, and
(iii) optionally removing the solid OSC layer from the substrate or the substrate from the solid layer.

In step (i) the solvent may be a single solvent, or the compound(s) of formula I and polymeric materials(s) may each be dissolved in a separate solvent followed by mixing the two resultant solutions.

The polymeric materials(s) may be dissolved together with the compound(s) of formula I in a suitable solvent, and the solution deposited for example by dipping, spraying, painting or printing it on a substrate to form a liquid layer and then removing the solvent to leave a solid layer. It will be appreciated that solvents are chosen which are able to dissolve both the compound(s) of formula I and polymeric materials(s), and which upon evaporation from the solution blend give a coherent defect free layer.

Examples of suitable and preferred organic solvents include, without limitation, dichloromethane, trichloromethane, monochlorobenzene, o-dichlorobenzene, 1,2,4-trichlorbenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane, mesitylene, 1-methyl-naphthalene and/or mixtures thereof.

It is desirable to generate small structures in modern microelectronics to reduce cost (more devices/unit area), and power consumption. Patterning of the layer of the invention may be carried out by photolithography, electron beam lithography or laser patterning.

Liquid coating of organic electronic devices such as field effect transistors is more desirable than vacuum deposition techniques. The formulations of the present invention enable the use of a number of liquid coating techniques. The organic semiconductor layer may be incorporated into the final device structure by, for example, and without limitation, dip coating, spin coating, ink jet printing, letter-press printing, screen printing, doctor blade coating, roller printing, reverse-roller printing, offset lithography printing, flexographic printing, web printing, spray coating, slot-die coating, brush coating or pad printing.

The OSC formulation according to the present invention can additionally comprise one or more further components like for example surface-active compounds, lubricating agents, wetting agents, dispersing agents, hydrophobing agents, adhesive agents, flow improvers, defoaming agents, deaerators, diluents, reactive or non-reactive diluents, auxiliaries, colourants, dyes, pigments or nanoparticles, furthermore, especially in case crosslinkable binders are used, catalysts, sensitizers, stabilizers, inhibitors, chain-transfer agents or co-reacting monomers.

In a further preferred embodiment the present invention is directed to compounds of the formula

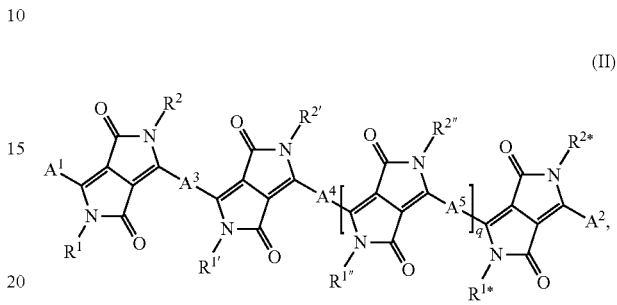

(II)

wherein q is 0, or 1, $A^1$, $A^2$, $A^3$, $A^4$, $A^5$, $R^1$, $R^2$, $R^{1'}$, $R^{2'}$, $R^{1''}$, $R^{2''}$, $R^{1*}$ and $R^{2*}$ are as defined above, with the proviso that compounds of formula

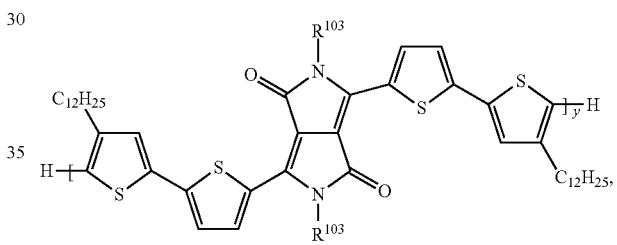

wherein $R^{103}$=2-hexyldecyl and y is 3, or 4, are excluded.

The compound of the formula II is more preferably a compound of the formula

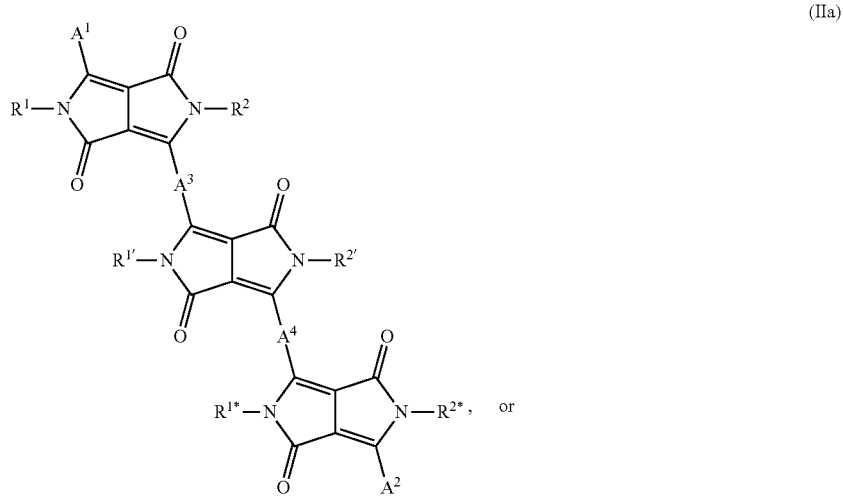

(IIa)

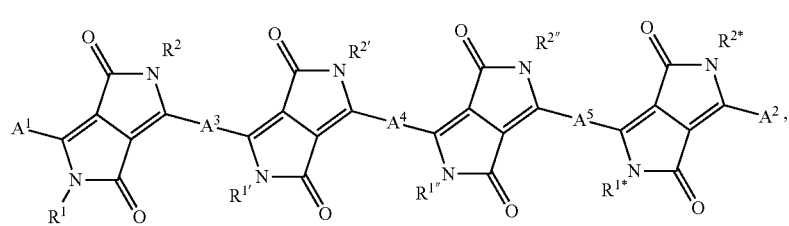
(IIb)

wherein $A^1, A^2, A^3, A^4, A^5, R^1, R^2, R^{1'}, R^{2'}, R^{1''}, R^{2''}, R^{1*}$ and $R^{2*}$ are as defined above. Compounds of the formula IIa are preferred.

The preferences for $A^1, A^2, A^3, A^4, A^5, R^1, R^2, R^{1'}, R^{2'}, R^{1''}, R^{2''}, R^{1*}$ and $R^{2*}$ are the same as specified above for the compounds of formula I.

In a further preferred embodiment the present invention is directed to compounds of the formula

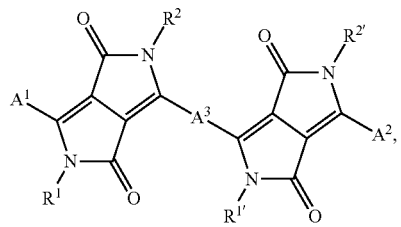
(III)

wherein
A1 and $A^2$ are independently of each other a group of formula

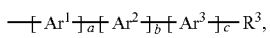

or $R^5$,
$A^3$ is a group of formula

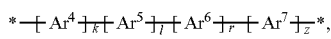

a is 1 or 2; b is 0, 1 or 2; c is 0, 1 or 2;
k is 0, 1, or 2; l is 1, 2, or 3; r is 0, or 1; z is 0, 1 or 2;
$R^1, R^2, R^{1'}, R^{2'}, R^3$ and $R^5$ are as defined above;
$Ar^1, Ar^2$ and $Ar^3$ are independently of each other a bivalent group of formula

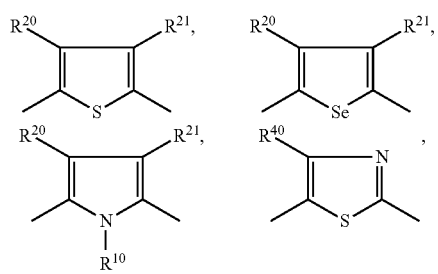

especially

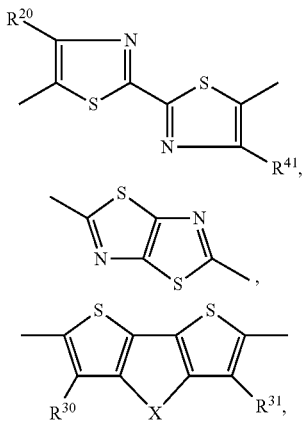

-continued

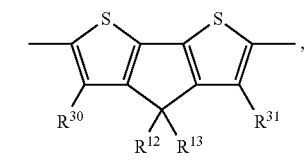

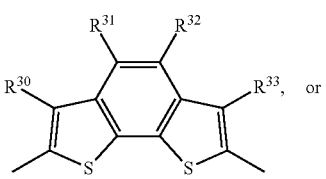

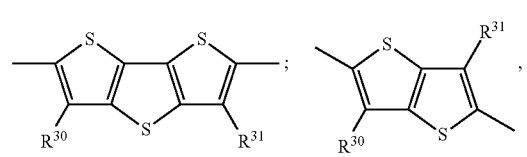

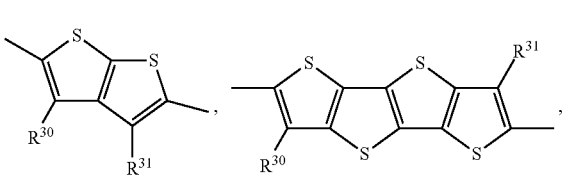

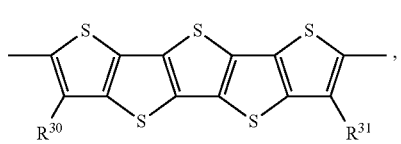

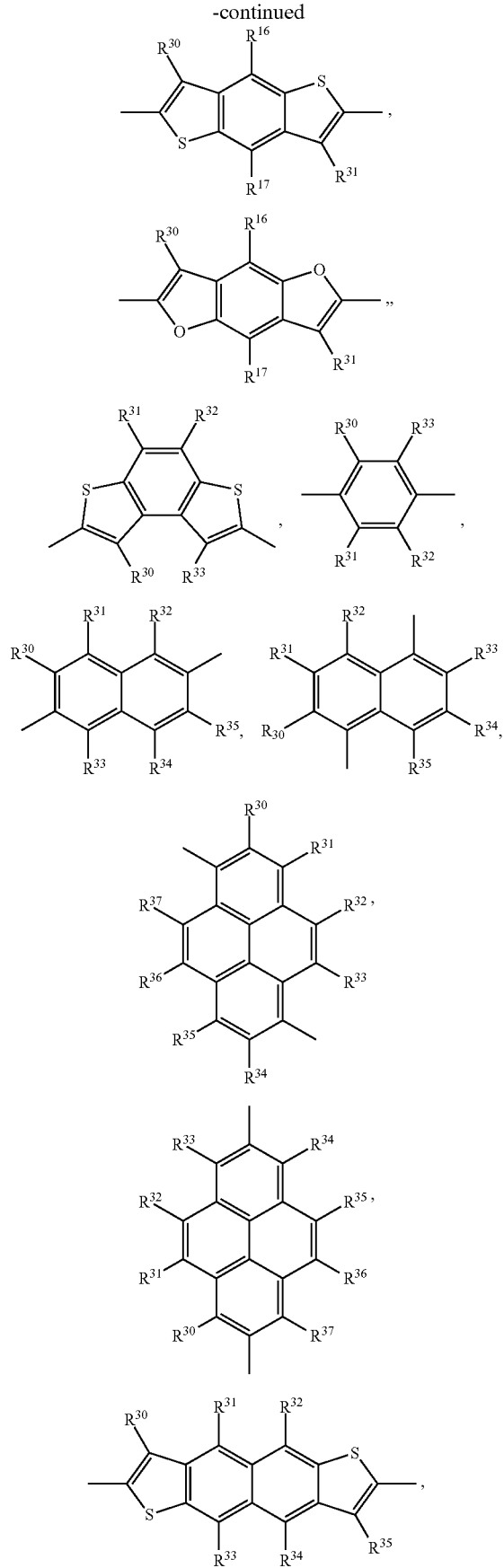
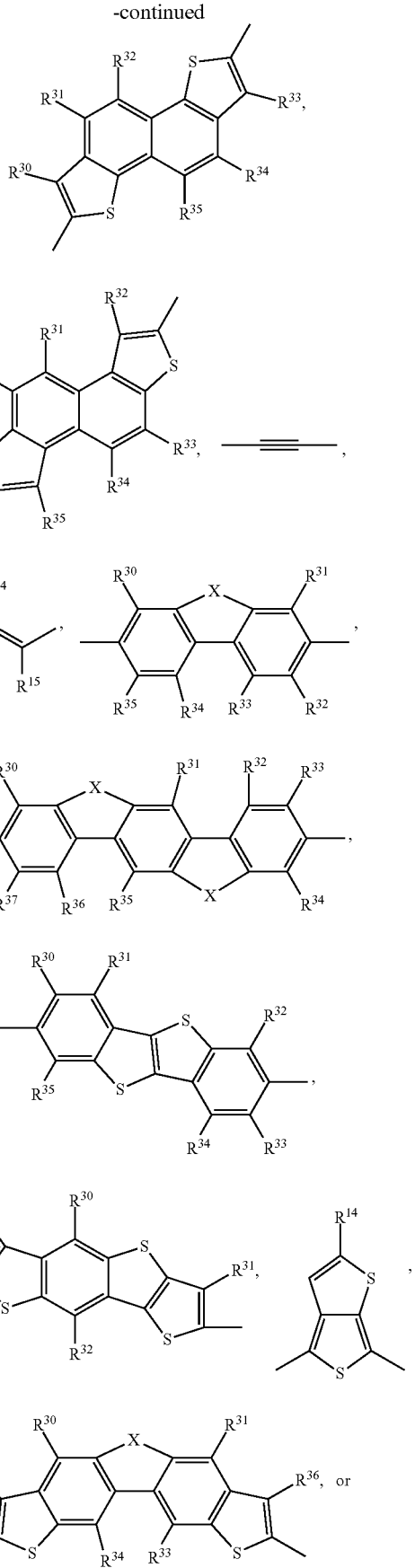

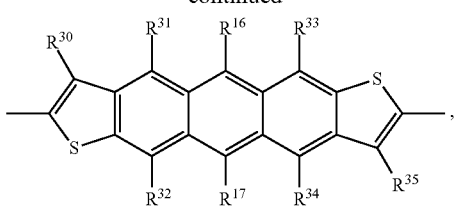
Ar⁴, Ar⁵, Ar⁶ and Ar⁷ are independently of each other a bivalent group of formula
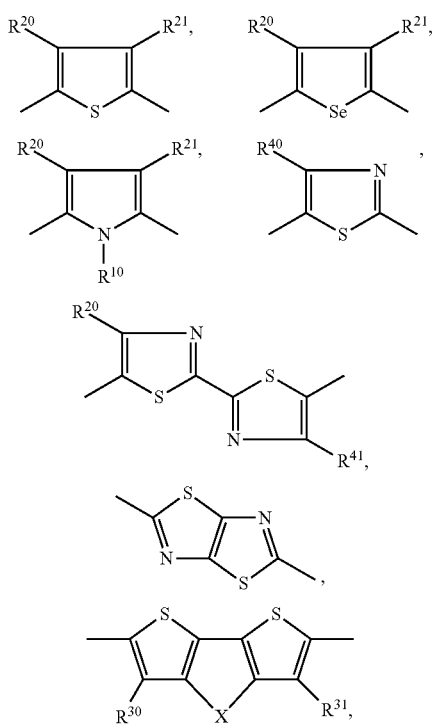
especially
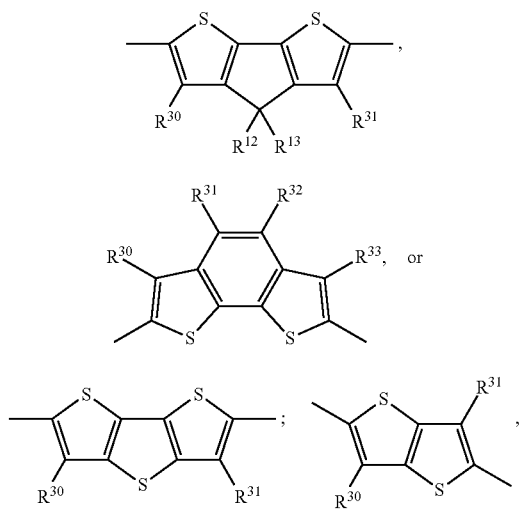
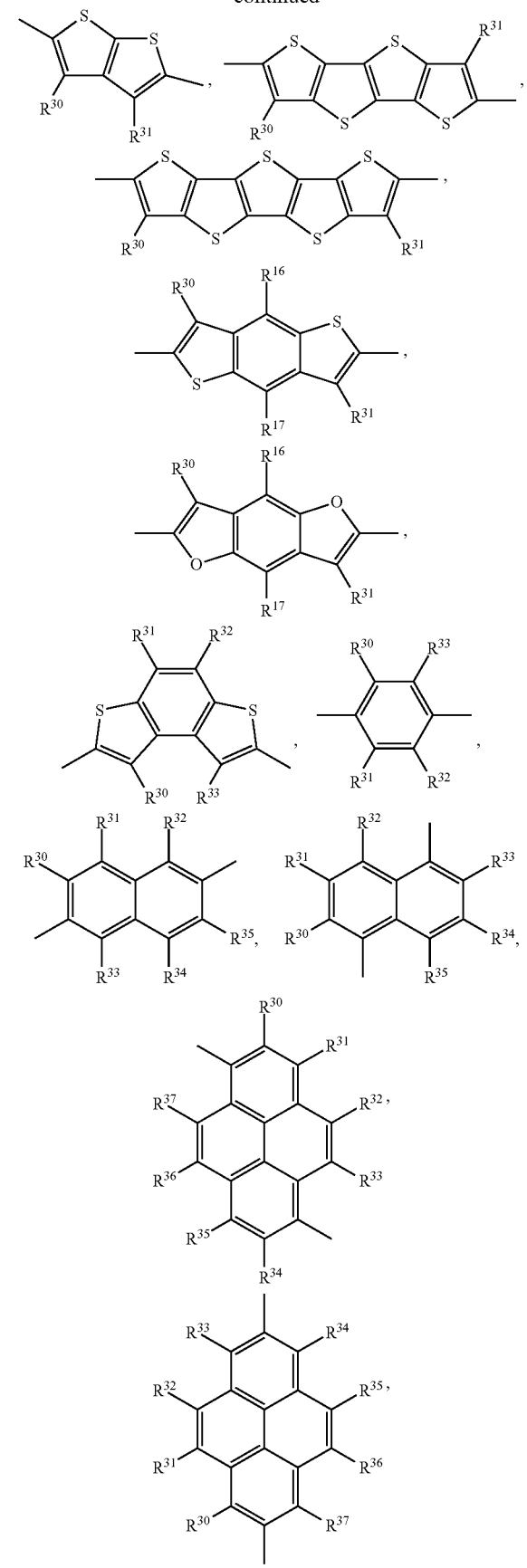

-continued
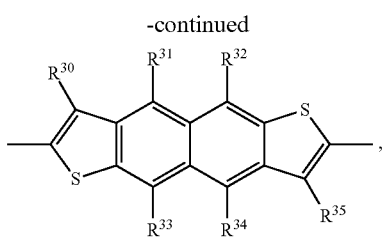
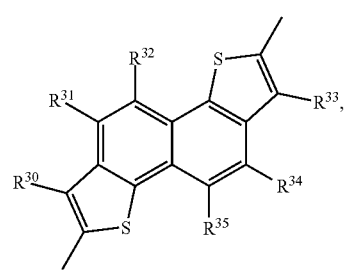
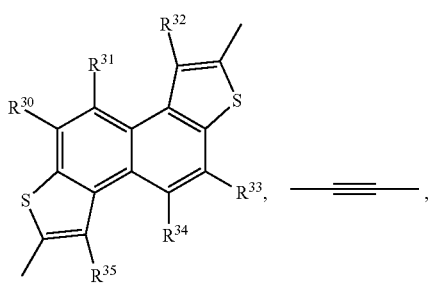
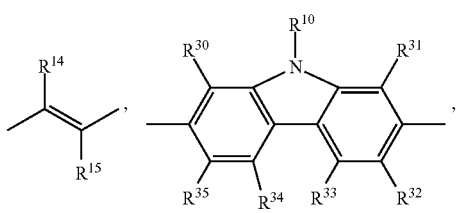
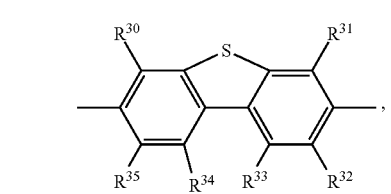
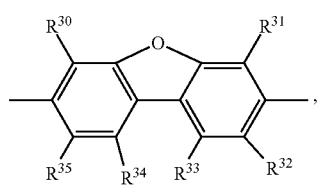
-continued
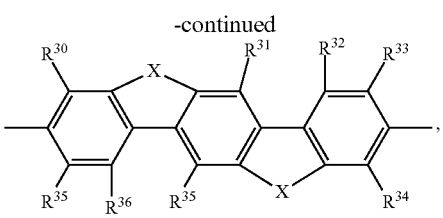
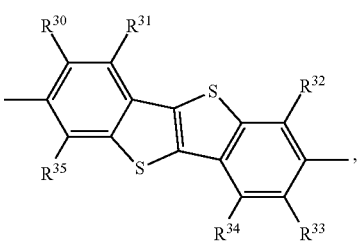
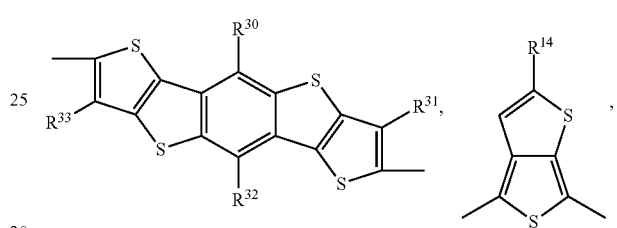
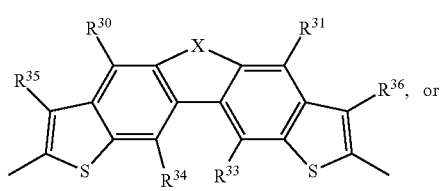
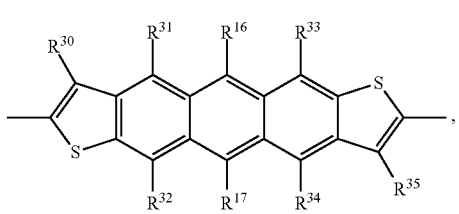
wherein X, $R^{10}$, $R^{12}$, $R^{13}$, $R^{14}$, $R^{15}$, $R_{16}$, $R_{17}$, $R^{20}$, $R^{21}$, $R^{30}$ to $R^{37}$, $R^{40}$ and $R^{41}$ are as defined for compound (I), with the proviso that $Ar^1$, $Ar^2$, $Ar^3$, or $Ar^7$ does not represent a six membered ring, which is attached directly to the diketopyrrolopyrrole moiety, and that
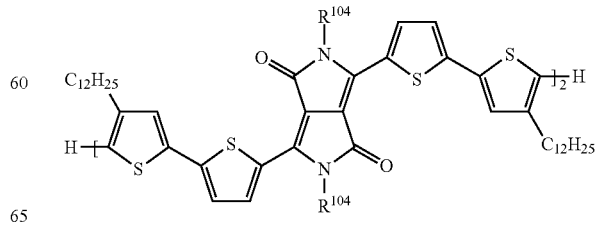
($R^{104}$ is 2-hexyldecyl), and

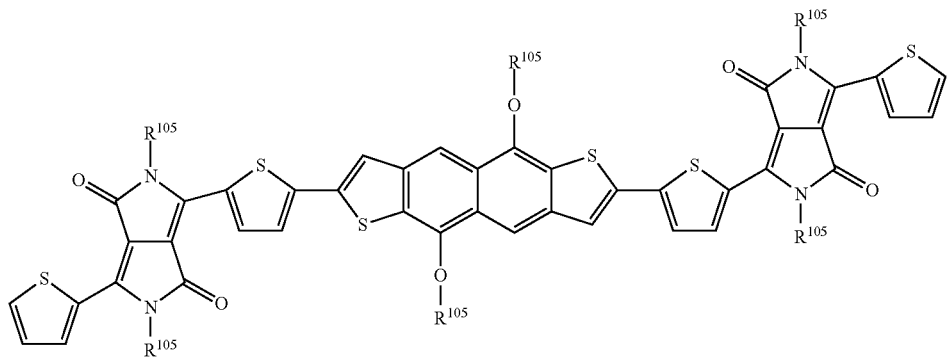

($R^{105}$ is 2-ethylhexyl) are excluded.

Compounds of formula III are preferred, wherein the (hetero)aryl groups $Ar^1$ and $Ar^4$ to $Ar^7$, which are directly linked to the diketopyrrolopyrrole basic structure, are different from a six-membered ring.

Compounds of formula III are preferred, wherein $R^3$, $R^{20}$, $R^{21}$, $R^{30}$ to $R^{38}$ and $R^{60}$ to $R^{68}$ are hydrogen.

Compounds of formula III are preferred, where $R^1$, $R^2$, $R^{1'}$, $R^{2'}$, $R^{1''}$, $R^{2''}$, $R^{1*}$ and $R^{2*}$ are $C_{13}$-$C_{24}$alkyl, especially $C_{16}$-$C_{24}$alkyl.

Preferably a is 1 or 2; b is 0, or 1; c is 0, or 1, more preferably a is 1, b is 1 and c is 1, even more preferably a is 1, b is 1 and c is 0, most preferably a is 1, b and c are 0.

Preferably k is 0, or 1; l is 1 or 2; r is 0, or 1; z is 0 or 1. Preferably k+l+r+z is an integer smaller than 4, more preferably k+l+r+z is 1 or 3.

In one preferred embodiment of the present invention at least one of $Ar^1$, $Ar^5$ or $Ar^7$ in compound (III) is different from

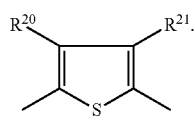

More preferably $Ar^1$ is different from

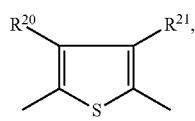

or $Ar^5$ and $Ar^7$ are different from

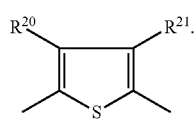

Even more preferably $Ar^5$ and $Ar^7$ are different from

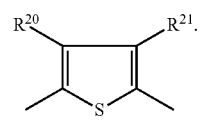

Most preferably $Ar^1$, $Ar^5$ and $Ar^7$ in compound (III) are different from

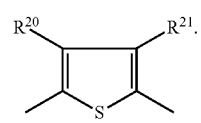

$R^{20}$ and $R^{21}$ have the meaning as described for compound (I).

The preferences for a, b, c, k, l, r, z, $R^3$, $R^5$, $R^6$, $R^1$, $R^2$, $R^{1*}$ and $R^{2*}$ are, in principal, the same as specified above for the compounds of formula I.

In a preferred embodiment the present invention is directed to compounds of formula III, wherein $R^1$, $R^2$, $R^{1*}$ and $R^{2*}$ may be the same or different and are selected from a $C_{13}$-$C_{24}$alkyl group.

Preferably $Ar^1$, $Ar^2$, $Ar^3$ are independently of each other a bivalent group of formula

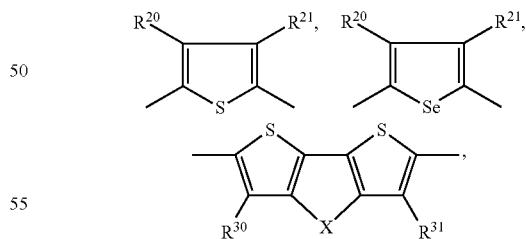

especially

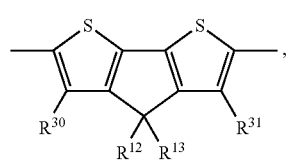

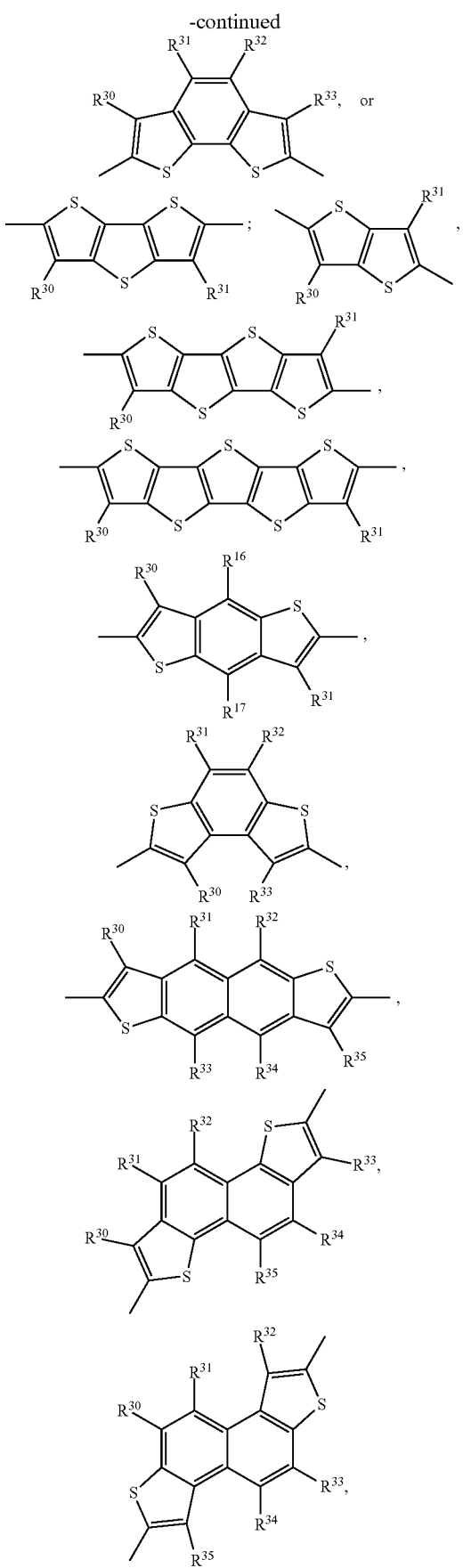
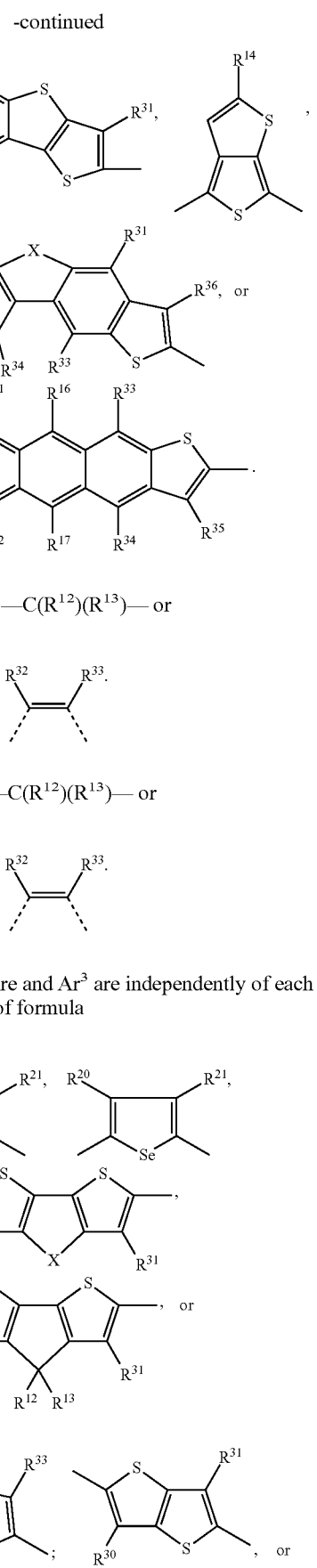
Preferably X is —S—, —C(R$^{12}$)(R$^{13}$)— or
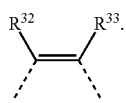
More preferably X is —C(R$^{12}$)(R$^{13}$)— or
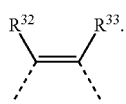
More preferably Ar$^1$, Ar$^2$ and Ar$^3$ are independently of each other a bivalent group of formula
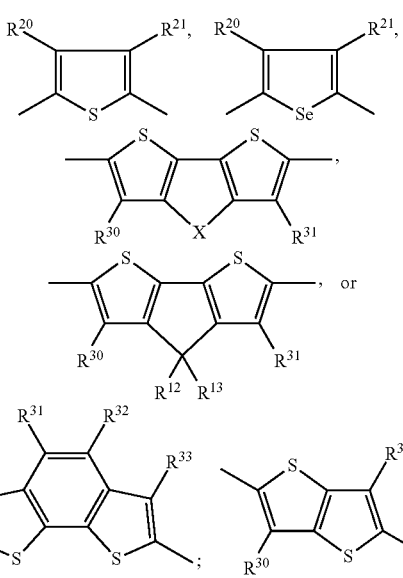

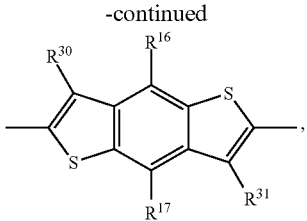
or. Most preferably Ar¹, Ar² and Ar³ are independently of each other a bivalent group of formula
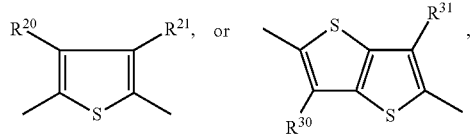
Preferably Ar⁴, Ar⁵, Ar⁶ and Ar⁷ are independently of each other a bivalent group of formula
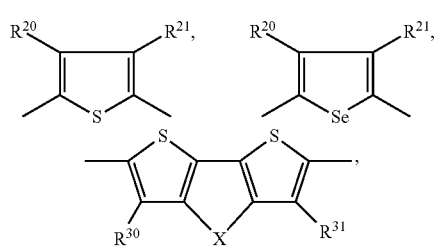
especially
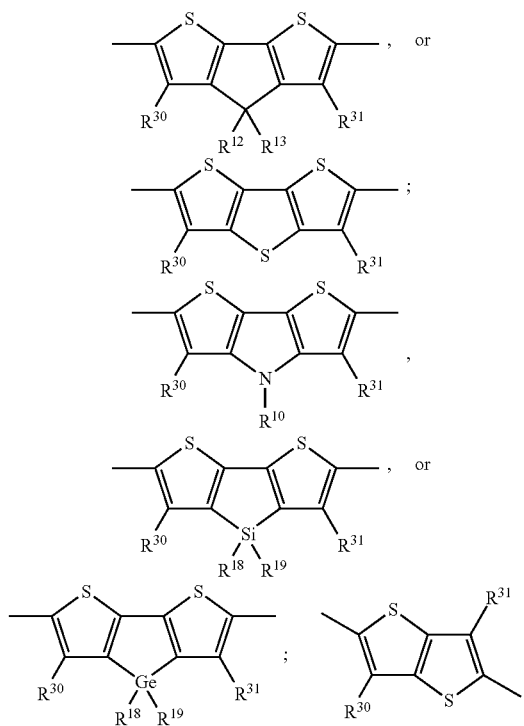
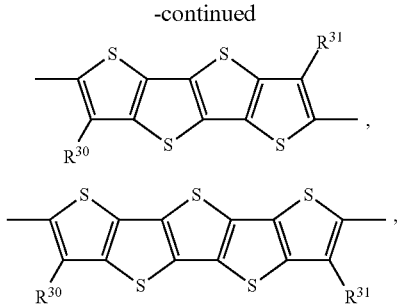
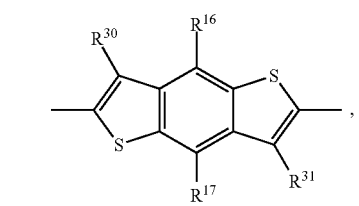
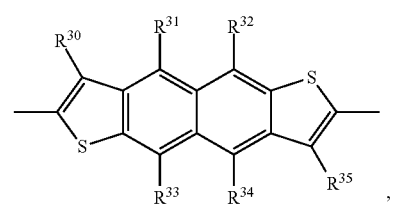
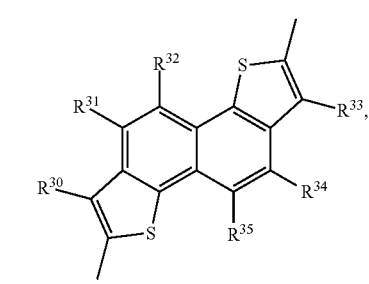
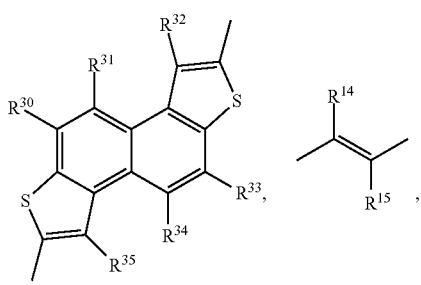
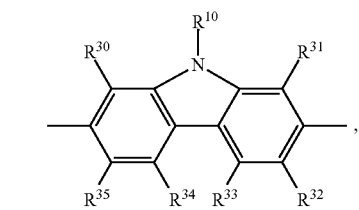
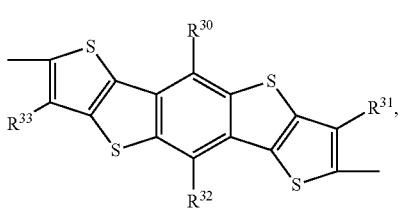

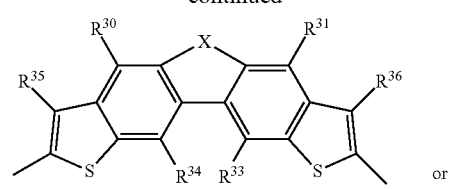
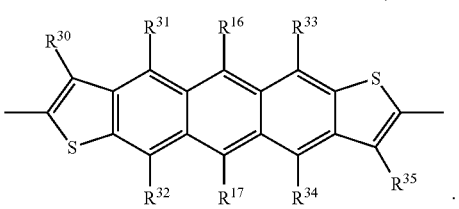 or
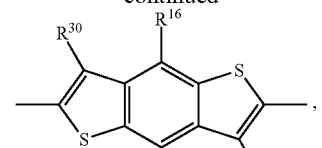,
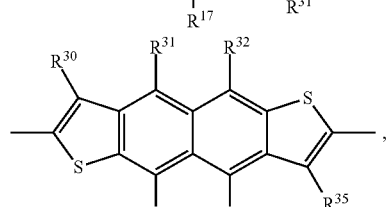,
More preferably Ar⁴, Ar⁵, Ar⁶ and Ar⁷ are independently of each other a bivalent group of formula
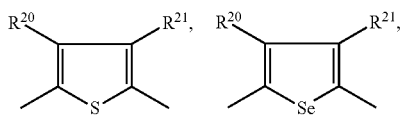
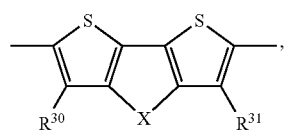,
especially
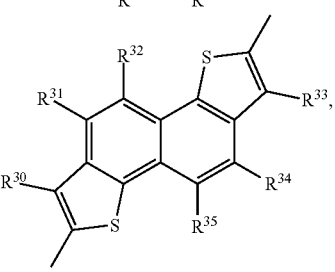,
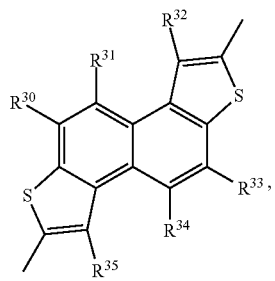,
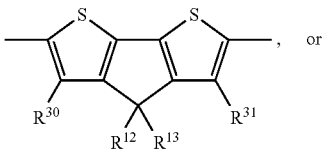 or
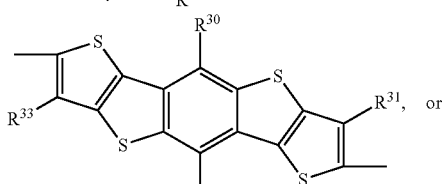, or
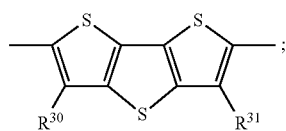;
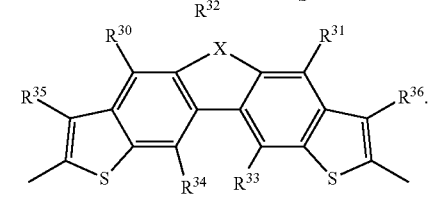.
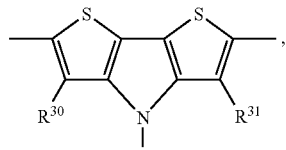, or
Even more preferably Ar⁴, Ar⁵, Ar⁶ and Ar⁷ are independently of each other a bivalent group of formula
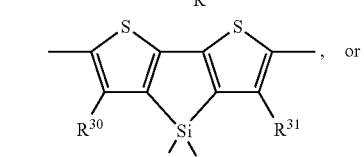
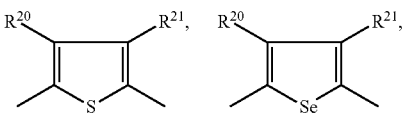,
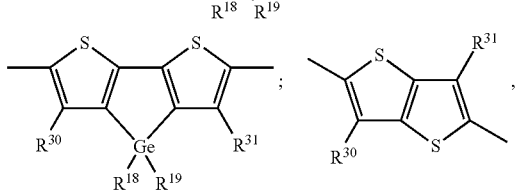
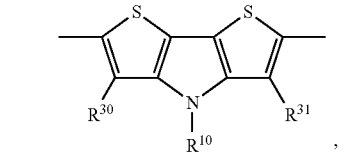,

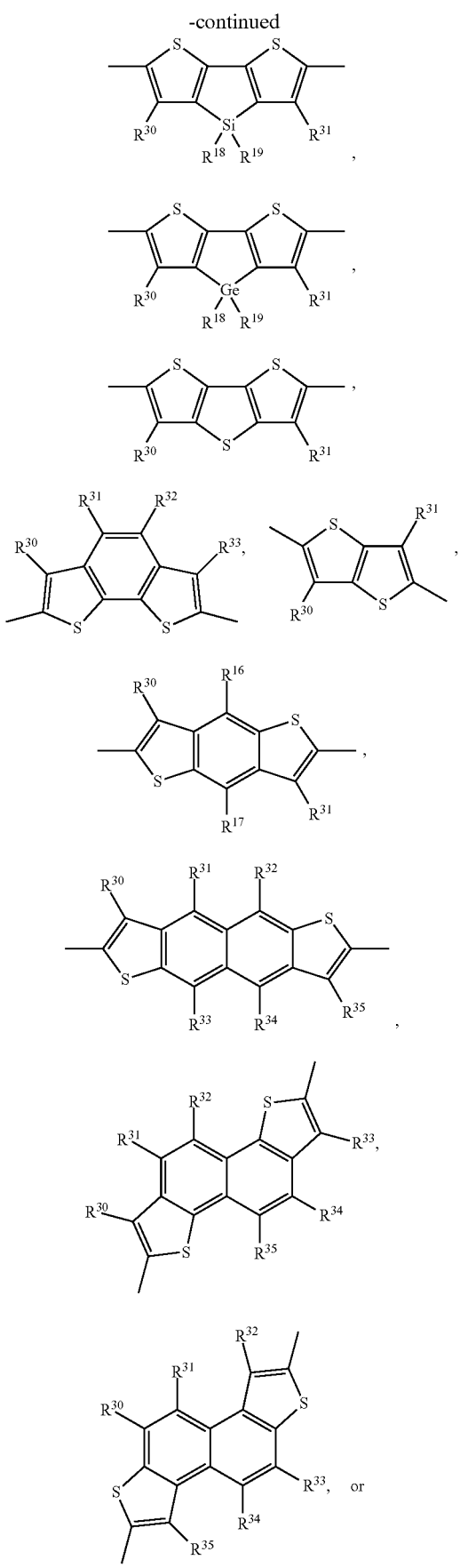
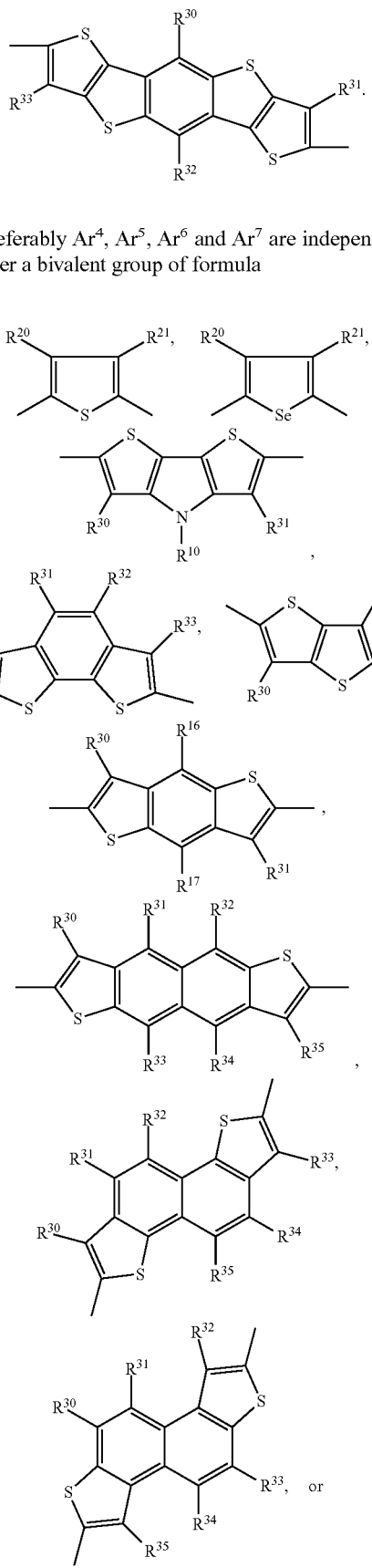
Most preferably Ar⁴, Ar⁵, Ar⁶ and Ar⁷ are independently of each other a bivalent group of formula -continued

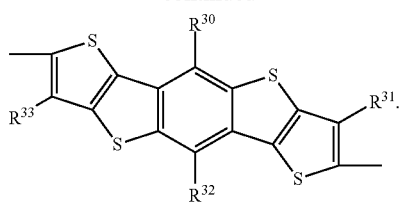

The preferences for X, $R^{10}$, $R^{11}$ $R^{12}$, $R^{13}$, $R^{14}$, $R^{15}$, $R^{16}$, $R^{17}$, $R^{18}$, $R^{19}$, $R^{20}$, $R^{21}$, $R^{30}$ to $R^{38}$, $R^{40}$, $R^{41}$, $R^{60}$ to $R^{68}$, D, E and G are the same as specified above for the compounds of formula I.

If a moiety selected from $Ar^1$, $Ar^5$ or $Ar^7$ is linked via a single bond to the DPP basis skeleton, preferably the substituents in ortho position to this linking bond are hydrogen.

In a preferred embodiment $R^3$ is $R^5$. In another preferred embodiment $A^1$ and $A^2$ have the meaning of $R^5$.

In another preferred embodiment the compound of formula III is a compound of formula

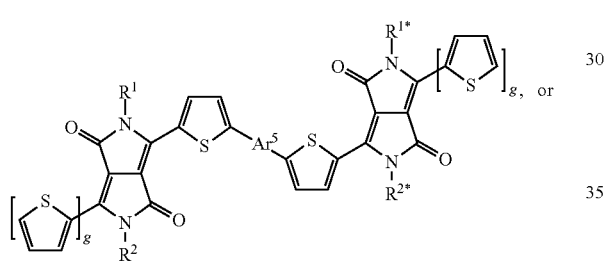
(IIIa)

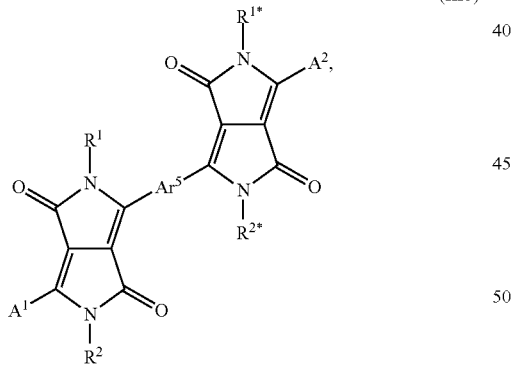
(IIIb)

wherein $A^1$ and $A^2$ are as defined above, g is an integer of 1 to 4, especially 1; $R^1$, $R^2$, $R^{1*}$ and $R^{2*}$ are a $C_1$-$C_{38}$alkyl group and $Ar^5$ is

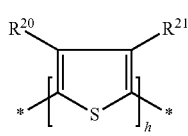

(h is 1, 2, or 3, especially 1, or 3, very especially 1), $Ar^5$ is

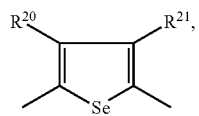

especially

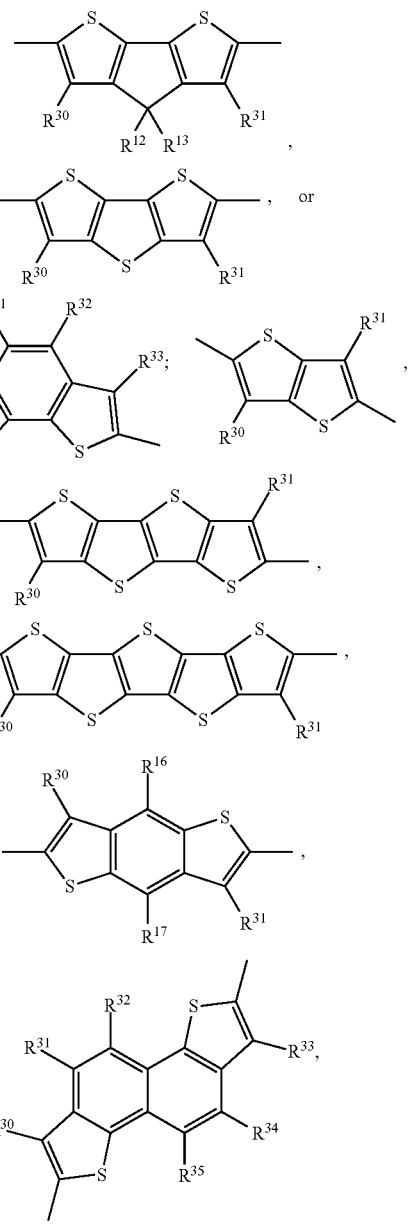

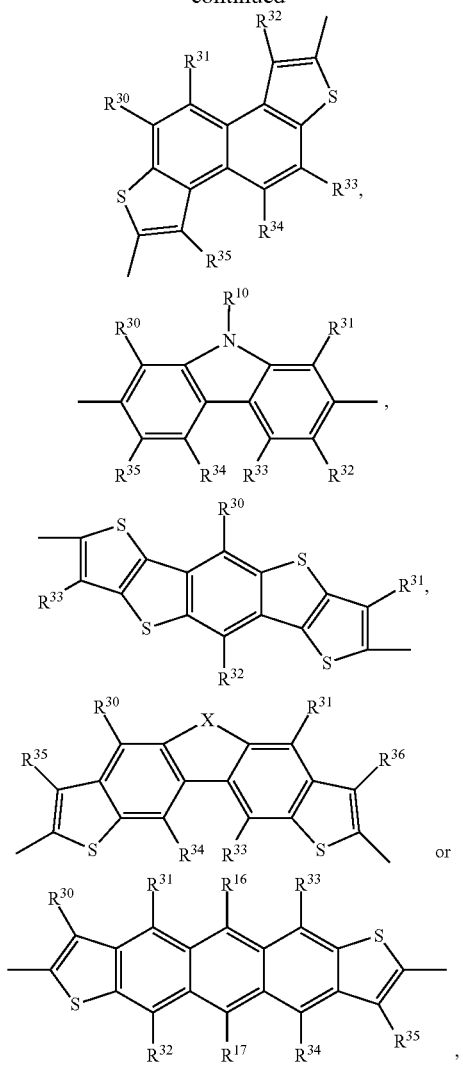
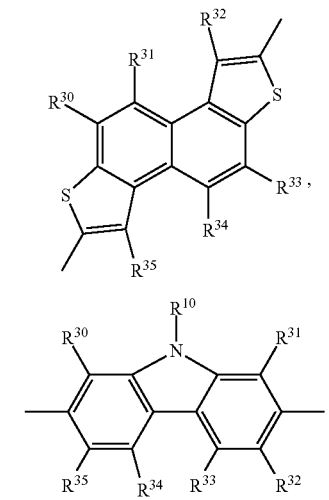
wherein X, $R^{10}$, $R^{12}$, $R^{13}$, $R^{16}$, $R^{17}$, $R^{20}$, $R^{21}$ and $R^{30}$ to $R^{35}$ are as defined above.
In another preferred embodiment the present invention is directed to compounds of formula
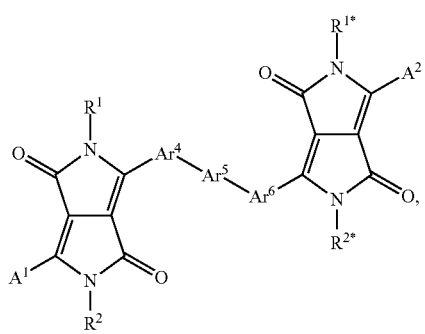
(IIIc)
wherein $Ar^5$, $A^1$ and $A^2$ are as defined above, $R^1$, $R^2$, $R^{1*}$ and $R^{2*}$ are a $C_1$-$C_{38}$ alkyl group, especially a $C_{13}$-$C_{24}$ alkyl group, and $Ar^4$ and $Ar^6$ are independently of each other -continued

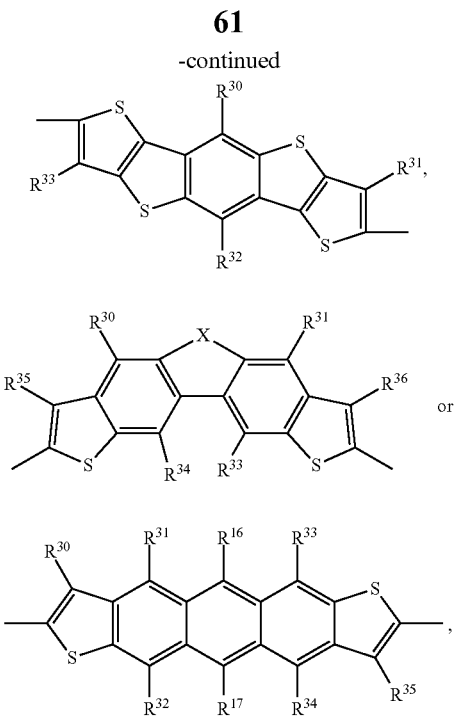

X, $R^{10}$, $R^{12}$, $R^{13}$, $R^{16}$, $R^{17}$, $R^{20}$, $R^{21}$ and $R^{30}$ to $R^{35}$ are as defined above.

Examples of compounds of the formula III are compounds A-1 to A-27. Reference is made to claim 9. Among the compounds A-1 to A-27 compounds A-1, A-4, A-10, A-11, A-13, A14, A-22 to A-27 are preferred.

A process for the preparation of compounds of formula

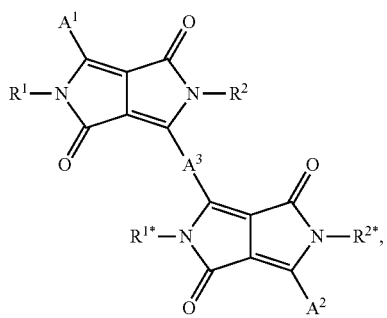

(III)

wherein $R^2$ is $R^{1*}$, comprises (a) reacting (in the presence of a strong base) 2 moles of a compound of formula

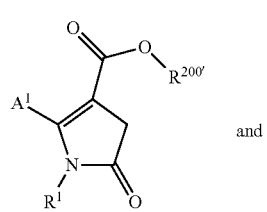

(XV)

and

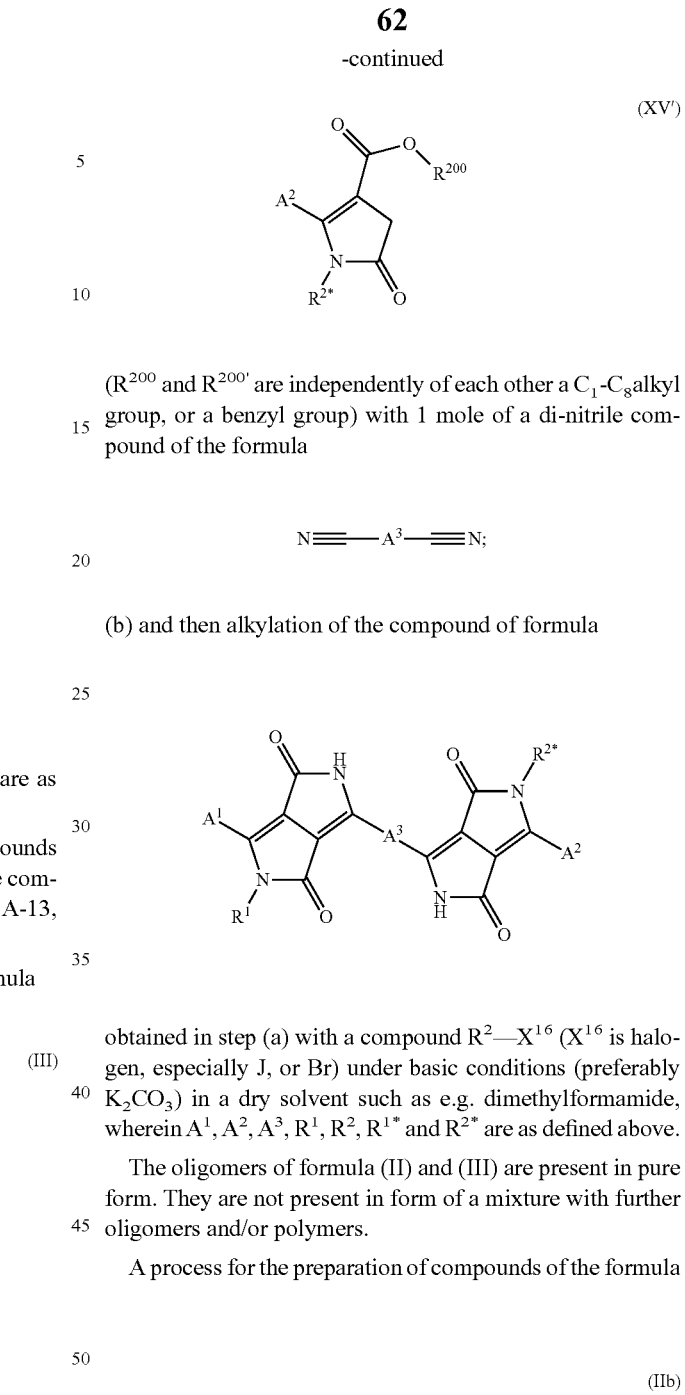

($R^{200}$ and $R^{200'}$ are independently of each other a $C_1$-$C_8$alkyl group, or a benzyl group) with 1 mole of a di-nitrile compound of the formula $$N\equiv\!\!\!=\!\!\!-A^3\!\!-\!\!\!=\!\!\!\equiv N;$$

(b) and then alkylation of the compound of formula obtained in step (a) with a compound $R^2$—$X^{16}$ ($X^{16}$ is halogen, especially J, or Br) under basic conditions (preferably $K_2CO_3$) in a dry solvent such as e.g. dimethylformamide, wherein $A^1$, $A^2$, $A^3$, $R^1$, $R^2$, $R^{1*}$ and $R^{2*}$ are as defined above.

The oligomers of formula (II) and (III) are present in pure form. They are not present in form of a mixture with further oligomers and/or polymers.

A process for the preparation of compounds of the formula ($R^1$=$R^2$=$R^{1*}$=$R^{2*}$), comprises (a) reacting (in the presence of a strong base) 2 mole of a disuccinate with 1 mole of a nitrile of the formula

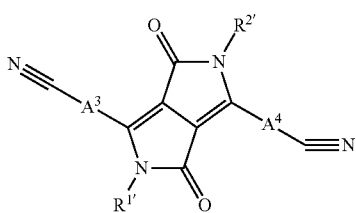

and 2 mole of a nitrile of the formula

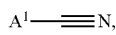

(b) reacting the compound of formula

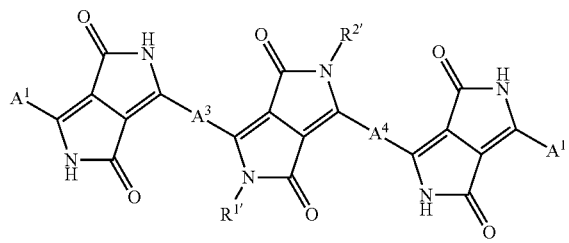

obtained in step a) with a bromide of the formula $R^1$—$X^{16}$ ($X^{16}$ is halogen, especially Br, or I) in the presence of a suitable base, like potassium carbonate, in a suitable solvent, like N-methyl-pyrrolidone, $R^1$, $R^{1'}$, $R^{2'}$, $A^1$, $A^3$ and $A^4$ are as defined above.

The disuccinates to be used in the process according to the invention include dialkyl, diaryl or monoalkyl-monoaryl succinates. The dialkyl and diaryl succinates may also be asymmetrical. However, it is preferred to use symmetrical disuccinates, most preferably symmetrical dialkyl succinates, most preferably symmetrical dialkyl succinates. If a diaryl or monoaryl-monoalkyl succinate is employed, aryl denotes preferably phenyl which is unsubstituted or substituted by halogen such as chlorine, $C_{1-6}$-alkyl such as ethyl, methyl, isopropyl or tert-butyl, or $C_{1-6}$-alkoxy such as methoxy or ethoxy. The preferred meaning of aryl is unsubstituted phenyl. If a dialkyl or monoalkyl-monoaryl succinate is employed, then alkyl may be unbranched or branched, preferably branched, and may contain preferably 1 to 18, in particular 1 to 12, more particularly 1 to 8 and more preferably 1 to 5, carbon atoms. Branched alkyl is preferably sec- or tert-alkyl, for example, isopropyl, sec-butyl, tert-butyl, tert-amyl and cyclohexyl.

Examples of disuccinates are dimethyl succinate, diethyl succinate, dipropyl succinate, dibutyl succinate, dipentyl succinate, dihexyl succinate, diheptyl succinate, dioctyl succinate, diisopropyl succinate, di-sec-butyl succinate, di-tert-butyl succinate, di-tert-amyl succinate, di-[1,1-dimethylbutyl]succinate, di-[1,1,3,3-tetramethylbutyl]succinate, di-[1,1-dimethylpentyl]succinate, di-[1-methylethylbutyl]succinate, di-[1,1-diethylpropyl]succinate, diphenyl succinate, di-[4-methylphenyl]succinate, di-[4-chlorophenyl]succinate, monoethyl-monophenyl succinate, and dicyclohexyl succinate. Most preferably, the starting disuccinate is diisopropyl succinate.

The disuccinates are known compounds and may be prepared by known methods.

Typically, the nitriles and the disuccinate are used in stoichiometric proportions. It can be advantageous to use the nitriles to be reacted with the disuccinate in more than only stoichiometric proportions. An excess of disuccinate over the nitrile can often have a positive influence on the yield, in which case the excess may be up to twice the stoichiometrically required amount of disuccinate.

The reaction of the disuccinate with the nitriles is carried out in an organic solvent. Examples of suitable solvents are primary, secondary or tertiary alcohols containing 1 to 10 carbon atoms, for example, methanol, ethanol, n-propanol, isopropanol, n-butanol, sec-butanol, tert-butanol, n-pentanol, 2-methyl-2-butanol, 2-methyl-2-pentanol, 3-methyl-3-pentanol, 2-methyl-2-hexanol, 3-ethyl-3-pentanol, 2,4,4-trimethyl-2-pentanol, or glycols such as ethylene glycol or diethylene glycol; and also ethers such as tetrahydrofuran or dioxan, or glycol ethers such as ethylene glycol methyl ether, ethylene glycol ethyl ether, diethylene glycol monomethyl ether or diethylene glycol monoethyl ether; as well as dipolar aprotic solvents such as acetonitrile, benzonitrile, dimethylformamide, N,N-dimethylacetamide, nitrobenzene, N-methylpyrrolidone; aliphatic or aromatic hydrocarbons such as benzene or benzene substituted by alkyl, alkoxy or halogen, for example, toluene, xylene, anisole or chlorobenzene; or aromatic heterocyclic compounds such as pyridine, picoline or quinoline. Mixtures of the above solvents may also be used. It is convenient to use 5 to 20 parts be weight of solvent per 1 part by weight of reactants.

In the process according to the invention, it is preferred to use an alcohol as solvent, in particular a secondary or tertiary alcohol. Preferred tertiary alcohols are tert-butanol and tert-amyl alcohol. Mixtures of these preferred solvents with aromatic hydrocarbons such as toluene or xylene, or halogen-substituted benzene such as chlorobenzene, are also useful.

The process according to the invention is carried out in the presence of a strong base. Suitable strong bases are in particular the alkali metals themselves such as lithium, sodium or potassium, or alkali metal amides such as lithium amide, sodium amide or potassium amide, or alkali metal hydrides such as lithium, sodium or potassium hydride, or alkaline earth metal alcoholates or alkali metal alcoholates which are derived preferably from primary, secondary or tertiary aliphatic alcohols containing from 1 to 10 carbon atoms, for example, lithium methylate, sodium methylate or potassium methylate, or lithium, sodium or potassium ethylate, lithium, sodium or potassium n-propylate, lithium, sodium or potassium iso-propylate, lithium, sodium or potassium n-butylate, lithium, sodium or potassium sec-butylate, lithium, sodium or potassium tert-butylate, lithium, sodium or potassium 2-methyl-2-butylate, lithium, sodium or potassium 2-methyl-2-pentylate, lithium, sodium or potassium 3-methyl-3-pentylate, lithium, sodium or potassium 3-ethyl-3-pentylate or lithium, sodium or potassium 3-ethyl-3-pentylate. Additionally, a mixture of these bases may also be employed.

The preferred strong base is an alkali metal alcoholate, the alkali metals being preferably sodium or potassium and the alcoholate being preferably derived from a secondary or tertiary alcohol. Particularly preferred strong bases are therefore, for example, sodium or potassium isopropylate, sodium or potassium sec-butylate, sodium or potassium tert-butylate and sodium or potassium tert-amylate. Moreover, the alkali metal alcoholates may be prepared in situ by reacting the appropriate alcohol with the alkali metal, alkali metal hydride or alkali metal amide.

The strong base is employed in an amount of preferably from about 0.1 to about 10 moles, most preferably from about 1.9 to about 4.0 moles, based on one mole of the disuccinate.

Although a stoichiometric amount of base may suffice, an excess of base has been found to have an advantageous effect on the yield.

Compounds of formula

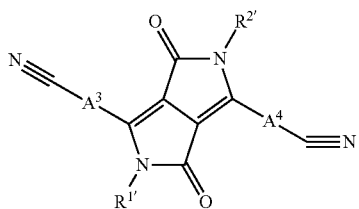

can be prepared by reacting

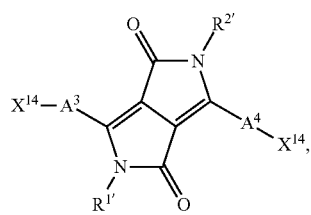

wherein $X^{14}$ is halogen, such as, for example, Br, or I, with copper(I)cyanide. The reaction with copper(I)cyanide is carried out in a suitable solvent, like dimethylforamide (DMF) and is carried out at a temperature from about room temperature to about 180° C., preferably from about 100° C. to about 170° C., e.g. at 130° C. Reference is made to WO2012/041849 and Frank Würthner et al., Chem. Commun., 2011, 47, 1767-1769.

Another process for the preparation of compounds of formula

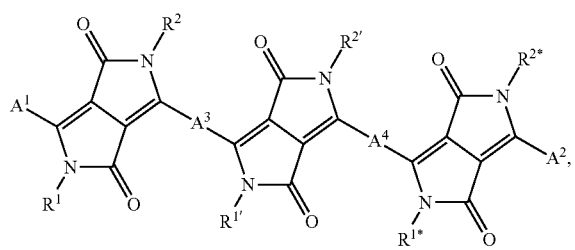

(Ib)

wherein $R^2$ is $R^{1*}$, comprises (a) reacting (in the presence of a strong base) 2 moles of a compound of formula

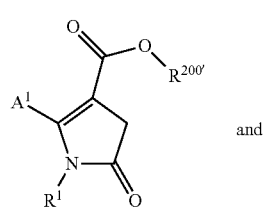

(XV)

and

-continued

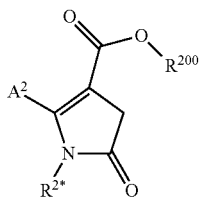

(XV')

($R^{200}$ and $R^{200'}$ are independently of each other a $C_1$-$C_8$alkyl group, or a benzyl group) with 1 mole of a di-nitrile compound of the formula

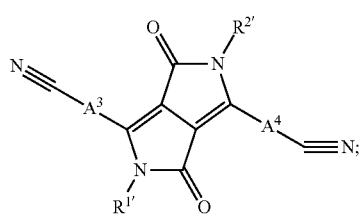

(b) and then alkylation of the compound of formula

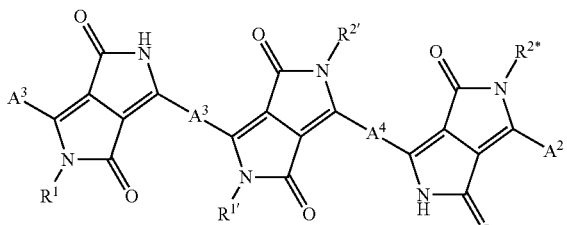

obtained in step (a) with a compound $R^2$—$X^{16}$ ($X^{16}$ is halogen, especially J, or Br) under basic conditions (preferably $K_2CO_3$) in a dry solvent such as e.g. dimethylformamide, $A^1$, $A^2$, $A^3$, $R^1$, $R^2$, $R^{1'}$, $R^{2'}$, $R^{1*}$ and $R^{2*}$ are as defined above.

A further synthesis route is, for example, the reaction of mono-halogenated compounds

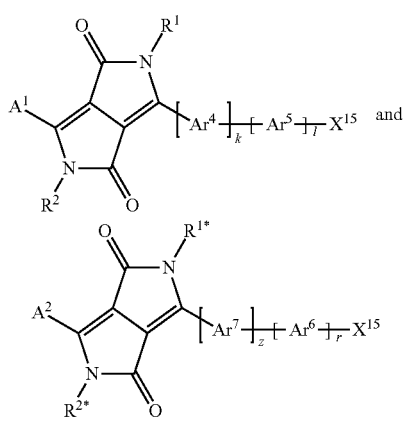

under Yamamoto reaction conditions with the aid of a Nickel complex, wherein compounds of formula III are obtained. $X^{15}$ is a halogen atom, especially Br, or I. l and z are independently of each other 1, or 2. k is 0, 1 or 2. r is 0, or 1. $R^1$, $R^2$, $R^{1*}$, $R^{2*}$, $A^1$ and $A^2$ are as defined above.

Another process for the preparation of compounds of formula (III), wherein $R^2$ is $R^{1*}$, comprises (a) reacting (in the presence of a strong base) 2 moles of a compound of formula

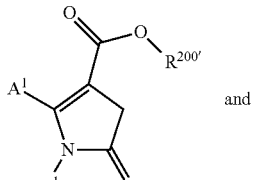

(XV)

and

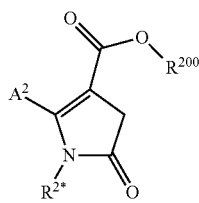

(XV')

($R^{200}$ and $R^{200'}$ are independently of each other a $C_1$-$C_8$alkyl group, or a benzyl group) with 1 mole of a di-nitrile compound of the formula

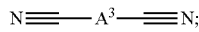

$$N\equiv\!\!=\!\!-A^3\!-\!\!=\!\!\equiv N;$$

(b) and then alkylation of the compound of formula

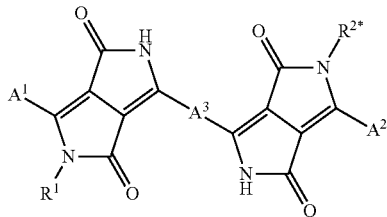

obtained in step (a) with a compound $R^2$—$X^{16}$ ($X^{16}$ is halogen, especially J, or Br) under basic conditions (preferably $K_2CO_3$) in a dry solvent such as e.g. dimethylformamide.

The compounds of formula XV and XV' can be synthesized, for example, in analogy to the methods described in C. Morton et al., Tetrahedron 58 (2002) 5547-5565, or Tetrahedron 62 (2006) 6018-6028.

Alternatively, compounds of the formula (III) ($R^1$=$R^{1*}$; $R^2$=$R^{2*}$, $A^3$ is a group of formula

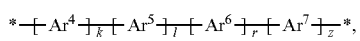

$Ar^4$ is $Ar^7$, k is 1, or 2, z is 1, or 2) may be prepared by reacting a compound of formula

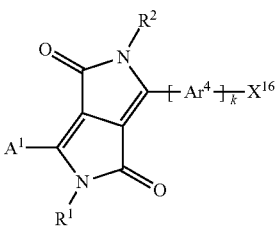

with a compound of formula

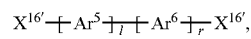

$$X^{16'}\!-\!\!\!\!+\!\!Ar^5\!\!+\!\!\!\overline{\phantom{i}}\!\!+\!\!Ar^6\!\!+\!\!\!\overline{\phantom{i}}\!\!X^{16'},$$

wherein $X^{16'}$ is —$B(OH)_2$, —$B(OH)_3^-$, —$BF_3$, —$B(OY^1)_2$,

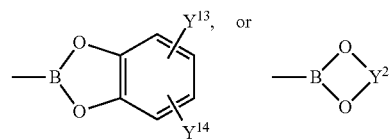

and $X^{16}$ is halogen, such as, for example, Br, or I.

The Suzuki reaction is typically conducted at about 0° C. to 180° C. in an aromatic hydrocarbon solvent such as toluene, xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A condensation reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252.

The compounds of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508). In order to carry out the process, tin compounds

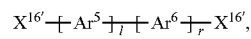

$$X^{16'}\!-\!\!\!\!+\!\!Ar^5\!\!+\!\!\!\overline{\phantom{i}}\!\!+\!\!Ar^6\!\!+\!\!\!\overline{\phantom{i}}\!\!X^{16'},$$

wherein $X^{16'}$ is —$SnR^{207}R^{208}R^{209}$, and the halogen compound

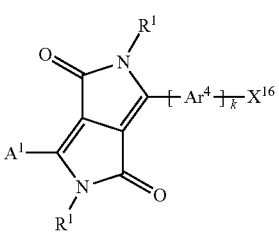

are preferably introduced into one or more inert organic solvents and stirred at a temperature of from 0 to 200° C., preferably from 30 to 170° C. for a period of from 1 hour to 200 hours, preferably from 5 hours to 150 hours.

Reference is made to WO2009/047104 and WO2012/041849 with respect to the preparation of the starting materials and the compounds of formula I.

In the above Stille and Suzuki coupling reactions the halogen $X^{16}$ on the halogenated reaction partner can be replaced with the $X^{16'}$ moiety and at the same time the $X^{16'}$ moiety of the other reaction partner is replaced by $X^{16}$.

Compounds of formula IIa can be prepared in analogy to the synthesis of compounds of formula III via Suzuki, or Stille reaction starting from the corresponding building blocks, e.g.: Two equivalents of a compound of formula

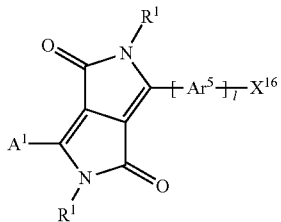

are reacted with one equivalent of a compound of formula

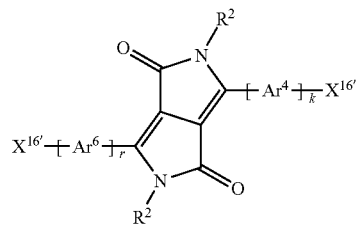

to give a compound of formula

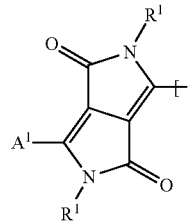

The compounds, wherein $R^1$, $R^2$, $R^{1'}$, $R^{2'}$, $R^{1''}$, $R^{2''}$, $R^{1*}$ and/or $R^{2*}$ are hydrogen, can be obtained by using a protecting group which can be removed after synthesis of the precursor compound (see, for example, EP-A-0648770, EP-A-0648817, EP-A-0742255, EP-A0761772, WO98/32802, WO98/45757, WO98/58027, WO99/01511, WO00/17275, WO00/39221, WO00/63297 and EP-A-1086984). Conversion of the precursor compound into the desired final compound is carried out by means of fragmentation under known conditions, for example thermally, optionally in the presence of an additional catalyst, for example the catalysts described in WO00/36210.

An example of such a protecting group is group of formula

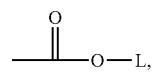

wherein L is any desired group suitable for imparting solubility.

L is preferably a group of formula

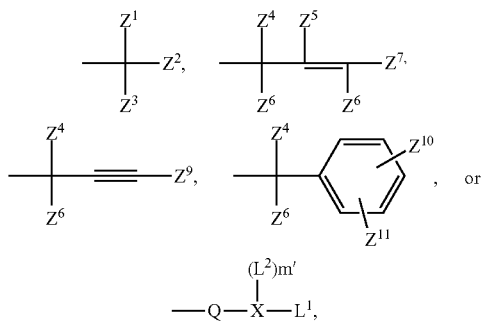

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^6$, $Z^6$ and $Z^7$ are independently of each other hydrogen or $C_1$-$C_6$alkyl, $Z^9$ is hydrogen, $C_1$-$C_6$alkyl or a group of formula

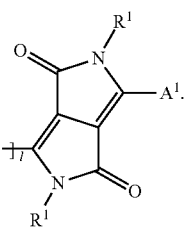

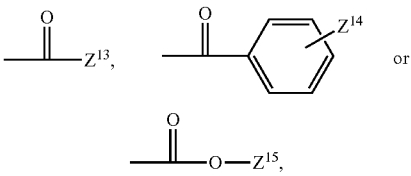

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{16}$ is hydrogen, $C_1$-$C_6$alkyl, or unsubstituted or $C_1$-$C_6$alkyl-substituted phenyl, Q is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X is a hetero atom selected from the group consisting of nitrogen, oxygen and sulfur, m' being the number 0 when X is oxygen or sulfur and m being the number 1 when X is nitrogen, and $L^1$ and $L^2$ are independently of each other unsubstituted or mono- or poly-$C_1$-$C_8$alkoxy-, —$C_1$-$C_8$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_8$alkyl or [-(p',q'-$C_2$-$C_6$alkylene)-Z-]$_{n'}$—$C_1$-$C_8$alkyl, n' being a number from 1 to 1000, p' and q' being different position numbers, each Z independently of any others being a hetero atom oxygen, sulfur or $C_1$-$C_8$alkyl-substituted nitrogen, and it being possible for $C_2$-$C_6$alkylene in the repeating [—$C_2$-$C_6$alkylene-Z—] units to be the same or different, and $L_1$ and $L_2$ may be saturated or unsaturated from one to ten times, may be uninterrupted or interrupted at any location by from 1 to 10 groups selected from the group consisting of —(C=O)— and —$C_6H_4$—, and may carry no further substituents or from 1 to 10 further substituents selected from the group consisting of halogen, cyano and nitro. Most preferred L is a group of formula

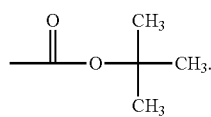

Compounds of formula

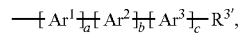

$R^{3'}$ is independently in each occurrence $ZnX^{12}$, —$SnR^{207}R^{208}R^{209}$, wherein $R^{207}$, $R^{208}$ and $R^{209}$ are identical or different and are H or $C_1$-$C_8$alkyl, wherein two radicals optionally form a common ring and these radicals are optionally branched or unbranched;

$X^{12}$ is a halogen atom, very especially I, or Br; —$OS(O)_2CF_3$, —$OS(O)_2$-aryl, especially

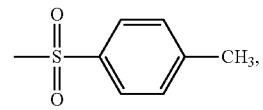

—$OS(O)_2CH_3$, —$B(OH)_2$, —$B(OH)_3$—, —$BF_3$, —$B(OY^1)_2$,

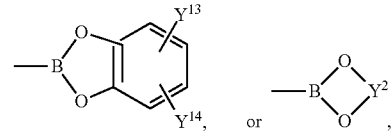

wherein $Y^1$ is independently in each occurrence a $C_1$-$C_8$alkyl group and $Y^2$ is independently in each occurrence a $C_2$-$C_{10}$alkylene group, such as —$CY^3Y^4$—$CY^5Y^6$—, or —$CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_8$alkyl group, especially —$C(CH_3)_2C(CH_3)_2$—, or —$C(CH_3)_2CH_2C(CH_3)_2$—, —$CH_2C(CH_3)_2CH_2$—, and $Y^{13}$ and $Y^{14}$ are independently of each other hydrogen, or a $C_1$-$C_8$alkyl group; a, b, c, p, q, $R^1$, $R^2$, $R^{1'}$, $R^{2'}$, $R^{1''}$, $R^{2''}$, $R^{1*}$, $R^{2*}$, $Ar^1$, $Ar^2$, $Ar^3$, $A^3$, $A^4$ and $A^5$ are as defined above.

An example of a compound of formula X is compound A-16 as depicted in claim 9. Compounds of formula X can be obtained in analogy to known procedures, which are, for example, described in U.S. Pat. No. 6,451,459, WO2005/049695, WO2008/000664, WO2009/047104, WO2010/049321, WO2010/049323, WO2010/108873, WO2010/115767, WO2010/136353, EP2033983 and EP2034537.

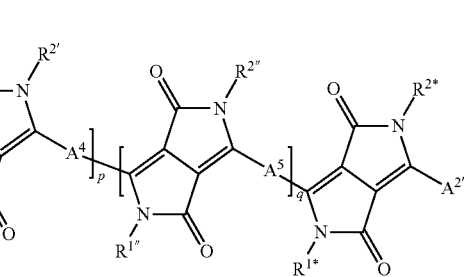

are intermediates in the production of polymers and form a further subject of the present invention. $A^{1'}$ and $A^{2'}$ are independently of each other a group of formula The compounds of formula X can be used to prepare polymers. Accordingly, the present invention is also directed to polymers comprising repeating unit(s) of formula

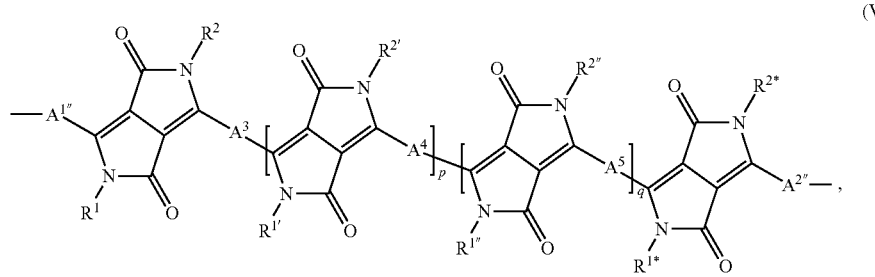

(VI)

wherein $A^{1\prime\prime\prime}$ and $A^{2\prime\prime\prime}$ are independently of each other a group of formula

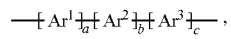

wherein a, b, c, p, q, $R^1$, $R^2$, $R^{1\prime}$, $R^{2\prime}$, $R^{1\prime\prime\prime}$, $R^{2\prime\prime\prime}$, $R^{1*}$, $R^{2*}$, $Ar^1$, $Ar^2$, $Ar^3$, $A^3$, $A^4$ and $A^5$ are as defined above. The polymers of the present invention may be used in the production of semiconductor devices. Accordingly, the present invention is also directed to semiconductor devices comprising a polymer of the present invention.

Halogen is fluorine, chlorine, bromine and iodine.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetramethylbutyl and 2-ethylhexyl. $C_1$-$C_4$alkyl is typically methyl, ethyl, n-propyl, isopropyl, n-butyl, sec.-butyl, isobutyl, tert.-butyl. A haloalkyl group is an alkyl group, wherein one, or more than one hydrogen atoms are repled by halogen atoms. A haloalkyl group is an alkyl group, wherein one, or more than one hydrogen atoms are repled by halogen atoms.

$C_2$-$C_{25}$alkenyl ($C_2$-$C_{18}$alkenyl) groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecyl, n-dodec-2-enyl or n-octadec-4-enyl.

$C_{2\text{-}25}$ alkynyl ($C_{2\text{-}18}$ alkynyl) is straight-chain or branched and preferably $C_{2\text{-}8}$ alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_1$-$C_{25}$alkoxy groups ($C_1$-$C_{18}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_1$-$C_{18}$perfluoroalkyl, especially $C_1$-$C_4$perfluoroalkyl, is a branched or unbranched radical such as for example —$CF_3$, —$CF_2CF_3$, —$CF_2CF_2CF_3$, —$CF(CF_3)_2$, —$(CF_2)_3CF_3$, and —$C(CF_3)_3$.

The term "carbamoyl group" is typically a $C_{1\text{-}18}$carbamoyl radical, preferably $C_{1\text{-}8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

The term "alkanoyl" represents an alkyl group attached to the parent molecular group through a carbonyl group and is exemplified by formyl, acetyl, propionyl, and butanoyl.

The term "silyl group" means a group of formula —$SiR^{62}R^{63}R^{64}$, wherein $R^{62}$, $R^{63}$ and $R^{64}$ are independently of each other a $C_1$-$C_8$alkyl group, in particular a $C_1$-$C_4$ alkyl group, a $C_6$-$C_{24}$aryl group, or a $C_7$-$C_{12}$aralkyl group, such as a trimethylsilyl group. The term "siloxanyl group" means a group of formula —O—$SiR^{62}R^{63}R^{64}$, wherein $R^{62}$, $R^{63}$ and $R^{64}$ are as defined above, such as a trimethylsiloxanyl group.

Aliphatic groups can, in contrast to aliphatic hydrocarbon groups, be substituted by any acyclic substituents, but are preferably unsubstituted. Preferred substituents are $C_1$-$C_8$alkoxy or $C_1$-$C_8$alkylthio groups as exemplified further below. The term "aliphatic group" comprises also alkyl groups wherein certain non-adjacent carbon atoms are replaced by oxygen, like —$CH_2$—O—$CH_2$—$CH_2$—O—$CH_3$. The latter group can be regarded as methyl substituted by —O—$CH_2$—$CH_2$—O—$CH_3$.

An aliphatic hydrocarbon group having up to 25 carbon atoms is a linear or branched alkyl, alkenyl or alkynyl (also spelled alkinyl) group having up to 25 carbon atoms as exemplified above.

Alkylene is bivalent alkyl, i.e. alkyl having two (instead of one) free valencies, e.g. trimethylene or tetramethylene.

Alkenylene is bivalent alkenyl, i.e. alkenyl having two (instead of one) free valencies, e.g. —$CH_2$—CH=CH—$CH_2$—.

Aliphatic groups can, in contrast to aliphatic hydrocarbon groups, be substituted by any acyclic substituents, but are preferably unsubstituted. Preferred substituents are $C_1$-$C_8$alkoxy or $C_1$-$C_8$alkylthio groups as exemplified further below. The term "aliphatic group" comprises also alkyl groups wherein certain non-adjacent carbon atoms are replaced by oxygen, like —CH$_2$—O—CH$_2$—CH$_2$—O—CH$_3$. The latter group can be regarded as methyl substituted by —O—CH$_2$—CH$_2$—O—CH$_3$.

A cycloaliphatic hydrocarbon group is a cycloalkyl or cycloalkenyl group which may be substituted by one or more aliphatic and/or cycloaliphatic hydrocarbon groups.

A cycloaliphatic-aliphatic group is an aliphatic group substituted by a cycloaliphatic group, wherein the terms "cycloaliphatic" and "aliphatic" have the meanings given herein and wherein the free valency extends from the aliphatic moiety. Hence, a cycloaliphatic-aliphatic group is for example a cycloalkyl-alkyl group.

A cycloalkyl-alkyl group is an alkyl group substituted by a cycloalkyl group, e.g. cyclohexyl-methyl.

A "cycloalkenyl group" means an unsaturated alicyclic hydrocarbon group containing one or more double bonds, such as cyclopentenyl, cyclopentadienyl, cyclohexenyl and the like, which may be unsubstituted or substituted by one or more aliphatic and/or cycloaliphatic hydrocarbon groups and/or condensed with phenyl groups.

A bivalent group of the formula

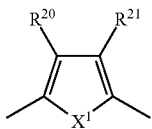

($X^1$ is, S, Se, or NR$^{10}$ wherein R$^{20}$ and R$^{21}$ together represent alkylene or alkenylene which may be both bonded via oxygen and/or sulfur to the thienyl residue and which may both have up to 25 carbon atoms, is e.g. a group of the formula

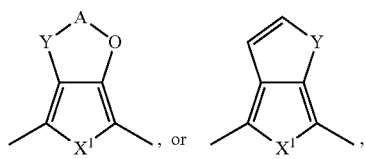

wherein A represents linear or branched alkylene having up to 25 carbon atoms, preferably ethylene or propylene which may be substituted by one or more alkyl groups, and Y represents oxygen or sulphur. For example, the bivalent group of the formula —Y-A-O— represents —O—CH$_2$—CH$_2$—O— or —O—CH$_2$—CH$_2$—CH$_2$—O—.

A cycloalkyl group is typically C$_3$-C$_{12}$cycloalkyl (especially C$_5$-C$_{12}$cycloalkyl), such as, for example, cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, or cycloalkenyl group, in particular a cyclohexyl group, can be condensed one or two times by phenyl which can be substituted one to three times with C$_1$-C$_4$-alkyl, halogen and cyano. Examples of such condensed cyclohexyl groups are:

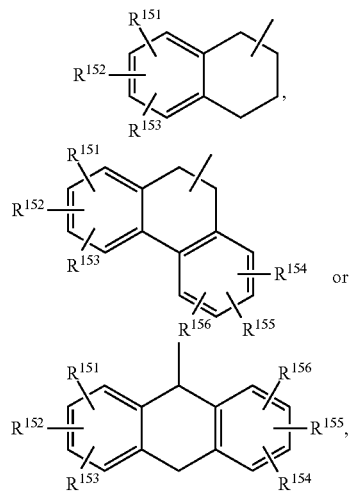

in particular

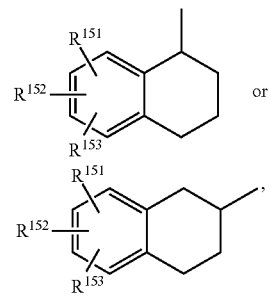

wherein R$^{151}$, R$^{152}$, R$^{153}$, R$^{154}$, R$^{155}$ and R$^{156}$ are independently of each other C$_1$-C$_8$-alkyl, C$_1$-C$_8$-alkoxy, halogen and cyano, in particular hydrogen.

C$_6$-C$_{24}$aryl (C$_6$-C$_{18}$aryl) is typically phenyl, indenyl, azulenyl, naphthyl, biphenyl, asindacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of C$_6$-C$_{12}$aryl are phenyl, 1-naphthyl, 2-naphthyl, 3- or 4-biphenyl, 2- or 9-fluorenyl or 9-phenanthryl, which may be unsubstituted or substituted.

C$_7$-C$_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably C$_7$-C$_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, co-phenyl-dodecyl or ω-phenyl-octadecyl, and particularly preferred C$_7$-C$_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

Heteroaryl is typically C$_2$-C$_{20}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{25}$alkyl ($C_1$-$C_{18}$alkyl) interrupted by one or more O is, for example, $(CH_2CH_2O)_{1-9}$—$R^x$, where $R^x$ is H or $C_1$-$C_{10}$alkyl, $CH_2$—$CH(OR^{y'})$—$CH_2$—O—$R^y$, where $R^y$ is $C_1$-$C_{25}$alkyl ($C_1$-$C_{18}$alkyl), and $R^{y'}$ embraces the same definitions as $R^y$ or is H.

If a substituent, such as for example $R^3$, occurs more than one time in a group, it can be different in each occurrence.

Advantageously, the compositions, or compounds of the present invention, or an organic semiconductor material, layer or component, comprising the compositions, or compounds of the present invention can be used in organic photovoltaics (solar cells) and photodiodes, or in an organic field effect transistor (OFET).

The compounds of the present invention can show p-type transistor behavior and can be used as the semiconductor layer in semiconductor devices. Accordingly, the present invention also relates to a semiconductor device comprising as a semiconducting effective means a compound of the present invention.

The invention relates especially to a semiconductor device comprising as a semiconducting effective means a composition, or a compound of the present invention. With respect to the composition, or compound of the present invention the above-mentioned preferences apply. The compounds are especially selected from compounds A-1 to A-27 and B-1, respectively, which are depicted in claim 9.

Preferably said semiconductor device is a diode, a photodiode, a sensor, an organic field effect transistor (OFET), a transistor for flexible displays, or a solar cell, or a device containing a diode and/or an organic field effect transistor, and/or a solar cell. There are numerous types of semiconductor devices. Common to all is the presence of one or more semiconductor materials. Semiconductor devices have been described, for example, by S. M. Sze in Physics of Semiconductor Devices, $2^{nd}$ edition, John Wiley and Sons, New York (1981). Such devices include rectifiers, transistors (of which there are many types, including p-n-p, n-p-n, and thin-film transistors), light emitting semiconductor devices (for example, organic light emitting diodes in display applications or backlight in e.g. liquid crystal displays), photoconductors, current limiters, solar cells, thermistors, p-n junctions, field-effect diodes, Schottky diodes, and so forth. In each semiconductor device, the semiconductor material is combined with one or more metals and/or insulators to form the device. Semiconductor devices can be prepared or manufactured by known methods such as, for example, those described by Peter Van Zant in Microchip Fabrication, Fourth Edition, McGraw-Hill, New York (2000). In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492, New York (1981)). These components can be assembled in a variety of configurations. More specifically, an organic thin-film transistor (OTFT) has an organic semiconductor layer.

Typically, a substrate supports the OTFT during manufacturing, testing, and/or use. Optionally, the substrate can provide an electrical function for the OTFT. Useful substrate materials include organic and inorganic materials. For example, the substrate can comprise silicon materials inclusive of various appropriate forms of silicon, inorganic glasses, ceramic foils, polymeric materials (for example, acrylics, polyester, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly (ethylene terephthalate) (PET), poly(phenylene sulfide) (PPS)), filled polymeric materials (for example, fiber-reinforced plastics (FRP)), and coated metallic foils. The substrate can have any suitable thickness, preferably in the range of 10 μm to 10 mm, even more preferably from 10 μm to 1 mm.

The gate electrode can be any useful conductive material. For example, the gate electrode can comprise doped silicon, or a metal, such as aluminum, chromium, gold, silver, nickel, palladium, platinum, tantalum, and titanium. Conductive oxides, such as indium tin oxide (ITO), or conducting inks/pastes comprised of carbon black/graphite or colloidal silver dispersions, optionally containing polymer binders can also be used. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OTFTs, the same material can provide the gate electrode function and also provide the support function of the substrate. For example, doped silicon can function as the gate electrode and support the OTFT.

The gate dielectric is generally provided on the gate electrode. This gate dielectric electrically insulates the gate electrode from the balance of the OTFT device. Useful materials for the gate dielectric can comprise, for example, an inorganic electrically insulating material.

The gate dielectric (insulator) can be a material, such as, an oxide, nitride, or it can be a material selected from the family of ferroelectric insulators (e.g. organic materials such as poly (vinylidene fluoride/trifluoroethylene or poly(m-xylylene adipamide)), or it can be an organic polymeric insulator (e.g. poly(methacrylate)s, poly(acrylate)s, polyimides, benzocyclobutenes (BCBs), parylenes, polyvinylalcohol, polyvinylphenol (PVP), polystyrenes, polyester, polycarbonates) as for example described in J. Veres et al. Chem. Mat. 2004, 16, 4543 or A. Facchetti et al. Adv. Mat. 2005, 17, 1705. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, including but not limited to PbZr$_x$Ti$_{1-x}$O$_3$ (PZT), Bi$_4$Ti$_3$O$_{12}$, BaMgF$_4$, Ba(Zr$_{1-x}$Ti$_x$)O$_3$ (BZT). In addition, alloys, hybride materials (e.g. polysiloxanes or nanoparticle-filled polymers) combinations, and multilayers of these materials can be used for the gate dielectric. The thickness of the dielectric layer is, for example, from about 10 to 1000 nm, with a more specific thickness being about 100 to 500 nm, providing a capacitance in the range of 0.1-100 nanofarads (nF).

The source electrode and drain electrode are separated from the gate electrode by the gate dielectric, while the organic semiconductor layer can be over or under the source electrode and drain electrode. The source and drain electrodes can be any useful conductive material favourably providing a low resistance ohmic contact to the semiconductor layer. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof. Some of these materials are appropriate for use with n-type semiconductor materials and others are appropriate for use with p-type semiconductor materials, as is known in the art.

The thin film electrodes (that is, the gate electrode, the source electrode, and the drain electrode) can be provided by any useful means such as physical vapor deposition (for example, thermal evaporation or sputtering) or (ink jet) printing methods. The patterning of these electrodes can be accomplished by known methods such as shadow masking, additive photolithography, subtractive photolithography, printing, microcontact printing, and pattern coating.

The present invention further provides a thin film transistor device comprising
a plurality of electrically conducting gate electrodes disposed on a substrate;
a gate insulator layer disposed on said electrically conducting gate electrodes;
a plurality of sets of electrically conductive source and drain electrodes disposed on said insulator layer such that each of said sets is in alignment with each of said gate electrodes;
an organic semiconductor layer disposed in the channel between source and drain electrodes on said insulator layer substantially overlapping said gate electrodes; wherein said organic semiconductor layer comprise a composition, or a compound of the present invention.

The present invention further provides a process for preparing a thin film transistor device comprising the steps of:
depositing a plurality of electrically conducting gate electrodes on a substrate;
depositing a gate insulator layer on said electrically conducting gate electrodes;
depositing a plurality of sets of electrically conductive source and drain electrodes on said layer such that each of said sets is in alignment with each of said gate electrodes;
depositing a layer comprising a composition, or a compound of the present invention on said insulator layer such that said layer comprising the composition, or the compound of the present invention substantially overlaps said gate electrodes, thereby producing the thin film transistor device.

The ratio of the compound of formula I to the polymeric material can vary from 5 to 95 percent based on the amount of the compound of formula I and the polymeric material.

The polymeric material may be a semi-conducting polymer, or a polymeric binder. Preferably, the polymeric binder is a semicrystalline polymer such as polystyrene (PS), high-density polyethylene (HDPE), polypropylene (PP) and polymethylmethacrylate (PMMA). With this technique, a degradation of the electrical performance can be avoided (cf. WO 2008/001123 A1).

The above-mentioned layer comprising a compound of the present invention may additionally comprise at least another material. The other material can be, but is not restricted to another compound of the present invention, a semi-conducting polymer, a polymeric binder, organic small molecules different from a compound of the present invention, carbon nanotubes, a fullerene derivative, inorganic particles (quantum dots, quantum rods, quantum tripods, TiO$_2$, ZnO etc.), conductive particles (Au, Ag etc.), and insulator materials like the ones described for the gate dielectric (PET, PS etc.).

Any suitable substrate can be used to prepare the thin films of the compositions, or compounds of the present invention. Preferably, the substrate used to prepare the above thin films is a metal, silicon, plastic, paper, coated paper, fabric, glass or coated glass.

Alternatively, a TFT is fabricated, for example, by solution deposition, or vacuum deposition of a composition, or compound of the present invention on a highly doped silicon substrate covered with a thermally grown oxide layer followed by vacuum deposition and patterning of source and drain electrodes.

In yet another approach, a TFT is fabricated by deposition of source and drain electrodes on a highly doped silicon substrate covered with a thermally grown oxide and then solution deposition of a composition, or compound of the present invention to form a thin film.

The gate electrode could also be a patterned metal gate electrode on a substrate or a conducting material such as a conducting polymer, which is then coated with an insulator applied either by solution coating or by vacuum deposition on the patterned gate electrodes.

Any suitable solvent can be used to dissolve, and/or disperse a compound of the formula I, provided it is inert and can be removed partly, or completely from the substrate by conventional drying means (e.g. application of heat, reduced pressure, airflow etc.). Suitable organic solvents for processing the semiconductors of the invention include, but are not limited to, aromatic or aliphatic hydrocarbons, halogenated such as chlorinated or fluorinated hydrocarbons, esters, ethers amides, such as chloroform, tetrachloroethane, tetrahydrofuran, toluene, tetraline, anisole, xylene, ethyl acetate, methyl ethyl ketone, dimethyl formamide, dichlorobenzene, trichlorobenzene, propylene glycol monomethyl ether acetate (PGMEA) and mixtures thereof. The solution, and/or dispersion is then applied by a method, such as, spin-coating, dip-coating, screen printing, microcontact printing, doctor blading or other solution application techniques known in the art on the substrate to obtain thin films of the semiconducting material.

The term "dispersion" covers any composition comprising a composition, or compound of the present invention, which is not fully dissolved in a solvent. The dispersion can be done selecting a composition including at least a compound of formula I, or a mixture containing a compound of formula I, and a solvent, wherein the oligomer and/or polymer exhibits lower solubility in the solvent at room temperature but exhibits greater solubility in the solvent at an elevated temperature, wherein the composition gels when the elevated temperature is lowered to a first lower temperature without agitation;
dissolving at the elevated temperature at least a portion of the compound of the formula I in the solvent; lowering the temperature of the composition from the elevated temperature to the first lower temperature; agitating the composition to disrupt any gelling, wherein the agitating commences at any time prior to, simultaneous with, or subsequent to the lowering the elevated temperature of the composition to the first lower temperature; depositing a layer of the composition wherein the composition is at a second lower temperature lower than the elevated temperature; and drying at least partially the layer.

The dispersion can also be constituted of (a) a continuous phase comprising a solvent, a binder resin, and optionally a dispersing agent, and (b) a disperse phase comprising a compound of formula I, or a mixture containing a compound of formula I of the present invention. The degree of solubility of the compound of formula I in the solvent may vary for example from 0.5% to about 20% solubility, particularly from 1% to about 5% solubility.

Preferably, the thickness of the organic semiconductor layer is in the range of from about 5 to about 1000 nm, especially the thickness is in the range of from about 10 to about 100 nm.

The compositions, or compounds of the present invention can be used alone as the organic semiconductor layer of the semiconductor device. The layer can be provided by any useful means, such as, for example, vapor deposition and printing techniques. The compositions, or compounds of the present invention, which are sufficiently soluble in organic solvents, can be solution deposited and patterned (for example, by spin coating, dip coating, ink jet printing, gravure printing, flexo printing, offset printing, screen printing, microcontact (wave)-printing, drop or zone casting, or other known techniques).

The compositions, or compounds of the present invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like. Due to its ambipolarity the material can also be used in Organic Light Emitting Transistors (OLET).

In addition, the invention provides organic photovoltaic (PV) devices (solar cells) comprising a composition, or a compound of the present invention. The structure of organic photovoltaic devices (solar cells) is, for example, described in C. Deibel et al. Rep. Prog. Phys. 73 (2010) 096401 and Christoph Brabec, Energy Environ. Sci 2. (2009) 347-303.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the compositions, or compounds of the present invention. Preferably, the photoactive layer is made of a composition, or a compound of the present invention, as an electron donor and an acceptor material, like a fullerene, particularly a functionalized fullerene PCBM, as an electron acceptor.

The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of another compound of formula I or any semi-conducting polymer provided that the polymers retain acceptor-type and electron mobility characteristics, organic small molecules, carbon nanotubes, inorganic particles (quantum dots, quantum rods, quantum tripods, $TiO_2$, ZnO etc.).

For heterojunction solar cells (bulk heterojunction solar cells) the active layer comprises preferably a mixture of a compound of the present invention and a fullerene, such as [60]PCBM (=6,6-phenyl-$C_{61}$-butyric acid methyl ester), or [70]PCBM, in a weight ratio of 1:1 to 1:3. Methanofullerene Phenyl-$C_{61}$-Butyric-Acid-Methyl-Ester ([60]PCBM), i.e. 1-[3-(methoxycarbonyl)propyl]-1-phenyl-[6.6]$C_{61}$-3'H-cyclopropa[1,9][5,6]fullerene-$C_{60}$-Ih-3'-butanoic acid 3'-phenyl methyl ester, is an effective solution processable n-type organic semiconductor. It is blended with conjugated polymers with nano-particles such as $C_{60}$.

The electrodes are preferably composed of metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide-bandgap semiconductors, for example, transparent conducting oxides such as indium tin oxide (ITO), gallium indium tin oxide (GITO), and zinc indium tin oxide (ZITO). Another suitable metal substitute is the transparent conductive polymer polyanaline (PANI) and its chemical relatives, or PEDOT:PSS. Metal substitutes may be further selected from a wide range of non-metallic materials, wherein the term "non-metallic" is meant to embrace a wide range of materials provided that the material is free of metal in its chemically uncombined form. Highly transparent, non-metallic, low resistance cathodes or highly efficient, low resistance metallic/non-metallic compound cathodes are, for example, disclosed in U.S. Pat. No. 6,420,031 and U.S. Pat. No. 5,703,436.

The substrate can be, for example, a plastic (flexible substrate), or glass substrate.

In another preferred embodiment of the invention, a smoothing layer is situated between the anode and the photoactive layer. A preferred material for this smoothing layer comprises a film of 3,4-polyethylenedioxythiophene (PEDOT), or 3,4-polyethylenedioxythiophene: polystyrene-sulfonate (PEDOT:PSS).

In a preferred embodiment of the present invention, the photovoltaic cell comprises, as described for example, in U.S. Pat. No. 6,933,436 a transparent glass carrier, onto which an electrode layer made of indium/tin oxide (ITO) is applied. This electrode layer generally has a comparatively rough surface structure, so that it is covered with a smoothing layer made of a polymer, typically PEDOT, which is made electrically conductive through doping. The photoactive layer is made of two components, has a layer thickness of, for example, 100 nm to a few μm depending on the application method, and is applied onto this smoothing layer. The photoactive layer is made of a compound of the formula I, as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and mixtures thereof.

Before a counter electrode is applied, a thin transition layer, which must be electrically insulating, having a layer thickness of, for example, 0.6 nm, is applied to the photoactive layer. In this exemplary embodiment, this transition layer is made of an alkali halogenide, namely a lithium fluoride, which is vapor deposited in a vacuum of $2 \cdot 10^{-6}$ torr at a rate of 0.2 nm/minute.

If ITO is used as a hole-collecting electrode, aluminum, which is vapor deposited onto the electrically insulating transition layer, is used as an electron-collecting electrode. The electric insulation properties of the transition layer obviously prevent influences which hinder the crossing of the charge carrier from being effective, particularly in the transition region from the photoactive layer to the transition layer.

In a further embodiment of the invention, one or more of the layers may be treated with plasma prior to depositing the next layer. It is particularly advantageous that prior to the deposition of the PEDOT:PSS layer the anode material is subjected to a mild plasma treatment.

As an alternative to PEDOT:PSS a crosslinkable hole-transport material based on triarylamines as referenced in Macromol. Rapid Commun. 20, 224-228 (1999) can be used. In addition to the triarylamine material the layer can also include an electron acceptor to improve electron transport. Such compounds are disclosed in US 2004/0004433. Preferably, the electron acceptor material is soluble in one or more organic solvents. Typically, the electron acceptor material is present in the range of 0.5 to 20% by weight of the triarylamine material.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161 and Christoph Brabec, Energy Environ. Sci 2. (2009) 347-303.

A so called 'tandem solar cell' comprise in this order:
(a) a cathode (electrode),
(b) optionally a transition layer, such as an alkali halogenide, especially lithium fluoride,
(c) a photoactive layer,
(d) optionally a smoothing layer,
(e) a middle electrode (such as Au, Al, ZnO, $TiO_2$ etc.)
(f) optionally an extra electrode to match the energy level,
(g) optionally a transition layer, such as an alkali halogenide, especially lithium fluoride,
(h) a photoactive layer,
(i) optionally a smoothing layer,
(j) an anode (electrode),
(k) a substrate.

The PV device can also be processed on a fiber as described, for example, in US20070079867 and US 20060013549.

Due to their excellent self-organising properties the materials or films comprising the compounds of the formula I, especially IIa, IIb and III can also be used alone or together with other materials in or as alignment layers in LCD or OLED devices, as described for example in US2003/0021913.

Various features and aspects of the present invention are illustrated further in the examples that follow. While these examples are presented to show one skilled in the art how to operate within the scope of this invention, they are not to serve as a limitation on the scope of the invention where such scope is only defined in the claims. Unless otherwise indicated in the following examples and elsewhere in the specification and claims, all parts and percentages are by weight, temperatures are in degrees centigrade and pressures are at or near atmospheric.

EXAMPLE 1

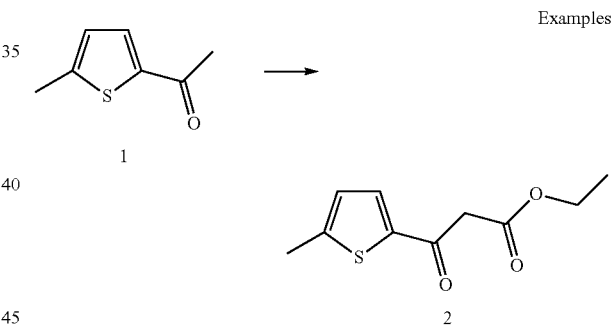

a) 4.28 g of sodium hydride and 8.41 g of diethyl carbonate are suspended in dry toluene. The mixture is heated to 80-90° C. and 5.00 g of 2-acetyl-5-methylthiophene (1) dissolved in dry toluene is added dropwise. The mixture is stirred for 3 hours at 90° C. After cooling to room temperature, glacial acetic acid and ice-cold water are added. The mixture is extracted with toluene. The organic phase is washed with water, dried over MgSat and evaporated. Compound 2 is obtained after Kugelrohr distillation. $^1$H NMR (300 MHz, $CDCl_3$) δ 7.55 1H d, 6.81 1H m, 4.19 2H q, 3.85 2H s, 2.53 3H large s, 1.25 3H t.

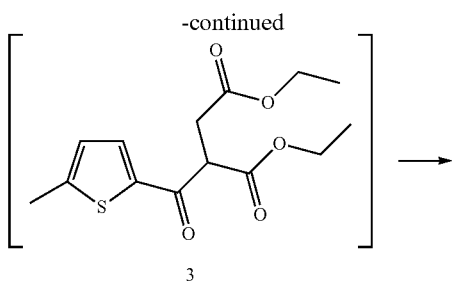

3

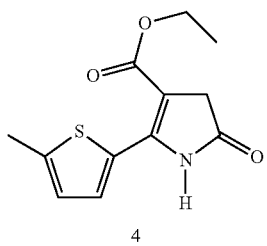

4 b) 1.54 g of sodium ethanolate (22.6 mmol), 4.00 g ethyl 3-(5-methylthiophen-2-yl)-3-oxopropanoate (2) and 6.67 g of ethyl bromoacetate are suspended under argon in absolute ethanol at 0° C. The mixture is stirred overnight. Water is added, ethanol is evaporated and the aqueous solution is extracted with diethyl ether. The organic phase is washed with water containing few drops of concentrated HCl, dried and evaporated to provide diethyl 2-(5-methylthiophene-2-carbonyl)succinate (3) which is used without further purification. A mixture of compound 3 and 11.64 g of ammonium acetate in glacial acetic acid is stirred at 120° C. under argon for 4 hours. After cooling to room temperature, the mixture is poured into water. The precipitate formed is isolated by filtration, washed with water and diethyl ether to provide compound 4. $^1$H NMR (300 MHz, CDCl$_3$) δ 9.57 1H s, 7.61 1H d, 6.81 1H m, 4.24 2H q, 3.53 2H s, 2.54 3H large s, 1.31 3H t.

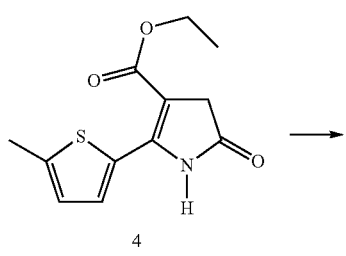

4 c) 2.00 g of sodium tert-amyl alcoholate (1M in tert-amyl alcohol) is added to dry tert-amyl alcohol under argon. 0.73 g of 2-cyanothiophene and 1.2 g of ethyl 2-(methylthiophen-2-yl)-5-oxo-4,5-dihydro-1H-pyrrole-3-carboxylate (4) are added. The mixture is refluxed for 2 hours. After cooling to room temperature, the mixture is poured into methanol acidified with concentrated HCl. The formed precipitate is isolated by filtration, washed successively with water, methanol and diethyl ether and dried to give DPP compound 5. $^1$H NMR (300 MHz, DMSO-d6) δ 11.20 1H s, 11.15 1H s, 8.17 1H dd, 8.02 1H d, 7.93 1H dd, 7.28 1H dd, 7.02 1H m, 2.56 3H large s.

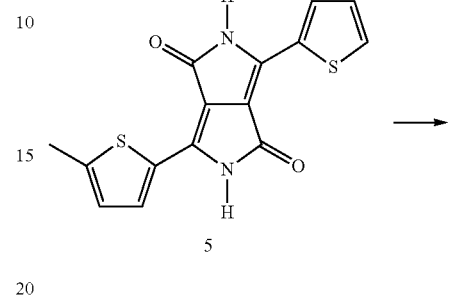

5 d) 2.62 g of DPP derivative 5 and 4.60 g of K$_2$CO$_3$ are suspended under argon in anhydrous N-methyl-2-pyrrolidone and refluxed for 30 minutes. 5.98 g of 1-Iodooctane is added and the reaction is further refluxed for 1 hour. After cooling to room temperature, the mixture is poured into water and a precipitate is isolated by filtration and dried. Compound 6 is obtained after column chromatography on silica gel. $^1$H NMR (300 MHz, CD$_2$Cl$_2$) δ 8.84 1H dd, 8.78 1H d, 7.65 1H dd, 7.28 1H dd, 6.98 1H m, 4.03 4H m, 2.61 3H large s, 1.71 4H m, 1.47-1.18 20H m, 0.87 6H m.

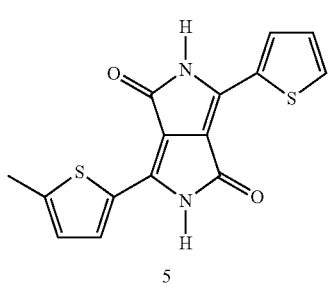

6

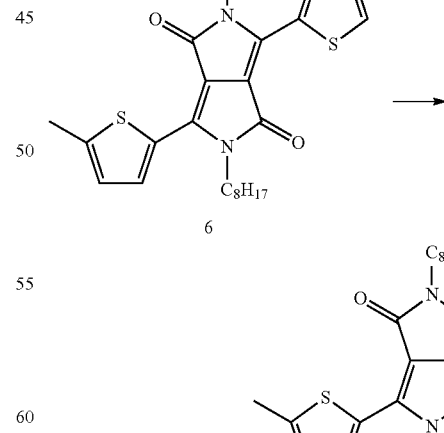

7 e) To a solution of 3.50 g of DPP derivative 6 in chloroform, under light exclusion, is added 1.28 g of N-bromosuccinimide. The mixture is stirred overnight and washed with water. The organic phase is dried, and evaporated to provide compound 7. $^1$H NMR (300 MHz, CDCl$_3$) δ 8.79 1H d, 8.61 1H d, 7.22 1H d, 6.96 1H m, 4.00 4H m, 2.61 3H large s, 1.72 4H m, 1.47-1.18 20H m, 0.86 6H m.

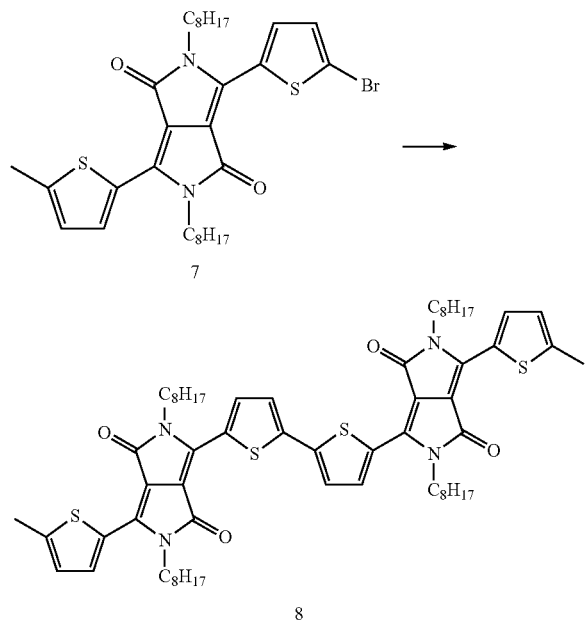

f) 300 mg of compound 7, 37 mg of Pd(OAc)$_2$ and 63 mg of diisopropylethylamine are suspended in anhydrous toluene under argon. The mixture is refluxed overnight. After cooling to room temperature, the mixture is filtered and washed with hot toluene, methanol and diethyl ether. DPP dimer 8 (Cpd. A-15) is obtained after Soxhlet extraction with chloroform. $^1$H NMR (300 MHz, CDCl$_3$, 40° C.) δ 8.88 2H d, 8.79 2H d, 7.43 2H d, 6.96 2H d, 4.16-3.98 8H m, 2.61 6H s, 1.77 8H m, 1.51-1.20 40H m, 0.88 12H m.

EXAMPLE 2

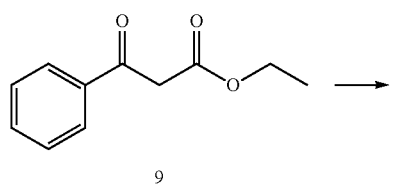

9

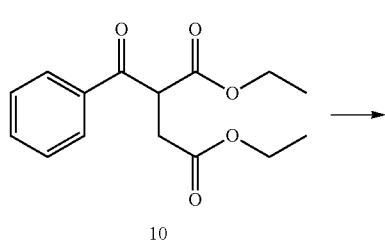

10

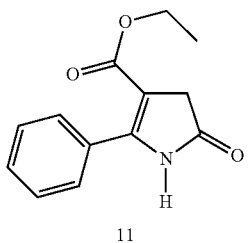

11 a) Compound 11 was synthesized according to a literature procedure. [(a) Morton, C. J. H.; Gilmour, R.; Smith, D. M.; Lightfoot, P.; Slawin, A. M. Z.; MacLean, E. J. *Tetrahedron*, 2002, 58, 5547. (b) Pfenninger, J.; lqbal, A.; Rochat, A. C.; Wallquist, O. U.S. Pat. No. 4,778,899, 1986. (c) Pfenninger, J.; lqbal, A.; Rochat, A. C. U.S. Pat. No. 4,749,795, 1986.]

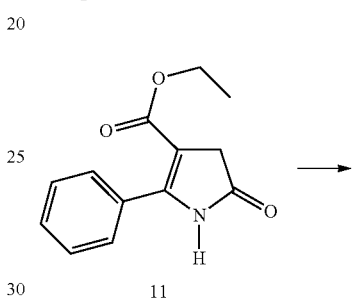

11

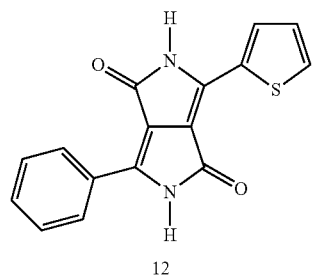

12 b) 1.5 g of compound 11 and 0.71 g of 2-cyanothiophene are added to a boiling solution of 11.0 mL of sodium tert-amyl alcoholate (1M in tert-amyl alcohol) in dry tert-amyl alcohol under argon. The mixture is refluxed for 3 hours. After cooling to room temperature, the mixture is poured into methanol acidified with concentrated HCl. The formed precipitate is isolated by filtration, washed successively with water and methanol and dried to give DPP compound 12. $^1$H NMR (300 MHz, DMSO-d6) δ 11.30 1H s, 11.26 1H s, 8.45-8.42 2H m, 8.28 1H dd, 7.99 1H dd, 7.57-7.54 3H m, 7.32 1H dd.

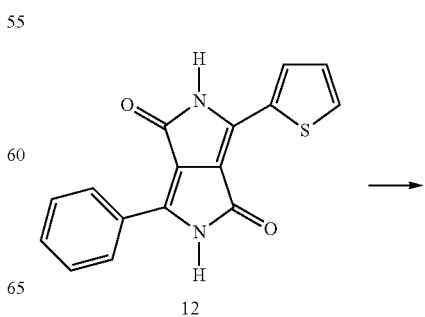

12

-continued

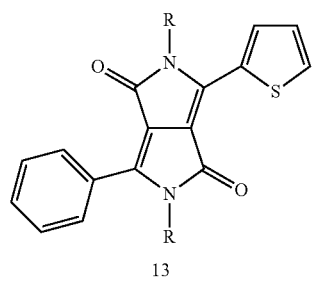

13 c) 294.3 mg of DPP 12 and 552.8 mg of $K_2CO_3$ are suspended in anhydrous DMF and heated for 40 min at 120° C. before 3 equivalents of the alkyliodide are added. The mixture is further stirred at 120° C. for 3 h. After cooling to room temperature, the mixture is poured into water, extracted with $CHCl_3$ and evaporated. The mixture is brought into MeOH and the formed precipitate is isolated by filtration, washed with methanol and dried to give DPP compound 13.

Compound 13a, R=n-octyl:

$^1$H NMR (300 MHz, $CDCl_3$): δ 8.95 1H dd, 7.81-7.78 2H m, 7.66 1H dd, 7.54-7.51 3H m, 7.30 1H dd, 4.00 2H t, 3.82 2H t, 1.76-1.66 2H m, 1.65-1.59 2H m, 1.41-1.20 20H m, 0.90-0.83 6H m.

Compound 13b, R=3,7-dimethyl-octyl:

$^1$H NMR (300 MHz, $CDCl_3$): δ 8.93 1H dd, 7.82-7.79 2H m, 7.65 1H dd, 7.54-7.49 3H m, 7.29 1H dd, 4.11-3.96 2H m, 3.90-3.79 2H m, 1.77-1.05 20H m, 0.97 6H d, 0.86-0.82 12H m.

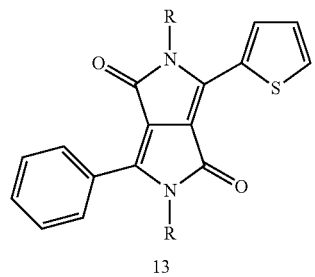

13

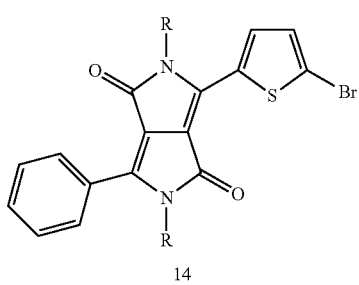

14 d) 88 mg of N-bromosuccinimide is added under light exclusion to a solution of DPP derivative 13 (0.45 mmol) in chloroform under argon. The mixture is stirred overnight and then washed with water. The water phase is extracted with $CHCl_3$. The combined organic phases are dried, filtered and the solvent is removed under reduced pressure. MeOH is added to the crude mixture and compound 14 is obtained as the precipitate which is filtered off, washed with MeOH and dried.

Compound 14a, R=n-octyl:

$^1$H NMR (300 MHz, $CDCl_3$): δ 8.70 1H d, 7.80-7.77 2H m, 7.53-7.51 3H m, 7.25 1H d, 3.92 2H t, 3.81 2H t, 1.74-1.58 2H m, 1.38-1.17 20H m, 0.91-0.80 6H m.

Compound 14b, R=3,7-dimethyl-octyl:

$^1$H NMR (300 MHz, $CDCl_3$): δ 8.67 1H d, 7.81-7.77 2H m, 7.52-7.50 3H m, 7.25 1H d, 4.04-3.80 4H m, 1.70-1.05 20H m, 0.98 6H d, 0.84 12H t.

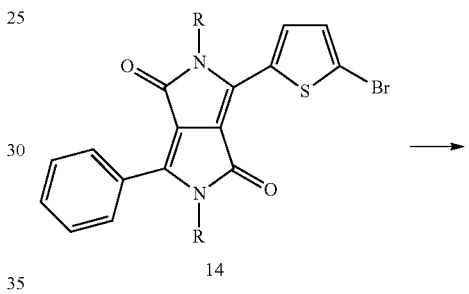

14

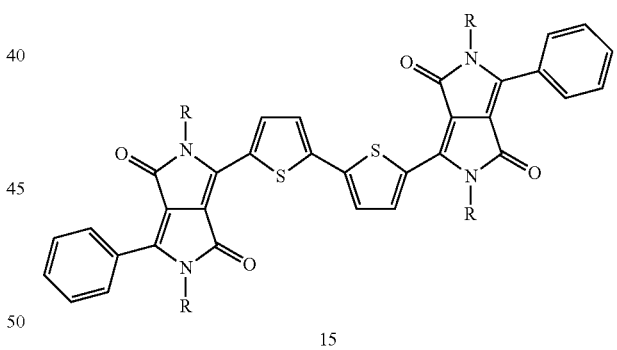

15 e) 0.3 mmol of compound 14, 20 mg of $Pd(OAc)_2$ and 39 mg of diisopropylethylamine are suspended in anhydrous toluene under argon. The mixture is refluxed overnight. After cooling to room temperature, the mixture is filtered over celite, toluene is evaporated and the crude mixture is brought in MeOH. Compound 15 is obtained as the precipitate which is filtered off, washed with MeOH and dried.

Compound 15a, R=n-octyl (Cpd. A-6):

$^1$H NMR (300 MHz, $CDCl_3$) δ 8.88 2H d, 7.75-7.71 4H m, 7.48-7.43 6H m, 7.40 2H d, 3.96 4H t, 3.76 4H t, 1.73-1.62 4H m, 1.60-1.49 4H m, 1.36-1.08 40H m, 0.85-0.78 12H m.

Compound 15b, R=3,7-dimethyl-octyl (Cpd. A-7):

¹H NMR (300 MHz, CDCl$_3$) δ 8.96 2H d, 7.83-7.79 4H m, 7.55-7.51 6H m, 7.46 2H d, 4.11-4.00 4H m, 3.90-3.82 4H m, 1.67-1.42 4H m, 1.79-1.06 4H m, 1.02 12H d, 0.84 24H d.

EXAMPLE 3

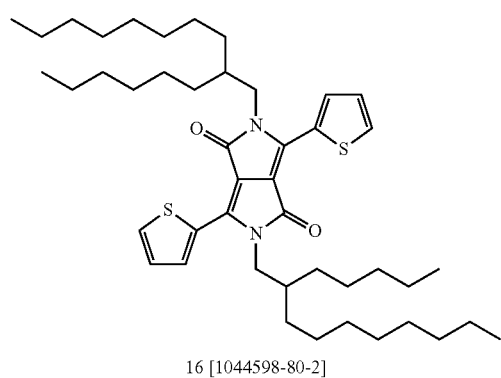

16 [1044598-80-2]

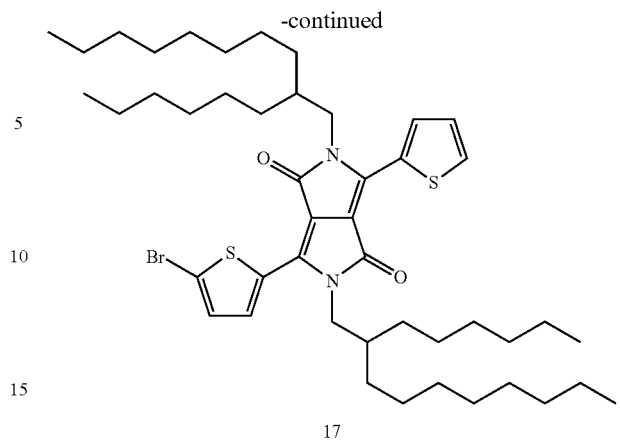

17 a) 0.47 g of N-bromosuccinimide is added under light exclusion to a solution of 2 g DPP derivative 16 [1044598-80-2] in chloroform under argon. The mixture is stirred overnight and then washed with water. The water phase is extracted with CHCl$_3$. The combined organic phases are dried, filtered and the solvent is removed under reduced pressure. Compound 17 is obtained after chromatography over silica gel. ¹H NMR (300 MHz, CDCl$_3$): δ 8.88 1H dd, 8.61 1H d, 7.64 1H d×d, 7.27 1H d, 7.22 1H d, 4.01 2H d, 3.93 2H d, 1.94 1.84 2H m, 1.35-1.15 48H m, 0.88-0.82 12H m.

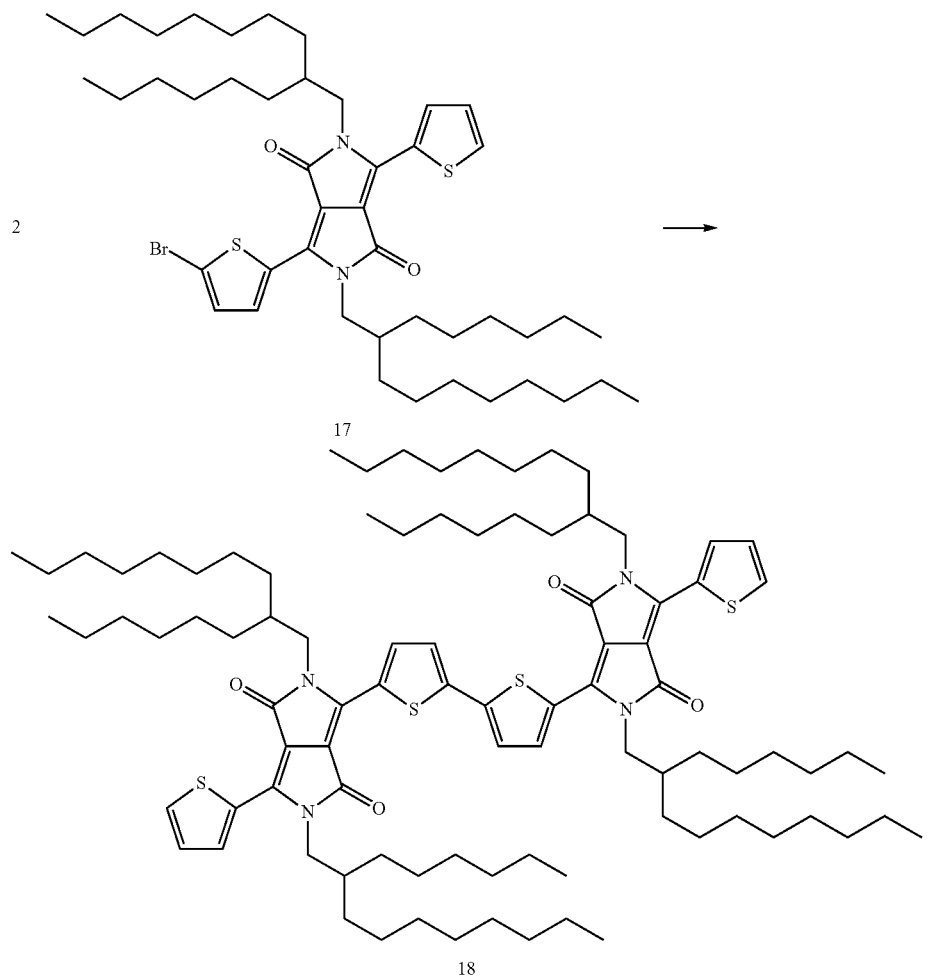

18 b) 259 mg of DPP compound 17, 21 mg of Pd(OAc)$_2$ and 40 mg of diisopropylethylamine are suspended in anhydrous toluene under argon. The mixture is refluxed overnight. After cooling to room temperature, the mixture is filtered over celite, toluene is evaporated and the crude mixture is brought in MeOH. The precipitate is filtered off, washed with MeOH and dried. Compound 18 (Cpd. A-5) is obtained after chromatography over silica gel. $^1$H NMR (300 MHz, CDCl$_3$) δ 8.93-8.90 4H m, 7.64 2H dd, 7.43 2H d, 7.28 2H dd, 4.04 8H d, 1.99-1.89 4H m, 1.30-1.22 48H m, 0.88-0.82 12H m.

EXAMPLE 4

454 mg of DPP compound 19 [1000623-98-2], 34 mg of Pd(OAc)$_2$ and 65 mg of diisopropylethylamine are suspended in anhydrous toluene under argon. The mixture is refluxed overnight. After cooling to room temperature, the mixture is filtered over celite, toluene is evaporated and the crude mixture is brought in MeOH. The precipitate is filtered off, washed with MeOH and dried. Compound 20 (Cpd. A-16) is obtained after chromatography over silica gel. $^1$H NMR (300 MHz, CDCl$_3$) δ 8.91 2H d, 8.63 2H d, 7.41 2H d, 7.21 2H d, 4.02 4H d, 3.95 4H d, 1.98-1.85 4H m, 1.35-1.18 48H m, 0.90-0.79 12H m.

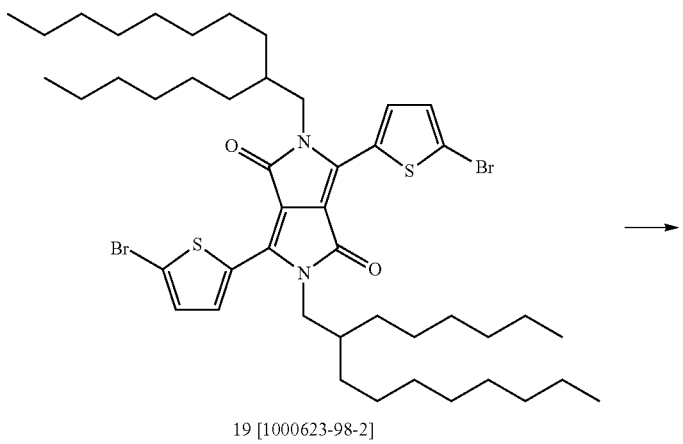

19 [1000623-98-2]

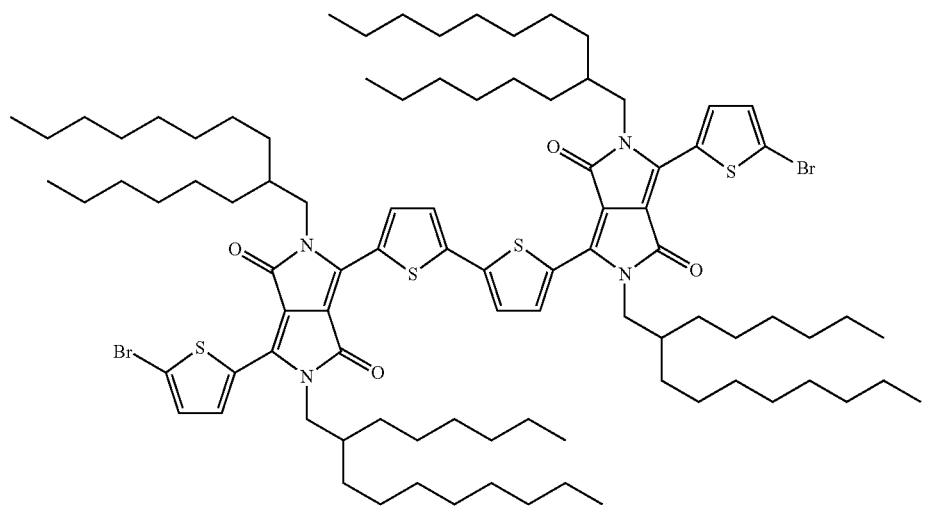

20

EXAMPLE 5

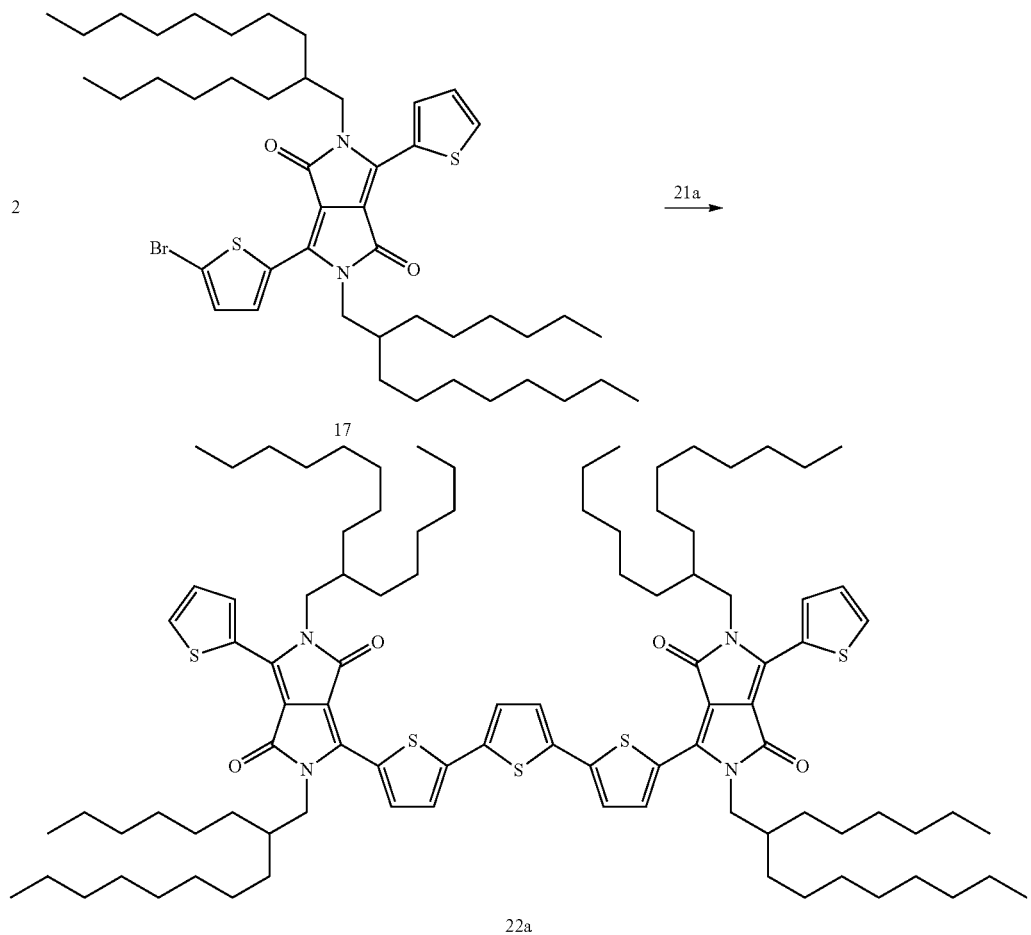

a) 500 mg of brominated DPP compound 17, 0.5 equiv/52 mg of the boron-compound 21a [26076-46-0] and 70 mg of Pd(PPh$_3$)$_4$ are suspended in 15 mL anhydrous toluene under argon. Subsequently, a few drops aliquat 336 are added and 0.23 mL of K$_2$CO$_3$ $_{aqueous}$ (2M).

The mixture is refluxed overnight. After cooling to room temperature, the mixture is filtered over celite, toluene is evaporated and the crude mixture is brought in MeOH. The precipitate is filtered off, washed with MeOH and water, and dried. Compound 22a (Cpd. A-4) is obtained after chromatography over silica gel.

$^1$H NMR (300 MHz, CDCl$_3$) δ 8.93-8.88 4H m, 7.62 2H dd, 7.34 2H d, 7.28-7.25 4H m, 4.03 8H d, 2.00-1.88 4H m, 1.39-1.21 48H m, 0.88-0.82 12H m.

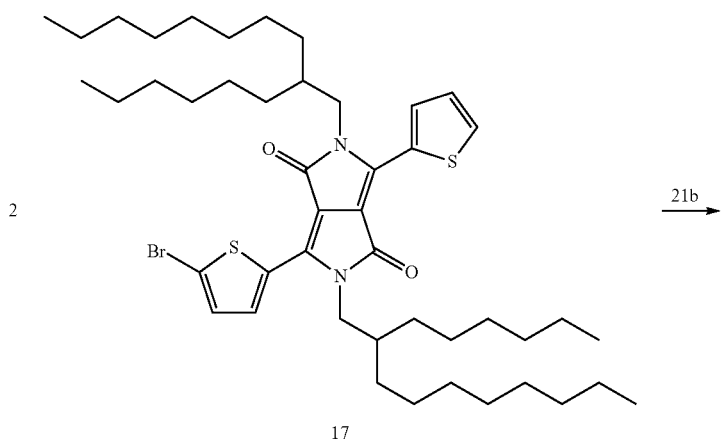

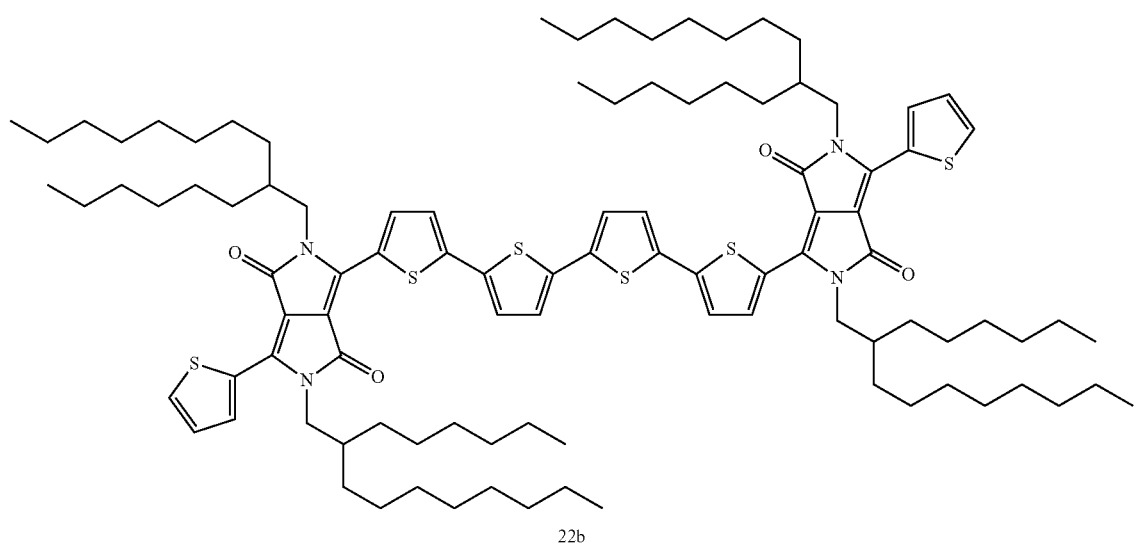

22b b) 500 mg of brominated DPP compound 17, 0.5 equiv/126 mg of the boron-compound 21b [239075-02-6] and 70 mg of Pd(PPh$_3$)$_4$ are suspended in 15 mL anhydrous toluene under argon. Subsequently, a few drops aliquat 336 are added and 0.23 mL of K$_2$CO$_3$ $_{aqueous}$ (2M). The mixture is refluxed overnight. After cooling to room temperature, the mixture is filtered over celite, toluene is evaporated and the crude mixture is brought in MeOH. The precipitate is filtered off, washed with MeOH and water, and dried. Compound 22b (Cpd. A8) is obtained after chromatography over silica gel.

$^1$H NMR (300 MHz, CDCl$_3$) δ 8.93 2H d, 8.89 2H d, 7.62 2H dd, 7.31 2H d, 7.28-7.23 4H m, 7.16 2H d, 4.03 8H d, 2.04-1.87 4H m, 1.31-1.21 48H m, 0.86-0.82 12H m.

EXAMPLE 6

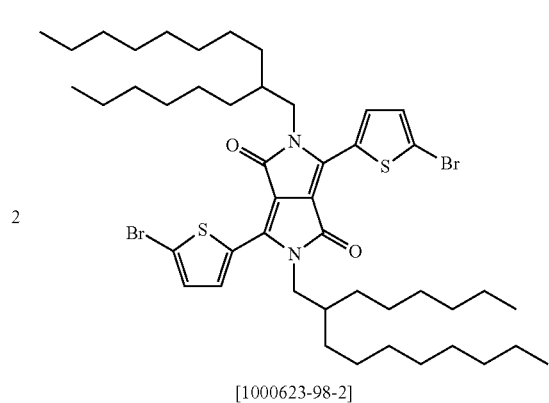

[1000623-98-2]

+

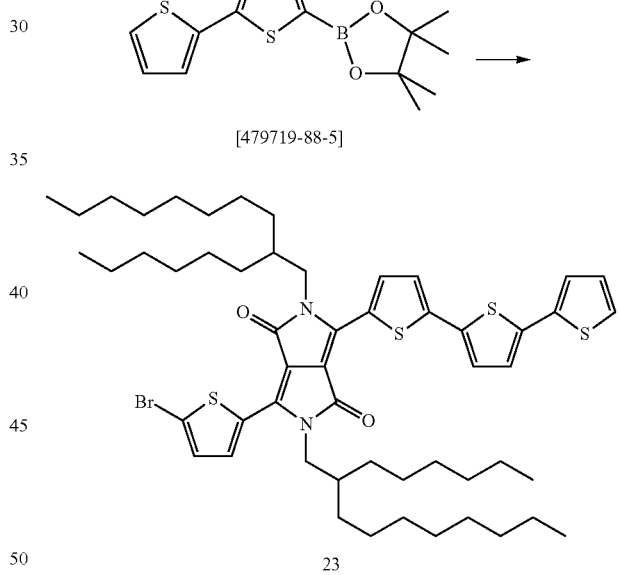

[479719-88-5]

23 a) 12.47 g of [1000623-98-2], 4.02 g of [479719-88-5], 0.25 g of Pd$_2$(dba)$_3$, and 0.19 g Tri-tert-butyl-phosphonium-tetrafluoroborate are suspended under argon in oxygen free tetrahydrofuran. The mixture is refluxed for 30 minutes and then a degassed solution of 7.30 g K$_3$PO$_4$ in 6 ml of water are added. The reaction mixture is then refluxed over night. The reaction mixture is poured on water and extracted with methylene chloride. The organic phase is dried and evaporated. The compound of formula 23 is obtained after chromatography over silica gel. $^1$H-NMR data (ppm, CDCl$_3$): 8.92 1H d, 8.59 1H d, 7.29-7.26 2H m, 7.22-7.19 3H m, 7.12 1H d, 7.04 1H dxd, 4.00 2H d, 3.93 2H d, 1.94 1H broad s, 1.89 1H broad s, 1.41-1.15 48H m, 0.91-0.79 12H m.

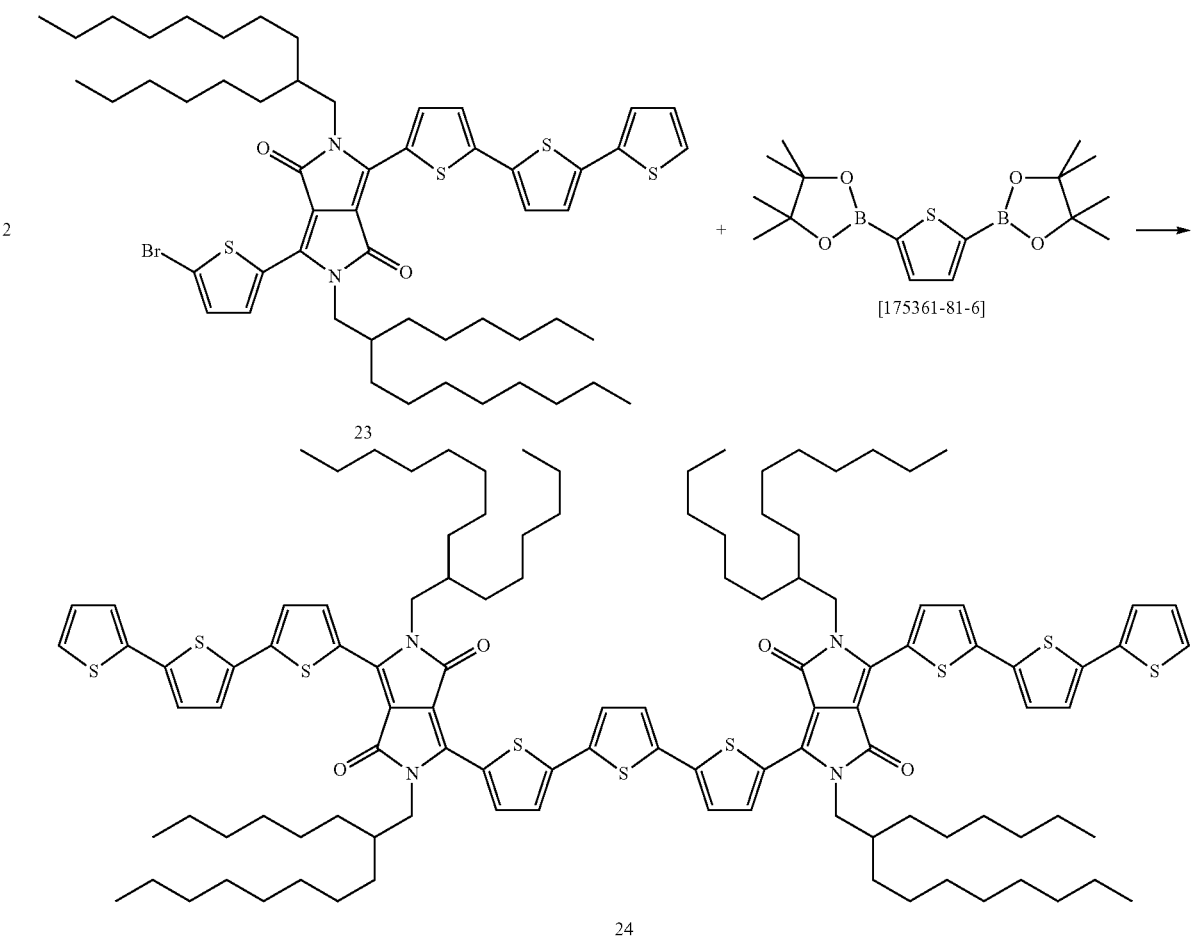

b) 500 mg of compound 23, 85 mg of [175361-81-6], 12 mg of Pd$_2$(dba)$_3$, and 7 mg Tri-tert-butyl-phosphonium-tetrafluoroborate are suspended under Argon in oxygen free tetrahydrofuran. The mixture is refluxed for 30 minutes and then a degassed solution of 0.32 g K$_3$PO$_4$ in 1 ml of water are added. The reaction mixture is then refluxed over night. The reaction mixture is poured on water and extracted with chloroform. The organic phase is dried and evaporated. The compound of formula 24 (Cpd. A-1) is obtained after chromatography over silica gel. $^1$H-NMR data (ppm, CDCl$_3$): 9.05-8.83 4H broad s, 7.82-7.12 12H m, 7.11 2H d, 7.04 2H d×d, 4.04 8H d, 1.97 4H broad s, 1.45-1.15 96H m, 0.86 24H t. The structure of the compound is additionally confirmed by HPLC-MS.

EXAMPLE 7

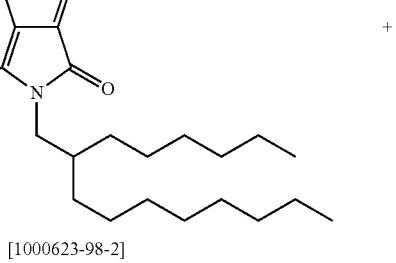

[1000623-98-2]

+

-continued

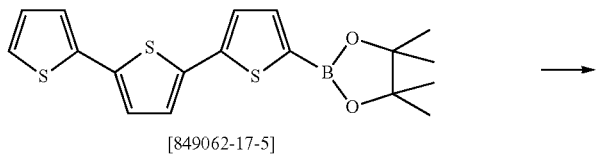
[849062-17-5]

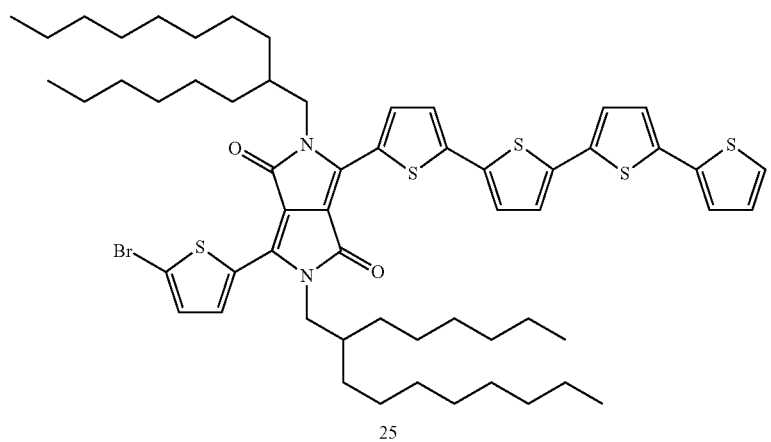
25 a) 4.846 g of [1000623-98-2], 1.031 g of [849062-17-5], 50 mg of $Pd_2(dba)_3$, and 40 mg Tri-tert-butyl-phosphonium-tetrafluoroborate are suspended under Argon in oxygen free tetrahydrofuran. The mixture is refluxed for 30 minutes and then a degassed solution of 2.8 g $K_3PO_4$ in 5 ml of water are added. The reaction mixture is then refluxed over night. The reaction mixture is poured on water and extracted with chloroform. The organic phase is dried and evaporated. The compound of formula 25 is obtained after chromatography over silica gel. $^1$H-NMR data (ppm, $CDCl_3$): 8.94 1H d, 8.61 1H d, 7.32-7.16 6H m, 7.12-7.08 2H m, 7.03 1H d×d, 4.01 2H d, 3.94 2H d, 1.95 1H broad s, 1.91 1H broad s, 1.45-1.15 48H m, 0.95-0.81 12H m.

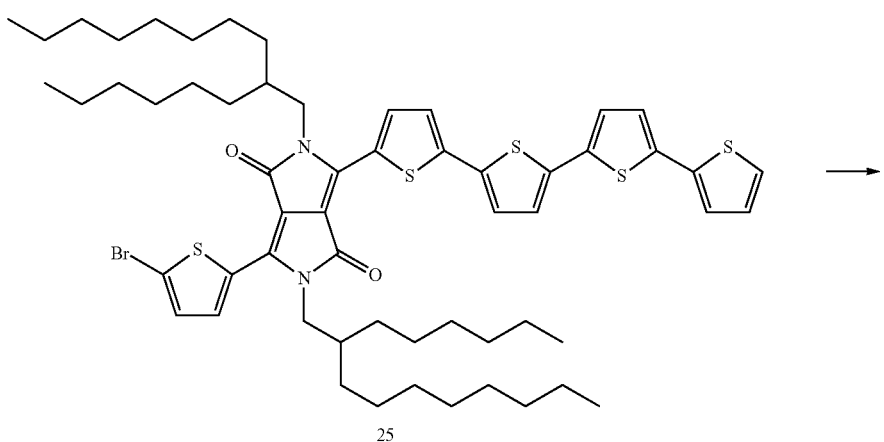
25

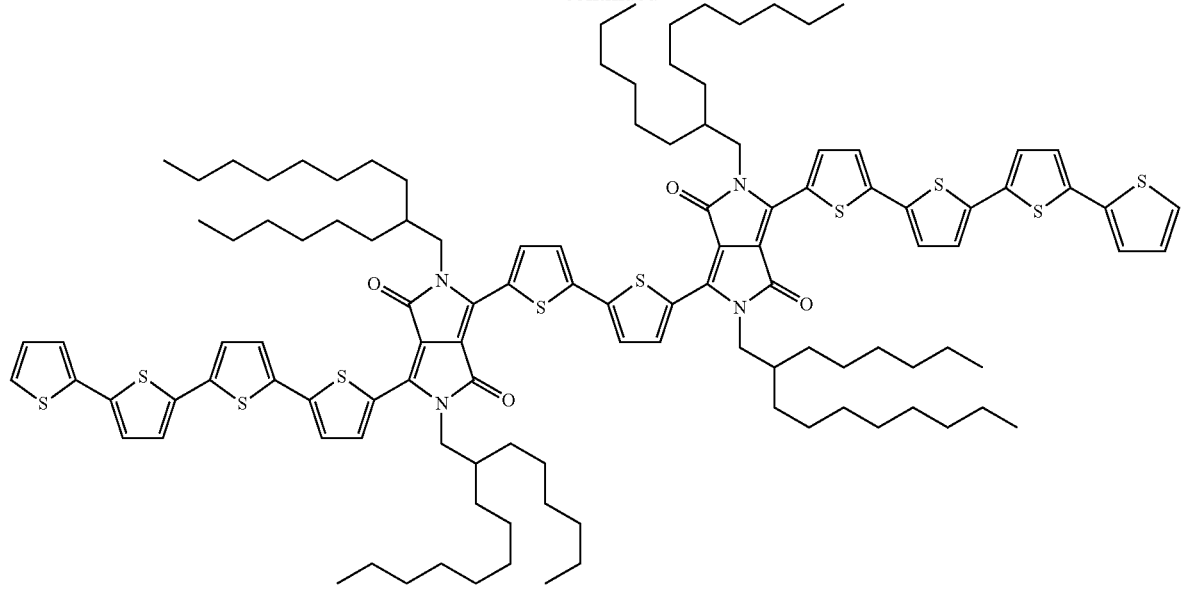

26 b) 17.4 mg of 2,2'-bipyridine and 30.7 mg of Ni(COD)$_2$ are added to a reaction flask under Argon and then 3 ml of degassed toluene are added. The reaction mixture is stirred at room temperature for 30 minutes and then 100 mg of compound 25 are added. The reaction mixture is then stirred at 80° C. for two hours. The reaction mixture is poured on water containing 110 mg of EDTA and stirred for 1 hour at 60° C. The product is then extracted with chloroform. The organic phase is dried and evaporated. The compound of formula 26 (Cpd. A2) is obtained after chromatography over silica gel. $^1$H-NMR data (ppm, CDCl$_3$): 9.05-8.85 4H broad s, 7.26-7.05 8H m, 7.05-6.95 10H m, 4.00 8H broad s, 1.94 4H broad s, 1.45-1.15 96H m, 0.84 24H broad s.

EXAMPLE 8

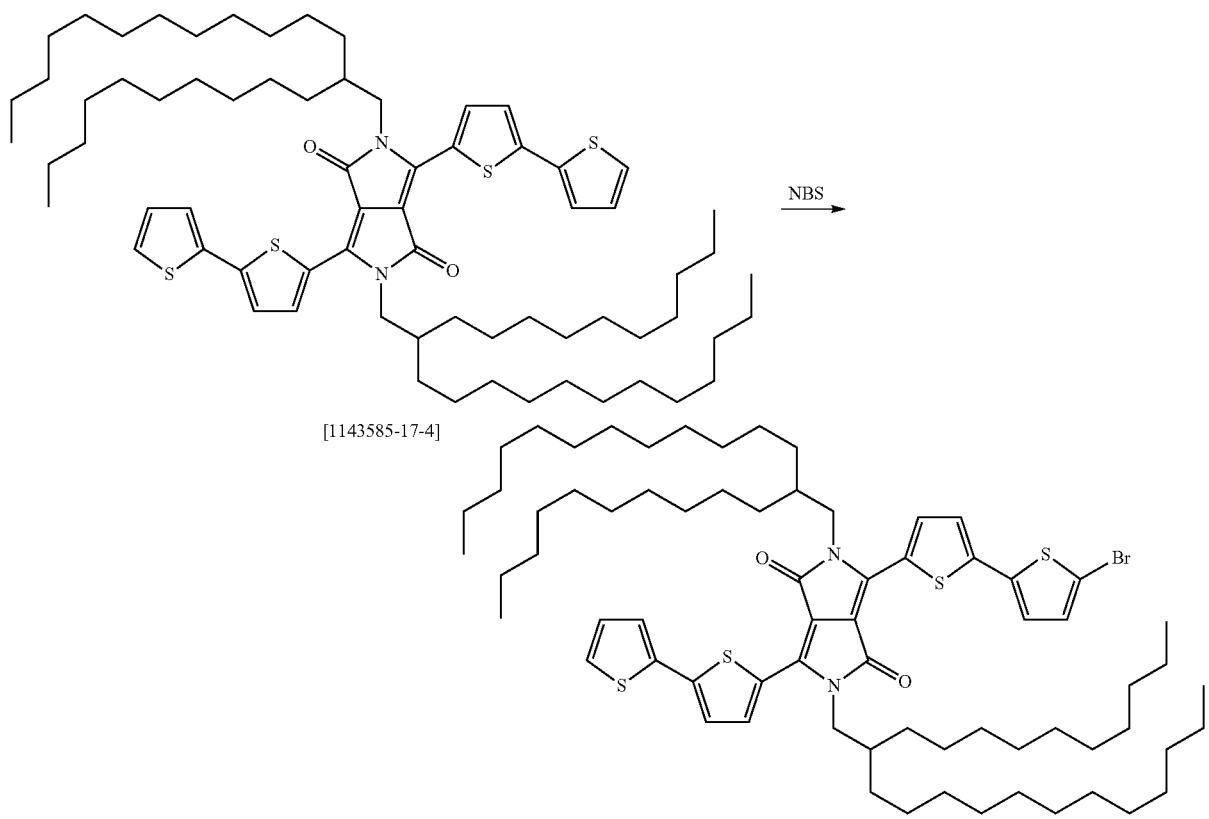

a) 4 g of compound [1143585-17-4] are dissolved in 100 ml chloroform and the mixture is cooled to −5° C. Then 20 mg perchloric acid (70%) are added, followed by the addition of 630 mg of N-bromo-succinic acid (NBS). The mixture is stirred for 1 hour at −5° C., and then washed with water. The organic phase is dried and evaporated. The compound of formula 27 is obtained after chromatography over silica gel. $^1$H-NMR data (ppm, CDCl$_3$): 8.91 1H d, 8.84 1H d, 7.34-7.29 3H m, 7.21 1H d, 7.08-7.01 3H m, 4.02 2H broad d, 4.00 2H broad d, 1.60 1H broad s, 1.56 1H broad s, 1.48-1.15 80H m, 0.90-0.80 12H m.

APPLICATION EXAMPLES 1 TO 7

Bottom Gate Bottom Contact (BGBC) Field-Effect Transistors (FETs)

Standard procedure for transistors on silicon substrates: Heavily doped silicon wafers (Si n$^-$-(425±40 μm) with a 230 nm thick thermally grown silicon dioxide layer having on top of the silicon dioxide layer indium tin oxide (15 nm)/gold (30 nm) contacts are used as substrates.

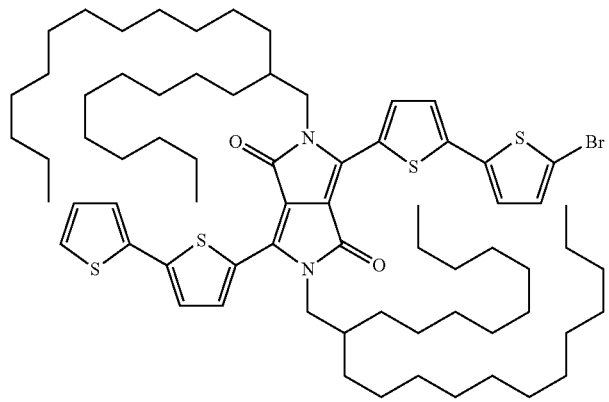

27

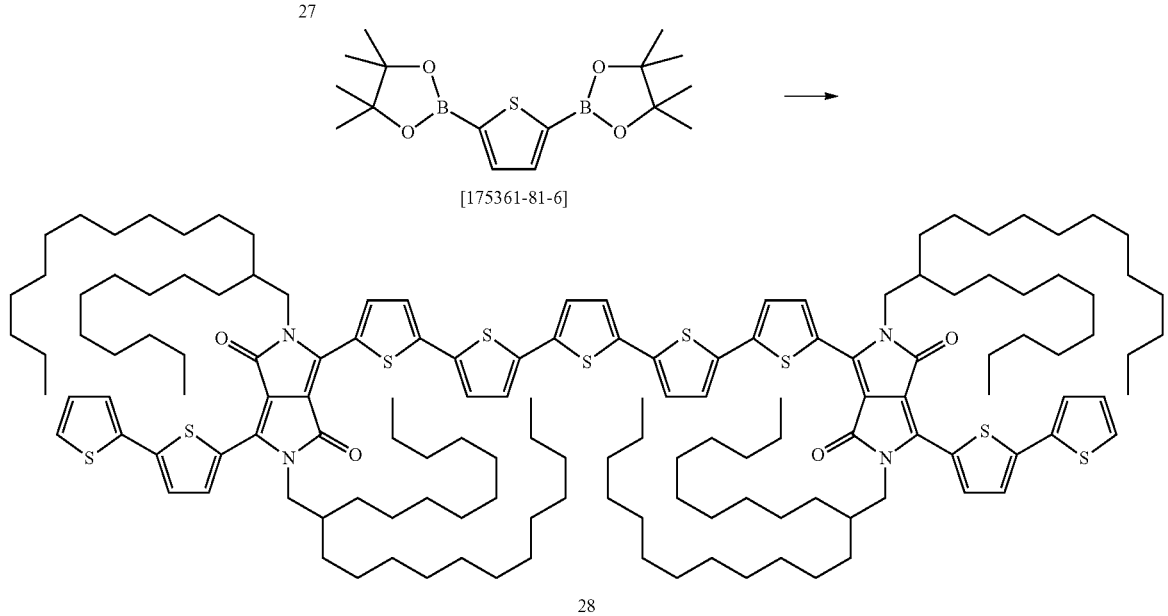

28 b) 500 mg of compound 27, 207 mg of [175361-81-6], 15 mg of Pd$_2$(dba)$_3$, and 11 mg tri-tert-butyl-phosphonium-tetrafluoroborate are suspended under Argon in oxygen free tetrahydrofuran. The mixture is refluxed for 30 minutes and then a degassed solution of 430 mg K$_3$PO$_4$ in 1.5 ml of water are added. The reaction mixture is then refluxed for 3 hours. The reaction mixture is poured on water and extracted with methylene chloride. The organic phase is dried and evaporated. The compound of formula 28 (Cpd. A-3) is obtained after chromatography over silica gel. $^1$H-NMR data (ppm, CDCl$_3$): 8.90 4H broad d, 7.30-7.15 8H m, 7.16 2H d, 7.09-7.00 6H m, 4.01 8H broad d, 1.95 4H broad s, 1.45-1.15 160H m, 0.86 24H broad t.

The substrates are prepared by standard cleaning in acetone and i-propanol followed by oxygen plasma treatment for 30 minutes and are then transferred in a glove box and treated with octyltrichlorosilane (OTS) to achieve a hydrophobic monolayer.

Deposition of Oligomer Film:

The semiconductor is dissolved in a proper solvent (see Table 1) in a concentration of 0.75% by weight at elevated temperature and is spin-coated at 1500 rounds per minute (rpm) for 60 seconds onto the silicon dioxide/silicon substrate.

Deposition of Oligomer/Polymer Film:

The oligomer and polymer are separately dissolved in dry toluene (0.75% by weight) at 80° C. for 4 h, then mixed to achieve the desired ratio and spin-coated at 1500 rpm for 60 seconds onto the silicon dioxide/silicon substrate.

All electrical measurements are performed under a nitrogen atmosphere in a glove box with a gate voltage (Vg) varying from 10 to −30 V and at a drain voltage (Vd) equal to 3 and 30V for the transfer characterisation. For the output characterization Vd is varied from 0 to −30V at Vg=0, 10, 20, 30 V. The reported mobilities represent the saturation mobilities at Vd=30V.

Results of BGBC FET measurements are shown in Table 1 below.

| Appl. Example | Semiconductor | Solvent | Sat. Mobility, cm²/VS | On/Off |
|---|---|---|---|---|
| 1 | A-1 | CHCl₃ | $4.4 * 10^{-2}$ | $1 * 10^{+4}$ |
| 2 | A-4 | Toluene | $1.5 * 10^{-7}$ | 4 |
| 3 | A-2 | CHCl₃ | $3.5 * 10^{-2}$ | $1.5 * 10^{+4}$ |
| 4 | A-3 | CHCl₃ | $3.2 * 10^{-3}$ | $6.5 * 10^{+4}$ |
| 5 | A-4 + 10 wt-% P-1 | Toluene | $6.0 * 10^{-5}$ | $7.7 * 10^{+2}$ |
| 6 | A-4 + 90 wt-% P-1 | Toluene | $1.2 * 10^{-1}$ | $3.0 * 10^{+6}$ |
| 7 | P-1 | Toluene | $7.3 * 10^{-2}$ | $6.1 * 10^{+4}$ |

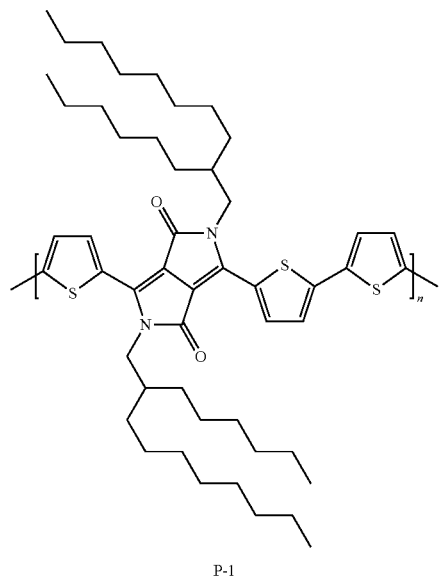

P-1
(WO2010/049321; Example 1 of Mw = 39'500, Polydispersity = 2.2 (measured by HT-GPC).

APPLICATION EXAMPLES 8 TO 12

Top Gate Bottom Contact (TGBC) FETs

Standard Procedure for Transistors on PET Substrates:

PET substrates with lithographically patterned gold contacts (50 nm) covered with a photoresist are used as substrates. The substrates are prepared by cleaning in acetone and ethanol and dried at 60° C. for 30 min. The oligomer and polymer are separately dissolved in dry toluene (0.75 wt %) at 80° C. for 4 h and then mixed to achieve the desired ratio, filtered through a 0.45μ filter, spin-coated to achieve a 50 nm semiconductor layer and dried at 80° C. for 30 seconds. Immediately thereafter a 500 nm thick layer of a dielectric (Allresist GmbH, 950K, 4% by weight polymethylmethacrylate (PMMA) in butylacetate: ethyllactate solvent mixture) is spin-coated and dried at 80° C. for 2 minutes. A 120 nm thick gold electrode is evaporated through a shadow mask for gate contact.

The results of the TGBC FET measurements are reported in the Table 2 below:

| Example | Semiconductor | Sat. Mobility, cm²/VS | rel. Sigma Mobility Sat, % |
|---|---|---|---|
| 8 | P-1 | 0.24 | 29 |
| 9 | A-1 + 99% P-1 | 0.09 | 40 |
| 10 | A-1 + 90% P-1 | 0.21 | 27 |
| 11 | A-4 + 99 wt-% P-1 | 0.22 | 13 |
| 12 | A-4 + 90 wt-% P-1 | 0.10 | 10 |

EXAMPLE 15

Organic Bulk Heterojunction Solar Cell

The solar cell has the following structure: Al electrode/LiF layer/organic layer, comprising a compound of the present invention and [60]PCBM/[poly(3,4-ethylenedioxythiophene) (PEDOT) in admixture with poly(styrenesulfonic acid) (PSS)]/ITO electrode/glass substrate. The solar cells are made by spin coating a layer of the PEDOT-PSS on a prepatterned ITO on glass substrate. Then a 1:1 mixture of the compound of the present invention (1% by weight): [60] PCBM (a substituted C₆₀ fullerene) is spin coated from orthodichlorobenzene (DCB). (organic layer). LiF and Al are sublimed under high vacuum through a shadow-mask.

Solar Cell Performance:

The solar cell is measured under Aescusoft solar light simulator with halogen light source. The current is estimated under AM1.5 conditions using the External Quantum Efficiency (EQE) graph.

The results of the measurements are reported in Table 3 below.

| Example | Semiconductor | JSC mA/cm² | Voc, V | FF, % | η % |
|---|---|---|---|---|---|
| 13 | A-1 | 4.05 | 0.65 | 56 | 1.47 |
| 14 | A-3 | 1.6 | 0.76 | 51 | 0.62 |

Adding small amounts of oligomer A-4 (up to 10%) to polymer P-1 preserves a good field effect mobility of polymer P-1, while at the same time the homogeneity of the films is improved and the statistical stread of the mobility from device to device is reduced, i.e. device reproducibility is enhanced.

The invention claimed is:

1. A composition, comprising:

(a) a compound of the formula

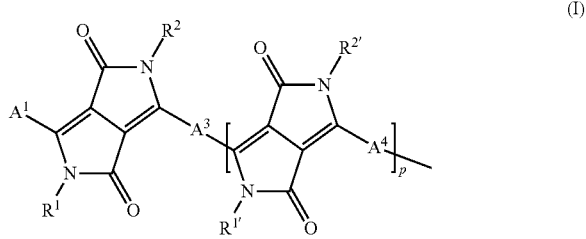

(I)

-continued

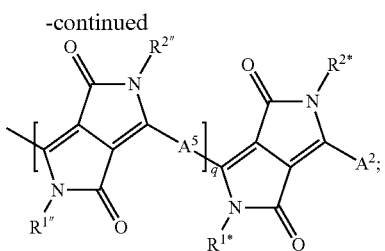

and
(b) a polymeric material,
wherein
p is 0, or 1,
q is 0, or 1,
$A^1$ and $A^2$ are independently of each other a group of formula

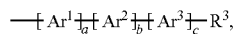

or have the meaning of $R^5$,
$A^3$, $A^4$ and $A^5$ are independently of each other a group of formula

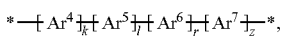

a is 1 or 2;
b is 0, 1 or 2;
c is 0, 1 or 2;
k is 0, 1, or 2;
l is 1, 2, or 3;
r is 0, or 1;
z is 0, 1 or 2;
$R^1$, $R^2$, $R^{1'}$, $R^{2'}$, $R^{1''}$, $R^{2''}$, $R^{1*}$ and $R^{2*}$ are optionally the same or different and are each independently selected from
hydrogen,
a $C_1$-$C_{100}$alkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_2$-$C_{100}$alkenyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_3$-$C_{100}$alkinyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_3$-$C_{12}$cycloalkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_6$-$C_{24}$aryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group,
a $C_2$-$C_{20}$heteroaryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, and
—CO—$C_1$-$C_{18}$alkyl, —CO—$C_5$-$C_{12}$cycloalkyl, —COO—$C_1$-$C_{18}$alkyl;
$R^3$ is hydrogen, halogen, cyano, $C_1$-$C_{25}$alkyl, $C_1$-$C_{25}$alkyl which is substituted by E and/or interrupted by D,

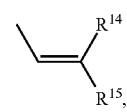

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^5$ is

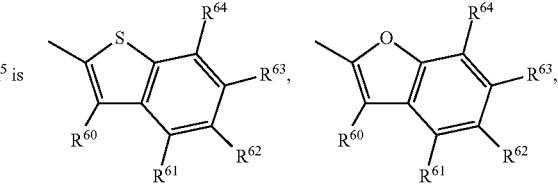

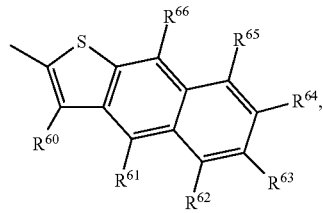

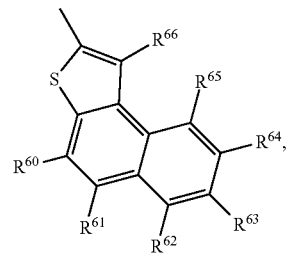

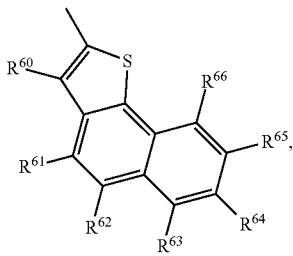

111
-continued
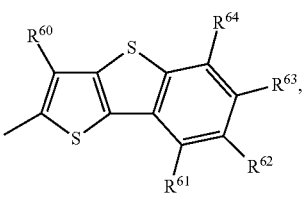
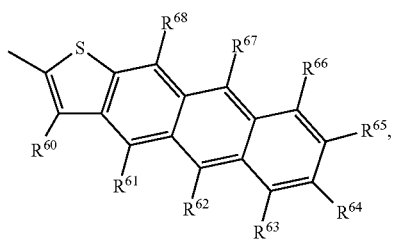
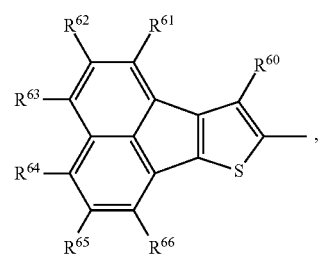
R⁶ is 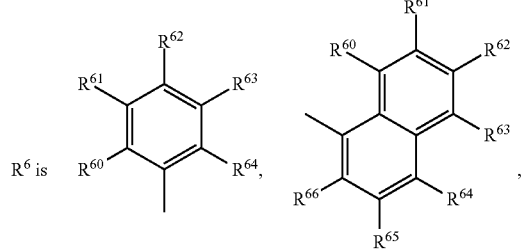
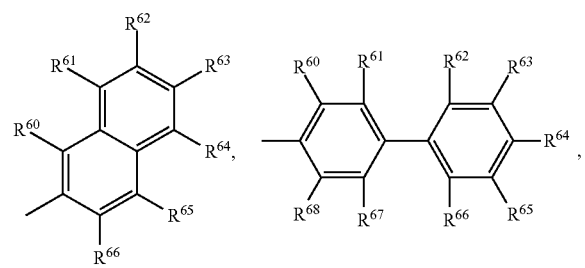
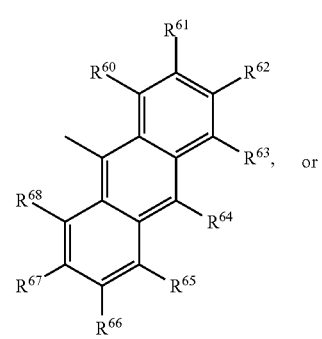
112
-continued
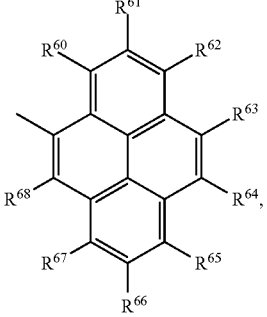
Ar¹, Ar², Ar³, Ar⁴, Ar⁵, Ar⁶ and Ar⁷ are each independently one of a bivalent group of formula
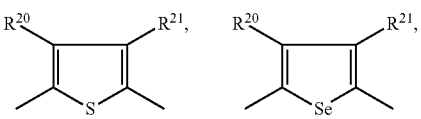
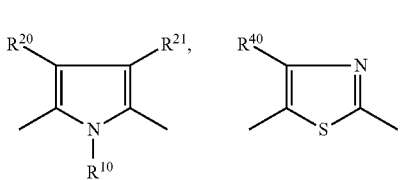
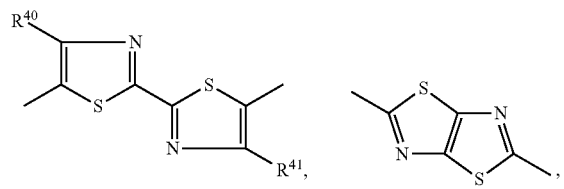
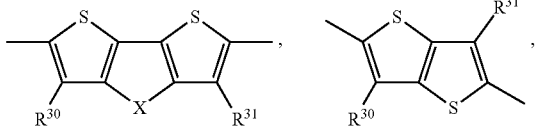
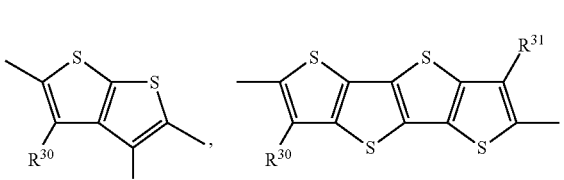
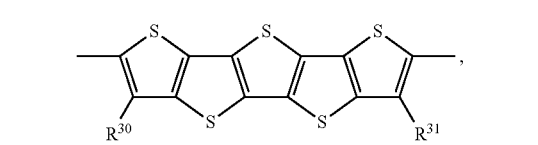
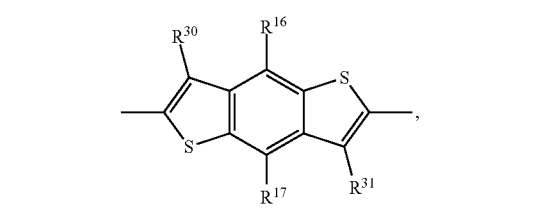

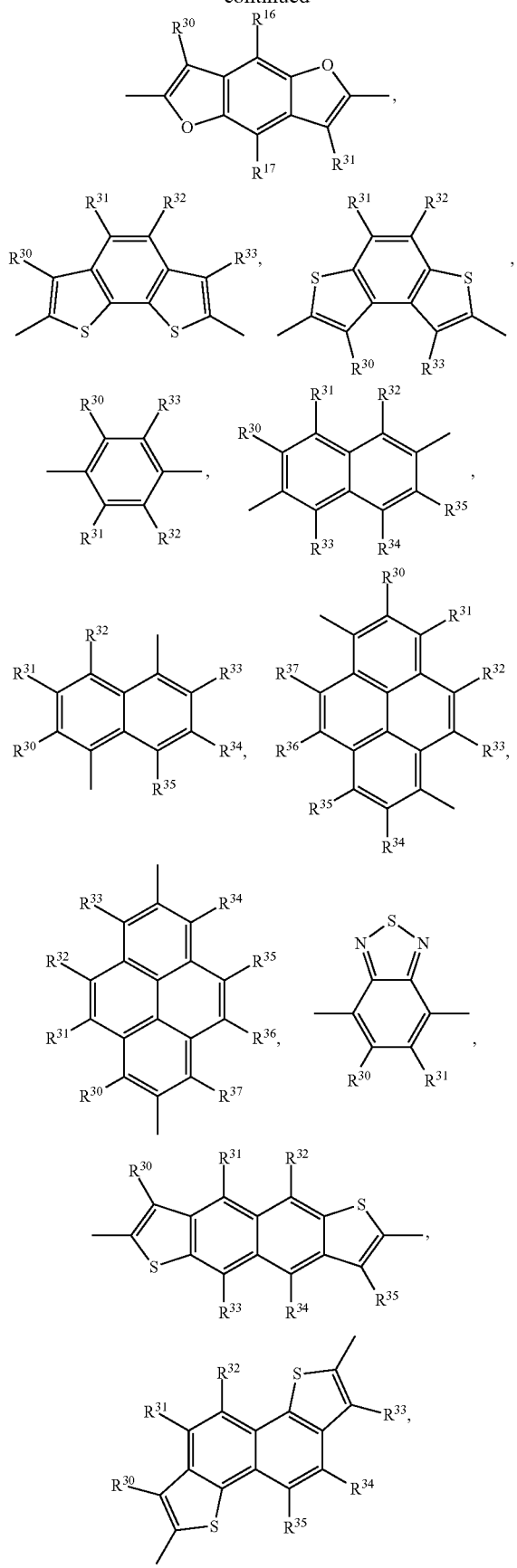
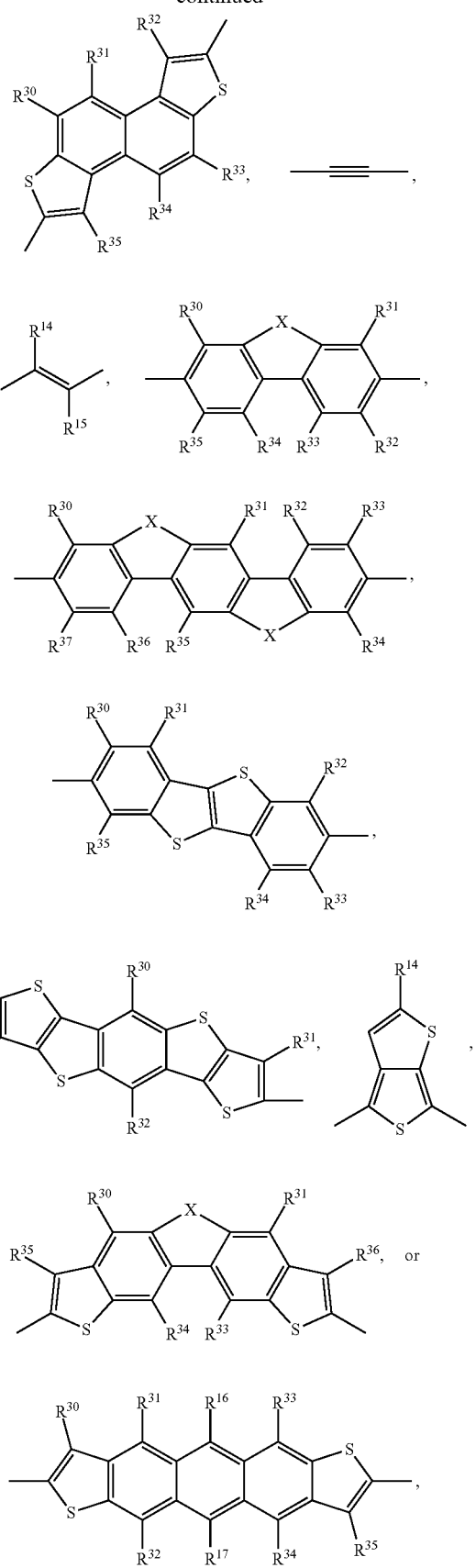

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,

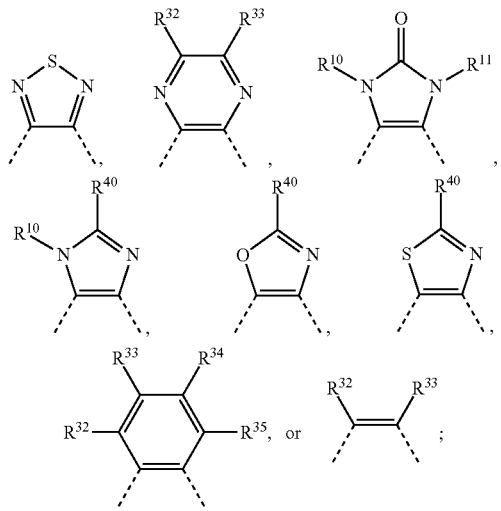

R$^{10}$ and R$^{11}$ are each independently hydrogen, C$_1$-C$_{18}$alkyl, C$_1$-C$_{18}$haloalkyl, C$_7$-C$_{25}$arylalkyl, or C$_1$-C$_{18}$alkanoyl, R$^{12}$ and R$^{13}$ are each independently hydrogen, C$_1$-C$_{18}$alkyl, C$_1$-C$_{18}$haloalkyl, C$_7$-C$_{25}$arylalkyl, C$_6$-C$_{24}$aryl, or C$_2$-C$_{20}$heteroaryl, or R$^{12}$ and R$^{13}$ together represent oxo,

or form a five or six membered ring, which is unsubstituted or substituted by C$_1$-C$_{18}$alkyl and/or C$_1$-C$_{18}$alkoxy;

R$^{14}$ and R$^{15}$ are each independently hydrogen, C$_1$-C$_{18}$alkyl, C$_6$-C$_{24}$aryl, C$_2$-C$_{20}$heteroaryl, —CN or COOR$^{50}$;

R$^{16}$ and R$^{17}$ are each independently hydrogen, halogen, C$_1$-C$_{25}$alkyl, C$_1$-C$_{25}$alkoxy, C$_7$-C$_{25}$arylalkyl, or

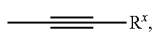

R$^x$ is a C$_1$-C$_8$alkyl group, or a tri(C$_1$-C$_8$alkyl)silyl group,

R$^{18}$ and R$^{19}$ are each independently hydrogen, C$_1$-C$_{18}$alkyl, C$_7$-C$_{25}$arylalkyl, or a phenyl group, which optionally can be substituted one to three times with C$_1$-C$_8$alkyl and/or C$_1$-C$_8$alkoxy, R$^{20}$ and R$^{21}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, or R$^{20}$ and R$^{21}$ together represent alkylene or alkenylene which are optionally both bonded via oxygen and/or sulfur to the (hetero)aromatic residue and which are optionally both have up to 4 carbon atoms, R$^{30}$ to R$^{37}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{40}$ and R$^{41}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{50}$ is C$_1$-C$_{25}$alkyl, C$_1$-C$_{25}$haloalkyl, C$_7$-C$_{25}$arylalkyl, C$_6$-C$_{24}$aryl or C$_2$-C$_{20}$heteroaryl;

R$^{60}$ to R$^{68}$ are each independently H, halogen, cyano, C$_1$-C$_{25}$alkyl, C$_1$-C$_{25}$alkyl which is substituted by E and/or interrupted by D, C$_6$-C$_{24}$aryl, C$_6$-C$_{24}$aryl which is substituted by G, C$_2$-C$_{20}$heteroaryl, C$_2$-C$_{20}$heteroaryl which is substituted by G, C$_3$-C$_{12}$cycloalkyl, C$_3$-C$_{12}$cycloalkyl, which is substituted by G, C$_2$-C$_{18}$alkenyl, C$_2$-C$_{18}$alkynyl, C$_1$-C$_{18}$alkoxy, C$_1$-C$_{18}$alkoxy which is substituted by E and/or interrupted by D, C$_7$-C$_{25}$aralkyl, or C$_7$-C$_{25}$aralkyl, which is substituted by G, D is —CO—, —COO—, —S—, —O—, —NR$^{39}$—, or —C(=O)NR$^{39}$—, E is C$_1$-C$_8$thioalkoxy, COO—C$_1$-C$_{18}$alkyl, C$_1$-C$_8$alkoxy, CN, —NR$^{39}$R$^{39'}$, —CONR$^{39}$R$^{39'}$, or halogen, G is E, or C$_1$-C$_{18}$alkyl, and R$^{39}$ and R$^{39'}$ are each independently hydrogen, C$_1$-C$_{18}$alkyl, C$_1$-C$_{18}$haloalkyl, C$_7$-C$_{25}$arylalkyl, or C$_1$-C$_{18}$alkanoyl, with the proviso that, if the polymeric material is a diketopyrrolopyrrole (DPP) polymer, a quotient of a weight average molecular weight of the DPP polymer and a molecular weight of the repeating unit of the polymer is at least 5.

2. The composition according to claim 1, wherein the polymeric material b) is selected from the group consisting of

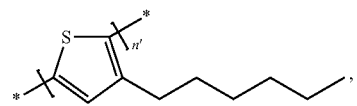

wherein n' is from 10 to 1000 and polymers comprising diketopyrrolopyrrole (DPP) repeating units.

3. The composition according to claim 2, wherein the polymeric material is a polymer of formula:

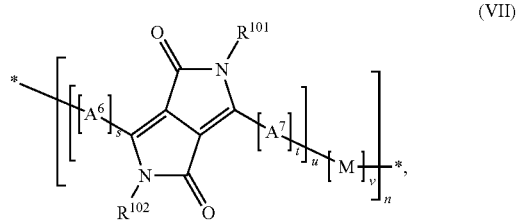

(VII)

wherein
each R$^{101}$ and R$^{102}$ have the meaning of R$^1$;
each A$^6$ and A$^7$ is independently selected from optionally substituted aryl and heteroaryl groups;
each M is an optional, conjugated moiety;
s is a number from 1 to 4;
t is a number from 1 to 4;
u is a number that is at least 1;
v is a number from 0 to 20; and
n is a number that is at least 5.

4. The composition according to claim 1, wherein the compound of formula I is a compound of formula

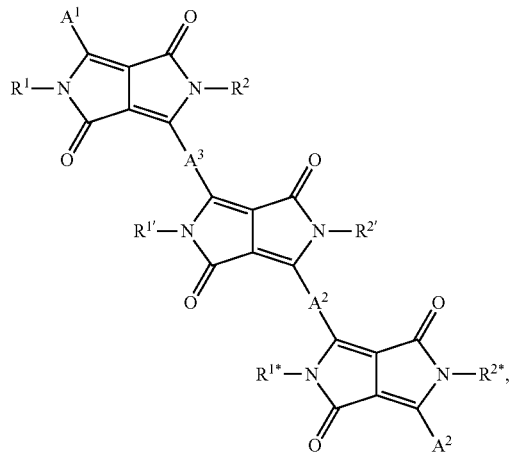

(IIa)

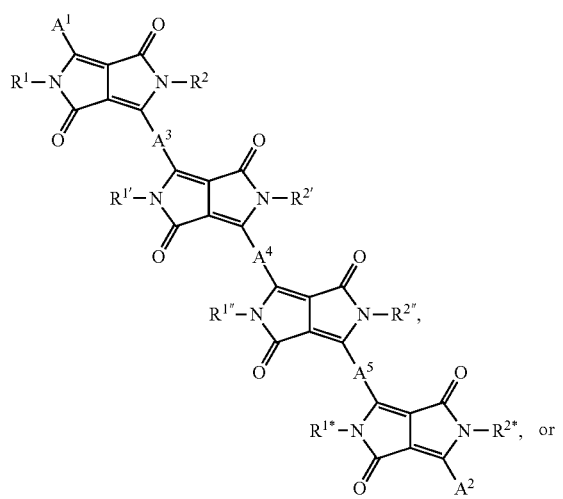

(IIb)

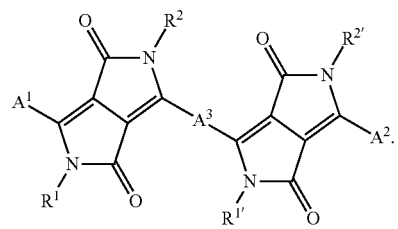

(III)

5. A compound of formula

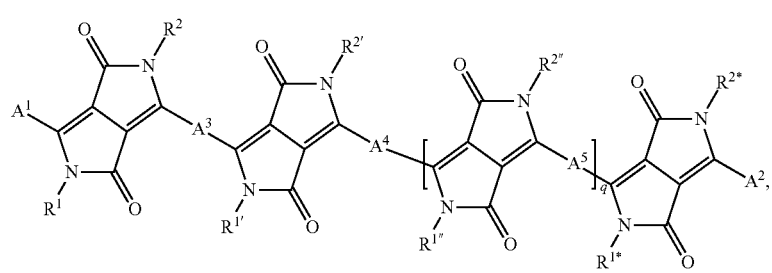

(II)

wherein
q is 0, or 1,
$A^1$ and $A^2$ are independently of each other a group of formula

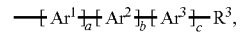

or have the meaning of $R^5$,
$A^3$, $A^4$ and $A^5$ are independently of each other a group of formula

a is 1 or 2;
b is 0, 1 or 2;
c is 0, 1 or 2;
k is 0, 1, or 2;
l is 1, 2, or 3;
r is 0, or 1;
z is 0, 1 or 2;
$R^1$, $R^2$, $R^{1'}$, $R^{2'}$, $R^{1''}$, $R^{2''}$, $R^{1*}$ and $R^{2*}$ are optionally the same or different and are each independently selected from
hydrogen,
a $C_1$-$C_{100}$alkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_2$-$C_{100}$alkenyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_3$-$C_{100}$alkinyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—,
a $C_3$-$C_{12}$cycloalkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_6$-$C_{24}$aryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, a $C_2$-$C_{20}$heteroaryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, and —CO—$C_1$-$C_{18}$alkyl, —CO—$C_5$-$C_{12}$cycloalkyl, —COO—$C_1$-$C_{18}$alkyl;

$R^3$ is hydrogen, halogen, cyano, $C_1$-$C_{25}$alkyl, $C_1$-$C_{25}$alkyl which is substituted by E and/or interrupted by D,

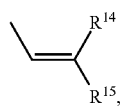

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^5$ is 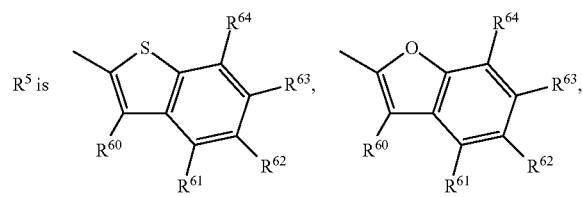

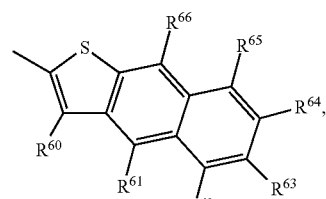

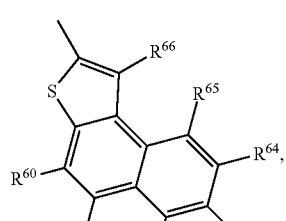

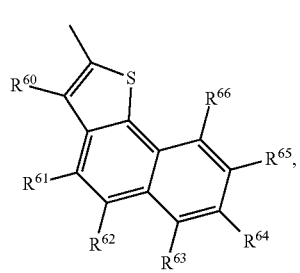

-continued

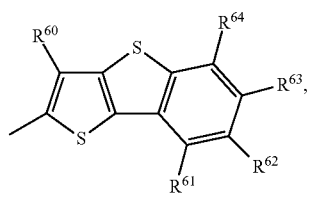

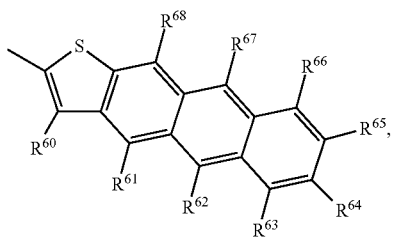

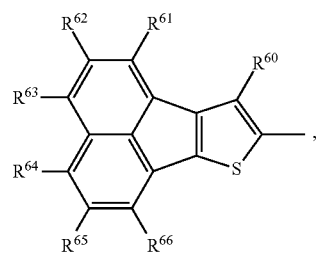

$R^6$ is 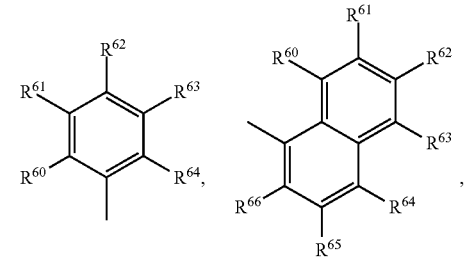

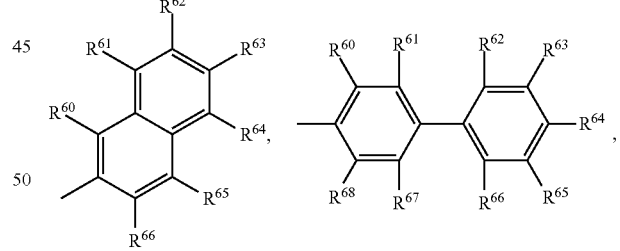

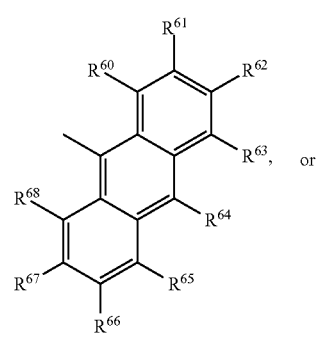

-continued
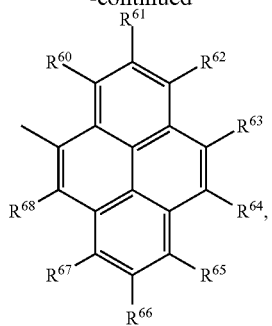
Ar¹, Ar², Ar³, Ar⁴, Ar⁵, Ar⁶ and Ar⁷ are each independently one of a bivalent group of formula
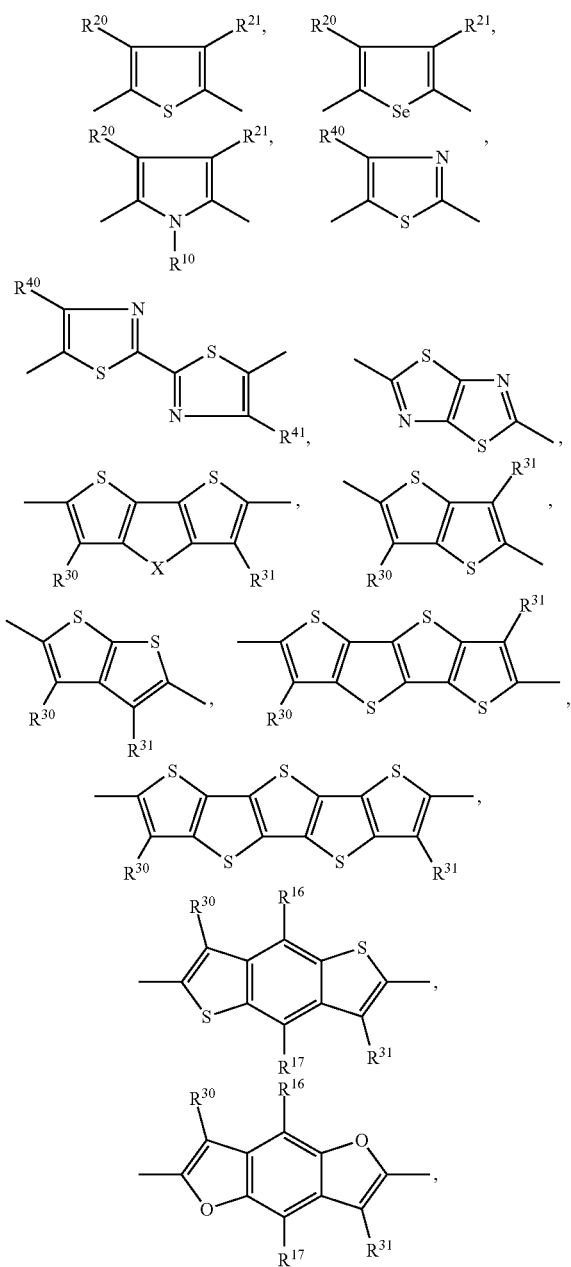
-continued
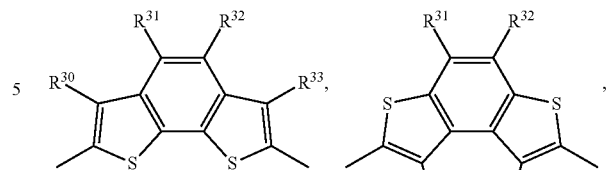
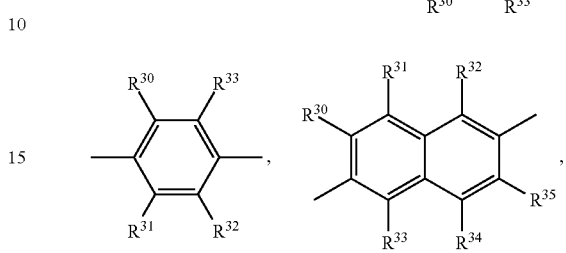
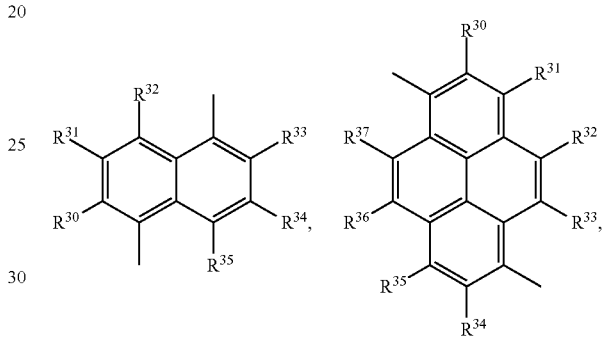
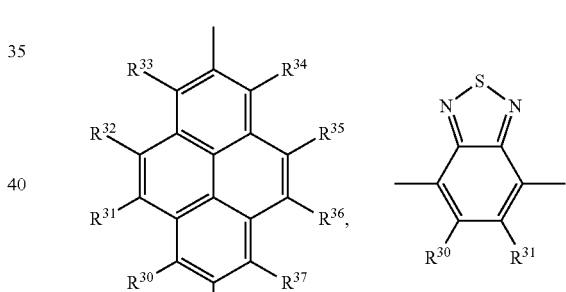
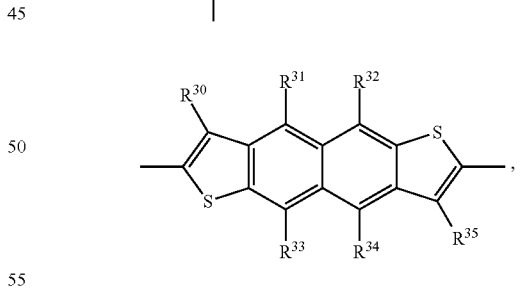
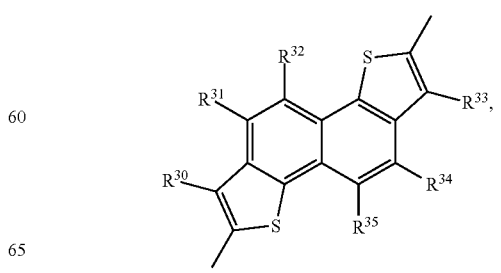

-continued

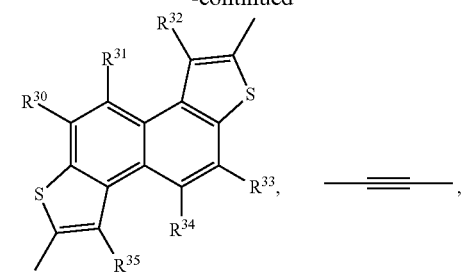

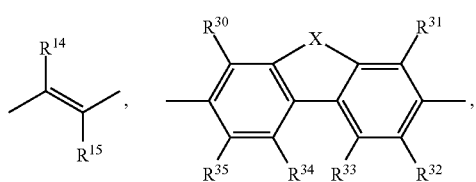

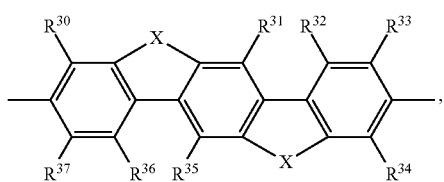

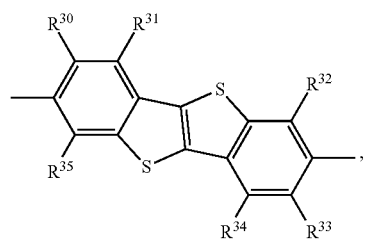

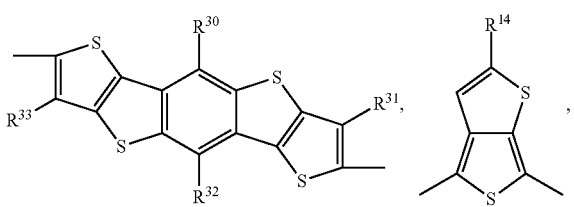

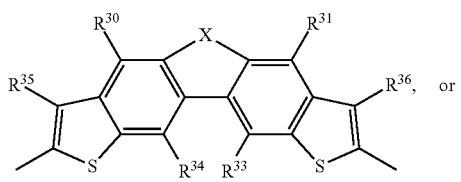

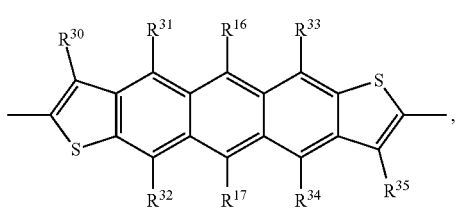

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,

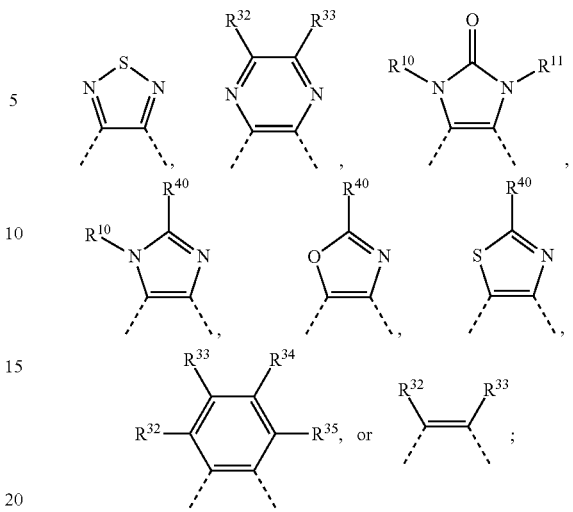

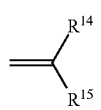

or form a five or six membered ring, which is unsubstituted or substituted by $C_1$-$C_{18}$alkyl and/or $C_1$-$C_{18}$alkoxy;

R$^{10}$ and R$^{11}$ are each independently hydrogen, $C_1$-$C_{18}$alkyl, $C_1$-$C_{18}$haloalkyl, $C_7$-$C_{25}$arylalkyl, or $C_1$-$C_{18}$alkanoyl, R$^{12}$ and R$^{13}$ are each independently hydrogen, $C_1$-$C_{18}$alkyl, $C_1$-$C_{18}$haloalkyl, $C_7$-$C_{25}$arylalkyl, $C_6$-$C_{24}$aryl, or $C_2$-$C_{20}$heteroaryl, or R$^{12}$ and R$^{13}$ together represent oxo, R$^{14}$ and R$^{15}$ are each independently hydrogen, $C_1$-$C_{18}$alkyl, $C_6$-$C_{24}$aryl, $C_2$-$C_{20}$heteroaryl, —CN or COOR$^{50}$;

R$^{16}$ and R$^{17}$ are each independently hydrogen, halogen, $C_1$-$C_{25}$alkyl, $C_1$-$C_{25}$alkoxy, $C_7$-$C_{25}$arylalkyl, or

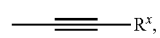

R$^x$ is a $C_1$-$C_8$alkyl group, or a tri($C_1$-$C_8$alkyl)silyl group,

R$^{18}$ and R$^{19}$ are each independently hydrogen, $C_1$-$C_{18}$alkyl, $C_7$-$C_{25}$arylalkyl, or a phenyl group, which optionally can be substituted one to three times with $C_1$-$C_8$alkyl and/or $C_1$-$C_8$alkoxy, R$^{20}$ and R$^{21}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, or R$^{20}$ and R$^{21}$ together represent alkylene or alkenylene which are optionally both bonded via oxygen and/or sulfur to the (hetero)aromatic residue and which are optionally both have up to 4 carbon atoms, R$^{30}$ to R$^{37}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{40}$ and $R^{41}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{50}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

$R^{60}$ to $R^{68}$ are each independently H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, D is —CO—, —COO—, —S—, —O—, —NR$^{39}$—, or —C(=O)NR$^{39}$—, E is $C_1$-$C_8$thioalkoxy, COO—$C_1$-$C_{18}$alkyl, $C_1$-$C_8$alkoxy, CN, —NR$^{39}$R$^{39'}$, —CONR$^{39}$R$^{39'}$, or halogen, G is E, or $C_1$-$C_{18}$alkyl, and $R^{39}$ and $R^{39'}$ are each independently hydrogen, $C_1$-$C_{18}$alkyl, $C_1$-$C_{18}$haloalkyl, $C_7$-$C_{25}$arylalkyl, or $C_1$-$C_{18}$alkanoyl, with the proviso that, if the polymeric material is a diketopyrrolopyrrole (DPP) polymer, a quotient of a weight average molecular weight of the DPP polymer and a molecular weight of the repeating unit of the polymer is at least 5, with the proviso that compounds of formula

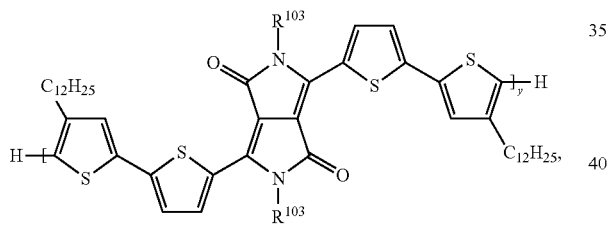

wherein $R^{103}$ is 2-hexyldecyl and y is 3, or 4, are excluded.

6. The compound according to claim 5, which is a compound of formula (IIa)

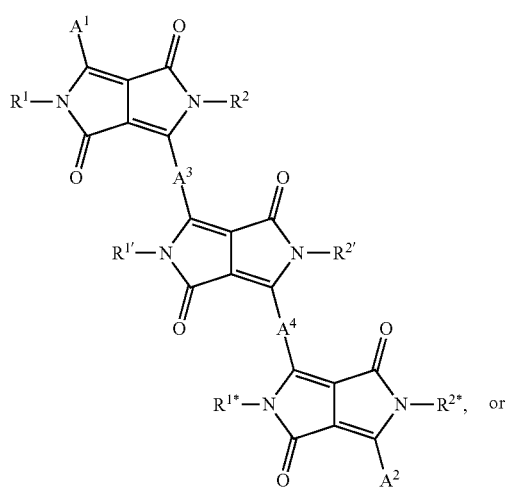

(IIb)

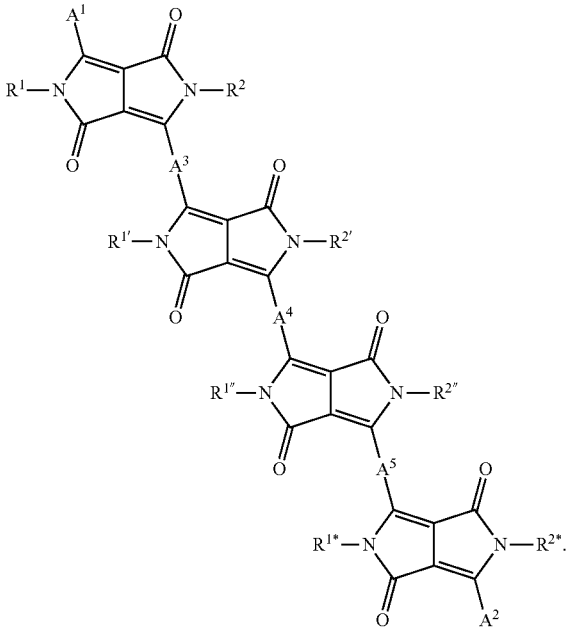

7. A compound of formula (III)

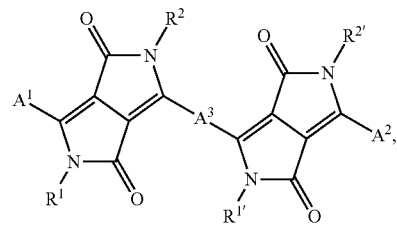

wherein $A^1$ and $A^2$ are independently of each other a group of formula

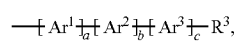

or $R^5$, $A^3$ is a group of formula

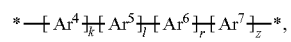

a is 1 or 2;
b is 0, 1 or 2;
c is 0, 1 or 2;
k is 0, 1, or 2;
l is 1, 2, or 3;
r is 0, or 1;
z is 0, 1 or 2;
$R^1$, $R^2$, $R^{1'}$ and $R^{2'*}$ are optionally the same or different and are each independently selected from hydrogen, a $C_1$-$C_{100}$alkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_2$-$C_{100}$alkenyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_3$-$C_{100}$alkinyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_3$-$C_{12}$cycloalkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_6$-$C_{24}$aryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, a $C_2$-$C_{20}$heteroaryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, and —CO—$C_1$-$C_{18}$alkyl, —CO—$C_5$-$C_{12}$cycloalkyl, —COO—$C_1$-$C_{18}$alkyl;

$R^3$ is hydrogen, halogen, cyano, $C_1$-$C_{25}$alkyl, $C_1$-$C_{25}$alkyl which is substituted by E and/or interrupted by D,

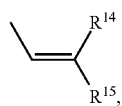

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^5$ is 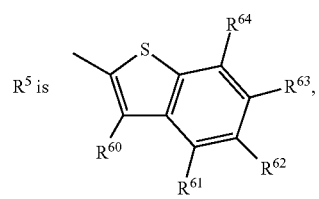 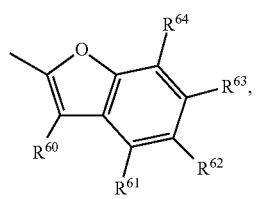

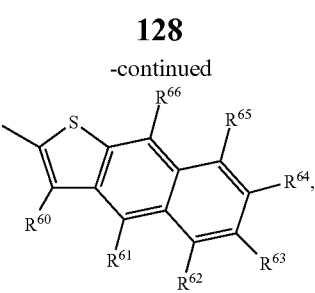

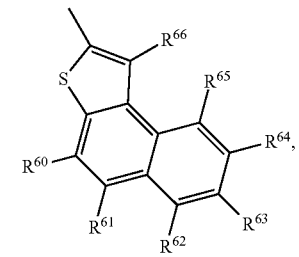

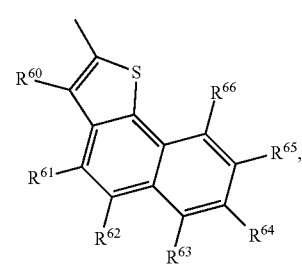

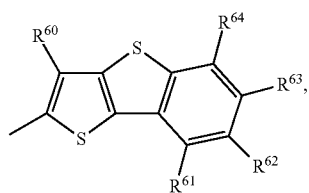

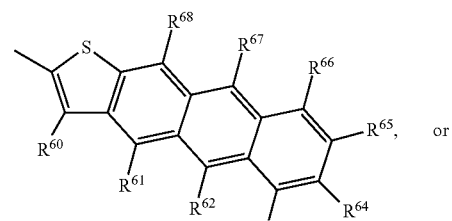

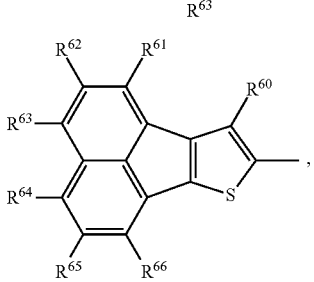

$R^6$ is 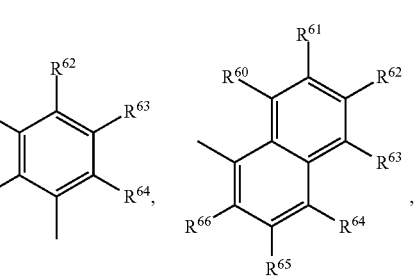

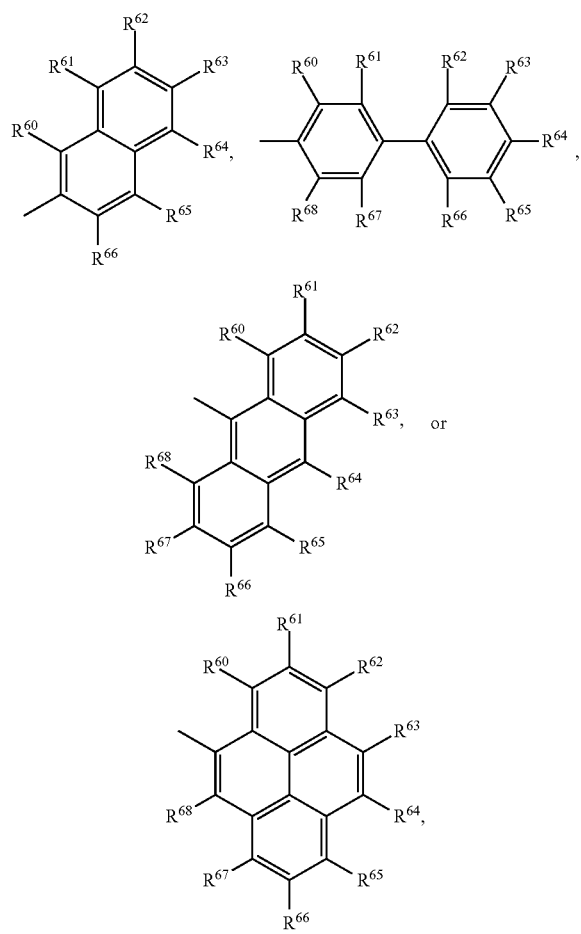
Ar¹, Ar² and Ar³ are each independently one of a bivalent group of formula
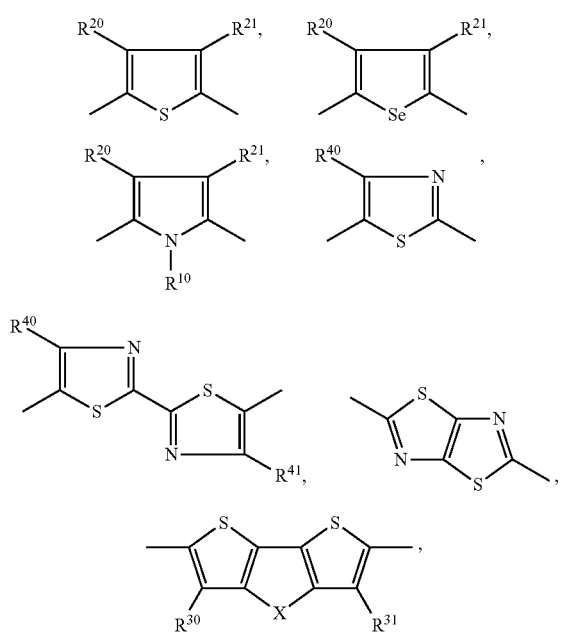
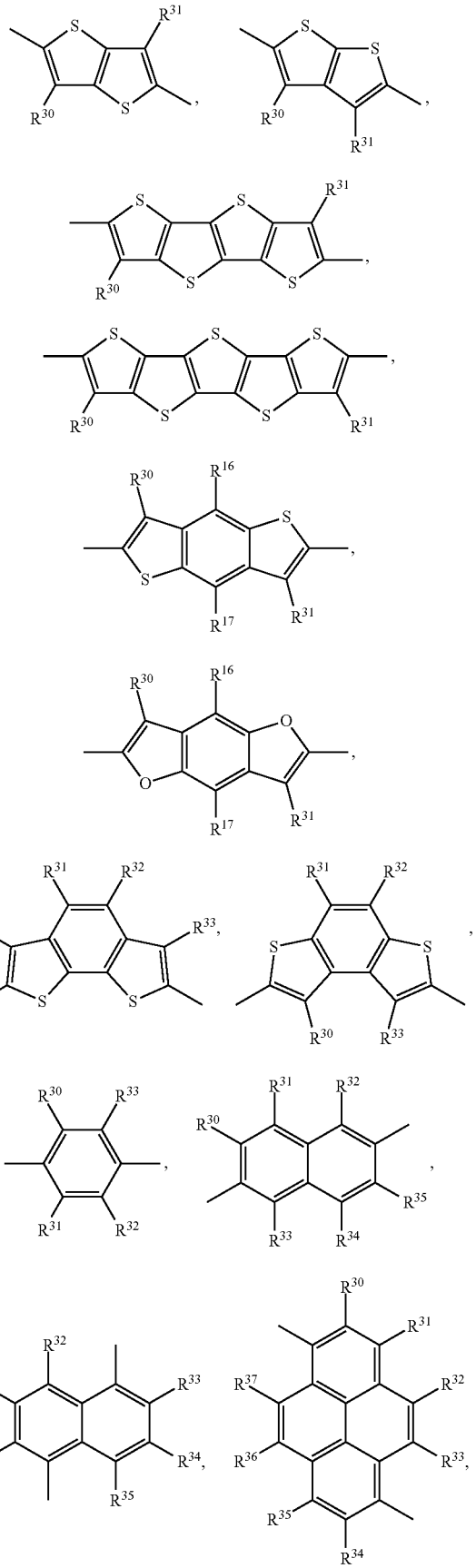

131
-continued
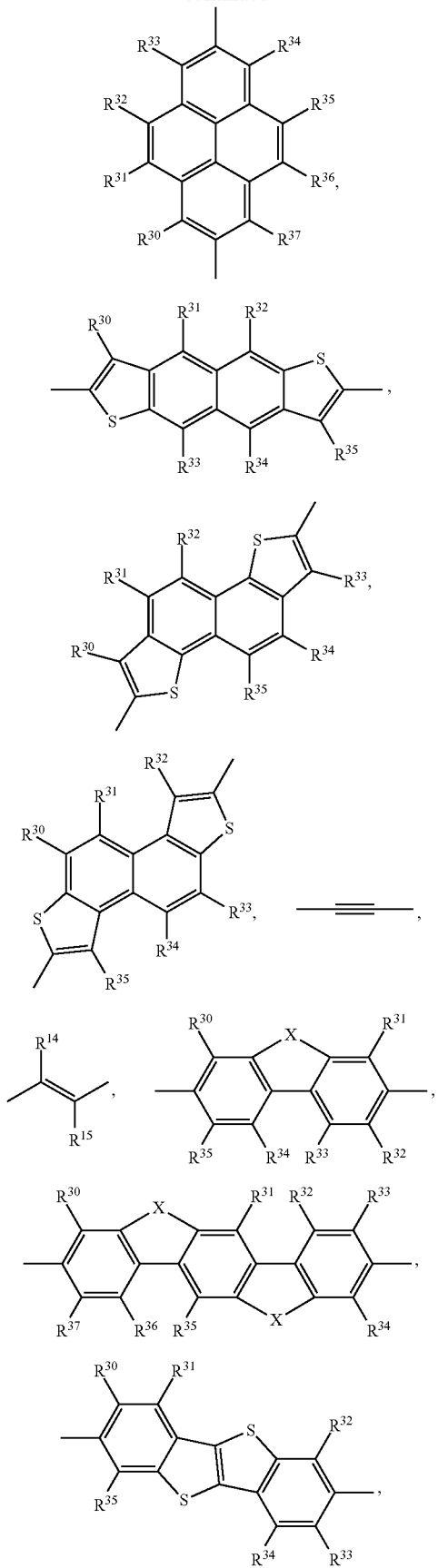
132
-continued
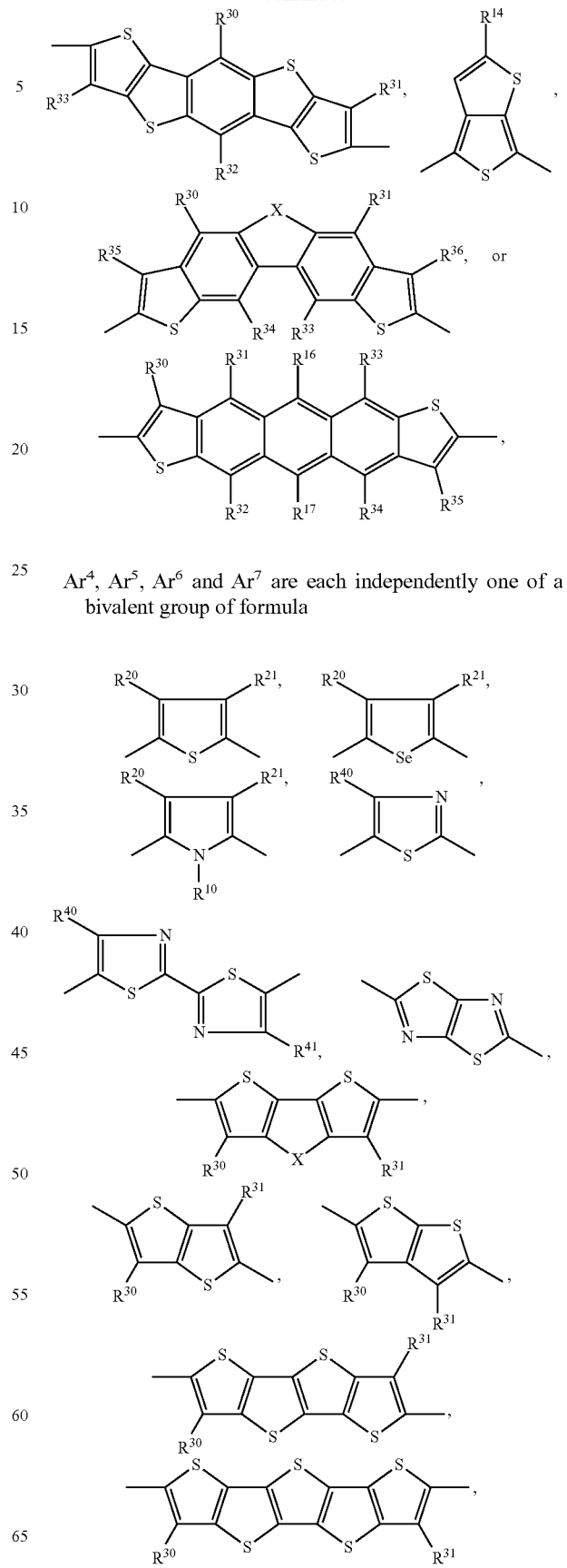
Ar⁴, Ar⁵, Ar⁶ and Ar⁷ are each independently one of a bivalent group of formula

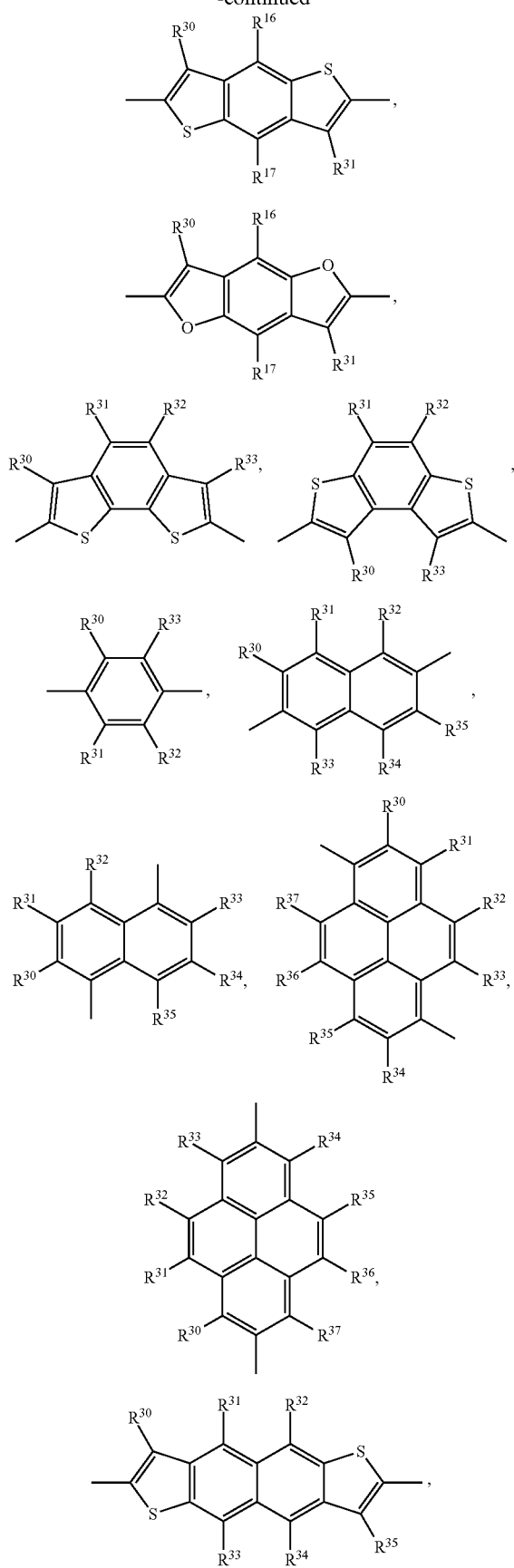
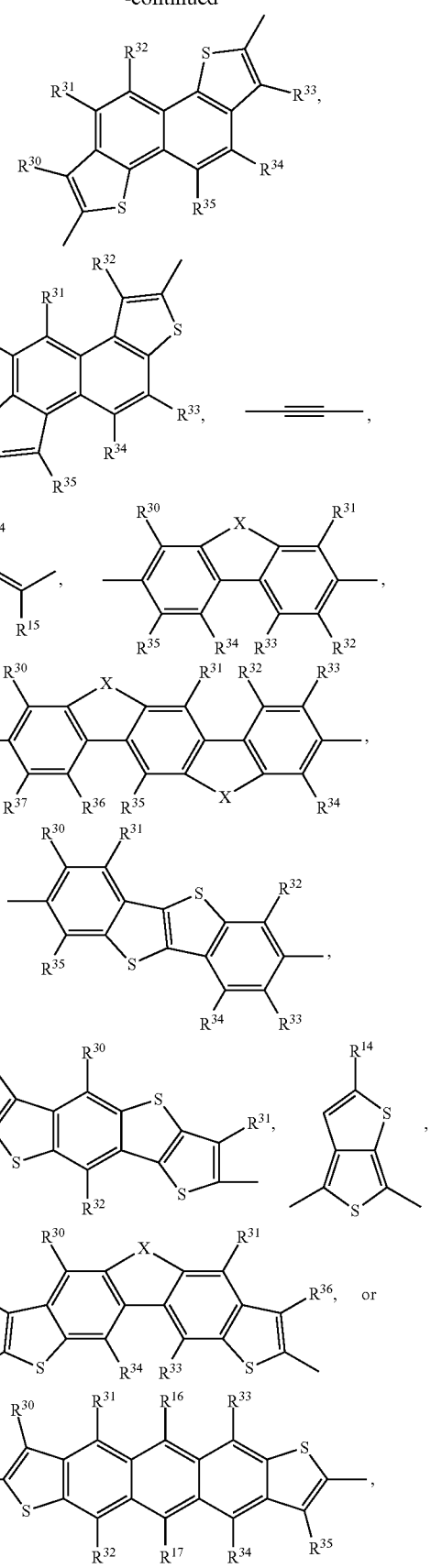

wherein

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,

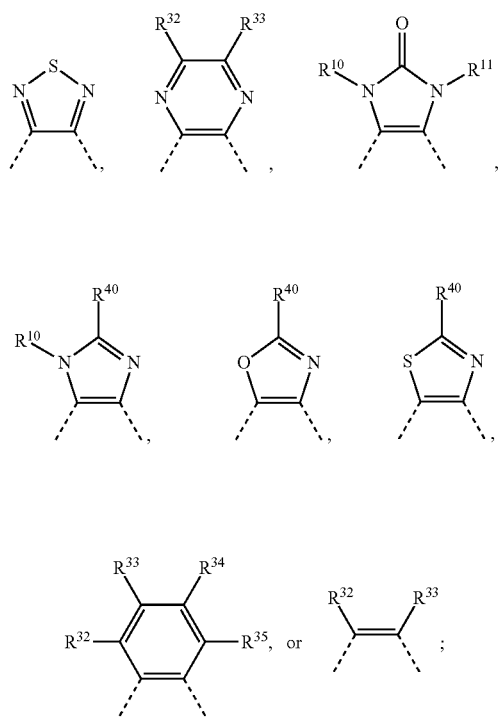

R$^{10}$ and R$^{11}$ are each independently hydrogen, C$_1$-C$_{18}$alkyl, C$_1$-C$_{18}$haloalkyl, C$_7$-C$_{25}$arylalkyl, or C$_1$-C$_{18}$alkanoyl, R$^{12}$ and R$^{13}$ are each independently hydrogen, C$_1$-C$_{18}$alkyl, C$_1$-C$_{18}$haloalkyl, C$_7$-C$_{25}$arylalkyl, C$_6$-C$_{24}$aryl, or C$_2$-C$_{20}$heteroaryl, or R$^{12}$ and R$^{13}$ together represent oxo,

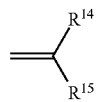

or form a five or six membered ring, which is unsubstituted or substituted by C$_1$-C$_{18}$alkyl and/or C$_1$-C$_{18}$alkoxy;

R$^{14}$ and R$^{15}$ are each independently hydrogen, C$_1$-C$_{18}$alkyl, C$_6$-C$_{24}$aryl, C$_2$-C$_{20}$heteroaryl, —CN or COOR$^{50}$;

R$^{16}$ and R$^{17}$ are each independently hydrogen, halogen, C$_1$-C$_{25}$alkyl, C$_1$-C$_{25}$alkoxy, C$_7$-C$_{25}$arylalkyl, or

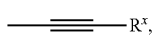

R$^x$ is a C$_1$-C$_8$alkyl group, or a tri(C$_1$-C$_8$alkyl)silyl group,

R$^{18}$ and R$^{19}$ are each independently hydrogen, C$_1$-C$_{18}$alkyl, C$_7$-C$_{25}$arylalkyl, or a phenyl group, which optionally can be substituted one to three times with C$_1$-C$_8$alkyl and/or C$_1$-C$_8$alkoxy, R$^{20}$ and R$^{21}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, or R$^{20}$ and R$^{21}$ together represent alkylene or alkenylene which are optionally both bonded via oxygen and/or sulfur to the (hetero)aromatic residue and which are optionally both have up to 4 carbon atoms, R$^{30}$ to R$^{37}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{40}$ and R$^{41}$ are each independently hydrogen, C$_1$-C$_{25}$alkyl, C$_2$-C$_{25}$alkenyl, C$_2$-C$_{25}$alkyl which is interrupted by —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{50}$ is C$_1$-C$_{25}$alkyl, C$_1$-C$_{25}$haloalkyl, C$_7$-C$_{25}$arylalkyl, C$_6$-C$_{24}$aryl or C$_2$-C$_{20}$heteroaryl;

R$^{60}$ to R$^{68}$ are each independently H, halogen, cyano, C$_1$-C$_{25}$alkyl, C$_1$-C$_{25}$alkyl which is substituted by E and/or interrupted by D, C$_6$-C$_{24}$aryl, C$_6$-C$_{24}$aryl which is substituted by G, C$_2$-C$_{20}$heteroaryl, C$_2$-C$_{20}$heteroaryl which is substituted by G, C$_3$-C$_{12}$cycloalkyl, C$_3$-C$_{12}$cycloalkyl, which is substituted by G, C$_2$-C$_{18}$alkenyl, C$_2$-C$_{18}$alkynyl, C$_1$-C$_{18}$alkoxy, C$_1$-C$_{18}$alkoxy which is substituted by E and/or interrupted by D, C$_7$-C$_{25}$aralkyl, or C$_7$-C$_{25}$aralkyl, which is substituted by G, D is —CO—, —COO—, —S—, —O—, —NR$^{39}$—, or —C(=O)NR$^{39}$—, E is C$_1$-C$_8$thioalkoxy, COO—C$_1$-C$_{18}$alkyl, C$_1$-C$_8$alkoxy, CN, —NR$^{39}$R$^{39'}$, —CONR$^{39}$R$^{39'}$, or halogen, G is E, or C$_1$-C$_{18}$alkyl, and R$^{39}$ and R$^{39'}$ are each independently hydrogen, C$_1$-C$_{18}$alkyl, C$_1$-C$_{18}$haloalkyl, C$_7$-C$_{25}$arylalkyl, or C$_1$-C$_{18}$alkanoyl, with the proviso that, if the polymeric material is a diketopyrrolopyrrole (DPP) polymer, a quotient of a weight average molecular weight of the DPP polymer and a molecular weight of the repeating unit of the polymer is at least 5, with the proviso that Ar$^1$, Ar$^4$, Ar$^5$, or Ar$^7$ does not represent a six membered ring, which is attached directly to the diketopyrrolopyrrole moiety; and that

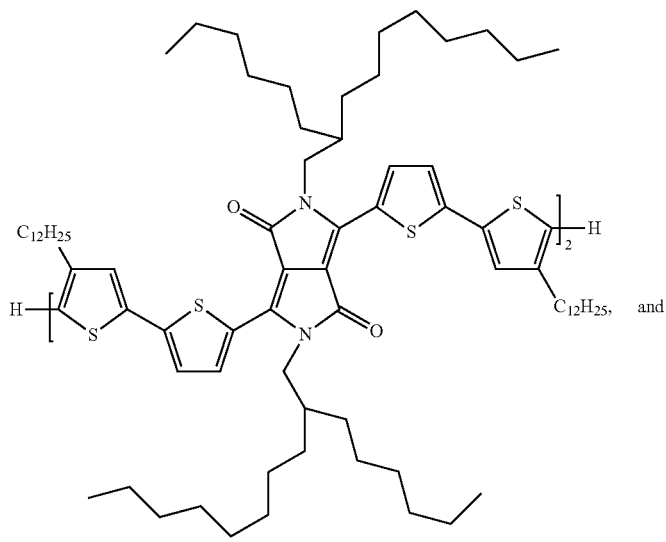
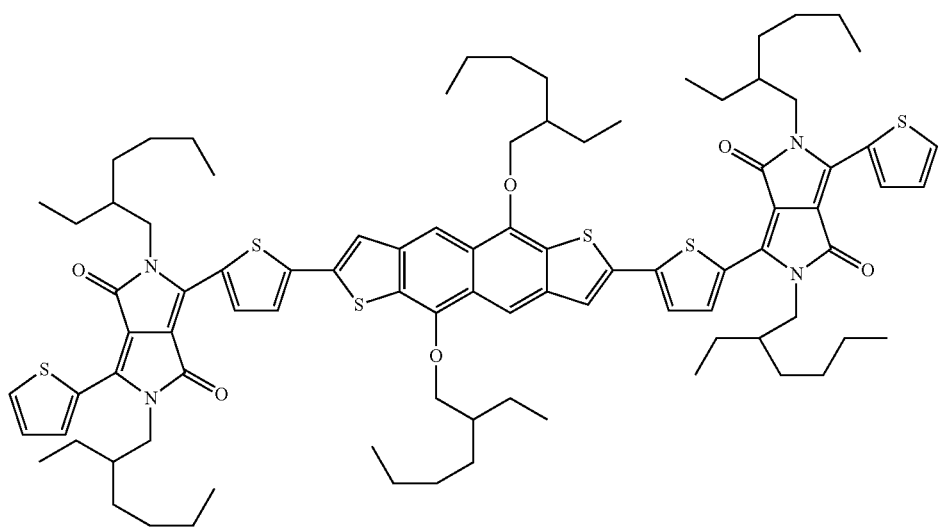
are excluded.
8. The compound according to claim 7, which is a compound of formula
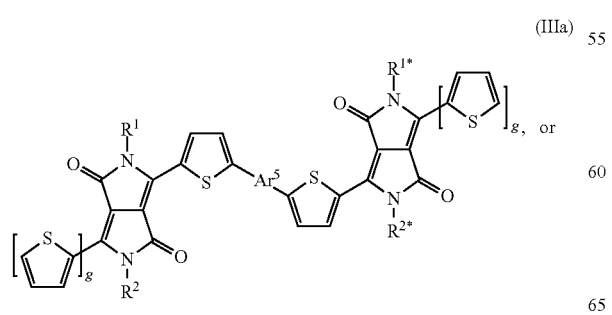
-continued
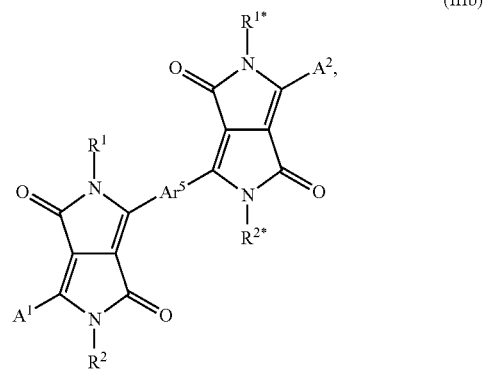

wherein
g is an integer of 1 to 4,
$R^1$, $R^2$, $R^{1*}$ and $R^{2*}$ are a $C_1$-$C_{38}$alkyl group and
$Ar^5$ is
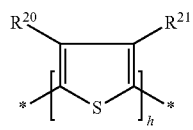
wherein h is 1, 2, or 3,
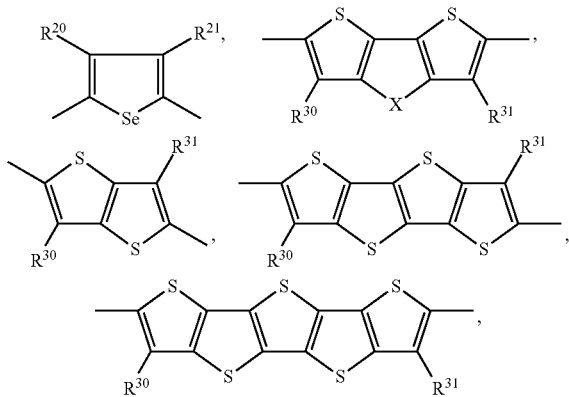
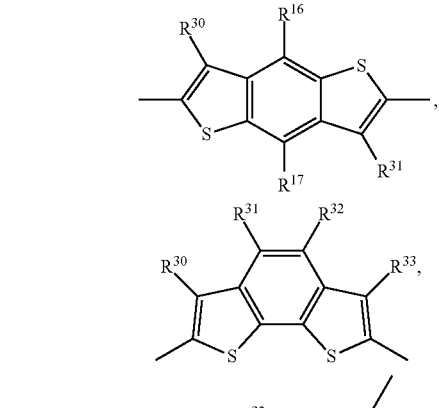
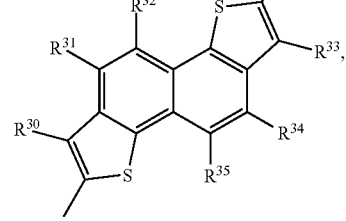
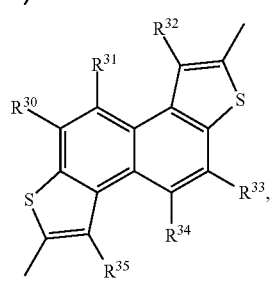
-continued
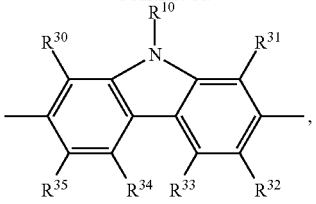
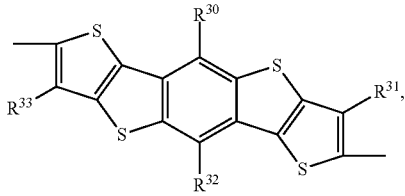
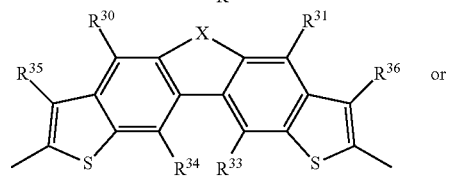
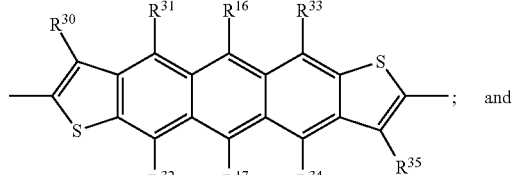
(IIIc)
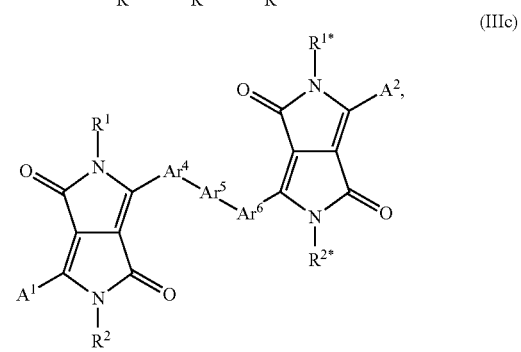
wherein
$Ar^5$, $A^1$ and $A^2$ are as defined above,
$R^1$, $R^2$, $R^{1*}$ and $R^{2*}$ are a $C_1$-$C_{38}$alkyl group, and
$Ar^4$ and $Ar^6$ are each independently one of
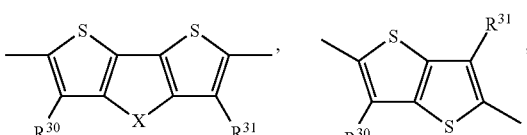
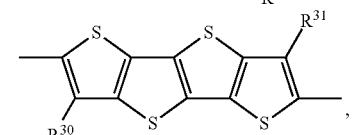
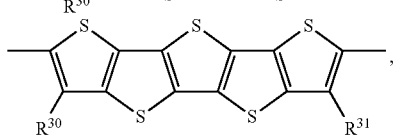

141
-continued
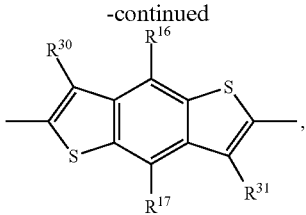
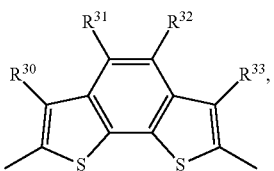
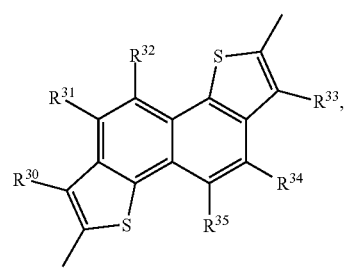
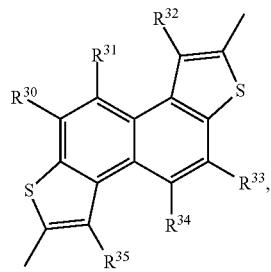
142
-continued
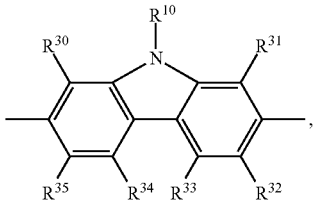
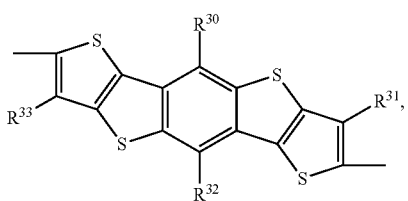
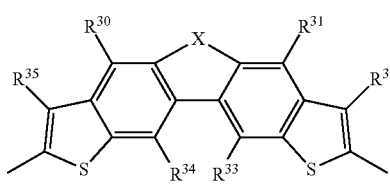
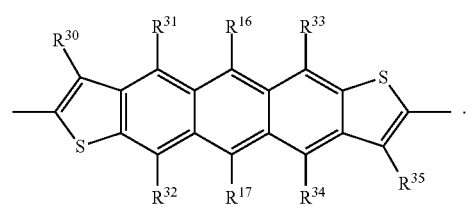
9. The compound according to claim 5, wherein the compound is selected from the group consisting of:
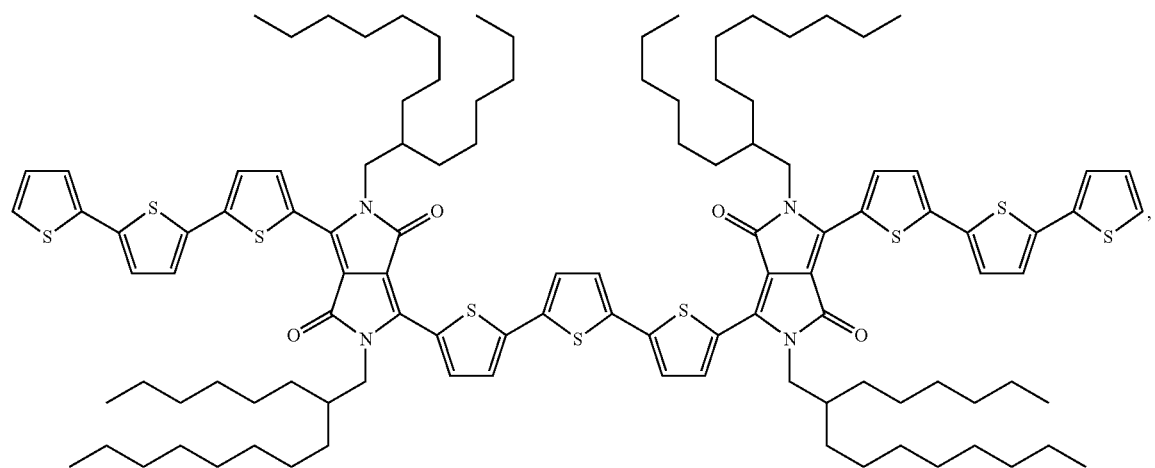
(A-1)

-continued
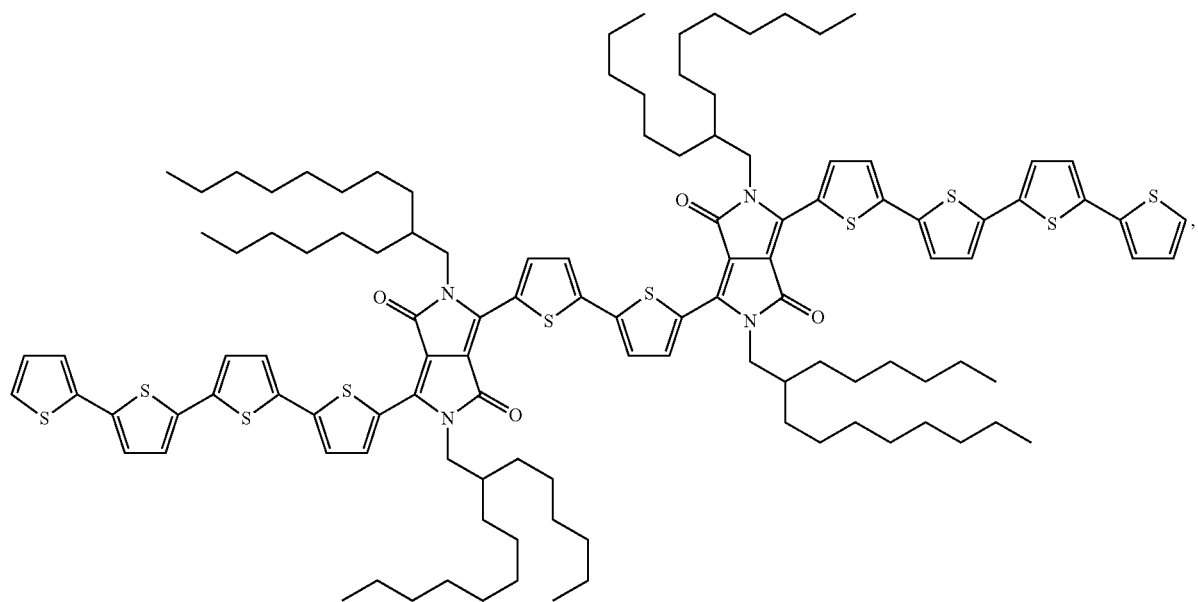
(A-2)
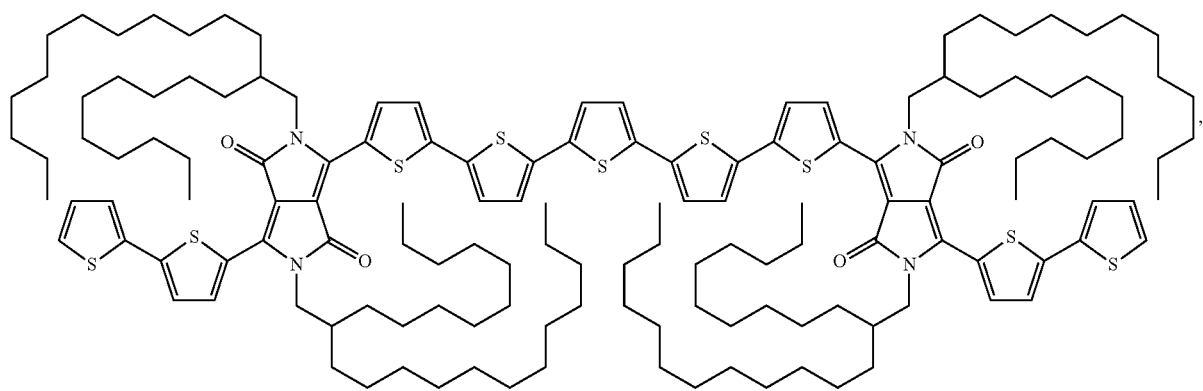
(A-3)
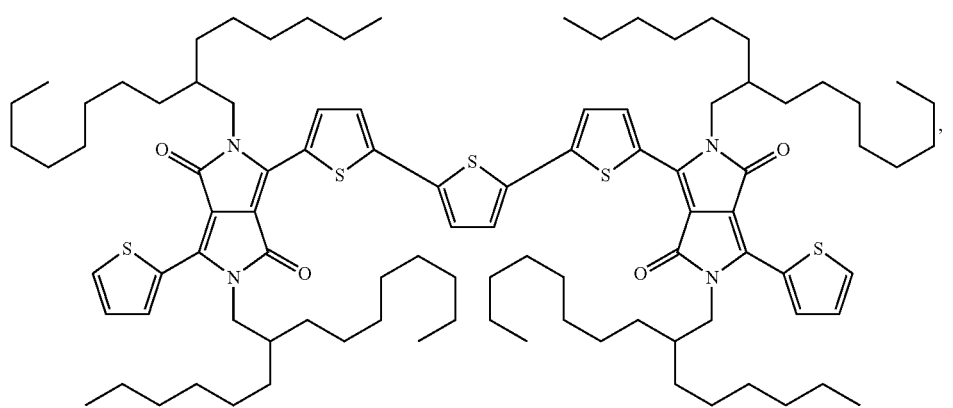
(A-4)

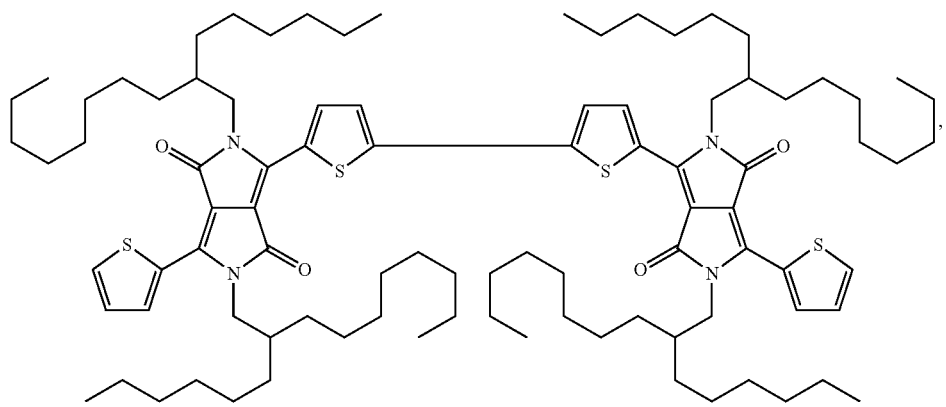
(A-5)
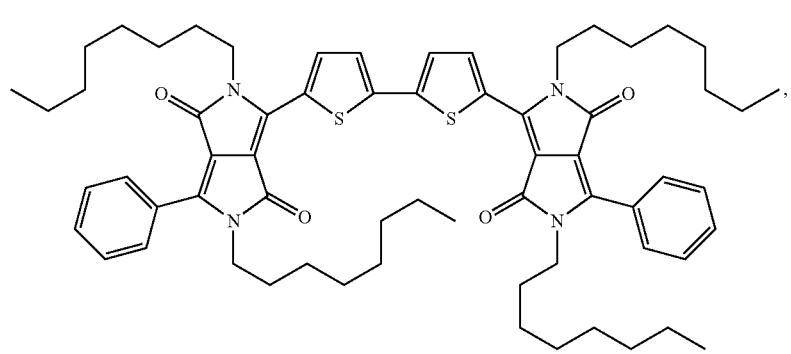
(A-6)
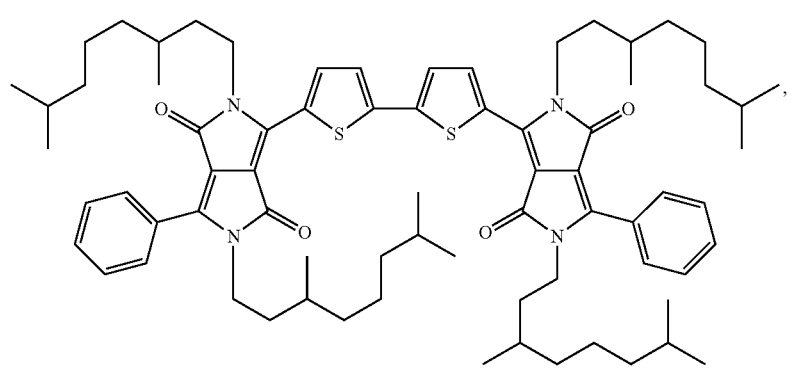
(A-7)
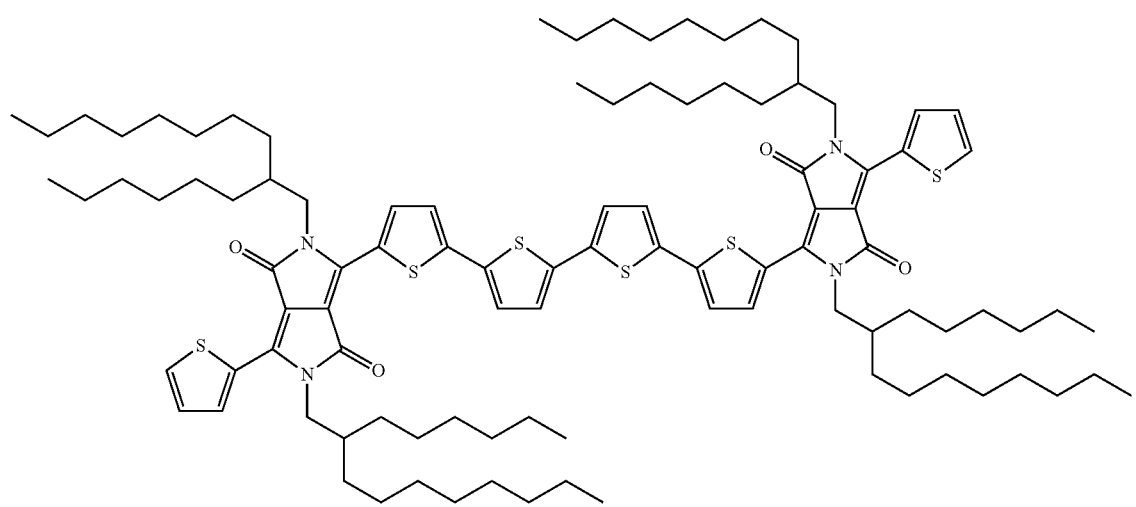
(A-8)

-continued
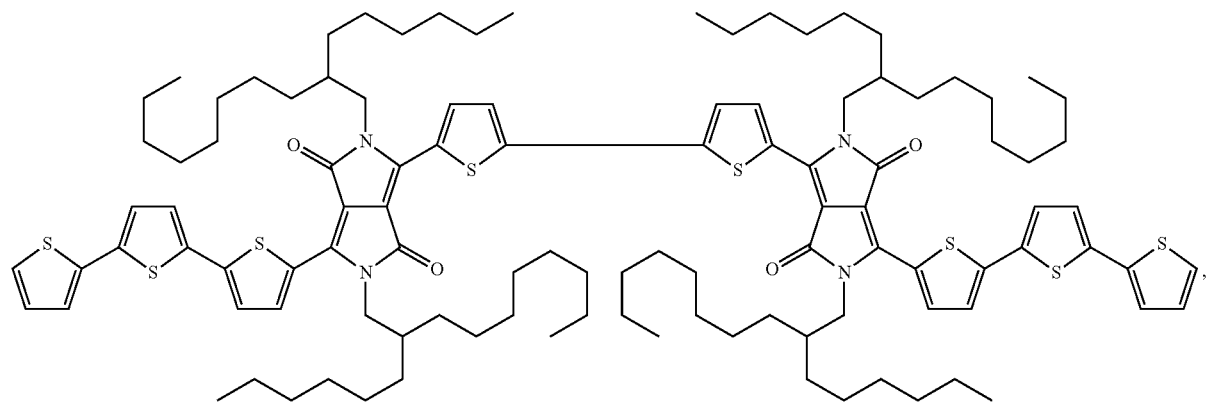
(A-9)
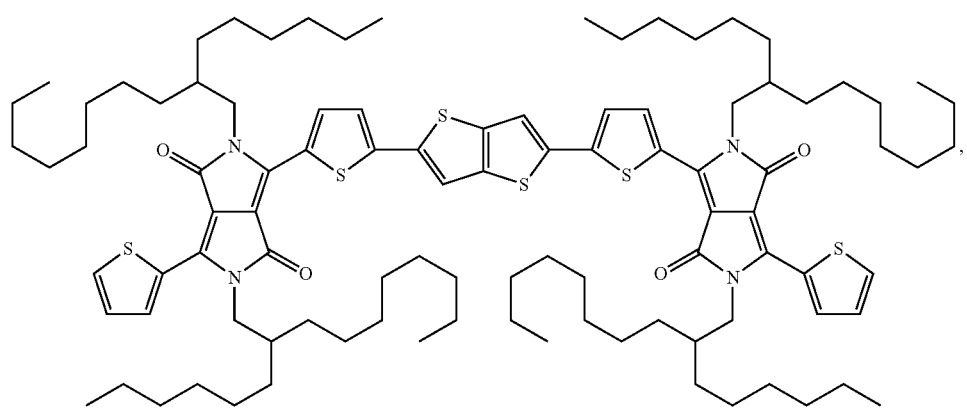
(A-10)
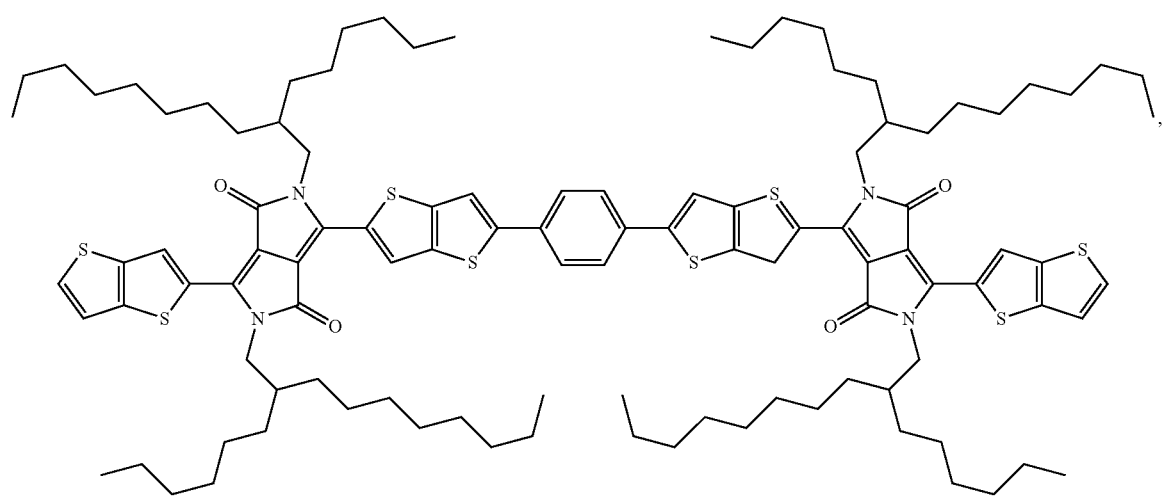
(A-11)

-continued
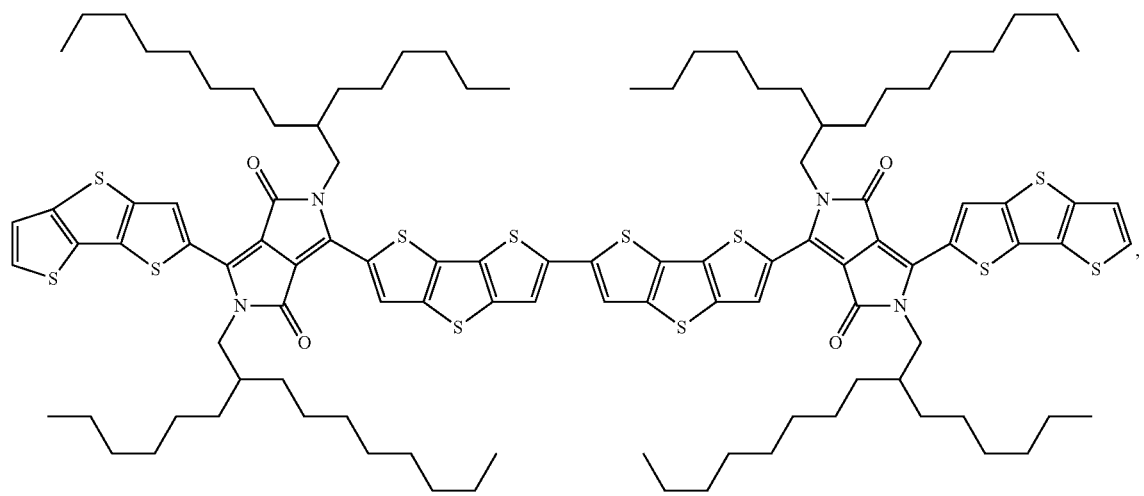
(A-12)
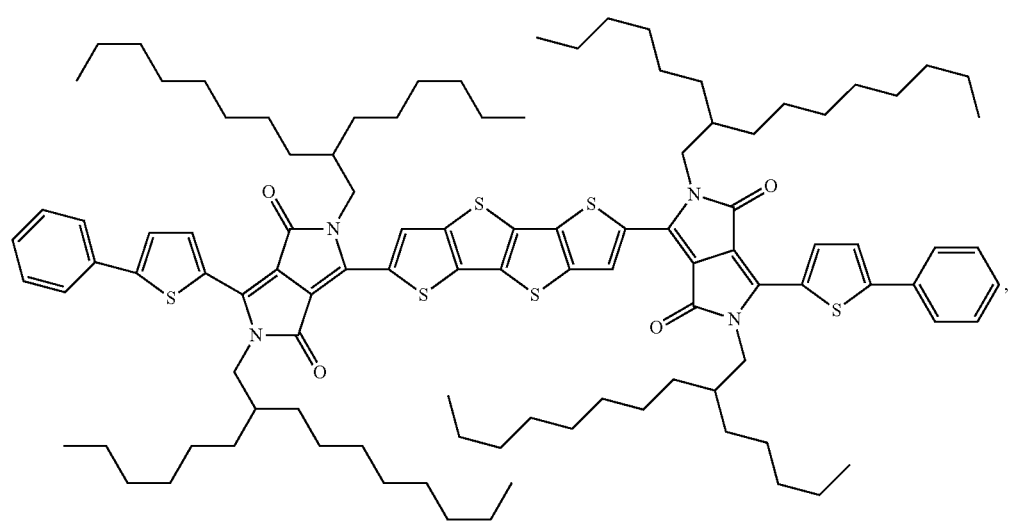
(A-13)
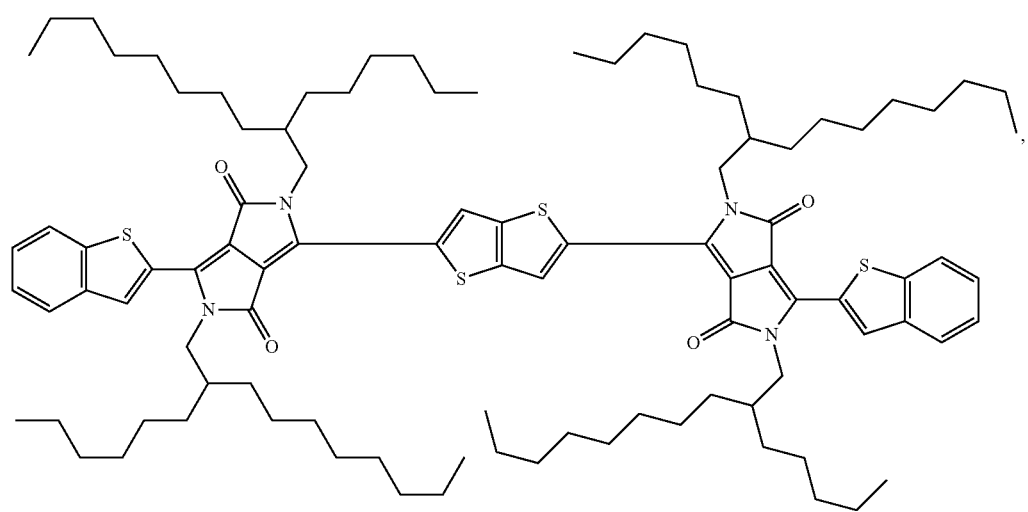
(A-14)

-continued
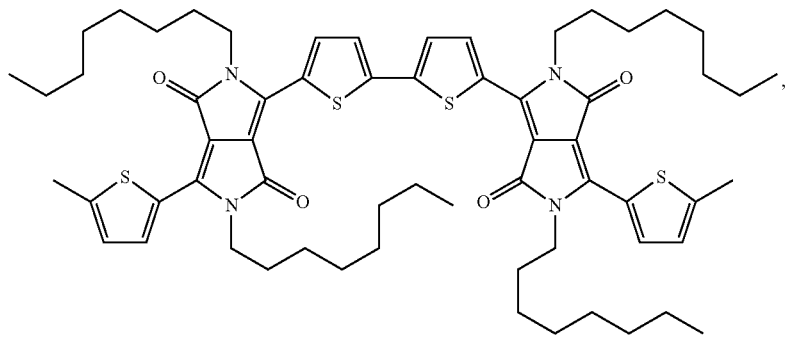
(A-15)
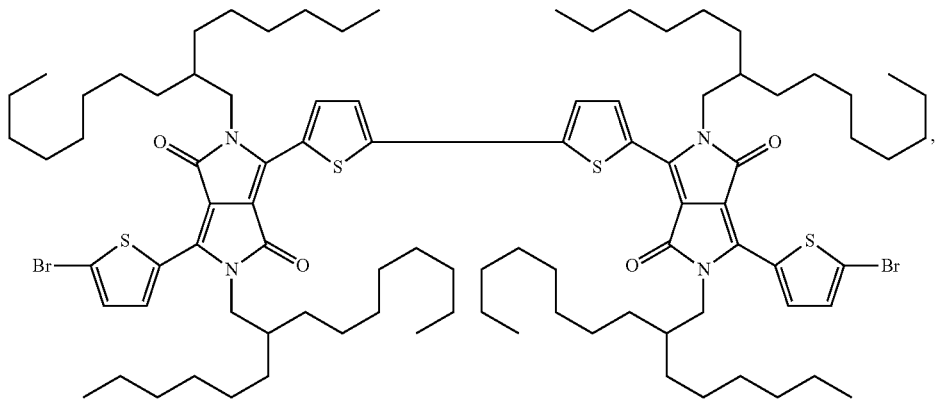
(A-16)
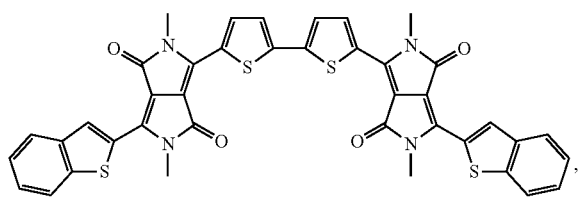
(A-17)
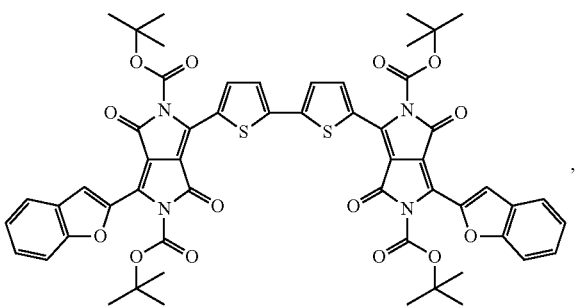
(A-18)
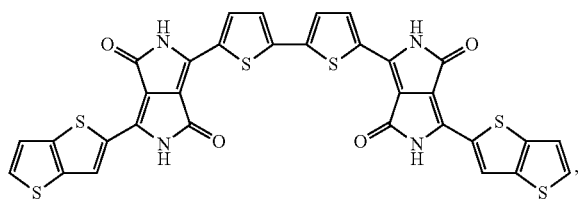
(A-19)
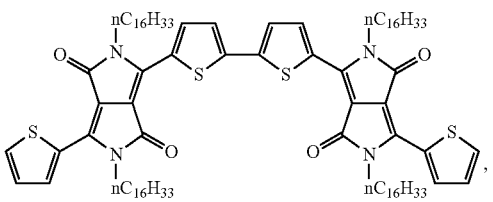
(A-20)
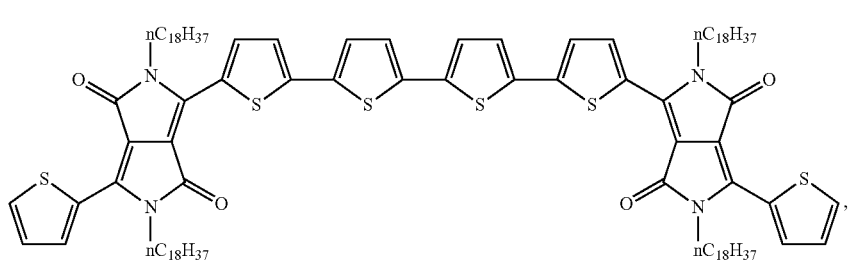
(A-21)

-continued
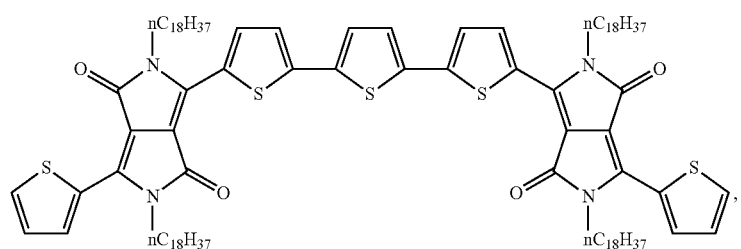
(A-22)
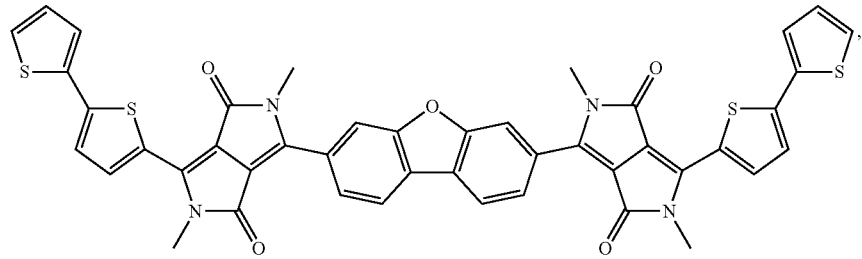
(A-23)
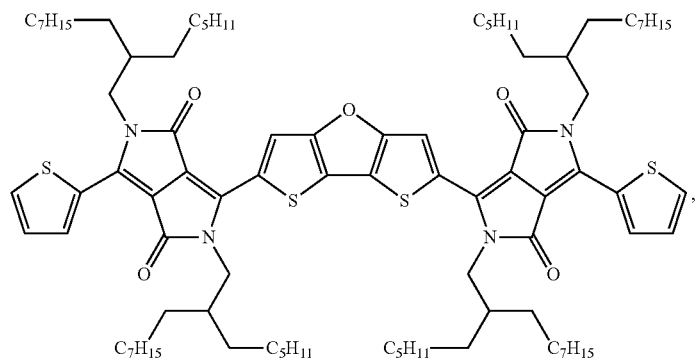
(A-24)
(A-25)
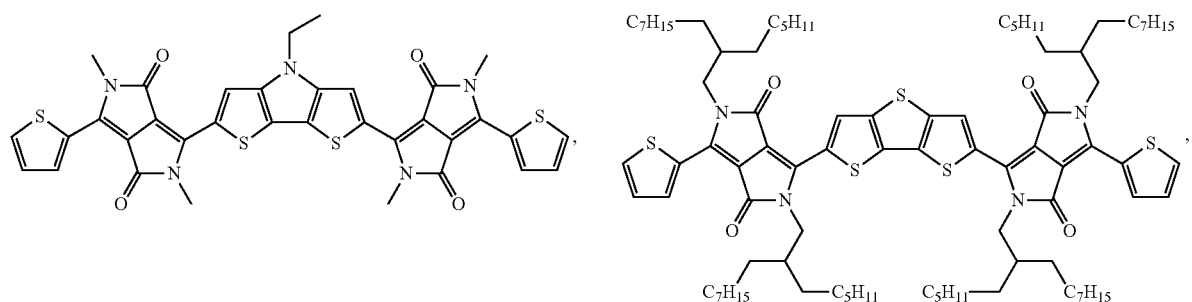
(A-26)
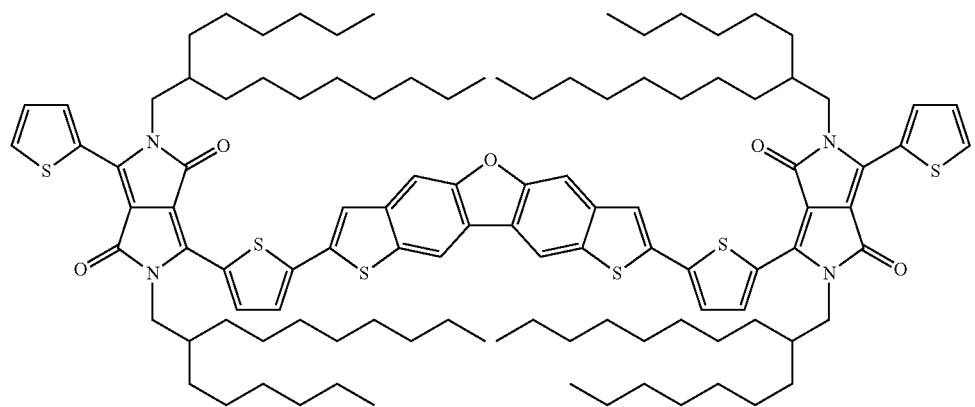
and
(A-27)

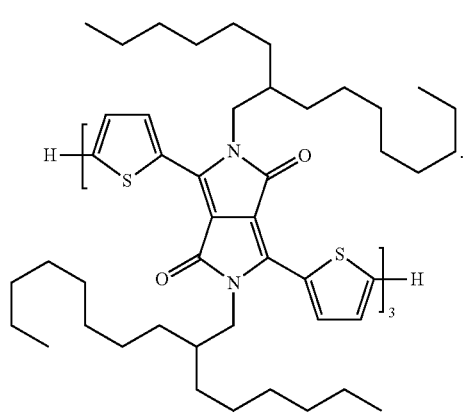

(B-1)

10. A semiconductor device comprising the composition according to claim 1.

11. The semiconductor device according to claim 10, wherein the device is in the form of a diode, a photodiode, a sensor, an organic field effect transistor, a transistor for flexible displays, or a heterojunction solar cell.

12. The compound according to claim 5, wherein the compound is suitable as a p-type transistor.

13. A process for preparation of a compound of formula

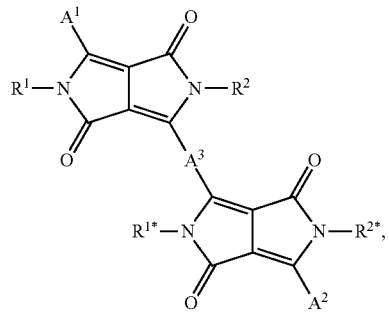

(III)

wherein $R^2$ is $R^{1*}$, the process comprising:
(a) reacting in the presence of a strong base 2 moles of a compound of formula

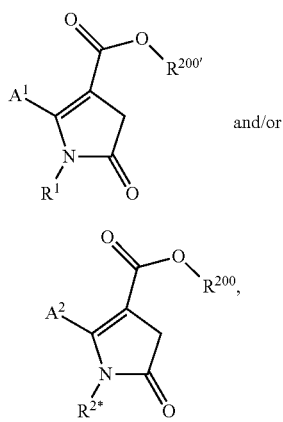

(XV)

and/or (XV')

wherein $R^{200}$ and $R^{200'}$ are independently of each other a $C_1$-$C_8$alkyl group, or a benzyl group with 1 mole of a di-nitrile compound of the formula $$N\!\!\equiv\!\!\equiv\!\!-A^3\!\!-\!\!\equiv\!\!\equiv\!N;$$

(b) and then alkylating the compound of formula

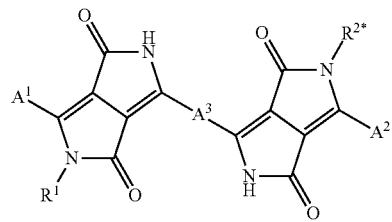

obtained in step (a) with a compound $R^2$—$X^{16}$, where $X^{16}$ is halogen, under basic conditions in a dry solvent;

or a compound of formula

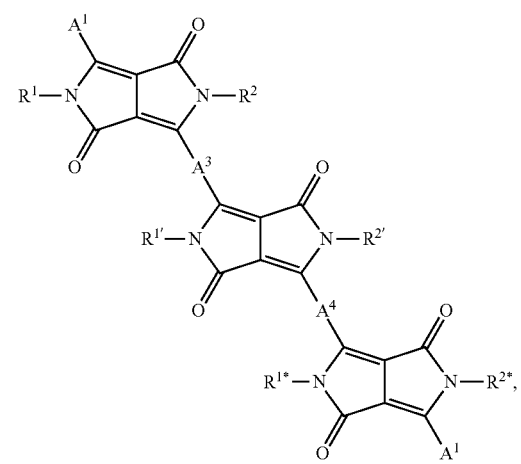

(IIb)

($R^1 = R^2 = R^{1*} = R^{2*}$)

the process comprising (a) reacting (in the presence of a strong base) 2 mole of a disuccinate with 1 mole of a nitrile of the formula

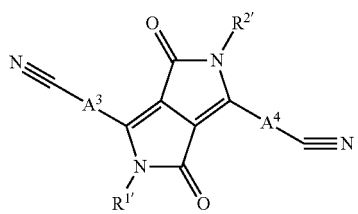

and 2 mole of a nitrile of the formula

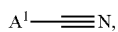

(b) reacting the compound of formula (IX'')

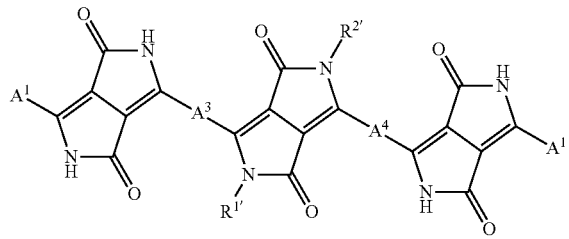

obtained in step a) with a bromide of the formula $R^1$—$X^{16}$ ($X^{16}$ is halogen) in the presence of a base in a solvent, wherein $R^1$, $R^{1'}$, $R^{2'}$, $A^1$, $A^3$ and $A^4$ are as defined above;

or a process for the preparation of a compound of the formula (IIb)

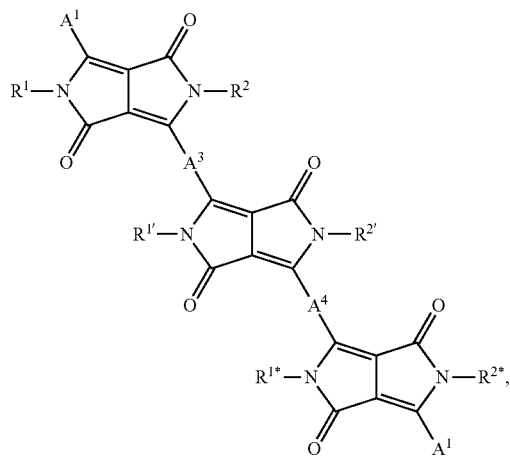

($R^2 = R^{1*}$)

the process comprising (a) reacting (in the presence of a strong base) 2 moles of a compound of formula (XV)

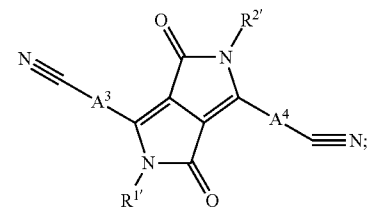

and/or (XV')

($R^{200}$ and $R^{200'}$ are independently of each other a $C_1$-$C_8$alkyl group, or a benzyl group) with 1 mole of a di-nitrile compound of the formula (b) reacting the compound of formula (IX'')

obtained in step a) with a halogenide of the formula $R^2$—$X^{16}$ ($X^{16}$ is halogen) in the presence of a suitable base in a suitable solvent, wherein $A^1$ and $A^2$ are independently of each other a group of formula

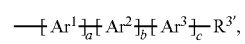

or have the meaning of $R^5$, $A^3$ and $A^4$ are independently of each other a group of formula

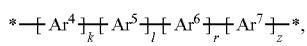

a is 1 or 2;

b is 0, 1 or 2;

c is 0, 1 or 2;

k is 0, 1, or 2;

l is 1, 2, or 3;

r is 0, or 1;

z is 0, 1 or 2;

$R^1$, $R^2$, $R^{1'}$, $R^{2'}$, $R^{1''}$, $R^{2''}$, $R^{1*}$ and $R^{2*}$ are optionally the same or different and are each independently selected from hydrogen, a $C_1$-$C_{100}$alkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_2$-$C_{100}$alkenyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_3$-$C_{100}$alkinyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_3$-$C_{12}$cycloalkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—, a $C_6$-$C_{24}$aryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, a $C_2$-$C_{20}$heteroaryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, and —CO—$C_1$-$C_{18}$alkyl, —CO—$C_5$-$C_{12}$cycloalkyl, —COO—$C_1$-$C_{18}$alkyl;

$R^3$ is hydrogen, halogen, cyano, $C_1$-$C_{25}$alkyl, $C_1$-$C_{25}$alkyl which is substituted by E and/or interrupted by D,

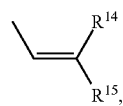

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^5$ is

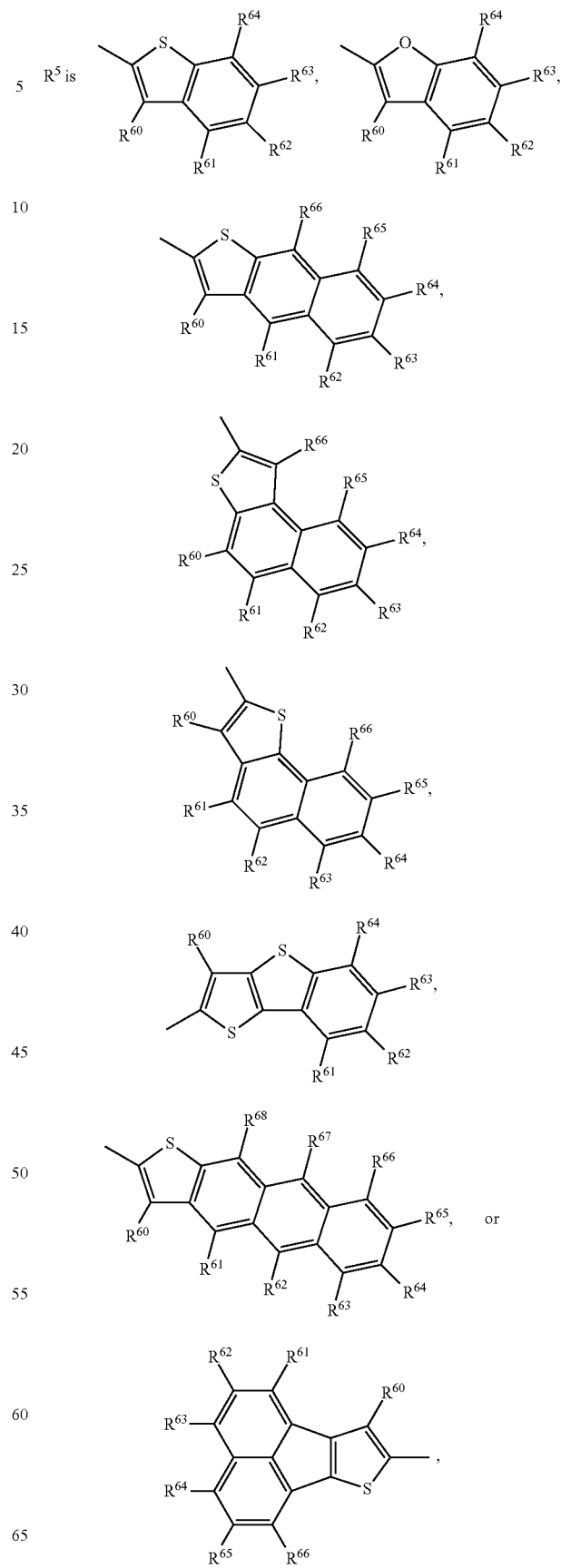

-continued
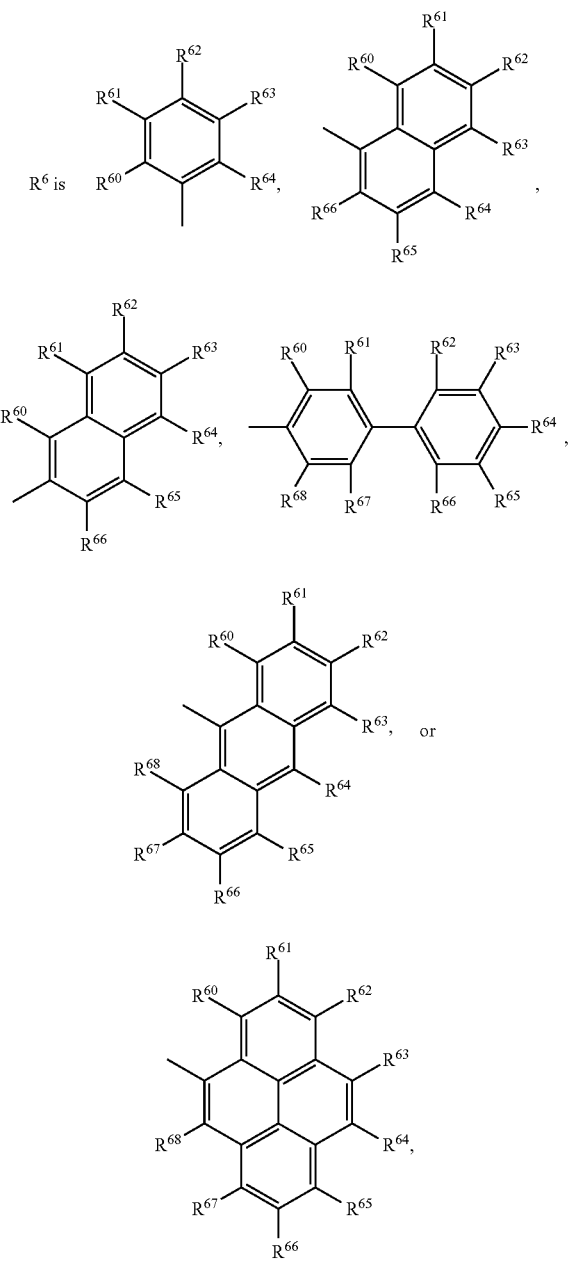
Ar¹, Ar², Ar³, Ar⁴, Ar⁵, Ar⁶ and Ar⁷ are each independently one of a bivalent group of formula
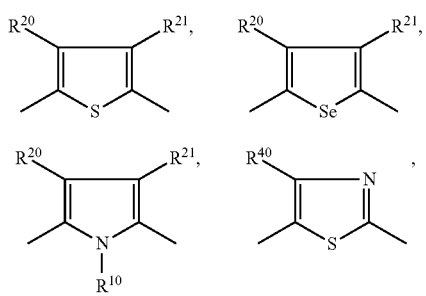
-continued
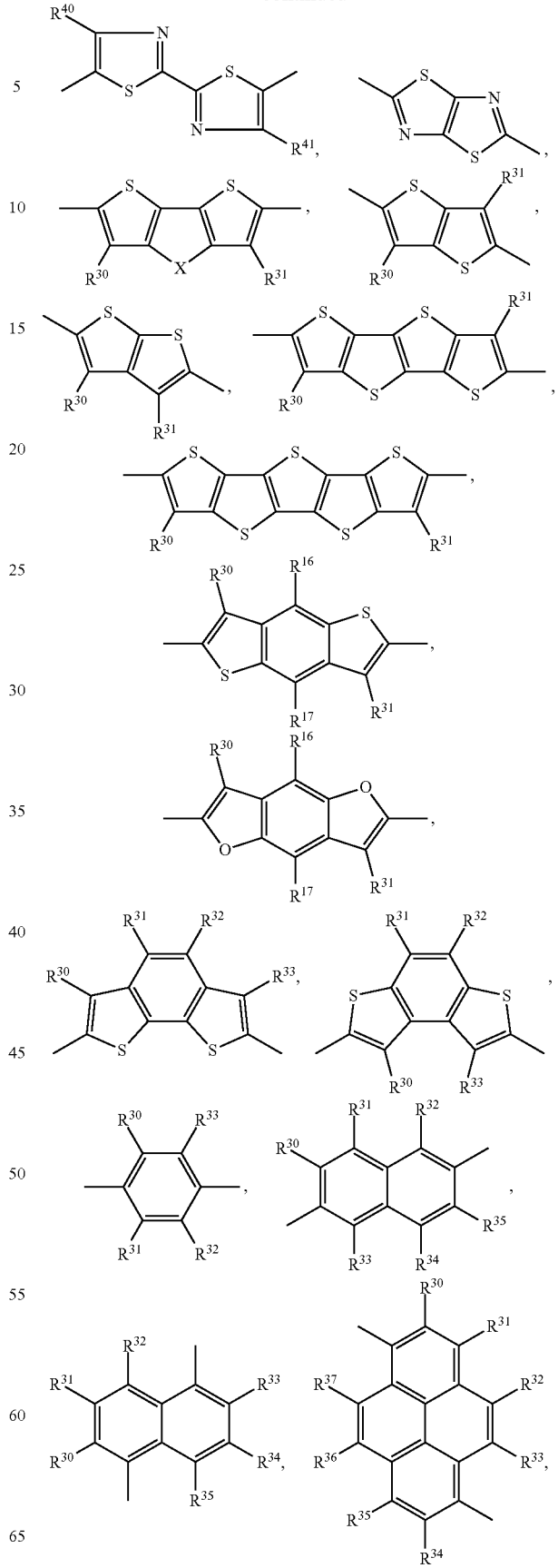

163
-continued

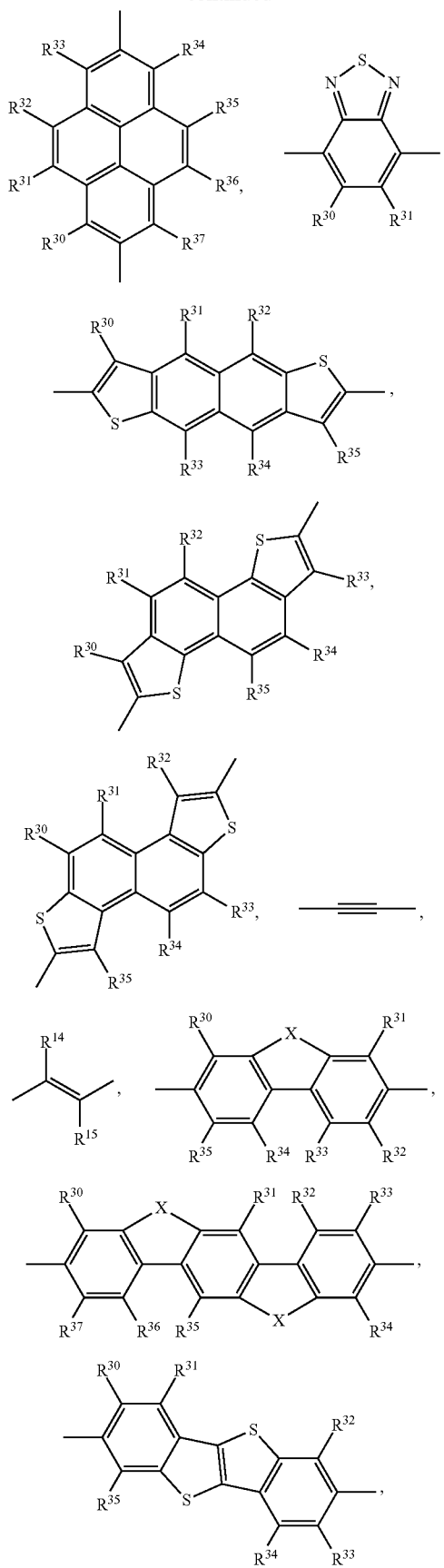

164
-continued

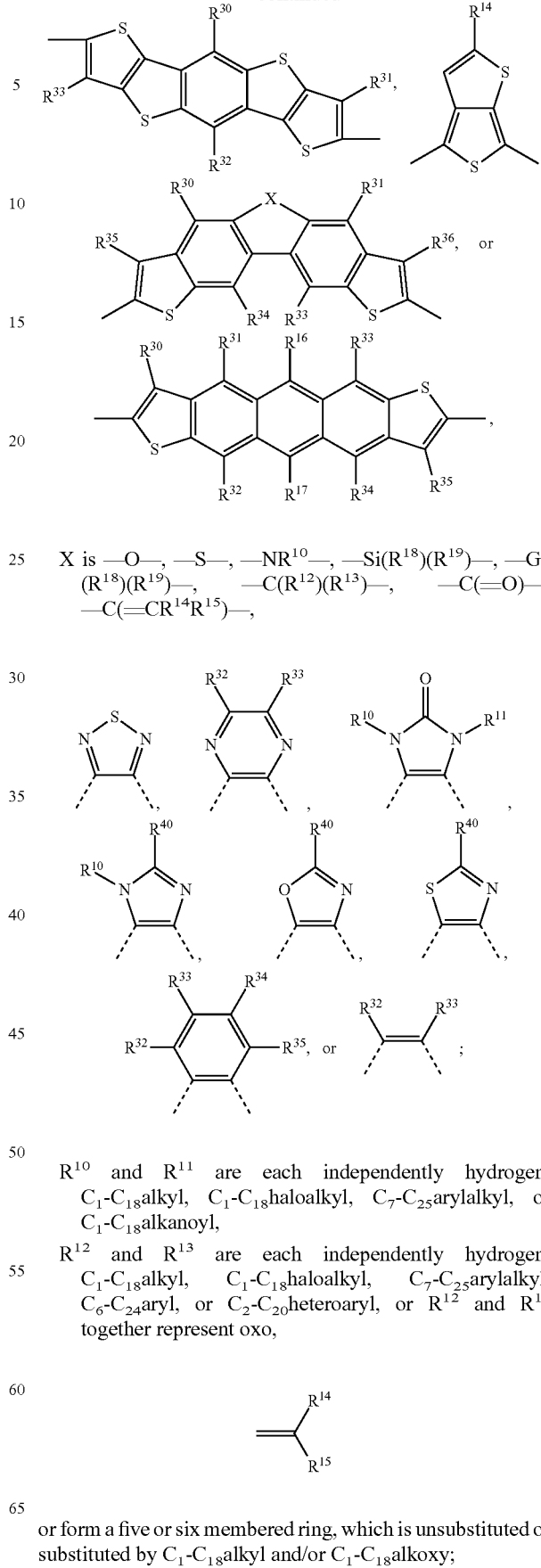

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,

R$^{10}$ and R$^{11}$ are each independently hydrogen, $C_1$-$C_{18}$alkyl, $C_1$-$C_{18}$haloalkyl, $C_7$-$C_{25}$arylalkyl, or $C_1$-$C_{18}$alkanoyl, R$^{12}$ and R$^{13}$ are each independently hydrogen, $C_1$-$C_{18}$alkyl, $C_1$-$C_{18}$haloalkyl, $C_7$-$C_{25}$arylalkyl, $C_6$-$C_{24}$aryl, or $C_2$-$C_{20}$heteroaryl, or R$^{12}$ and R$^{13}$ together represent oxo, or form a five or six membered ring, which is unsubstituted or substituted by $C_1$-$C_{18}$alkyl and/or $C_1$-$C_{18}$alkoxy;

$R^{14}$ and $R^{15}$ are each independently hydrogen, $C_1$-$C_{18}$alkyl, $C_6$-$C_{24}$aryl, $C_2$-$C_{20}$heteroaryl, —CN or COOR$^{50}$;

$R^{16}$ and $R^{17}$ are each independently hydrogen, halogen, $C_1$-$C_{25}$alkyl, $C_1$-$C_{25}$alkoxy, $C_7$-$C_{25}$arylalkyl, or

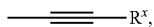

$R^x$ is a $C_1$-$C_8$alkyl group, or a tri($C_1$-$C_8$alkyl)silyl group, $R^{18}$ and $R^{19}$ are each independently hydrogen, $C_1$-$C_{18}$alkyl, $C_7$-$C_{25}$arylalkyl, or a phenyl group, which optionally can be substituted one to three times with $C_1$-$C_8$alkyl and/or $C_1$-$C_8$alkoxy, $R^{20}$ and $R^{21}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, or $R^{20}$ and $R^{21}$ together represent alkylene or alkenylene which are optionally both bonded via oxygen and/or sulfur to the (hetero)aromatic residue and which are optionally both have up to 4 carbon atoms, $R^{30}$ to $R^{37}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{40}$ and $R^{41}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{50}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

$R^{60}$ to $R^{68}$ are each independently H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, D is —CO—, —COO—, —S—, —O—, —NR$^{39}$—, or —C(=O)NR$^{39}$—, E is $C_1$-$C_8$thioalkoxy, COO—$C_1$-$C_{18}$alkyl, $C_1$-$C_8$alkoxy, CN, —NR$^{39}$R$^{39'}$, —CONR$^{39}$R$^{39'}$, or halogen, G is E, or $C_1$-$C_{18}$alkyl, and $R^{39}$ and $R^{39'}$ are each independently hydrogen, $C_1$-$C_{18}$alkyl, $C_1$-$C_{18}$haloalkyl, $C_7$-$C_{25}$arylalkyl, or $C_1$-$C_{18}$alkanoyl, with the proviso that, if the polymeric material is a diketopyrrolopyrrole (DPP) polymer, a quotient of a weight average molecular weight of the DPP polymer and a molecular weight of the repeating unit of the polymer is at least 5.

14. A compound of formula

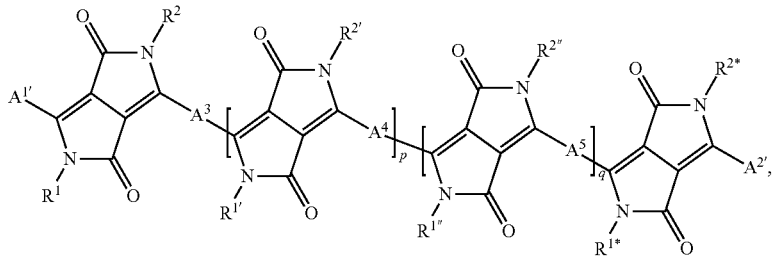

(X)

wherein $A^{1'}$ and $A^{2'}$ are independently of each other a group of formula

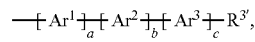

$R^{3'}$ is independently in each occurrence ZnX$^{12}$, —SnR$^{207}$R$^{208}$R$^{209}$, wherein R$^{207}$, R$^{208}$ and R$^{209}$ are identical or different and are H or $C_1$-$C_6$alkyl, wherein two radicals optionally form a common ring and these radicals are optionally branched or unbranched;

X$^{12}$ is a halogen atom; —OS(O)$_2$CF$_3$, —OS(O)$_2$-aryl, —OS(O)$_2$CH$_3$, —B(OH)$_2$, —B(OH)$_3^-$, —BF$_3$, —B(OY$^1$)$_2$,

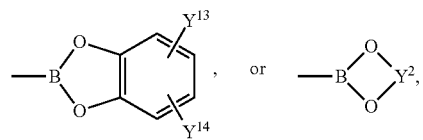

Y$^1$ is independently in each occurrence a $C_1$-$C_8$alkyl group and

Y$^2$ is independently in each occurrence a $C_2$-$C_{10}$alkylene group, and

Y$^{13}$ and Y$^{14}$ are each independently hydrogen, or a $C_1$-$C_8$alkyl group p is 0, or 1, q is 0, or 1, $A^3$, $A^4$ and $A^5$ are independently of each other a group of formula

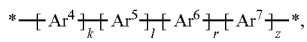

a is 1 or 2;
b is 0, 1 or 2;
c is 0, 1 or 2;
k is 0, 1, or 2;
l is 1, 2, or 3;
r is 0, or 1;
z is 0, 1 or 2;
$R^1$, $R^2$, $R^{1'}$, $R^{2'}$, $R^{1''}$, $R^{2''}$, $R^{1*}$ and $R^{2*}$ are optionally the same or different and are each independently selected from
hydrogen,
a $C_1$-$C_{100}$alkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_2$-$C_{100}$alkenyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_3$-$C_{100}$alkinyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_3$-$C_{12}$cycloalkyl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —NR$^{39}$—, —COO—, —CO— or —OCO—,
a $C_6$-$C_{24}$aryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group,
a $C_2$-$C_{20}$heteroaryl group which can optionally be substituted with $C_1$-$C_8$alkyl, $C_1$-$C_8$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, and —CO—$C_1$-$C_{18}$alkyl, —CO—$C_5$-$C_{12}$cycloalkyl, —COO—$C_1$-$C_{18}$alkyl;
$R^3$ is hydrogen, halogen, cyano, $C_1$-$C_{25}$alkyl, $C_1$-$C_{25}$alkyl which is substituted by E and/or interrupted by D,

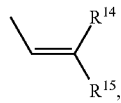

COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$;

$R^5$ is

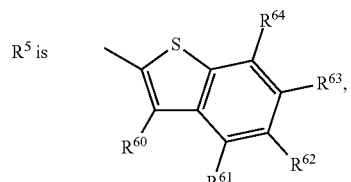

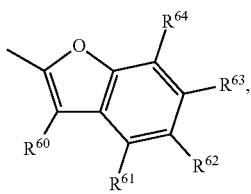

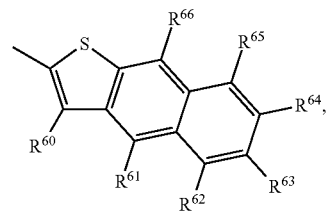

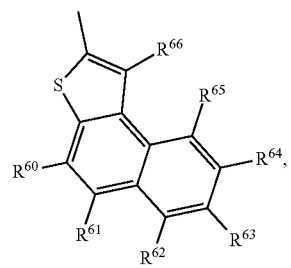

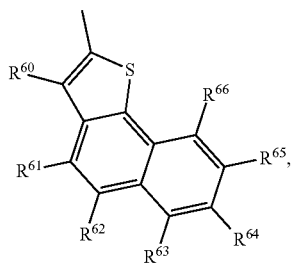

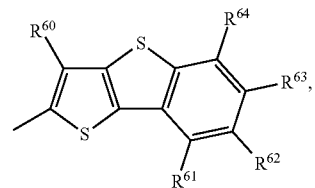

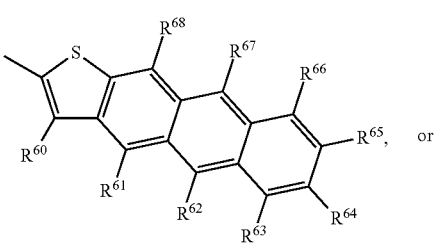

or

-continued
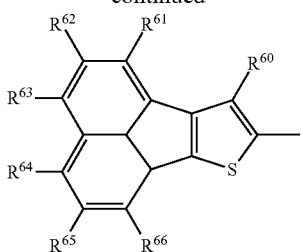
R⁶ is 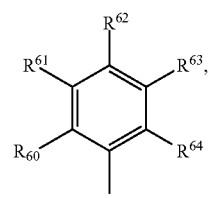
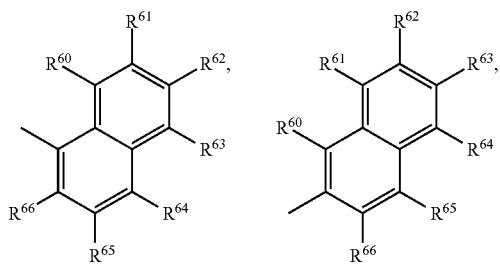
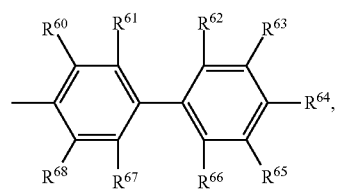
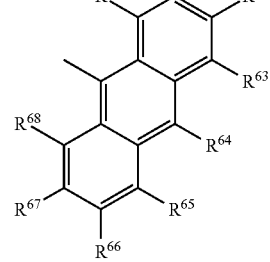 or
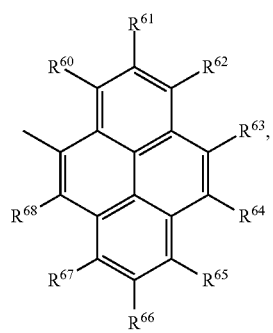
Ar¹, Ar², Ar³, Ar⁴, Ar⁵, Ar⁶ and Ar⁷ are each independently one of a bivalent group of formula
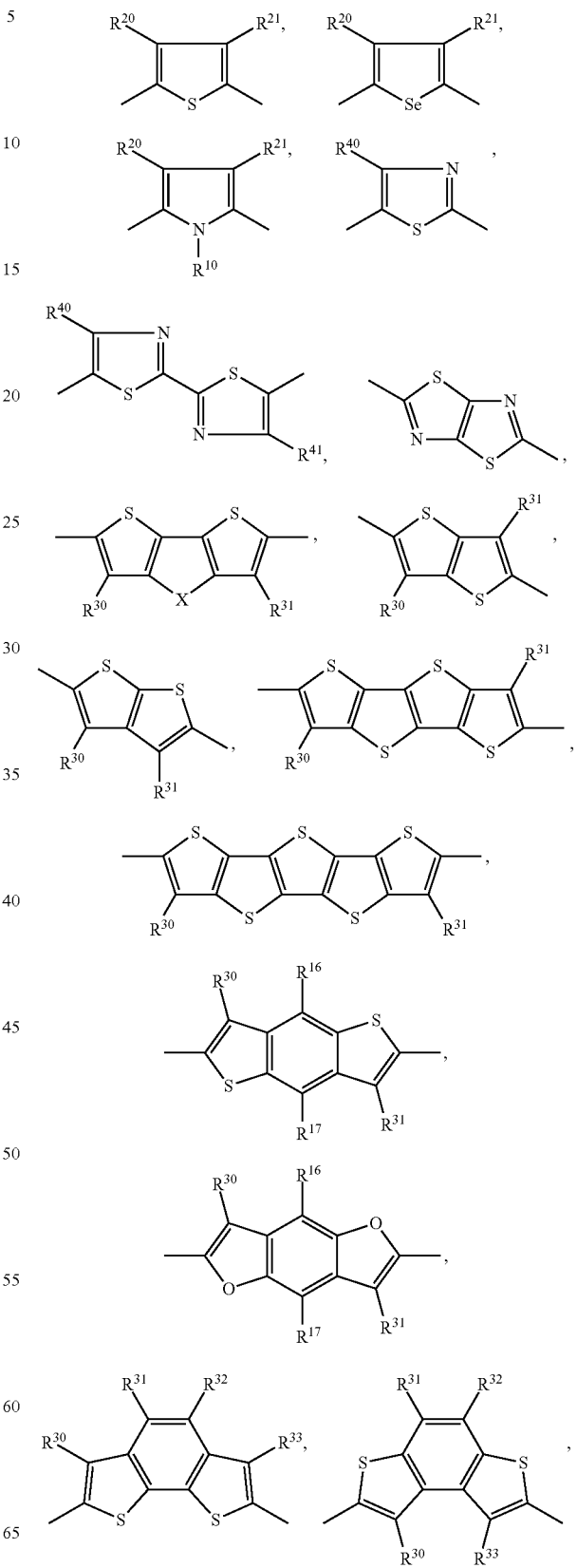

171
-continued
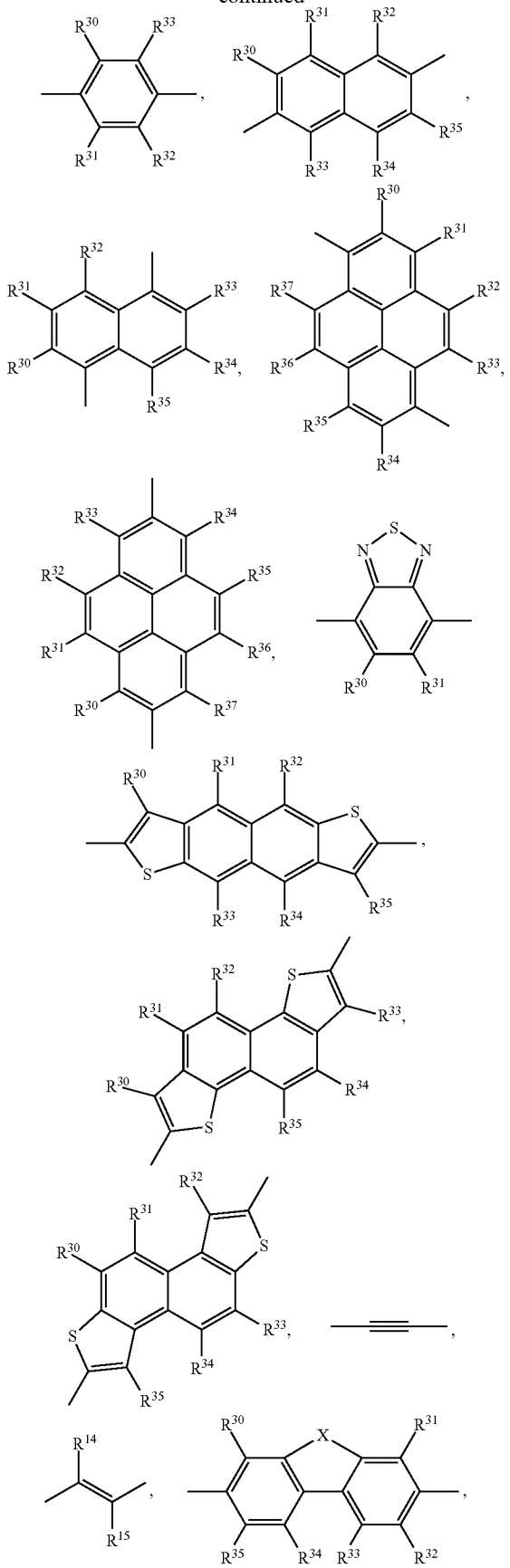
172
-continued
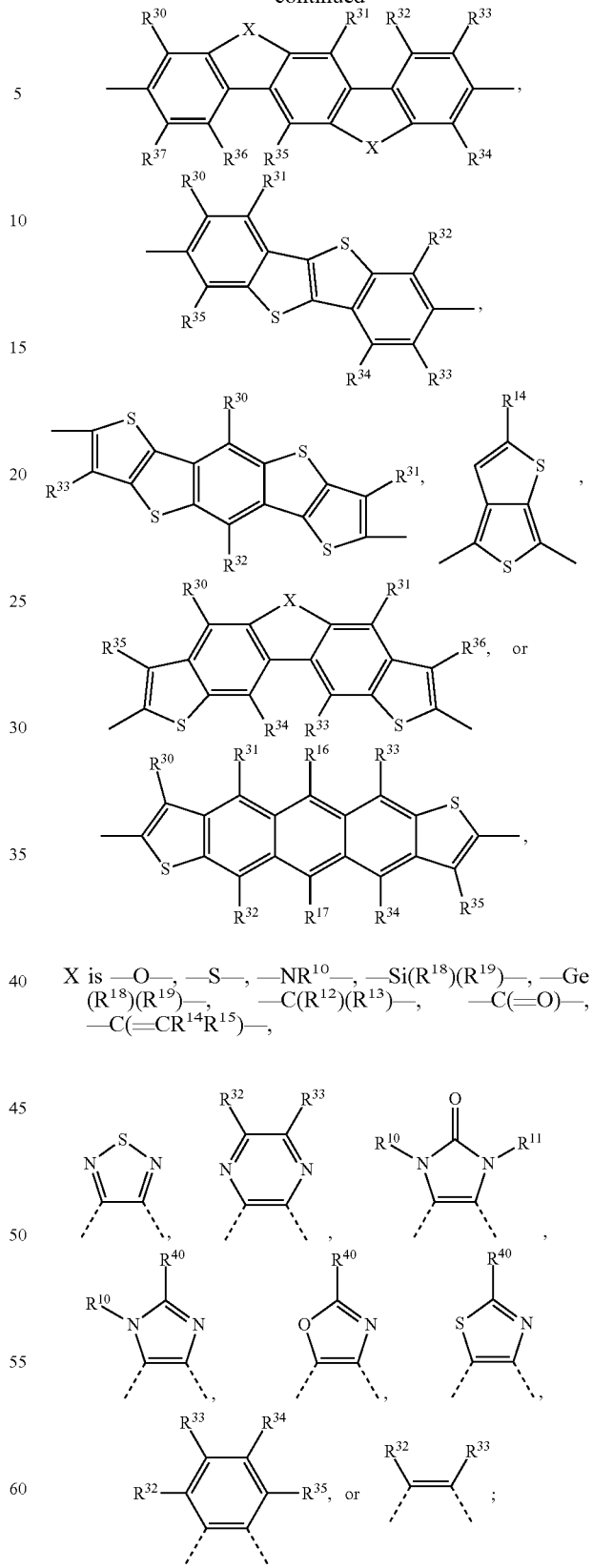
X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—,
R$^{10}$ and R$^{11}$ are each independently hydrogen, C$_1$-C$_{18}$alkyl, C$_1$-C$_{18}$haloalkyl, C$_7$-C$_{25}$arylalkyl, or C$_1$-C$_{18}$alkanoyl, $R^{12}$ and $R^{13}$ are each independently hydrogen, $C_1$-$C_{18}$alkyl, $C_1$-$C_{18}$haloalkyl, $C_7$-$C_{25}$arylalkyl, $C_6$-$C_{24}$aryl, or $C_2$-$C_{20}$heteroaryl, or $R^{12}$ and $R^{13}$ together represent oxo,

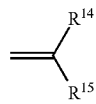

or form a five or six membered ring, which is unsubstituted or substituted by $C_1$-$C_{18}$alkyl and/or $C_1$-$C_{18}$alkoxy;

$R^{14}$ and $R^{15}$ are each independently hydrogen, $C_1$-$C_{18}$alkyl, $C_6$-$C_{24}$aryl, $C_2$-$C_{20}$heteroaryl, —CN or COOR$^{50}$;

$R^{16}$ and $R^{17}$ are each independently hydrogen, halogen, $C_1$-$C_{25}$alkyl, $C_1$-$C_{25}$alkoxy, $C_7$-$C_{25}$arylalkyl, or

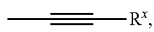

$R^x$ is a $C_1$-$C_8$alkyl group, or a tri($C_1$-$C_8$alkyl)silyl group, $R^{18}$ and $R^{19}$ are each independently hydrogen, $C_1$-$C_{18}$alkyl, $C_7$-$C_{25}$arylalkyl, or a phenyl group, which optionally can be substituted one to three times with $C_1$-$C_8$alkyl and/or $C_1$-$C_8$alkoxy, $R^{20}$ and $R^{21}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, or $R^{20}$ and $R^{21}$ together represent alkylene or alkenylene which are optionally both bonded via oxygen and/or sulfur to the (hetero)aromatic residue and which are optionally both have up to 4 carbon atoms, $R^{30}$ to $R^{37}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{40}$ and $R^{41}$ are each independently hydrogen, $C_1$-$C_{25}$alkyl, $C_2$-$C_{25}$alkenyl, $C_2$-$C_{25}$alkyl which is interrupted by —O— or —S—, COOR$^{50}$, cyano, $C_1$-$C_{18}$alkoxy, $C_6$-$C_{24}$aryl, $C_7$-$C_{25}$arylalkyl, halogen or $C_2$-$C_{20}$heteroaryl, $R^{50}$ is $C_1$-$C_{25}$alkyl, $C_1$-$C_{25}$haloalkyl, $C_7$-$C_{25}$arylalkyl, $C_6$-$C_{24}$aryl or $C_2$-$C_{20}$heteroaryl;

$R^{60}$ to $R^{68}$ are each independently H, halogen, cyano, $C_1$-$C_{25}$alkyl, $C_1$-$C_{25}$alkyl which is substituted by E and/or interrupted by D, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, D is —CO—, —COO—, —S—, —O—, —NR$^{39}$—, or —C(=O)NR$^{39}$—, E is $C_1$-$C_8$thioalkoxy, COO—$C_1$-$C_{18}$alkyl, $C_1$-$C_8$alkoxy, CN, —NR$^{39}$R$^{39'}$, —CONR$^{39}$R$^{39'}$, or halogen, G is E, or $C_1$-$C_{18}$alkyl, and $R^{39}$ and $R^{39'}$ are each independently hydrogen, $C_1$-$C_{18}$alkyl, $C_1$-$C_{18}$haloalkyl, $C_7$-$C_{25}$arylalkyl, or $C_1$-$C_{18}$alkanoyl, with the proviso that, if the polymeric material is a diketopyrrolopyrrole (DPP) polymer, a quotient of a weight average molecular weight of the DPP polymer and a molecular weight of the repeating unit of the polymer is at least 5.

15. A process for the preparation of a polymer comprising repeating unit(s) of formula

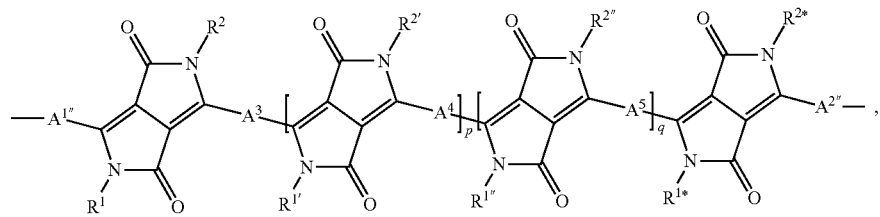

(VI)

$R^x$ is a $C_1$-$C_8$alkyl group, or a tri($C_1$-$C_8$alkyl)silyl group, the process comprising polymerizing the compound of formula (X) according to claim 14 as an intermediate, wherein $A^{1''}$ and $A^{2''}$ are independently of each other a group of formula

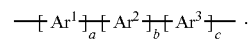

16. The composition of claim 1, wherein:

$R^3$ is hydrogen, halogen, cyano, $C_1$-$C_{25}$alkyl, $C_1$-$C_{25}$alkyl which is substituted by E and/or interrupted by D, COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$; and $Ar^1$, $Ar^2$, $Ar^3$, $Ar^4$, $Ar^5$, $Ar^6$ and $Ar^7$ are each independently one of a bivalent group of formula

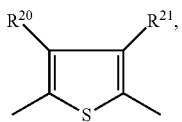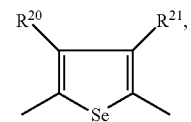

175
-continued
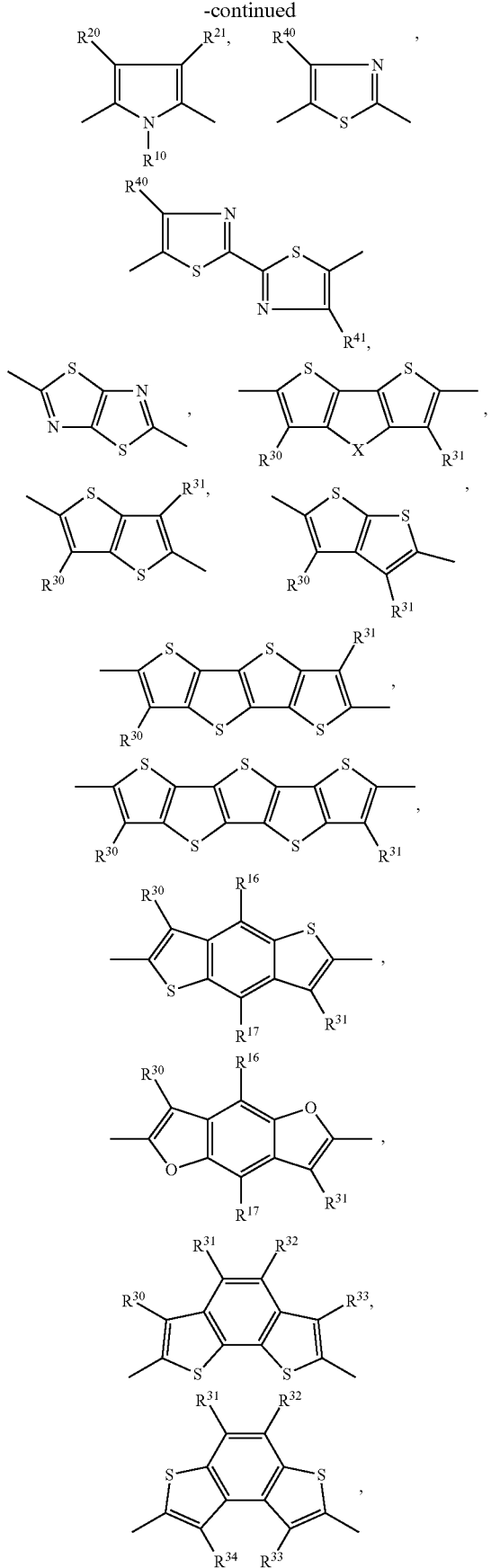
176
-continued
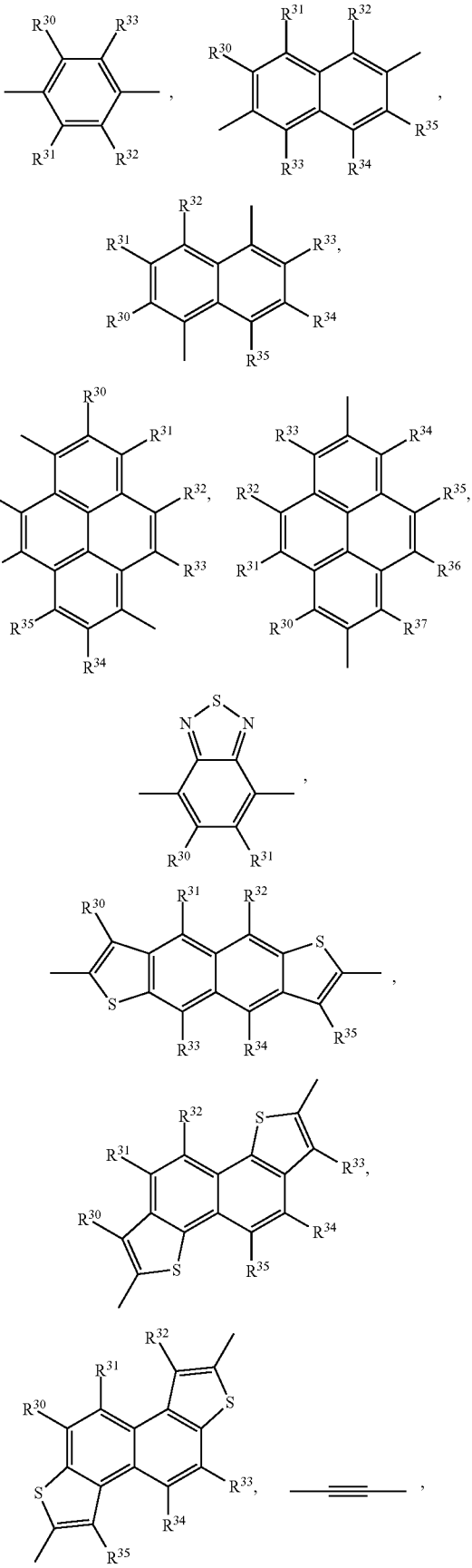

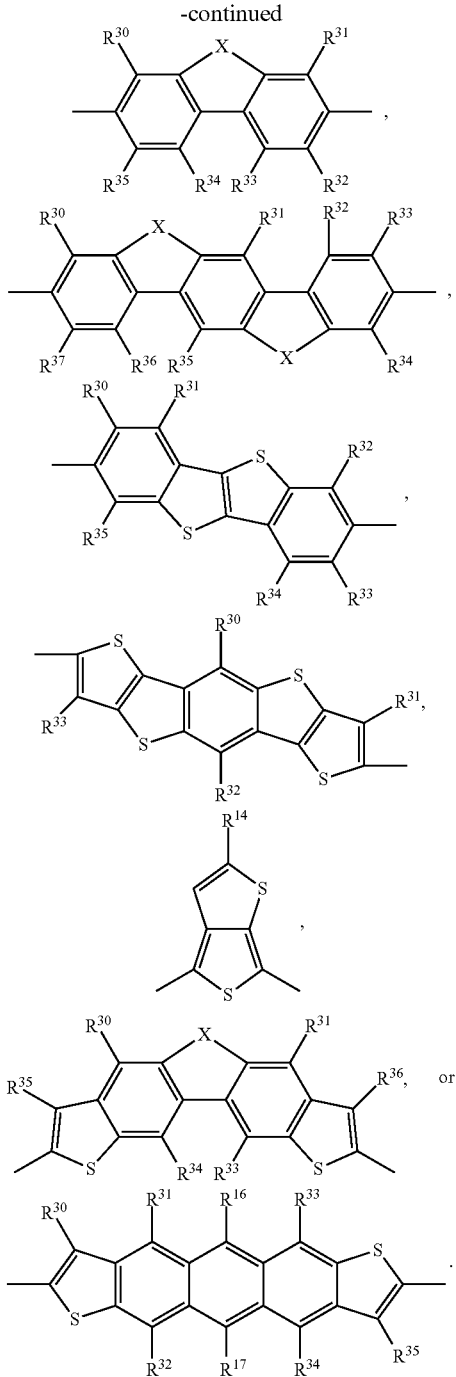

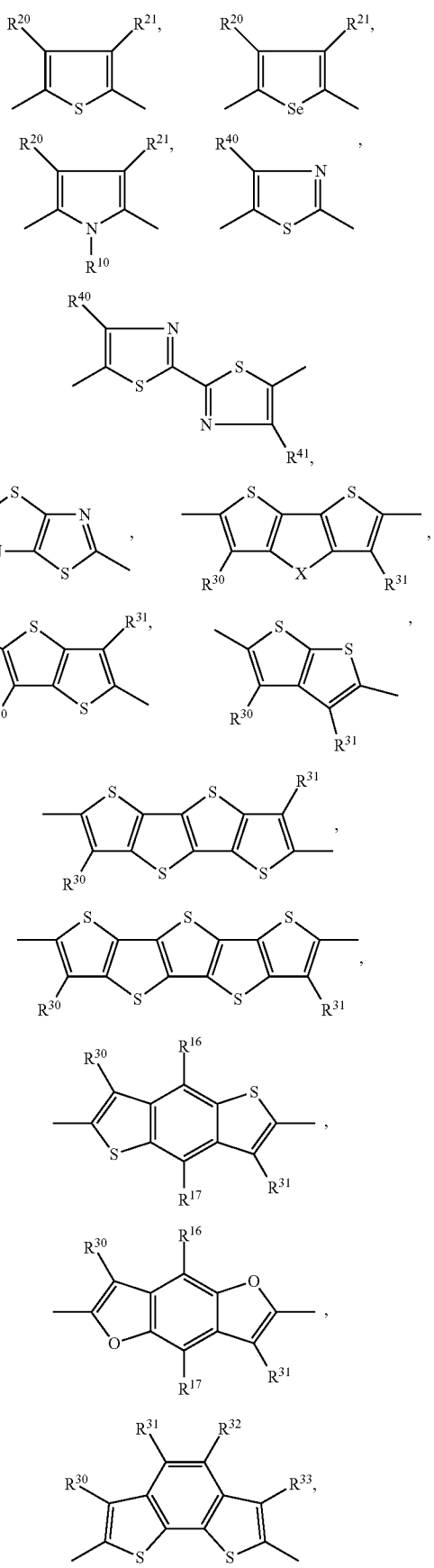

17. The compound of claim 5, wherein:

R³ is hydrogen, halogen, cyano, C₁-C₂₅alkyl, C₁-C₂₅alkyl which is substituted by E and/or interrupted by D, COO—C₁-C₁₈alkyl, C₃-C₁₂cycloalkyl, C₃-C₁₂cycloalkyl, which is substituted by G, C₂-C₁₈alkenyl, C₂-C₁₈alkynyl, C₁-C₁₈thioalkoxy, C₁-C₁₈alkoxy, C₁-C₁₈alkoxy which is substituted by E and/or interrupted by D, C₇-C₂₅aralkyl, or C₇-C₂₅aralkyl, which is substituted by G, or has the meaning of R⁵, or R⁶; and Ar¹, Ar², Ar³, Ar⁴, Ar⁵, Ar⁶ and Ar⁷ are each independently one of a bivalent group of formula

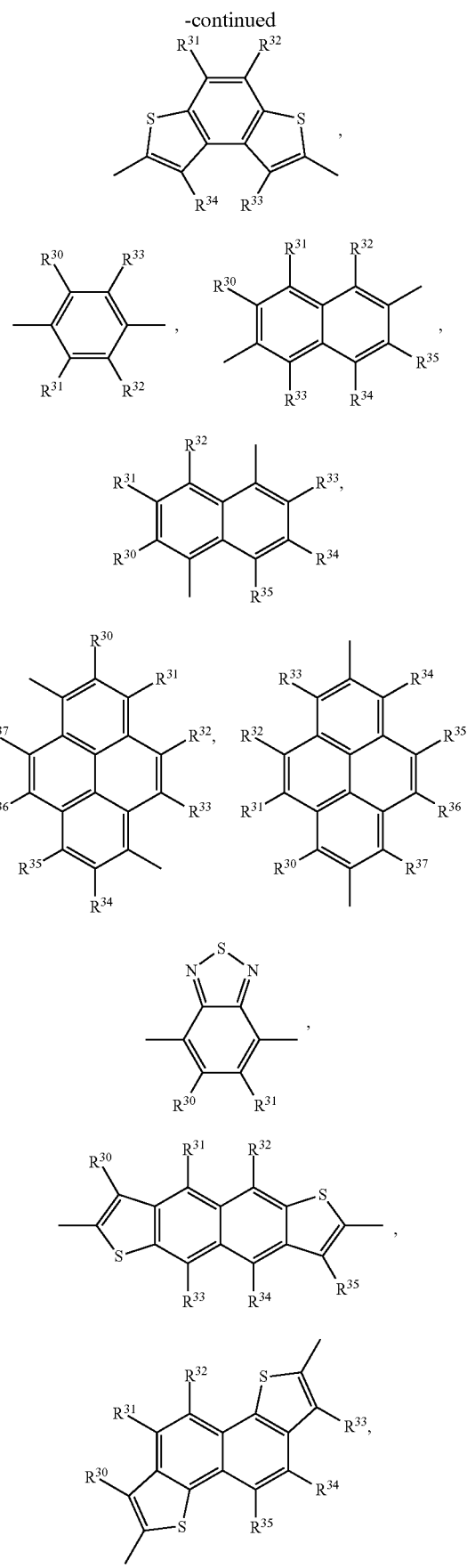
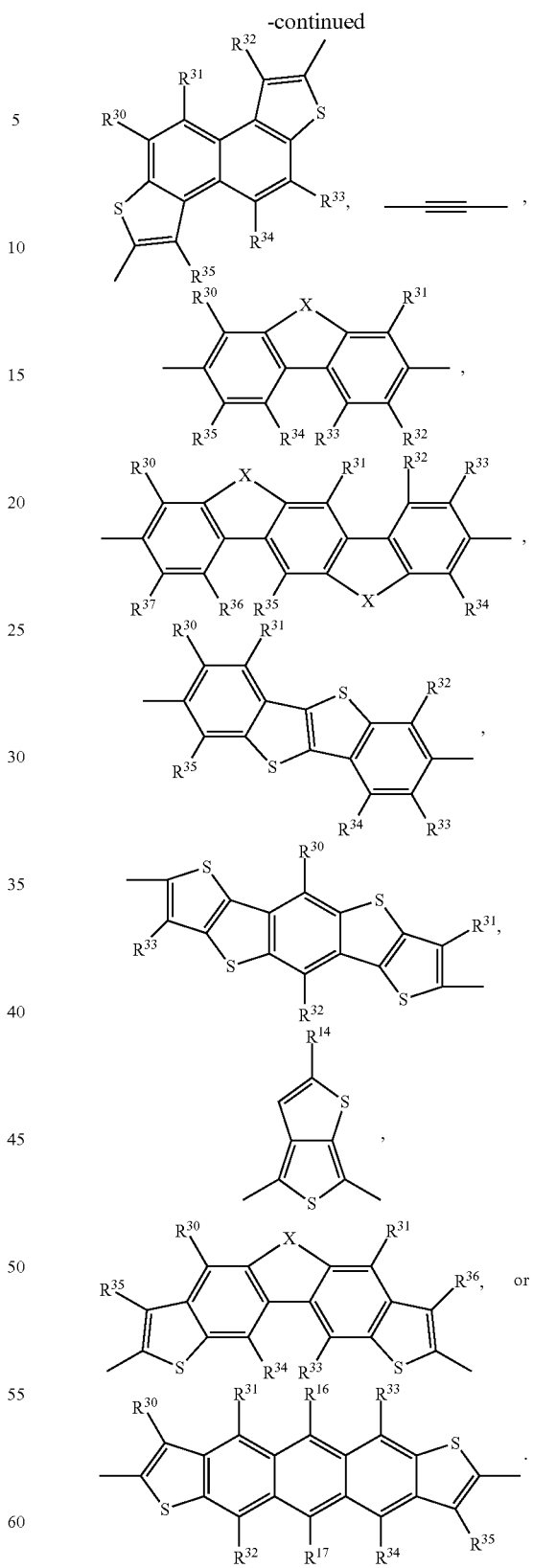
18. The compound of claim 7, wherein:
R$^3$ is hydrogen, halogen, cyano, C$_1$-C$_{25}$alkyl, C$_1$-C$_{25}$alkyl which is substituted by E and/or interrupted by D, COO—C$_1$-C$_{18}$alkyl, C$_3$-C$_{12}$cycloalkyl, C$_3$-C$_{12}$cycloalkyl, which is substituted by G, C$_2$-C$_{18}$alkenyl, C$_2$-C$_{18}$alkynyl, C$_1$-C$_{18}$thioalkoxy, C$_1$-C$_{18}$alkoxy, C$_1$-C$_{18}$alkoxy which is substituted by E and/or interrupted by D, C$_7$-C$_{25}$aralkyl, or C$_7$-C$_{25}$aralkyl, which is substituted by G, or has the meaning of R$^5$, or R$^6$;
Ar$^1$, Ar$^2$ and Ar$^3$ are each independently one of a bivalent group of formula
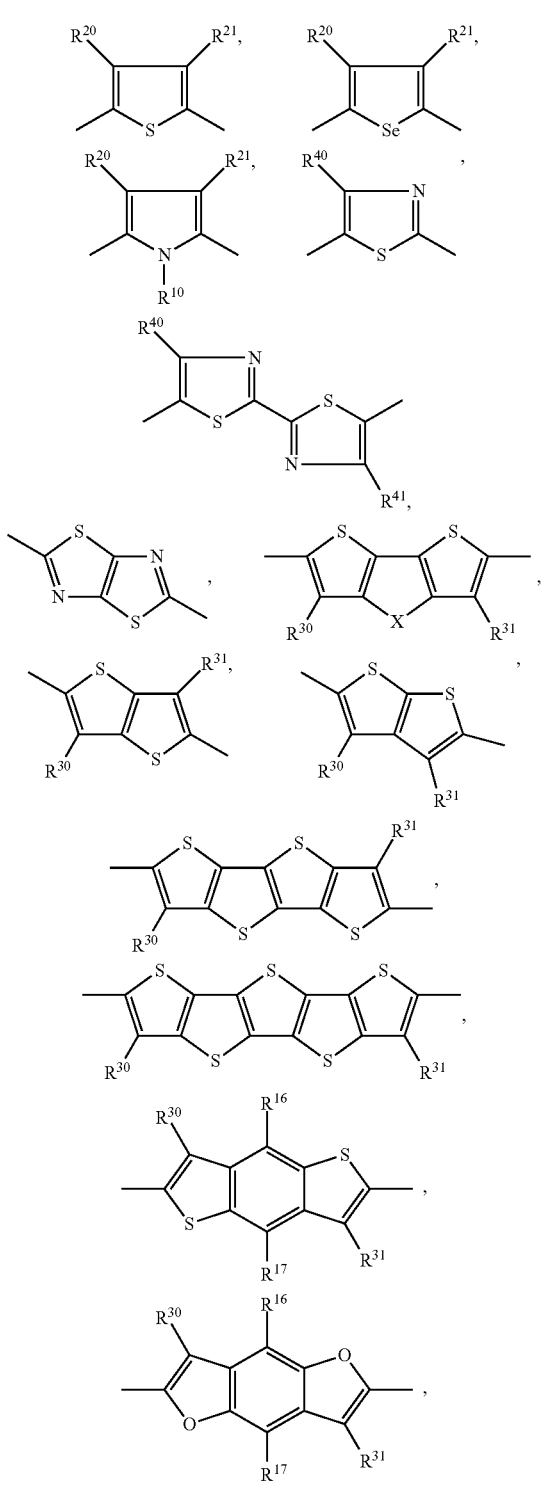
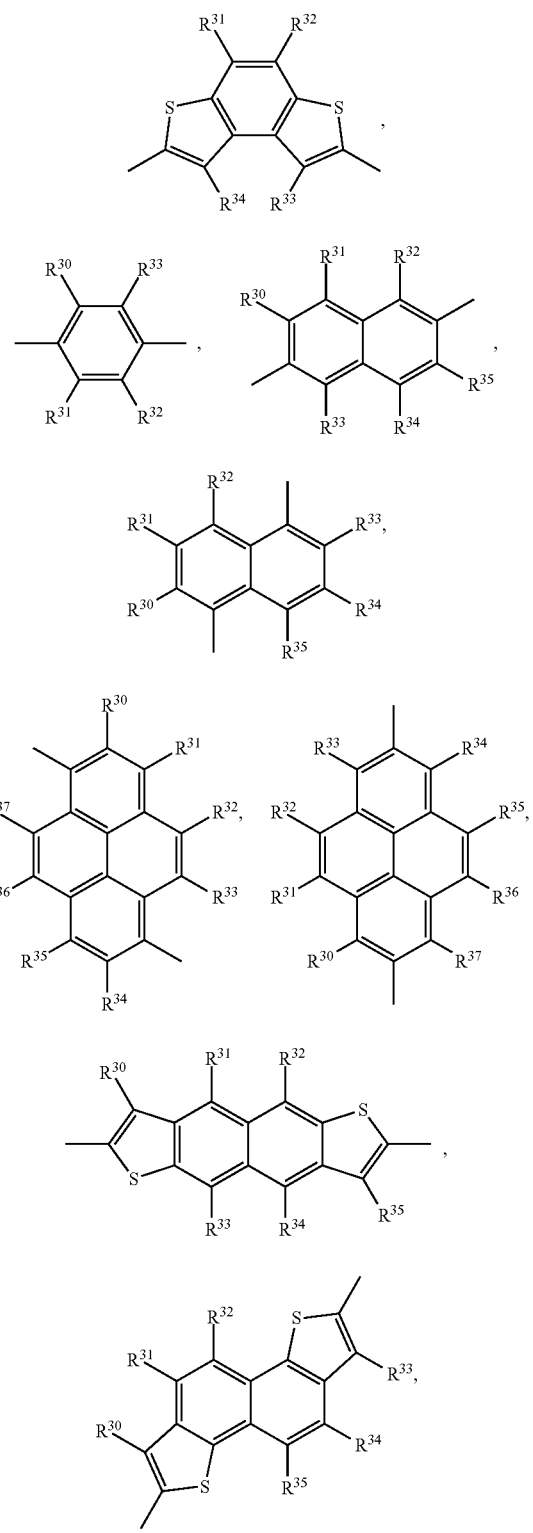

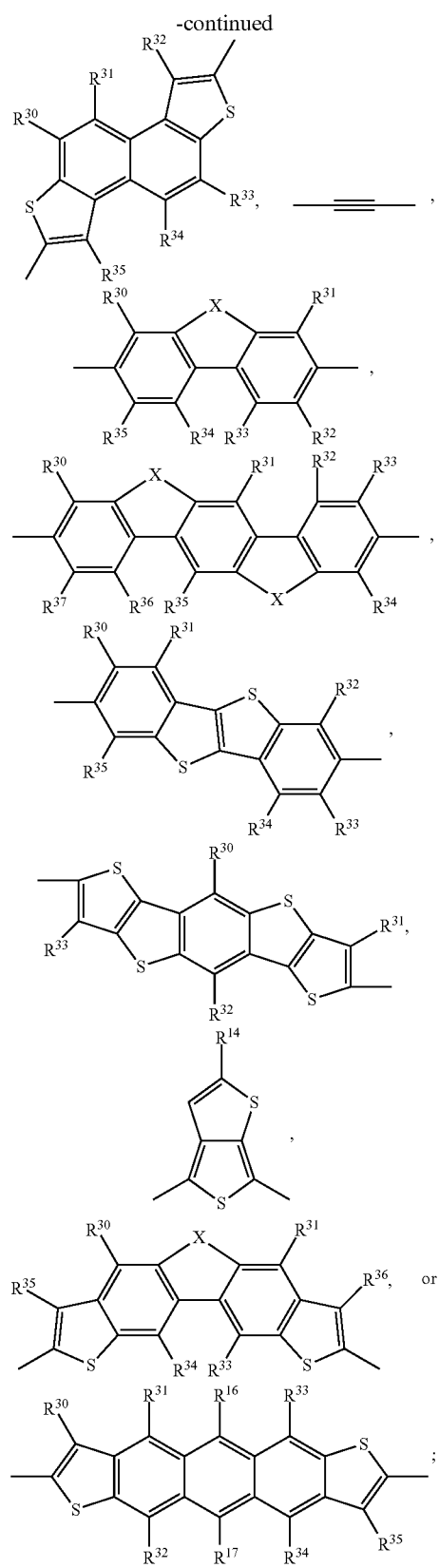
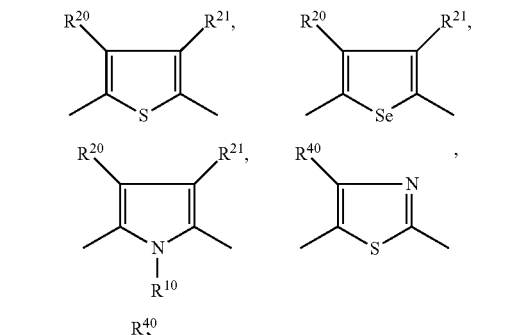
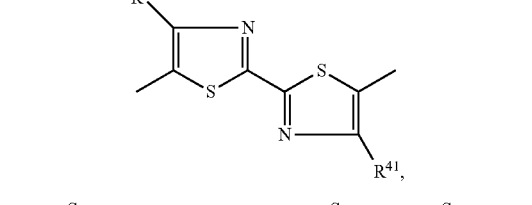
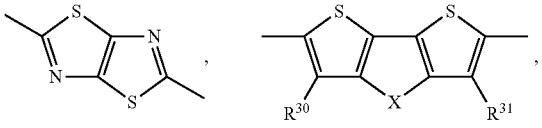
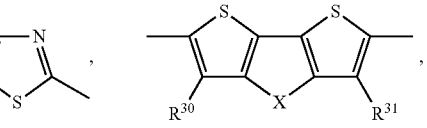
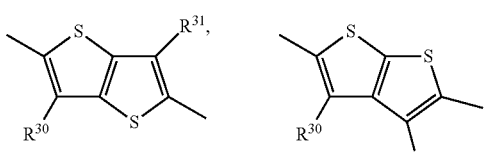
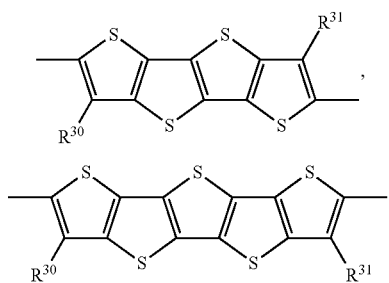
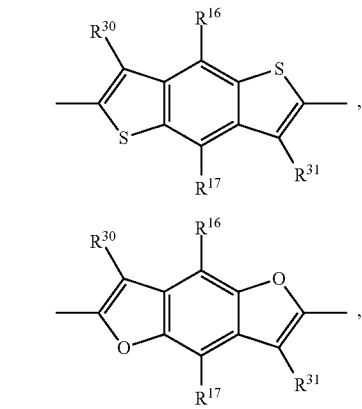
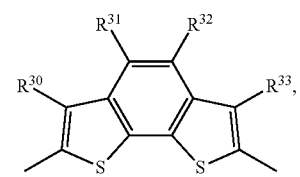
and
Ar⁴, Ar⁵, Ar⁶ and Ar⁷ are each independently one of a bivalent group of formula

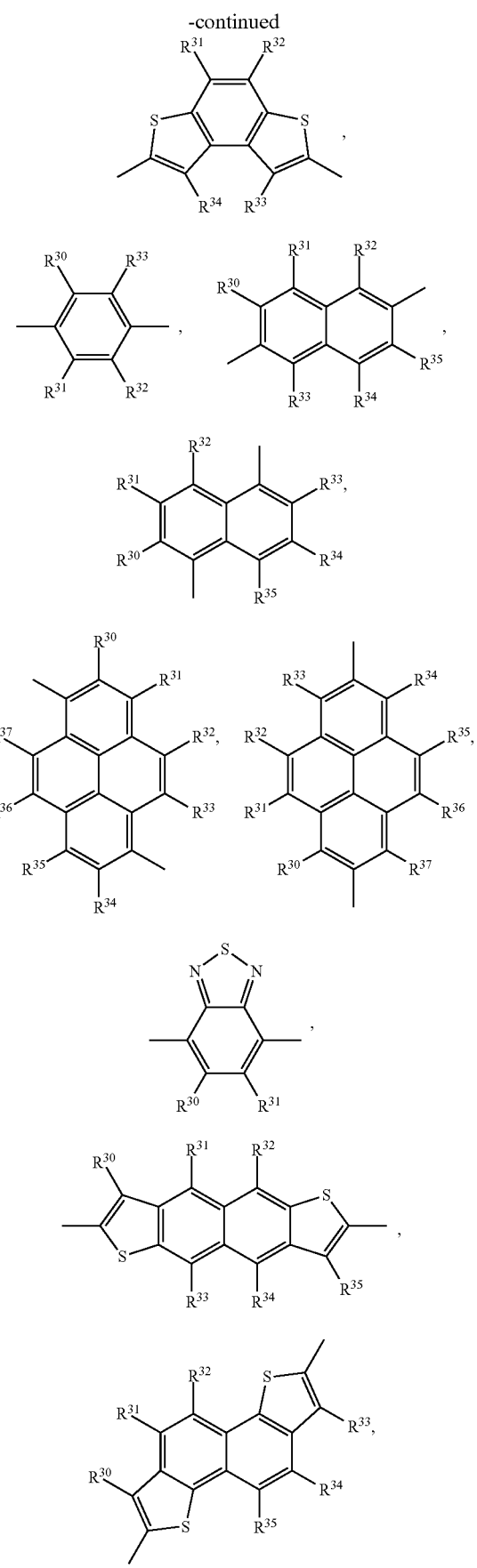
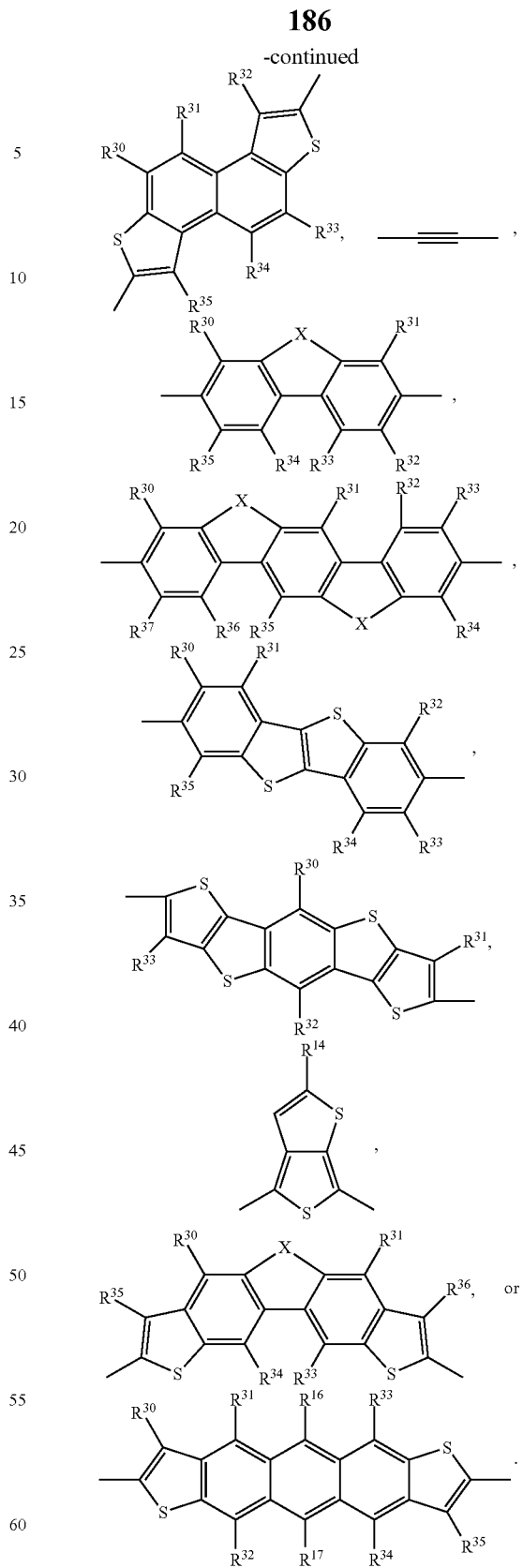
19. The process of claim 13, wherein:
R[3] is hydrogen, halogen, cyano, $C_1$-$C_{25}$alkyl, $C_1$-$C_{25}$alkyl which is substituted by E and/or interrupted by D, COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$; and $Ar^1$, $Ar^2$, $Ar^3$, $Ar^4$, $Ar^5$, $Ar^6$ and $Ar^7$ are each independently one of a bivalent group of formula

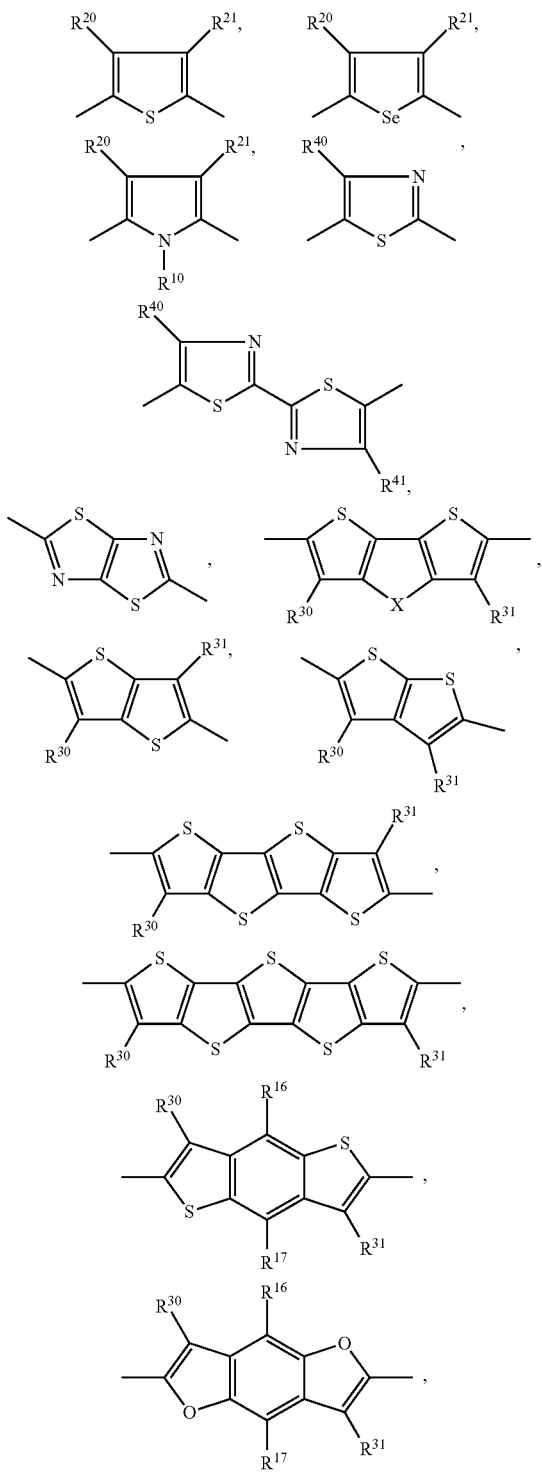

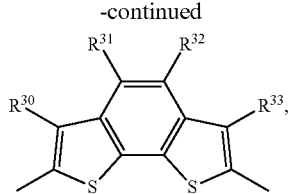

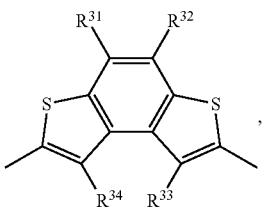

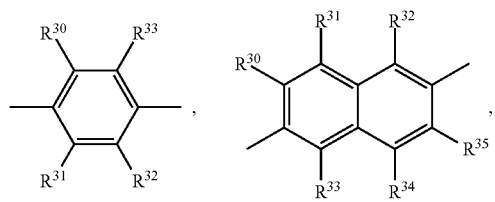

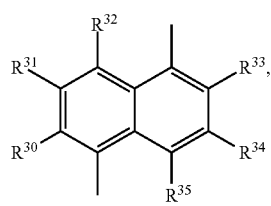

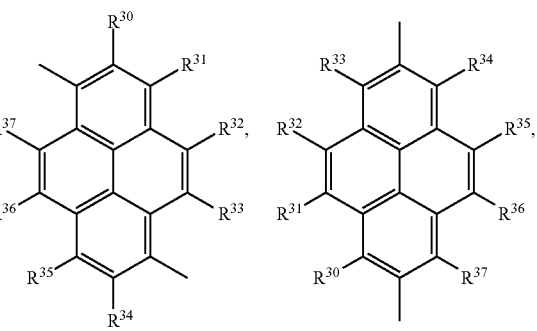

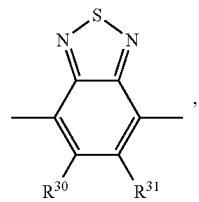

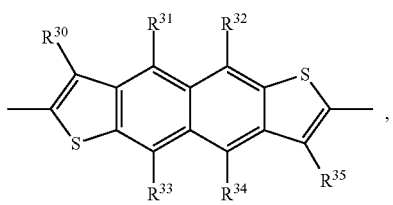

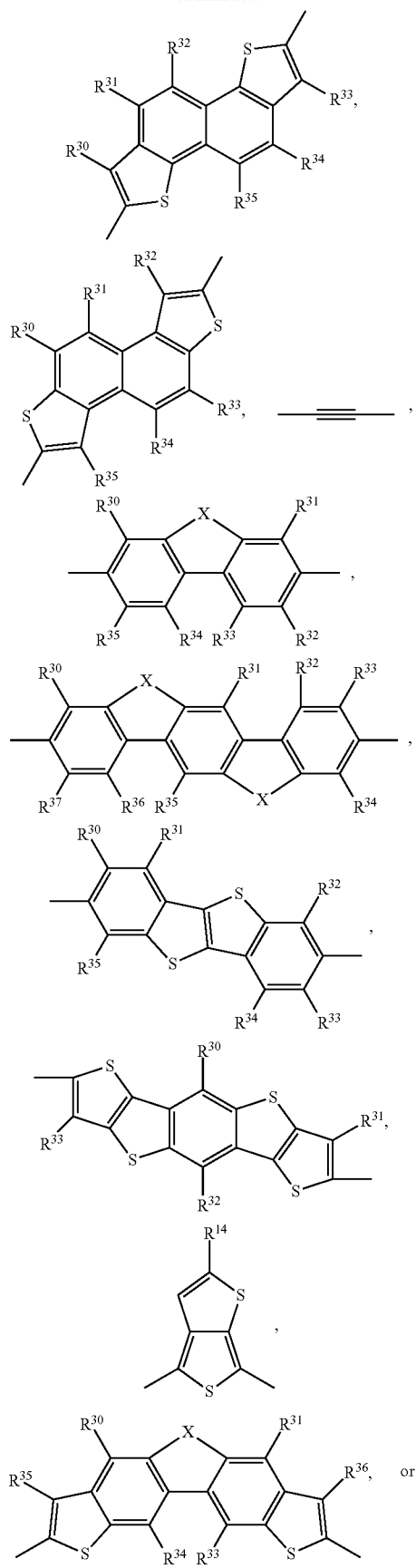

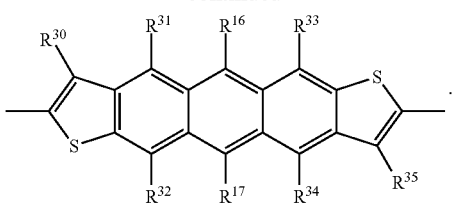

20. The compound of claim 14, wherein:

$R^3$ is hydrogen, halogen, cyano, $C_1$-$C_{25}$alkyl, $C_1$-$C_{25}$alkyl which is substituted by E and/or interrupted by D, COO—$C_1$-$C_{18}$alkyl, $C_3$-$C_{12}$cycloalkyl, $C_3$-$C_{12}$cycloalkyl, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or has the meaning of $R^5$, or $R^6$; and $Ar^1$, $Ar^2$, $Ar^3$, $Ar^4$, $Ar^5$, $Ar^6$ and $Ar^7$ are each independently one of a bivalent group of formula

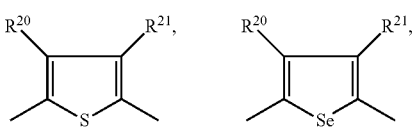

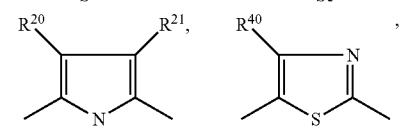

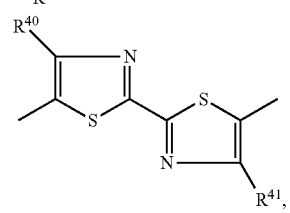

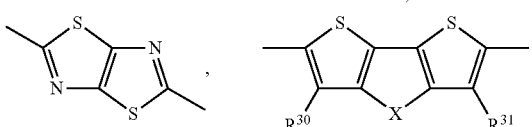

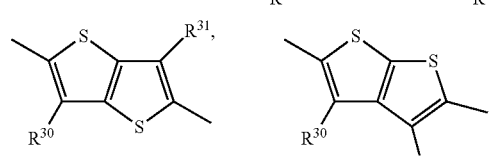

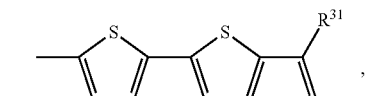

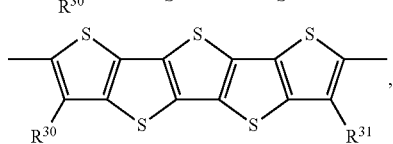

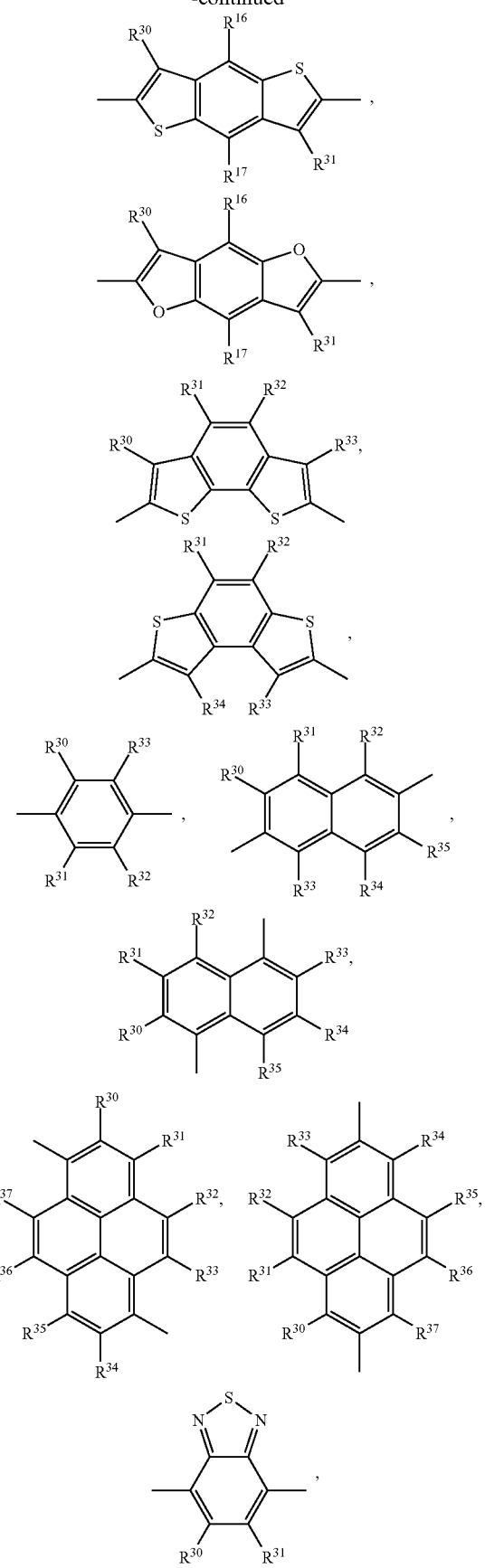
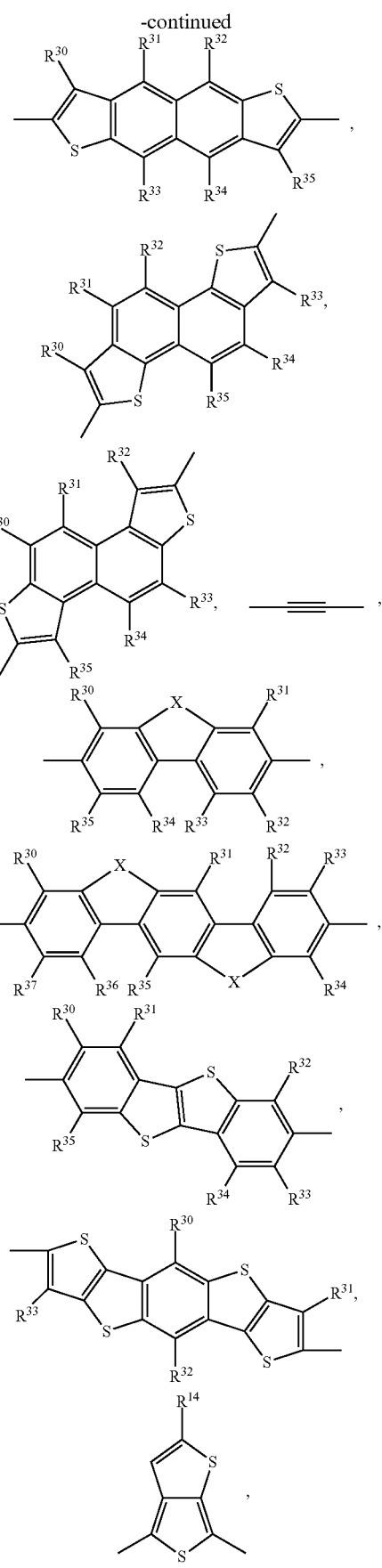

-continued
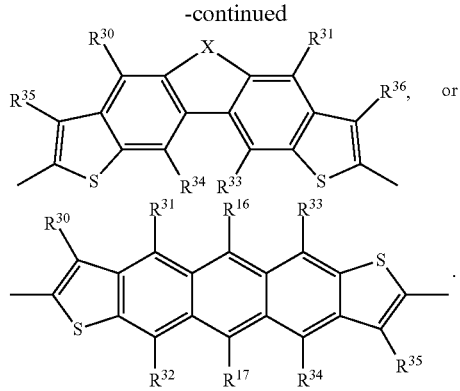
or
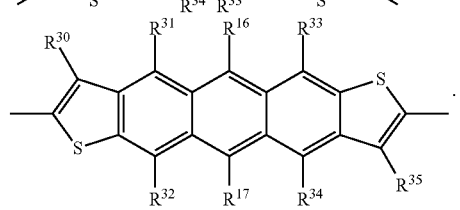
* * * * *